US010317794B2

(12) United States Patent
Idei et al.

(10) Patent No.: US 10,317,794 B2
(45) Date of Patent: Jun. 11, 2019

(54) COLORING COMPOSITION, CURED FILM, COLOR FILTER, METHOD FOR MANUFACTURING COLOR FILTER, SOLID-STATE IMAGING DEVICE, IMAGE DISPLAY DEVICE, ORGANIC ELECTROLUMINESCENT ELEMENT, COLORANT, AND METHOD FOR PRODUCING COLORANT

(71) Applicant: FUJIFILM Corporation, Tokyo (JP)

(72) Inventors: Hiroaki Idei, Haibara-gun (JP); Kazuya Oota, Haibara-gun (JP); Suguru Samejima, Haibara-gun (JP); Masayuki Harada, Haibara-gun (JP); Akihiro Hara, Haibara-gun (JP); Junichi Ito, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 126 days.

(21) Appl. No.: 15/274,360

(22) Filed: Sep. 23, 2016

(65) Prior Publication Data

US 2017/0010530 A1 Jan. 12, 2017

Related U.S. Application Data

(63) Continuation of application No. PCT/JP2015/059310, filed on Mar. 26, 2015.

(30) Foreign Application Priority Data

Mar. 31, 2014 (JP) ................................ 2014-073226
May 30, 2014 (JP) ................................ 2014-112511
Nov. 14, 2014 (JP) ................................ 2014-232013
Feb. 17, 2015 (JP) ................................ 2015-028594

(51) Int. Cl.

| | |
|---|---|
| ***G02B 5/20*** | (2006.01) |
| ***G03F 7/004*** | (2006.01) |
| ***G03F 7/00*** | (2006.01) |
| ***C09B 69/10*** | (2006.01) |
| ***C08F 2/38*** | (2006.01) |
| ***C08F 2/44*** | (2006.01) |
| ***C08F 2/50*** | (2006.01) |
| ***G02B 5/22*** | (2006.01) |
| ***C09B 11/12*** | (2006.01) |

(Continued)

(52) U.S. Cl.

CPC ............. *G03F 7/0007* (2013.01); *C08F 2/38* (2013.01); *C08F 2/44* (2013.01); *C08F 2/50* (2013.01); *C09B 5/14* (2013.01); *C09B 11/12* (2013.01); *C09B 11/24* (2013.01); *C09B 25/00* (2013.01); *C09B 49/12* (2013.01); *C09B 49/122* (2013.01); *C09B 49/126* (2013.01); *C09B 67/0033* (2013.01); *C09B 67/0034* (2013.01); *C09B 69/101* (2013.01); *C09B 69/103* (2013.01); *C09B 69/105* (2013.01); *C09B 69/106* (2013.01); *C09B 69/108* (2013.01); *C09B 69/109* (2013.01); *G02B 5/223* (2013.01); *G03F 7/029* (2013.01); *G03F 7/031* (2013.01); *G03F 7/033* (2013.01); *G03F 7/0388* (2013.01); *G03F 7/105* (2013.01); *C08F 222/1006* (2013.01); *C08F 2220/325* (2013.01); *C08F 2220/343* (2013.01); *C08F 2222/104* (2013.01); *C08F 2222/1013* (2013.01); *C08F 2222/1026* (2013.01)

(58) Field of Classification Search

CPC ..... C09B 69/10; C09B 69/101; C09B 69/103; C09B 69/105; C09B 69/106; C09B 69/108; C09B 69/109; G03F 7/0007; G03F 7/004; G03F 7/027; G03F 7/0388; G03F 7/20; G02B 5/233
USPC .................................................. 430/7, 281.1
See application file for complete search history.

(56) References Cited

U.S. PATENT DOCUMENTS 8,808,947 B2 8/2014 Takahashi et al.
8,921,018 B2 12/2014 Takahashi et al.
(Continued)

FOREIGN PATENT DOCUMENTS

CN 101405310 A 4/2009
EP 2 006 310 A2 12/2008
(Continued)

OTHER PUBLICATIONS

Computer-generated translation iof JP 11-189732 (1999). (Year: 1999).*

(Continued)

*Primary Examiner* — John A McPherson
(74) *Attorney, Agent, or Firm* — Sughrue Mion, PLLC

(57) ABSTRACT

A coloring composition having excellent light fastness, color migration properties, and flatness, a colorant, and a method for producing a colorant are provided. Further, a cured film, a color filter, a method for manufacturing a color filter, a solid-state imaging device, an image display device, and an organic electroluminescent element, each using such the coloring composition, are also provided. The coloring composition contains a colorant represented by General Formula (1) and a curable compound, and has a specific absorbance of 5 or more at a maximum absorption wavelength of 400 nm to 800 nm. $R^1$ represents an (m+n)-valent linking group, P represents a monovalent substituent having a repeating units derived from a vinyl compound, D represents a colorant structure, and $R^2$ and $L^1$ each independently represent a single bond or a divalent linking group.

$$(D\text{-}R^2)_n\text{—}R^1\text{-}(L^1\text{-}P)_m \qquad (1)$$

42 Claims, No Drawings

(51) Int. Cl.

| | |
|---|---|
| ***C09B 11/24*** | (2006.01) |
| ***C09B 25/00*** | (2006.01) |
| ***C09B 5/14*** | (2006.01) |
| ***C09B 49/12*** | (2006.01) |
| ***C09B 67/22*** | (2006.01) |
| ***G03F 7/029*** | (2006.01) |
| ***G03F 7/031*** | (2006.01) |
| ***G03F 7/033*** | (2006.01) |
| ***G03F 7/038*** | (2006.01) |
| ***G03F 7/105*** | (2006.01) |
| *C08F 222/10* | (2006.01) |
| *C08F 220/32* | (2006.01) |
| *C08F 220/34* | (2006.01) |

(56) References Cited

U.S. PATENT DOCUMENTS

2010/0233595 A1 9/2010 Takahashi et al.
2014/0175348 A1 6/2014 Takahashi et al.
2016/0116838 A1 4/2016 Hara et al.

FOREIGN PATENT DOCUMENTS

JP 11-189732 A * 7/1999
JP 2007-277514 A 10/2007
JP 2013-209435 A 10/2013
WO 2007/108367 A1 9/2007
WO 2013/024691 A1 2/2013

OTHER PUBLICATIONS

International Preliminary Report on Patentability with translation of Written Opinion dated Oct. 13, 2016, issued by the International Searching Authority in Application No. PCT/JP2015/059310.
Office Action dated Feb. 4, 2017, issued from the State Intellectual Property Office of People's Republic of China in corresponding Chinese Patent Application No. 201580017749.X.
Office Action dated Mar. 21, 2017, issued from the Japan Patent Office in corresponding Japanese Patent Application No. 2015-028594.
Extended European Search Report dated May 29, 2017 from the European Patent Office in counterpart European Application No. 15772244.8.
International Search Report of PCT/JP2015/059310 dated Jun. 16, 2015.
Written Opinion of PCT/JP2015/059310 dated Jun. 16, 2015.

* cited by examiner

COLORING COMPOSITION, CURED FILM, COLOR FILTER, METHOD FOR MANUFACTURING COLOR FILTER, SOLID-STATE IMAGING DEVICE, IMAGE DISPLAY DEVICE, ORGANIC ELECTROLUMINESCENT ELEMENT, COLORANT, AND METHOD FOR PRODUCING COLORANT

CROSS-REFERENCE TO RELATED APPLICATIONS

This application is a Continuation of PCT International Application No. PCT/JP2015/059310 filed on Mar. 26, 2015, which claims priority under 35 U.S.C § 119(a) to Japanese Patent Application No. 2014-073226 filed on Mar. 31, 2014, Japanese Patent Application No. 2014-112511 filed on May 30, 2014, Japanese Patent Application No. 2014-232013 filed on Nov. 14, 2014 and Japanese Patent Application No. 2015-028594 filed on Feb. 17, 2015. Each of the above application(s) is hereby expressly incorporated by reference, in its entirety, into the present application.

BACKGROUND OF THE INVENTION

The present invention relates to a coloring composition. In particular, the present invention relates to a coloring composition which is suitable for the manufacture of a color filter for use in a solid-state imaging device, an image display device, and the like. The present invention further relates to a cured film, a color filter, a solid-state imaging device, an image display device, and an organic electroluminescent element, each using the coloring composition; a method for manufacture of a color filter using the coloring composition; and a colorant and a method for producing a colorant.

DESCRIPTION OF THE RELATED ART

As digital cameras, camera-equipped cellular phones, and the like have come into wide use in recent years, a demand for solid-state imaging devices such as a CCD image sensor has greatly increased. As a key device of these displays or optical devices, a color filter is used, and it is increasingly required for the color filter to have a higher degree of sensitivity and to be miniaturized. Such a color filter has a colored pattern of three primary colors of red (R), green (G), and blue (B), and plays a role in separating transmitted light into the three primary colors.

Coloring agents for use in the color filters are required to have properties as follow in common. That is, they are required to have light absorption properties that are preferable in term of color reproducibility; good light fastness; and the like.

For example, JP2013-209435A discloses a quinophthalone colorant which has excellent solvent solubility and fastness, which has 2 to 6 colorant structures derived from a quinophthalone colorant within one molecule.

On the other hand, JP2007-277514A discloses a pigment dispersing agent which has 2 to 9 moieties having an ability of being absorbed onto a pigment within one molecule. Examples of the moiety having an ability of being absorbed onto a pigment include an organic colorant structure, a heterocyclic structure, an acid group, a basic nitrogen atom-containing group, a urea group, a urethane group, a group having a coordinating oxygen atom, a hydrocarbon group having 4 or more carbon atoms, an alkoxysilyl group, an epoxy group, an isocyanate group, and a hydroxyl group.

SUMMARY OF THE INVENTION

A coloring composition for use in a color filter or the like is required to have further improvement in light fastness, color migration properties, and flatness.

The present inventors have studied a coloring composition including the colorant disclosed in JP2013-209435A, and as a result, they have found that the coloring composition has deteriorated color migration properties or flatness.

On the other hand, JP2007-277514A is directed to an invention relating to a pigment dispersing agent. It describes that an organic colorant structure is used as a moiety having an adsorbing property onto a pigment, but since it is preferable that the pigment dispersing agent has no color, it is necessary for a moiety having an adsorbing ability onto a pigment to take a structure having small absorbance. In addition, JP2007-277514A has no description on any motif for use of a pigment dispersing agent as a coloring agent. Therefore, there is no necessity that the pigment dispersing agent described in JP2007-277514A is used as a coloring agent.

The present invention has been made taking such situations into consideration, and thus has an object to provide a coloring composition having excellent light fastness, color migration properties, and flatness, a colorant, and a method for producing a colorant. The present invention has another object to provide a cured film, a color filter, a method for manufacturing a color filter, a solid-state imaging device, an image display device, and an organic electroluminescent element, each using such a coloring composition.

The present inventors have extensively studied and as a result, they have found that a coloring composition having excellent light fastness, color migration properties, and flatness is obtained with a coloring composition containing a colorant having 2 to 14 a colorant structures, and 1 to 13 specific monovalent substituents having repeating units derived from a vinyl compound, thereby completing the present invention.

Specifically, the problems were solved by the following means <1>, and preferably by <2> to <25>.

<1> A coloring composition comprising:

a colorant represented by the following General Formula (1); and a curable compound, wherein the coloring composition has a specific absorbance represented by the following formula ($A_\lambda$) of 5 or more at a maximum absorption wavelength of 400 nm to 800 nm:

$$(\text{D-R}^2)_n\text{—R}^1\text{-}(\text{L}^1\text{-P})_m \quad (1)$$

(in General Formula (1), $R^1$ represents an (m+n)-valent linking group,

P represents a monovalent substituent having repeating units derived from a vinyl compound, D represents a colorant structure, $R^2$ and $L^1$ each independently represent a single bond or a divalent linking group, m represents an integer of 1 to 13, in the case where m is 1, P represents a monovalent substituent having 2 to 20 repeating units derived from a vinyl compound, in the case where m is 2 or more, a plurality of P's may be different from each other, and the average value of numbers of the repeating units derived from a vinyl compound of the plurality of P's is 2 to 20, n represents an integer of 2 to 14, in the case where n is 2 or more, a plurality of D's may be different from each other, and m+n represents an integer of 2 to 15), and $$E=A/(c \cdot l) \ldots (A_\lambda)$$

(in Formula ($A_\lambda$),

E represents the specific absorbance at a maximum absorption wavelength of 400 nm to 800 nm, A represents the absorbance at a maximum absorption wavelength of 400 nm to 800 nm, l represents the cell length in units of cm, and c represents the concentration in a unit of mg/ml of a colorant in the solution).

<2> The coloring composition as described in <1>, in which D in General Formula (1) is derived from a colorant selected from a triarylmethane colorant, a xanthene colorant, an anthraquinone colorant, a cyanine colorant, a squarylium colorant, a quinophthalone colorant, a phthalocyanine colorant, a subphthalocyanine colorant, an azo colorant, and a dipyrromethene colorant.

<3> The coloring composition as described in <1> or <2>, in which D in General Formula (1) is derived from a colorant selected from a triarylmethane colorant and a xanthene colorant.

<4> The coloring composition as described in any one of <1> to <3>, in which P in General Formula (1) contains repeating units derived from a vinyl compound having an acid group in an amount of 30% by mole or more with respect to all the repeating units of P.

<5> The coloring composition as described in any one of <1> to <4>, in which the colorant contains a group having an ethylenically unsaturated bond.

<6> The coloring composition as described in any one of <1> to <5>, in which the colorant represented by General Formula (1) is a colorant represented by the following General Formula (2):

$$(\text{D-R}^4\text{—(S)}_p)_n\text{—R}^3\text{—(S-L}^2\text{-P)}_m \quad (2)$$

(in General Formula (2), $R^3$ represents an (m+n)-valent linking group,

P represents a monovalent substituent having repeating units derived from a vinyl compound, D represents a colorant structure, $R^4$ and $L^2$ each independently represent a single bond or a divalent linking group, S represents a sulfur atom, m represents an integer of 1 to 13, in the case where m is 1, P represents a monovalent substituent having 2 to 20 repeating units derived from a vinyl compound, in the case where m is 2 or more, a plurality of P's may be different from each other, and the average value of numbers of the repeating units derived from the vinyl compounds of the plurality of P's is 2 to 20, n represents an integer of 2 to 14, in the case where n is 2 or more, a plurality of D's may be different from each other, m+n represents an integer of 2 to 15, and p represents 0 or 1).

<7> The coloring composition as described in any one of <1> to <6>, in which the colorant represented by General Formula (1) is obtained by subjecting a vinyl compound to a radical polymerization reaction in the presence of a compound represented by the following General Formula (3):

$$(\text{D-R}^4\text{—(S)}_p)_n\text{—R}^3\text{—(SH)}_m \quad (3)$$

(in General Formula (3), $R^3$ represents an (m+n)-valent linking group,

D represents a colorant structure, $R^4$ represents a single bond or a divalent linking group, S represents a sulfur atom, SH represents a thiol group, m represents an integer of 1 to 13, n represents an integer of 2 to 14, in the case where n is 2 or more, a plurality of D's may be different from each other, m+n represents an integer of 2 to 15, and p represents 0 or 1).

<8> The coloring composition as described in any one of <1> to <7>, in which D of General Formula (1) has a cation moiety and a counter anion or has a cation moiety and an anion moiety within one molecule.

<9> The coloring composition as described in <8>, in which the counter anion is at least one selected from a sulfonic acid anion, a sulfonylimide anion, a bis(alkylsulfonyl)imide anion, a tris(alkylsulfonyl)methide anion, a carboxylic acid anion, a tetraarylborate anion, $BF_4^-$, $PF_6^-$, and $SbF_6^-$.

<10> The coloring composition as described in any one of <1> to <9>, in which the weight-average molecular weight of the colorant represented by General Formula (1) is 2,000 to 12,500.

<11> The coloring composition as described in any one of <1> to <10>, further comprising a pigment other than the colorant represented by General Formula (1).

<12> The coloring composition as described in any one of <1> to <11>, further comprising a photopolymerization initiator.

<13> The coloring composition as described in any one of <1> to <12>, for formation of a colored layer of a color filter.

<14> A cured film obtained by curing the coloring composition as described in any one of <1> to <13>.

<15> A color filter formed by using the coloring composition as described in any one of <1> to <13>.

<16> A method for manufacturing a color filter, comprising:

a step of applying the coloring composition as described in any one of <1> to <13> onto a support to form a coloring composition layer;

a step of patternwise exposing the coloring composition layer; and a step of removing an unexposed area by development to form a colored pattern.

<17> A method for manufacturing a color filter, comprising:

a step of applying the coloring composition as described in any one of <1> to <13> onto a support to form a coloring composition layer, followed by curing to form a colored layer;

a step of forming a photoresist layer on the colored layer;

a step of patterning the photoresist layer by carrying out exposure and development to obtain a resist pattern; and a step of dry-etching the colored layer using the resist pattern as an etching mask to form a colored pattern.

<18> A solid-state imaging device comprising the color filter as described in <15> or a color filter obtained by the method for manufacturing a color filter as described in <16> or <17>.

<19> An image display device comprising the color filter as described in <15> or a color filter obtained by the method for manufacturing a color filter as described in <16> or <17>.

<20> An organic electroluminescent element comprising the color filter as described in <15> or a color filter obtained by the method for manufacturing a color filter as described in <16> or <17>.

<21> A colorant represented by the following General Formula (1), which has a specific absorbance represented by the following formula ($A_\lambda$) of 5 or more at a maximum absorption wavelength of 400 nm to 800 nm:

$$(D\text{-}R^2)_n\text{—}R^1\text{-}(L^1\text{-}P)_m \quad (1)$$

(in General Formula (1), $R^1$ represents an (m+n)-valent linking group,

P represents a monovalent substituent having repeating units derived from a vinyl compound, D represents a colorant structure, $R^2$ and $L^1$ each independently represent a single bond or a divalent linking group, m represents an integer of 1 to 13, in the case where m is 1, P represents a monovalent substituent having 2 to 20 repeating units derived from a vinyl compound, in the case where m is 2 or more, a plurality of P's may be different from each other, and the average value of numbers of the repeating units derived from the vinyl compounds of the plurality of P's is 2 to 20, n represents an integer of 2 to 14, in the case where n is 2 or more, a plurality of D's may be different from each other, and m+n represents an integer of 2 to 15), and $$E=A/(c+l) \ldots (A_\lambda)$$

(in Formula ($A_\lambda$),

E represents the specific absorbance at a maximum absorption wavelength of 400 nm to 800 nm, A represents the absorbance at a maximum absorption wavelength of 400 nm to 800 nm, l represents the cell length in a unit of cm, and c represents the concentration in a unit of mg/ml of a colorant in the solution).

<22> The colorant as described in <21>, in which D in General Formula (1) is derived from a colorant selected from a triarylmethane colorant, a xanthene colorant, an anthraquinone colorant, a cyanine colorant, a squarylium colorant, a quinophthalone colorant, a phthalocyanine colorant, a subphthalocyanine colorant, an azo colorant, and a dipyrromethene colorant.

<23> The colorant as described in <21> or <22>, in which D in General Formula (1) is derived from a colorant selected from a triarylmethane colorant and a xanthene colorant.

<24> The colorant as described in any one of <21> to <23>, in which P in General Formula (1) contains repeating units derived from a vinyl compound having an acid group in the amount of 30% by mole or more with respect to all the repeating units of P.

<25> The colorant as described in any one of <21> to <24>, in which the colorant contains a group having an ethylenically unsaturated bond.

<26> A method for producing a colorant, comprising subjecting a vinyl compound to a radical polymerization reaction in the presence of a compound represented by the following General Formula (3) to produce the colorant as described in any one of <21> to <25>:

$$(D\text{-}R^4\text{—}(S)_p)_n\text{—}R^3\text{—}(SH)_m \quad (3)$$

(in General Formula (3), $R^3$ represents an (m+n)-valent linking group,

D represents a colorant structure, $R^4$ represents a single bond or a divalent linking group, S represents a sulfur atom, SH represents a thiol group, m represents an integer of 1 to 13, n represents an integer of 2 to 14, in the case where n is 2 or more, a plurality of D's may be different from each other, m+n represents an integer of 2 to 15, and p represents 0 or 1).

According to the present invention, it is possible to provide a coloring composition and a colorant, each having excellent light fastness, color migration properties, and flatness. It is also possible to provide a cured film, a color filter, a method for manufacturing a color filter, a solid-state imaging device, an image display device, and an organic electroluminescent element, each using such a coloring composition.

DESCRIPTION OF THE PREFERRED EMBODIMENTS

The present invention will be described in detail.

In citations for a group (atomic group) in the present specification, when the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

Furthermore, "active light" or "radiation" in the present specification means, for example, bright line spectrum of a mercury lamp, far ultraviolet rays represented by an excimer laser, extreme ultraviolet rays (EUV rays), X-rays, electron beams, or the like. In addition, in the present invention, light means actinic rays or radiation. "Exposure" in the present specification includes, unless otherwise specified, not only exposure by a mercury lamp, far ultraviolet rays represented by an excimer laser, X-rays, EUV rays, or the like, but also writing by particle rays such as electron beams and ion beams.

In the present specification, a numeral value range represented by "(a value) to (a value)" means a range including the numeral values represented before and after "to" as a lower limit value and an upper limit value, respectively.

In the present specification, the total solid content refers to a total mass of the components remaining when a solvent is excluded from the entire composition of a coloring composition.

Moreover, in the present specification, "(meth)acrylate" represents either or both of acrylate and methacrylate, "(meth)acryl" represents either or both of acryl and methacryl, and "(meth)acryloyl" represents either or both of acryloyl and methacryloyl.

In addition, in the present specification, a "monomer material" and a "monomer" have the same definition. The monomer in the present specification refers to a compound which is distinguished from an oligomer or a polymer and has a weight-average molecular weight of 2,000 or less. In the present specification, a polymerizable compound refers to a compound having a polymerizable functional group, and may be a monomer or a polymer. The polymerizable functional group refers to a group involved in a polymerization reaction.

In the present specification, Me represents a methyl group, Et represents an ethyl group, Pr represents a propyl group, Bu represents a butyl group, and Ph represents a phenyl group in formulae.

In the present specification, a term "step" includes not only an independent step, but also steps which are not clearly distinguished from other steps if an intended action of the steps is obtained.

In the present specification, the weight-average molecular weight and the number-average molecular weight are defined as a value in terms of polystyrene by GPC measurement. In the present specification, the weight-average molecular weight (Mw) and the number-average molecular weight (Mn) can be determined, for example, using HLC-8220 (manufactured by Tosoh Corporation) and TSKgel Super AWM-H (manufactured by Tosoh Corporation, 6.0 mm ID×15.0 cm) as a column, and a 10 mmol/L solution of lithium bromide in N-methylpyrrolidone (NMP) as an eluant.

<Coloring Composition>

The coloring composition of the present invention contains the colorant represented by General Formula (1) which will be described later, and a curable compound.

By adopting such a configuration, it is possible to provide a coloring composition having excellent light fastness, color migration properties, and flatness.

A reason for obtaining such an effect is still not clear, but it is presumed that the colorant represented by General Formula (1) which will be described later includes two or more colorant structures and a small deviation in molecular weights, and as a result, its light fastness and color migration properties are improved. In addition, it is thought that by incorporating a specific monovalent substituent having repeating units derived from a vinyl compound into the composition, the viscosity decreases and the flatness of the coating film is improved. Hereinafter, the present invention will be described in detail.

<<Colorant Represented by General Formula (1)>>

The composition of the present invention contains at least one kind of colorant represented by the following General Formula (1) (which may be hereinafter referred to as a simply "colorant (A)" in some cases). Further, the colorant (A) is also the colorant of the present invention.

The colorant (A) is an oligomer in the form of a dimer through a 14-mer having a colorant structure, and has a maximum absorption wavelength in a range of 400 nm to 800 nm. The colorant (A) functions as a coloring agent, for example, in the coloring composition of the present invention.

$$(D\text{-}R^2)_n\text{—}R^1\text{-}(L^1\text{-}P)_m \quad (1)$$

In General Formula (1), $R^1$ represents an (m+n)-valent linking group,

P represents a monovalent substituent having repeating units derived from a vinyl compound, D represents a colorant structure, $R^2$ and $L^1$ each independently represent a single bond or a divalent linking group, m represents an integer of 1 to 13, in the case where m is 1, P represents a monovalent substituent having 2 to 20 repeating units derived from a vinyl compound, in the case where m is 2 or more, a plurality of P's may be different from each other, and the average value of numbers of the repeating units derived from the vinyl compounds of the plurality of P's is 2 to 20, n represents an integer of 2 to 14, in the case where n is 2 or more, a plurality of D's may be the same as or different from each other, and m+n represents an integer of 2 to 15.

In General Formula (1), m represents an integer of 1 to 13. m is preferably 1 to 5, more preferably 1 to 4, and particularly preferably 1 to 3.

In General Formula (1), n represents an integer of 2 to 14. n is preferably 2 to 8, more preferably 2 to 7, and particularly preferably 3 to 6.

In General Formula (1), m+n represents an integer of 2 to 15.

In one colorant (A), m and n each represent an integer, and the coloring composition of the present invention may include a plurality of colorants (A) having different m's and n's. Accordingly, in the coloring composition of the present invention, the average value of m's and n's may not be an integer in some cases.

In General Formula (1), $R^1$ represents an (m+n)-valent linking group. m+n satisfies 2 to 15.

Examples of the (m+n)-valent linking group represented by $R^1$ include a group having 1 to 100 carbon atoms, 0 to 10 nitrogen atoms, 0 to 50 oxygen atoms, 1 to 200 hydrogen atoms, and 0 to 20 sulfur atoms, and the (m+n)-valent linking group may be unsubstituted or may further have a substituent.

Specific examples of the (m+n)-valent linking group represented by $R^1$ include a group (which may form a ring structure) including the following structure or a combination of the two or more structural units.

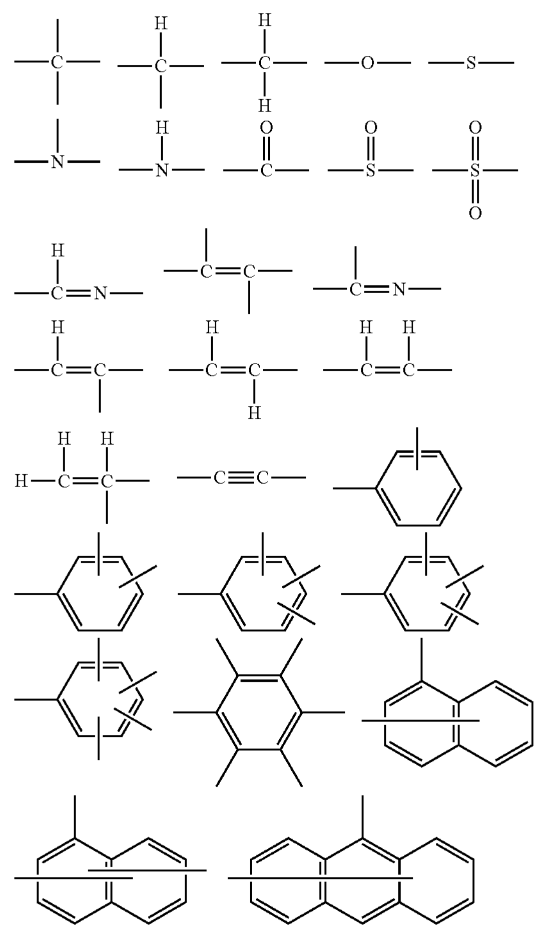

As the (m+n)-valent linking group represented by $R^1$, a group having 1 to 60 carbon atoms, 0 to 10 nitrogen atoms, 0 to 40 oxygen atoms, 1 to 120 hydrogen atoms, and 0 to 10 sulfur atoms is preferable; a group having 1 to 50 carbon atoms, 0 to 10 nitrogen atoms, 0 to 30 oxygen atoms, 1 to 100 hydrogen atoms, and 0 to 7 sulfur atoms is more preferable; and a group having 1 to 40 carbon atoms, 0 to 8 nitrogen atoms, 0 to 20 oxygen atoms, 1 to 80 hydrogen atoms, and 0 to 5 sulfur atoms is still more preferable.

The (m+n)-valent linking group represented by $R^1$ may further have a substituent. Examples of the substituent include an alkyl group having 1 to 20 carbon atoms, such as a methyl group and an ethyl group, an aryl group having 6 to 16 carbon atoms, such as a phenyl group and a naphthyl group, a hydroxyl group, an amino group, a carboxyl group, a sulfonamide group, an N-sulfonylamide group, an acyloxy group having 1 to 6 carbon atoms, such as an acetoxy group, an alkoxy group having 1 to 6 carbon atoms, such as a methoxy group and an ethoxy group, a halogen atom such as chlorine and bromine, an alkoxycarbonyl group having 2 to 7 carbon atoms, such as a methoxycarbonyl group, an ethoxycarbonyl group and a cyclohexyloxycarbonyl group, a cyano group, and a carbonic acid ester group such as a t-butyl carbonate.

Specific examples of the (m+n)-valent linking group represented by $R^1$ are shown below, but the present invention is not limited thereto.

(1)

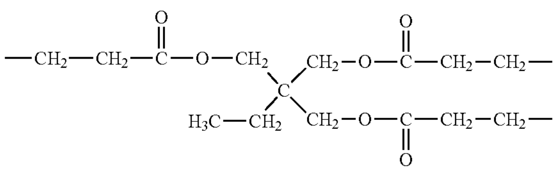

(2)

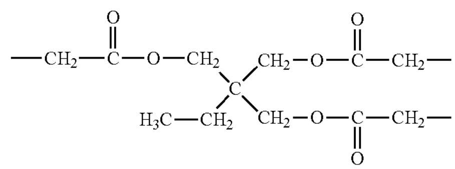

(3)

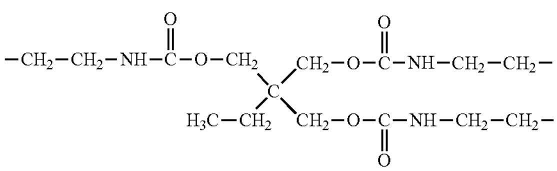

(4)

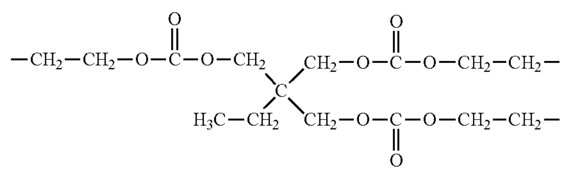

(5)

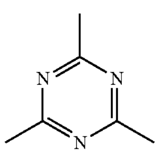

(6)

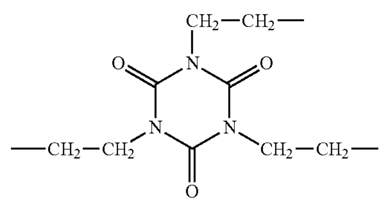

(7)

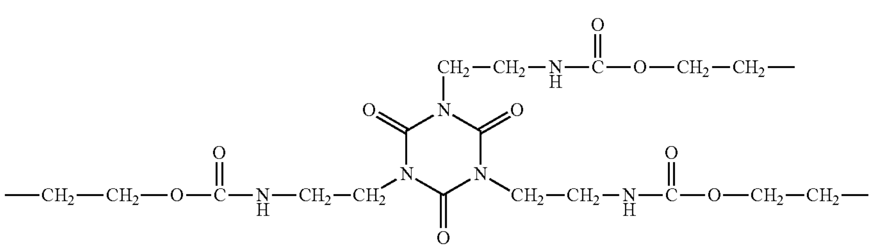

(8)

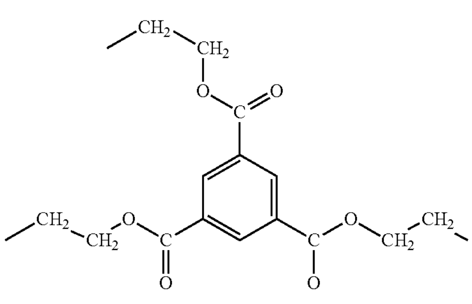

(9)

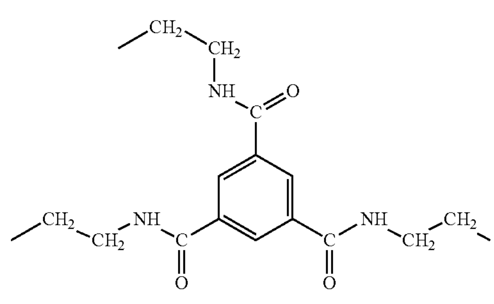

-continued
(10)
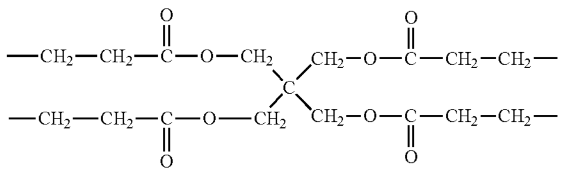
(11)
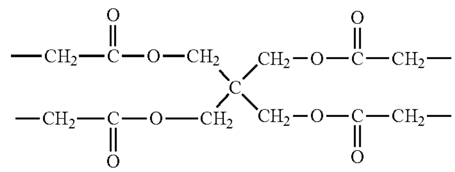
(12)
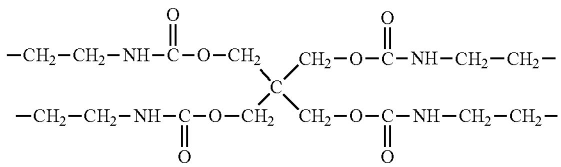
(13)
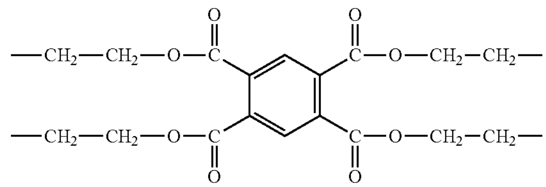
(14)
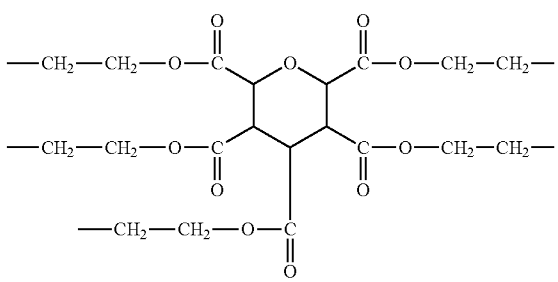
(15)
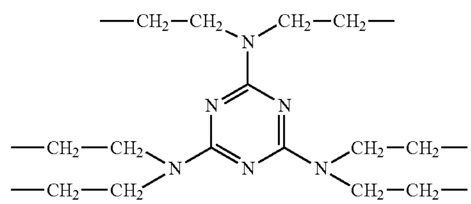
(16)
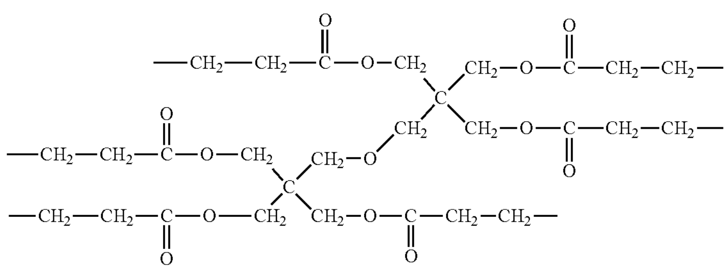
(17)
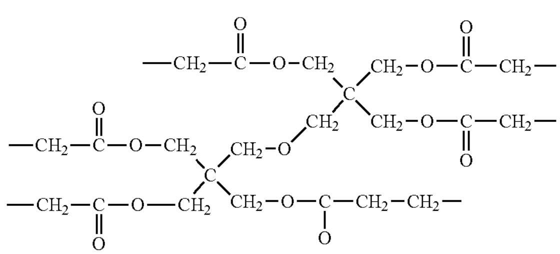
(18)
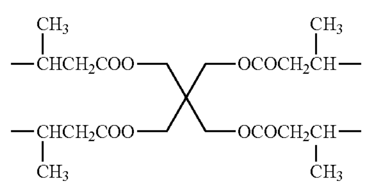
(19)
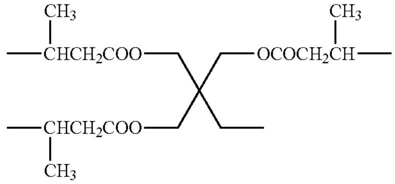
(20)
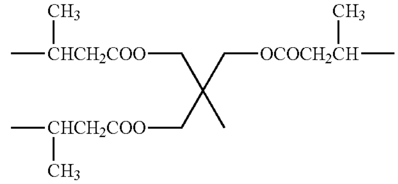

-continued
(21)
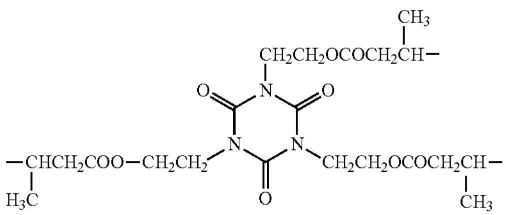
(22)
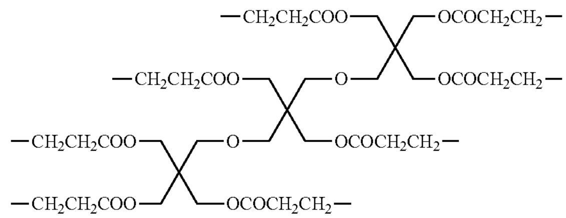
(23)
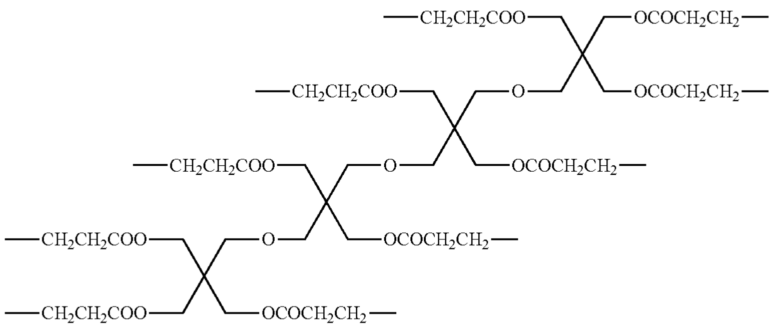
(24)
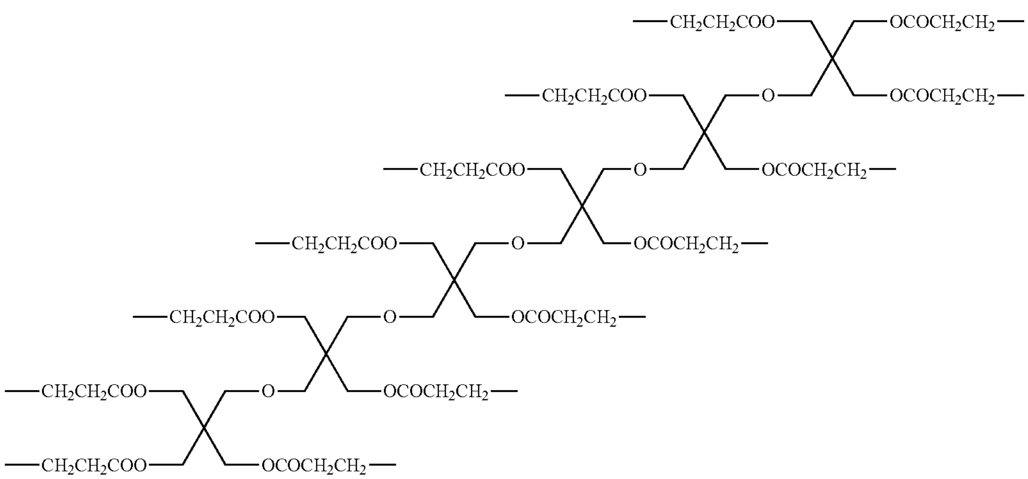
(25)
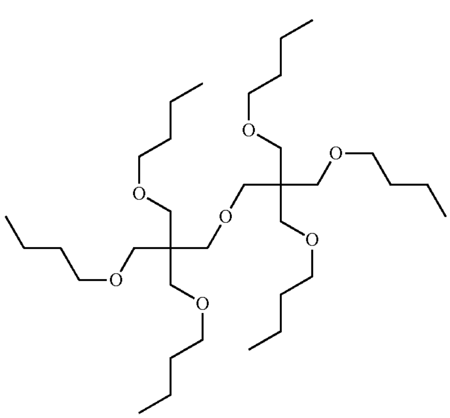
(26)
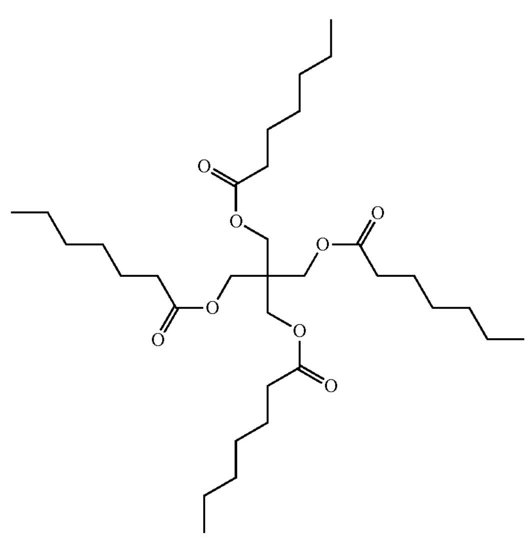

-continued
(27)
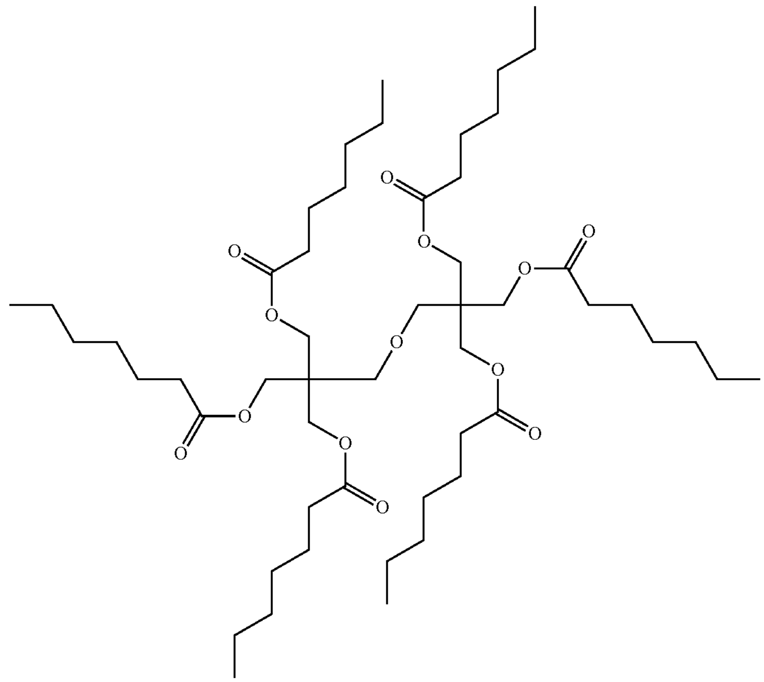
(28)
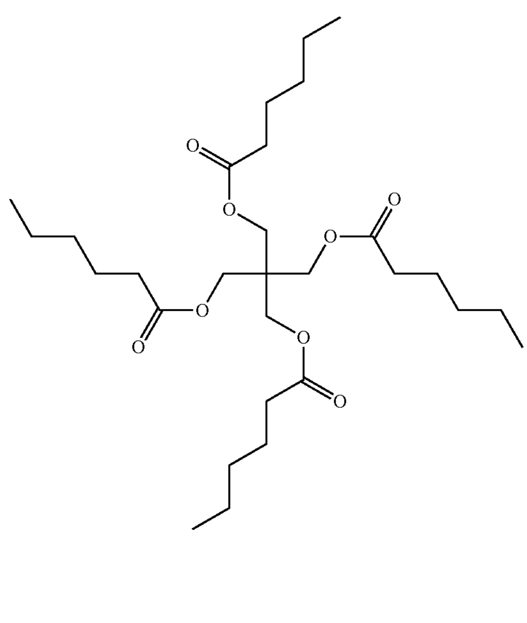

-continued
(29)
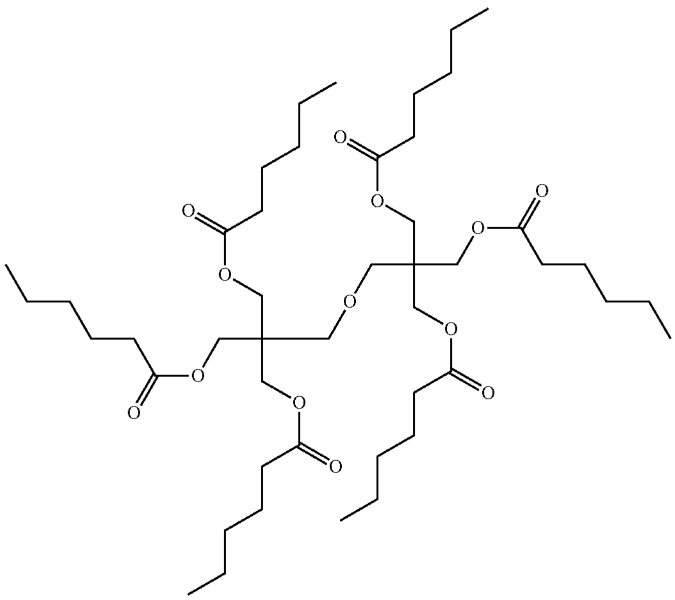
(30)
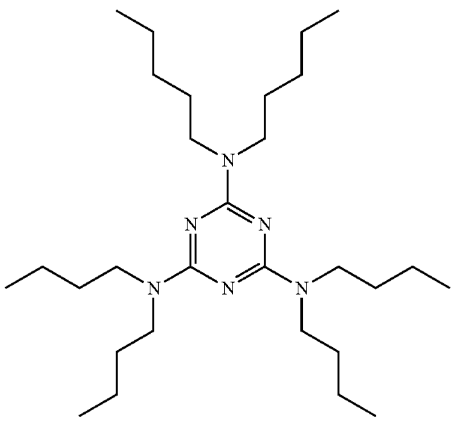
(31)
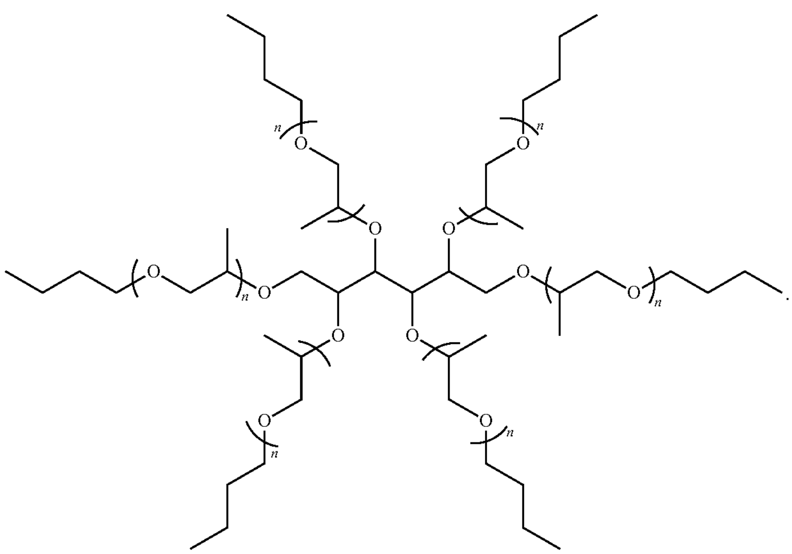

The (m+n)-valent linking group is preferably (1), (2), (10), (11), (16) to (21), and (26) to (29).

In General Formula (1), $R^2$ and $L^1$ each independently represent a single bond or a divalent linking group. In the case of a plurality of $R^2$'s and $L^1$'s are present, they may be the same as or different from each other.

Examples of the divalent linking group include a group including a group including 1 to 100 carbon atoms, 0 to 10 nitrogen atoms, 0 to 50 oxygen atoms, 1 to 200 hydrogen atoms, and 0 to 20 sulfur atoms, and the divalent linking group may be unsubstituted or may further have a substituent.

Specific examples of the divalent linking group include groups including the following structure or a combination of the two or more structural units.

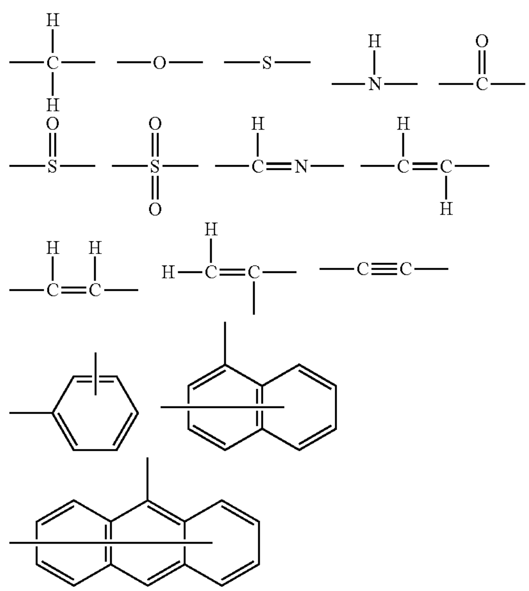

As $R^2$, a divalent linking group including a single bond, or 1 to 50 carbon atoms, 0 to 8 nitrogen atoms, 0 to 25 oxygen atoms, 1 to 100 hydrogen atoms, and 0 to 10 sulfur atoms is preferable; a divalent linking group including a single bond, or 1 to 30 carbon atoms, 0 to 6 nitrogen atoms, 0 to 15 oxygen atoms, 1 to 50 hydrogen atoms, and 0 to 7 sulfur atoms is more preferable; and a divalent linking group including a single bond, or 1 to 10 carbon atoms, 0 to 5 nitrogen atoms, 0 to 10 oxygen atoms, 1 to 30 hydrogen atoms, and 0 to 5 sulfur atoms is still more preferable.

The divalent linking group represented by $R^2$ may further have a substituent. Examples of the substituent include an alkyl group having 1 to 20 carbon atoms, such as a methyl group and an ethyl group, an aryl group having 6 to 16 carbon atoms, such as a phenyl group and a naphthyl group, a hydroxyl group, an amino group, a carboxyl group, a sulfonamide group, an N-sulfonylamide group, an acyloxy group having 1 to 6 carbon atoms, such as an acetoxy group, an alkoxy group having 1 to 6 carbon atoms, such as a methoxy group and an ethoxy group, a halogen atom such as chlorine and bromine, an alkoxycarbonyl group having 2 to 7 carbon atoms, such as a methoxycarbonyl group, an ethoxycarbonyl group and a cyclohexyloxycarbonyl group, a cyano group, and a carbonic acid ester group such as t-butyl carbonate.

In General Formula (1), P represents a monovalent substituent having repeating units derived from a vinyl compound. In the case where m is 2 or more, P's in the number of m may be the same as or different from each other.

In the case where m is 1, P represents a monovalent substituent having 2 to 20 (preferably 2 to 15, and more preferably 2 to 10) repeating units derived from a vinyl compound. Further, in the case where m is 2 or more, the average value of the numbers of the repeating units derived from a vinyl compound contained in P's in the number of m is 2 to 20 (preferably 2 to 15, and more preferably 2 to 10). According to the aspect, the flatness of the coating film is improved.

The number of the repeating units derived from a vinyl compound in the case where m is 1, and the average value of the numbers of the repeating units derived from a vinyl compound contained in P's in the number of m in the case where m is 2 can be determined by NMR. Specifically, for example, the number can be calculated by determining m from the peak surface area ratio of the (m+n)-valent linking group represented by $R^1$ to the colorant structure D, and then dividing the peak surface area ratio of the repeating units derived from a vinyl compound by m.

P is preferably at least one selected from the group consisting of a polymer or copolymer of vinyl compounds, an ester-based polymer, an ether-based polymer, a urethane-based polymer, an amide-based polymer, an epoxy-based polymer, a silicone-based polymer, or a modified product or copolymer thereof [includes, for example, a polyether/polyurethane copolymer, a copolymer of polyether/polymer of a vinyl compound, and the like (in which the copolymer may be any of a random copolymer, a block copolymer, and a graft copolymer)], more preferably at least one selected from the group consisting of a polymer or copolymer of vinyl compounds, an ester-based polymer, an ether-based polymer, a urethane-based polymer, or a modified product or copolymer thereof, and particularly preferably a polymer or copolymer of vinyl compounds.

The vinyl compound is not particularly limited, but is preferably, for example, (meth)acrylic acid esters, crotonic acid esters, vinyl esters, maleic acid diesters, fumaric acid diesters, itaconic acid diesters, (meth)acrylamides, styrenes, vinyl ethers, vinyl ketones, olefins, maleimides, (meth) acrylonitrile, a vinyl compound having an acid group, or the like.

Examples of the (meth)acrylic acid esters include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, amyl (meth) acrylate, n-hexyl (meth)acrylate, cyclohexyl (meth)acrylate, t-butylcyclohexyl (meth)acrylate, 2-ethylhexyl (meth)acrylate, t-octyl (meth)acrylate, dodecyl (meth)acrylate, octadecyl (meth)acrylate, acetoxyethyl (meth)acrylate, phenyl (meth)acrylate, 2-hydroxyethyl (meth)acrylate, 2-hydroxypropyl (meth)acrylate, 3-hydroxypropyl (meth)acrylate, 4-hydroxybutyl (meth)acrylate, 2-methoxyethyl (meth)acrylate, 2-ethoxyethyl (meth)acrylate, 2-(2-methoxyethoxy) ethyl (meth)acrylate, 3-phenoxy-2-hydroxypropyl (meth) acrylate, 2-chloroethyl (meth)acrylate, glycidyl (meth) acrylate, 3,4-epoxycyclohexylmethyl (meth)acrylate, vinyl (meth)acrylate, 2-phenylvinyl (meth)acrylate, 1-propenyl (meth)acrylate, allyl (meth)acrylate, 2-allyloxyethyl (meth) acrylate, propargyl (meth)acrylate, benzyl (meth)acrylate, diethylene glycol monomethyl ether (meth)acrylate, diethylene glycol monoethyl ether (meth)acrylate, triethylene glycol monomethyl ether (meth)acrylate, triethylene glycol monoethyl ether (meth)acrylate, polyethylene glycol monomethyl ether (meth)acrylate, polyethylene glycol monoethyl ether (meth)acrylate, β-phenoxyethoxyethyl (meth)acrylate, nonylphenoxypolyethylene glycol (meth) acrylate, dicyclopentenyl (meth)acrylate, dicyclopentenyloxyethyl (meth)acrylate, trifluoroethyl (meth)acrylate, octafluoropentyl (meth)acrylate, perfluorooctyl ethyl (meth) acrylate, dicyclopentanyl (meth)acrylate, tribromophenyl (meth)acrylate, tribromophenyloxyethyl (meth)acrylate, and γ-butyrolactone (meth)acrylate.

Examples of the crotonic acid esters include butyl crotonate and hexyl crotonate.

Examples of the vinyl esters include vinyl acetate, vinyl chloroacetate, vinyl propionate, vinyl butyrate, vinyl methoxyacetate, and vinyl benzoate.

Examples of the maleic acid diesters include dimethyl maleate, diethyl maleate, and dibutyl maleate.

Examples of the fumaric acid diesters include dimethyl fumarate, diethyl fumarate, and dibutyl fumarate.

Examples of the itaconic acid diesters include dimethyl itaconate, diethyl itaconate, and dibutyl itaconate.

Examples of the (meth)acrylamides include (meth)acrylamide, N-methyl (meth)acrylamide, N-ethyl (meth)acrylamide, N-propyl (meth)acrylamide, N-isopropyl (meth)acryl amide, N-n-butylacryl(meth)amide, N-t-butyl (meth)acryl amide, N-cyclohexyl (meth)acrylamide, N-(2-methoxyethyl)(meth)acrylamide, N,N-dimethyl (meth)acrylamide, N,N-diethyl (meth)acrylamide, N-phenyl (meth)acrylamide, N-nitrophenylacrylamide, N-ethyl-N-phenylacrylamide, N-benzyl (meth)acrylamide, (meth)acryloylmorpholine, diacetoneacrylamide, N-methylol acrylamide, N-hydroxyethylacrylamide, vinyl (meth)acryl amide, N,N-diallyl (meth)acrylamide, and N-allyl (meth)acryl amide.

Examples of the styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected by a group deprotectable with an acidic substance (for example, a tert-butoxycarbonyl group), methyl vinyl benzoate, and α-methylstyrene.

Examples of the vinyl ethers include methylvinyl ether, ethylvinyl ether, 2-chloroethylvinyl ether, hydroxyethylvinyl ether, propylvinyl ether, butylvinyl ether, hexylvinyl ether, octylvinyl ether, methoxyethylvinyl ether, and phenylvinyl ether.

Examples of the vinyl ketones include methylvinyl ketone, ethylvinyl ketone, propylvinyl ketone, and phenylvinyl ketone.

Examples of the olefins include ethylene, propylene, isobutylene, butadiene, and isoprene.

Examples of the maleimides include maleimide, butylmaleimide, cyclohexylmaleimide, and phenylmaleimide.

As the (meth)acrylonitrile, a heterocyclic group having a vinyl group substituted therein (for example, vinyl pyridine, N-vinyl pyrrolidone, and vinyl carbazole), N-vinyl formamide, N-vinyl acetamide, N-vinyl imidazole, vinyl caprolactone, or the like can also be used.

In addition to the compounds above, for example, a vinyl compound having a functional group such as a urethane group, a urea group, a sulfonamide group, a phenol group, and an imido group can be used. Such compounds having a urethane group or a urea group can be appropriately synthesized by using, for example, an addition reaction of an isocyanate group with hydroxyl or amino, specifically, for example, an addition reaction of an isocyanate group-containing monomer with a compound having a single hydroxyl, or with a compound containing a single primary or secondary amino, or an addition reaction of a hydroxyl-containing monomer or a primary or secondary amino-containing monomer with monoisocyanate.

Examples of the vinyl compound having an acid group include a vinyl compound having a carboxyl group, a vinyl compound having a sulfonic acid group, and a vinyl compound having a phosphoric acid group.

Examples of the vinyl compound having a carboxyl group include (meth)acrylic acid, vinyl benzoic acid, maleic acid, monoalkyl maleate ester, fumaric acid, itaconic acid, crotonic acid, cinnamic acid, an acrylic acid dimer, and the like. In addition, an addition reaction products of a monomer having a hydroxyl group, such as 2-hydroxyethyl (meth) acrylate, like with a cyclic acid anhydride such as maleic acid anhydride, phthalic acid anhydride, and cyclohexane dicarboxylic acid anhydride; ω-carboxy-polycaprolactone mono(meth)acrylate; or the like may also be used. As a precursor of a carboxyl group, an anhydride-containing monomer such as maleic acid anhydride, itaconic acid anhydride, and citraconic acid anhydride is used. Among these, a (meth)acrylic acid is particularly preferable from the viewpoints of copolymerization property, cost, solubility, and the like.

Examples of the vinyl compound having a sulfonic acid group include 2-acrylamide-2-methylpropanesulfonic acid.

Examples of the vinyl compound having a phosphoric acid group include mono(2-acryloyloxyethyl ester)phosphate and mono(1-methyl-2-acryloyloxyethyl ester)phosphate.

Furthermore, as the vinyl compound having an acid group, a vinyl compound having a phenolic hydroxyl group or a vinyl compound having a sulfonamide group can be used.

In the present invention, it is preferable that P contains repeating units derived from a vinyl compound having an acid group, it is more preferable that P contains the repeating units in the amount of 30% by mole or more with respect to all the repeating units of P, and it is still more preferable that P contains the repeating units in the amount of 30 to 90% by mole with respect to all the repeating units of P. By incorporating the repeating units derived from a vinyl compound having an acid group into P, generation of development residues can be further reduced.

As the acid group, a carboxyl group, a sulfo group, or a phosphoric acid group is preferable, and a carboxyl group is more preferable.

In the present invention, it is preferable that P contains repeating units derived from a vinyl compound having a polymerizable group, it is more preferable that P contains the repeating units in the amount of 10% by mole or more with respect to all the repeating units of P, and it is further more preferable that P contains the repeating units in the amount of 10 to 80% by mole. By incorporating the repeating units derived from a vinyl compound having a polymerizable group into P, color migration properties can be improved.

As the polymerizable group, known polymerizable groups that can be crosslinked by a radical, an acid, or heat can be used, and examples thereof include a group having an ethylenically unsaturated bond, a cyclic ether group (an epoxy group and a oxetane group), and a methylol group. The group having an ethylenically unsaturated bond is preferable, a (meth)acryloyl group is more preferable, and (meth)acryloyl group derived from glycidyl (meth)acrylate and 3,4-epoxy-cyclohexyl methyl (meth)acrylate are particularly preferable.

In General Formula (I), D represents a colorant structure. As the colorant structure, a colorant structure having a cation moiety and a counter anion, or a colorant structure having a cation moiety and an anion within one molecule is preferable. Further, the counter anion refers to an anion existing outside the molecule of a colorant structure, and is an anion capable of forming a salt with a cation moiety of the colorant structure. For example, it refers to a case where a cation and an anion are not bonded to each other via a covalent bond, and exists as a separate compound. Further, having a cation moiety and an anion moiety within one molecule means a case where a cation and an anion are bonded to each other via a covalent bond.

<<<Colorant Structure D>>>

The colorant structure D in the colorant (A) is not particularly limited, and various colorant structures including known colorant structures can be applied.

Specific colorant compounds which can form colorant structures are described in "A Dye Handbook, new edition" (The Society of Synthetic Organic Chemistry, Japan; Maruzen Company, Limited, 1970), "Color Index" (The Society of Dyers and Colourists), "A Pigment Handbook (Okawara et al.; Kodansha Ltd., 1986) and the like.

Examples of the colorant structure that is also used in the present invention include colorant structures selected from a quinone colorant (a benzoquinone colorant, a naphthoquinone colorant, an anthraquinone colorant, an anthrapyridone colorant, and the like), a carbonium colorant (a diarylmethane colorant, a triarylmethane colorant, a xanthene colorant, an acridine colorant, and the like), a quinonimine colorant (an oxazine colorant, a thiazin colorant, and the like), an azine colorant, a polymethine colorant (an oxonol colorant, a merocyanine colorant, an arylidene colorant, a styryl colorant, a cyanine colorant, a squarylium colorant, a croconium colorant, and the like), a quinophthalone colorant, a phthalocyanine colorant, a subphthalocyanine colorant, a perinone colorant, an indigo colorant, a thioindigo colorant, a quinoline colorant, a nitro colorant, a nitroso colorant, a dipyrromethene colorant, an azo colorant, and metal complex colorants thereof.

Among these colorant structures, from the viewpoint of color separation properties and light fastness, colorant structures selected from a triarylmethane colorant, a xanthene colorant, an anthraquinone colorant, a cyanine colorant, a squarylium colorant, a quinophthalone colorant, a phthalocyanine colorant, a subphthalocyanine colorant, an azo colorant, and a dipyrromethene colorant are preferable; colorant structures selected from a triarylmethane colorant, a xanthene colorant, an anthraquinone colorant, a squarylium colorant, a quinophthalone colorant, a phthalocyanine colorant, a subphthalocyanine colorant, and an azo colorant are more preferable; and colorant structures selected from a triarylmethane colorant and a xanthene colorant are still more preferable.

Hereinafter, the colorant structures that are preferably used in the present invention will be specifically described.

<<<<Triarylmethane Colorant>>>>

One of aspects of the colorant structures used in the present invention is a colorant structure having a partial structure derived from a triarylmethane colorant (a triarylmethane compound). The triarylmethane colorant has a partial structure derived from a compound represented by the following General Formula (TP). The triarylmethane compound collectively refers to compounds having a colorant moiety containing a triarylmethane skeleton within a molecule.

Formula (TP)

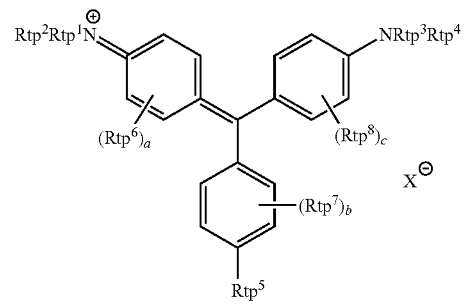

In Formula (TP), $Rtp^1$ to $Rtp^4$ each independently represent a hydrogen atom, an alkyl group, or an aryl group. $Rtp^5$ represents a hydrogen atom, an alkyl group, an aryl group, or $NRtp^9Rtp^{10}$ (in which $Rtp^9$ and $Rtp^{10}$ represent a hydrogen atom, an alkyl group, or an aryl group). $Rtp^6$, $Rtp^7$, and $Rtp^8$ represent substituents. a, b, and c represent an integer of 0 to 4. In the case where a, b, and c are 2 or more, $Rtp^6$, $Rtp^7$, and $Rtp^8$ may be linked to each other to form a ring. $X^-$ represents an anion structure. In the case where $X^-$ is not present, at least one of $Rtp^1$, or $Rtp^7$ includes an anion.

$Rtp^1$ to $Rtp^6$ are preferably a hydrogen atom, a linear or branched alkyl group having 1 to 5 carbon atoms, or a phenyl group. $Rtp^5$ is preferably a hydrogen atom or $NRtp^9Rtp^{10}$, and particularly preferably $NRtp^9Rtp^{10}$. $Rtp^9$ and $Rtp^{10}$ are preferably a hydrogen atom, a linear or branched alkyl group having 1 to 5 carbon atoms, or a phenyl group. As the substituents represented by $Rtp^6$, $Rtp^7$, and $Rtp^8$, the substituents exemplified in the section of the substituent group A which will be described later can be used. In particular, a linear or branched alkyl group having 1 to 5 carbon atoms, an alkenyl group having 1 to 5 carbon atoms, an aryl group having 6 to 15 carbon atoms, a carboxyl group, or a sulfo group is preferable, and a linear or branched alkyl group having 1 to 5 carbon atoms, an alkenyl group having 1 to 5 carbon atoms, a phenyl group, or a carboxyl group is more preferable. $Rtp^6$ and $Rtp^8$ are particularly preferably an alkyl group having 1 to 5 carbon atoms, and $Rtp^7$ is preferably an alkenyl group (particularly preferably a phenyl group formed by linking two adjacent alkenyl groups to each other), a phenyl group, or a carboxyl group.

a, b, and c each independently represent an integer of 0 to 4. In particular, a and b are preferably 0 to 1, and c is preferably 0 to 2.

In the compound represented by Formula (TP), it is preferable that any one moiety of $Rtp^1$ to $Rtp^{10}$ is bonded to $R^2$ in General Formula (1).

Specific examples of the compound represented by Formula (TP) are shown below, but the present invention is not limited thereto. In the following specific examples, $X^-$ represents an anion. Further, any one hydrogen atom of the colorant structures is bonded to $R^2$ in General Formula (1).

(tp-1)
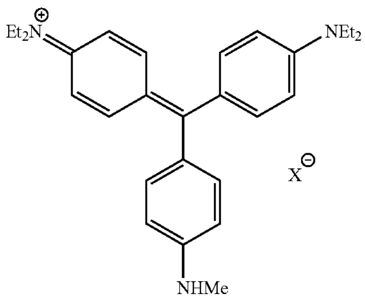
(tp-2)
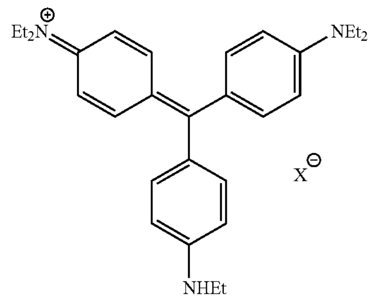
(tp-3)
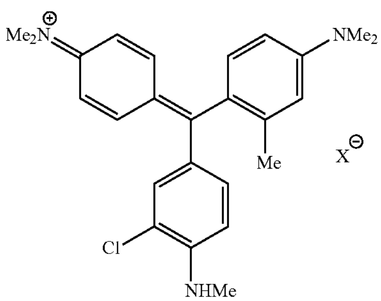
(tp-4)
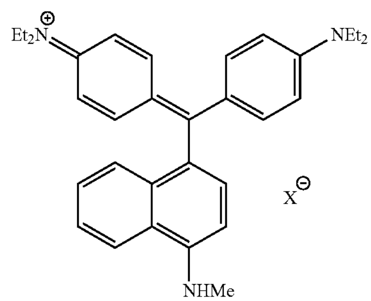
(tp-5)
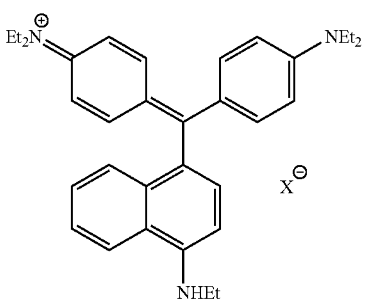
(tp-6)
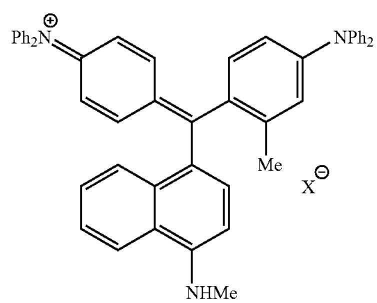
(tp-7)
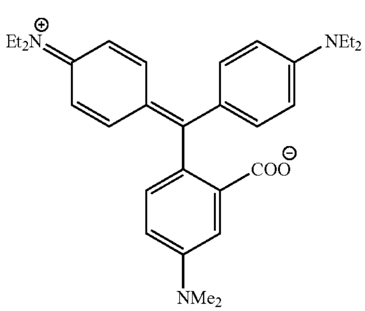
(tp-8)
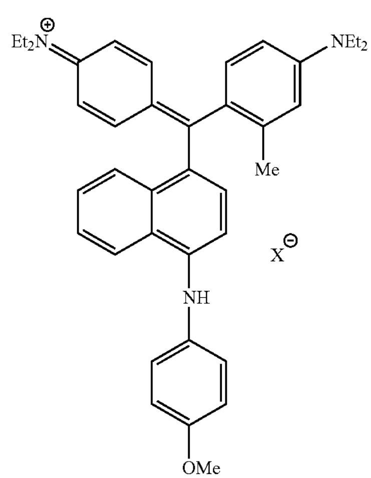

-continued
(tp-9)
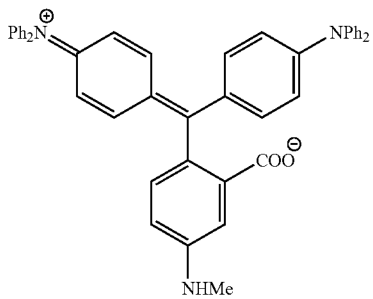
(tp-10)
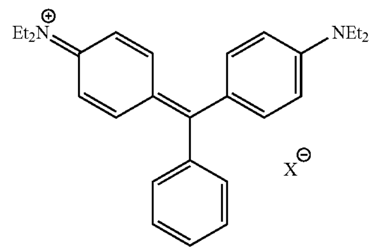
(tp-11)
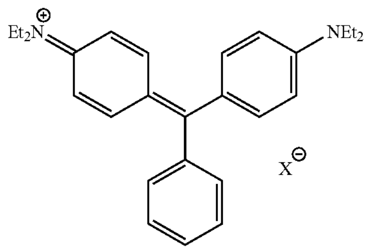
(tp-12)
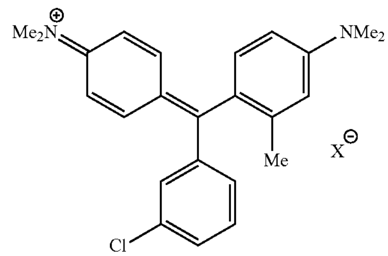
(tp-13)
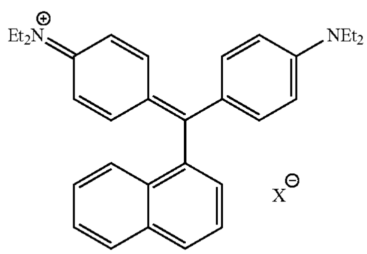
(tp-14)
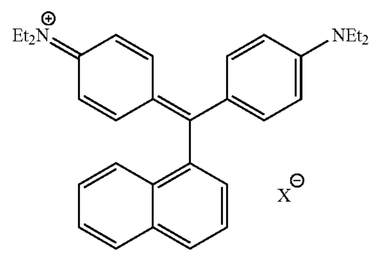
(tp-15)
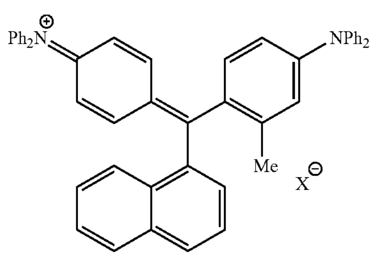
(tp-16)
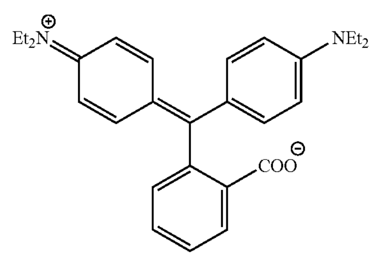
(tp-17)
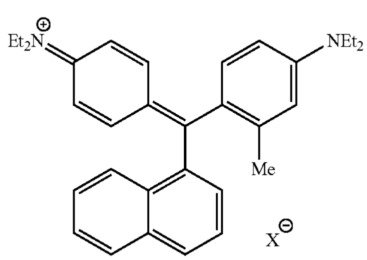
(tp-18)
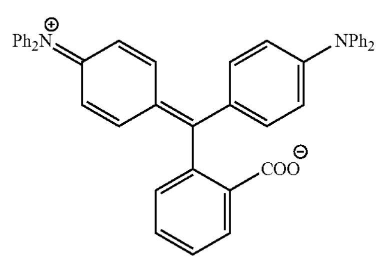

-continued
(A-tp-1)
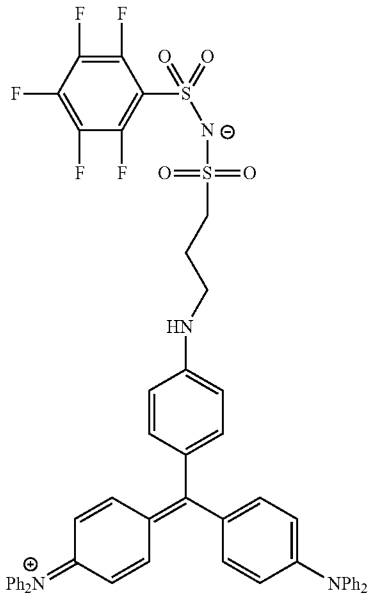
(A-tp-2)
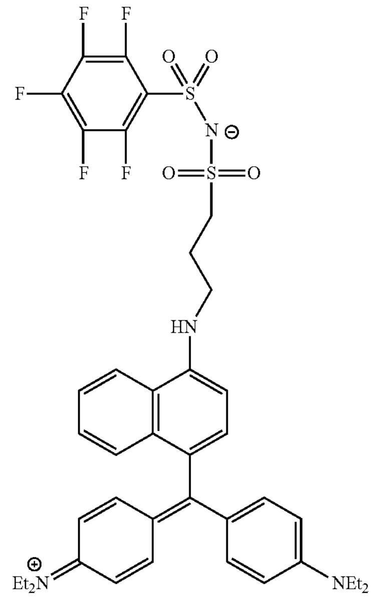
(A-tp-3)
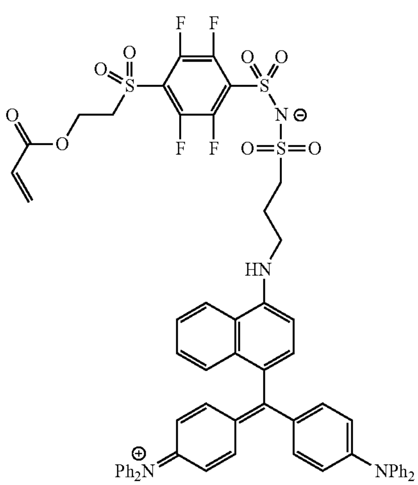
(A-tp-4)
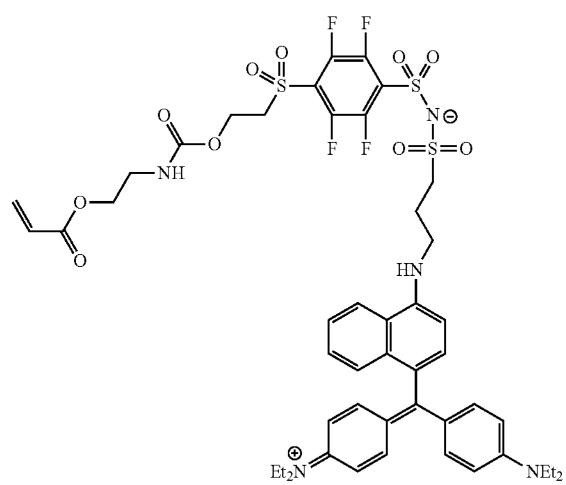

-continued
(A-tp-5)
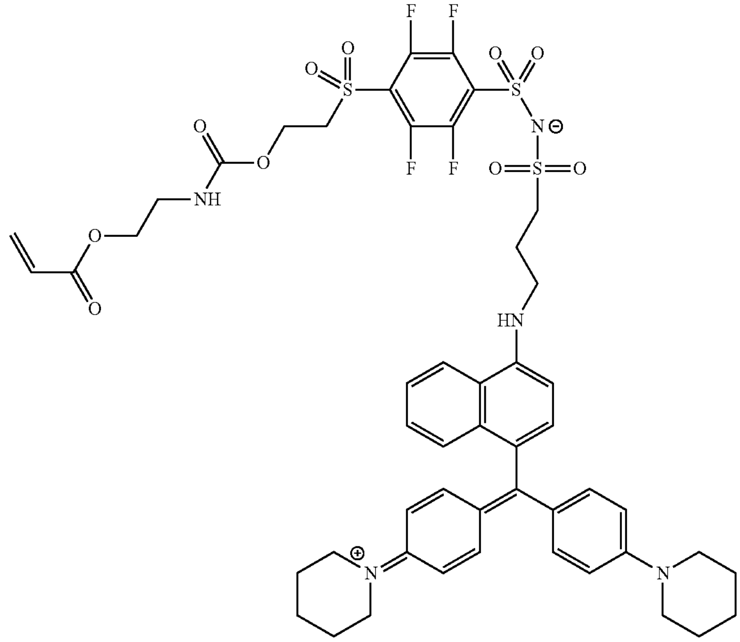
(A-tp-6)
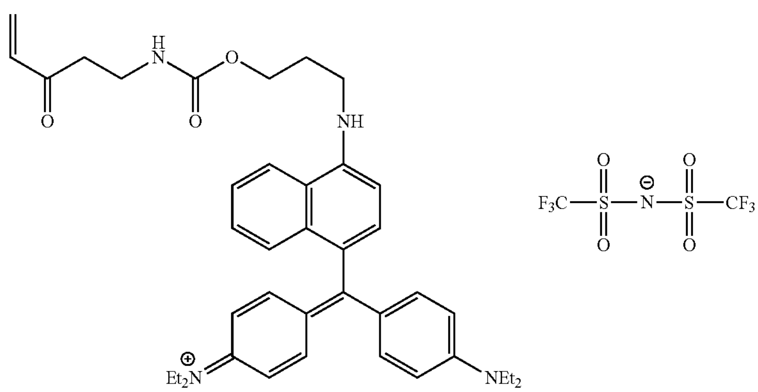
(A-tp-7)
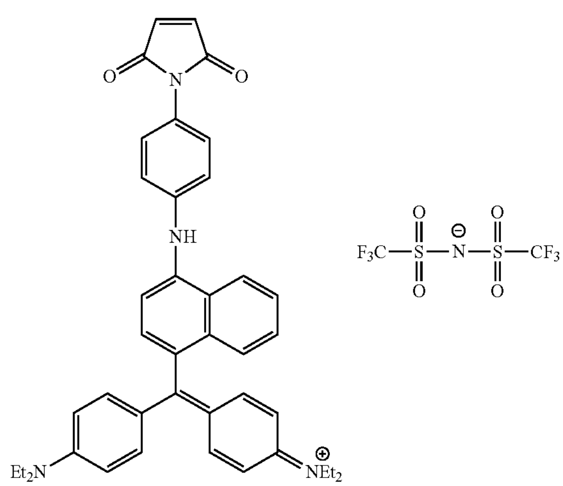
(A-tp-8)
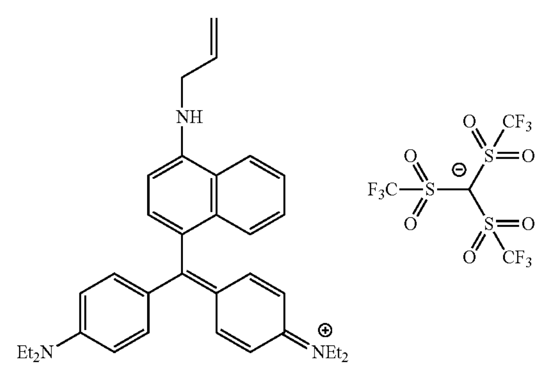

-continued
(A-tp-9)
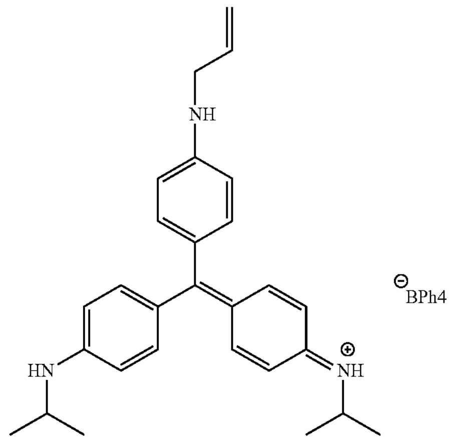
(A-tp-10)
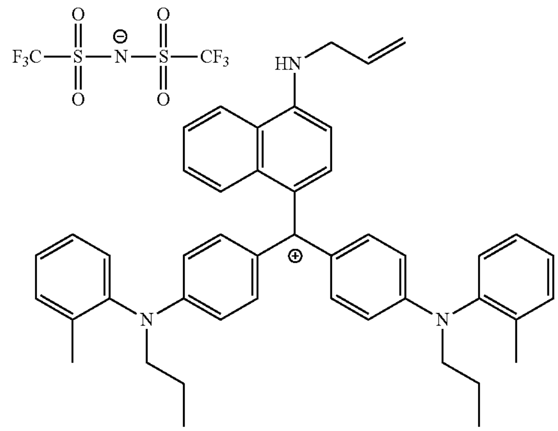
(A-tp-11)
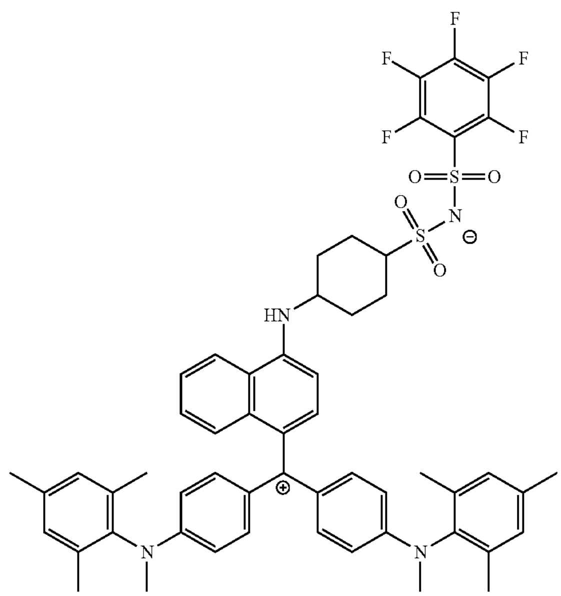
(A-tp-12)
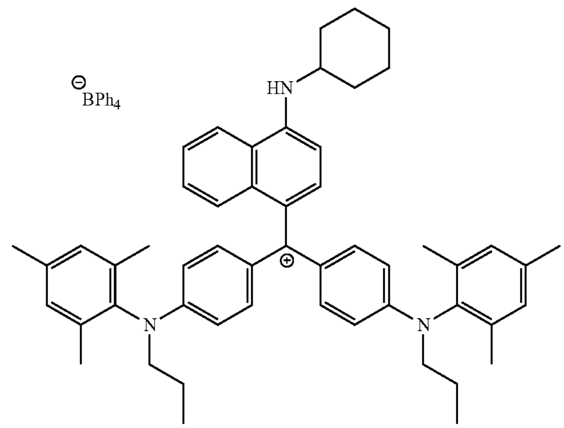
(A-tp-13)
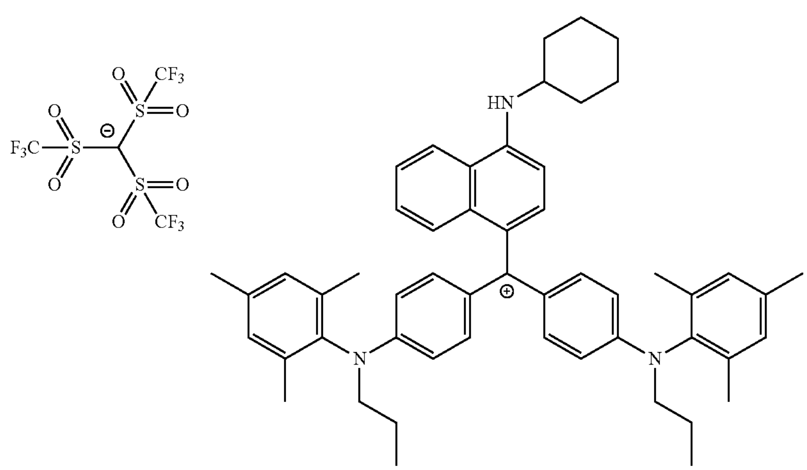

-continued (A-tp-14)

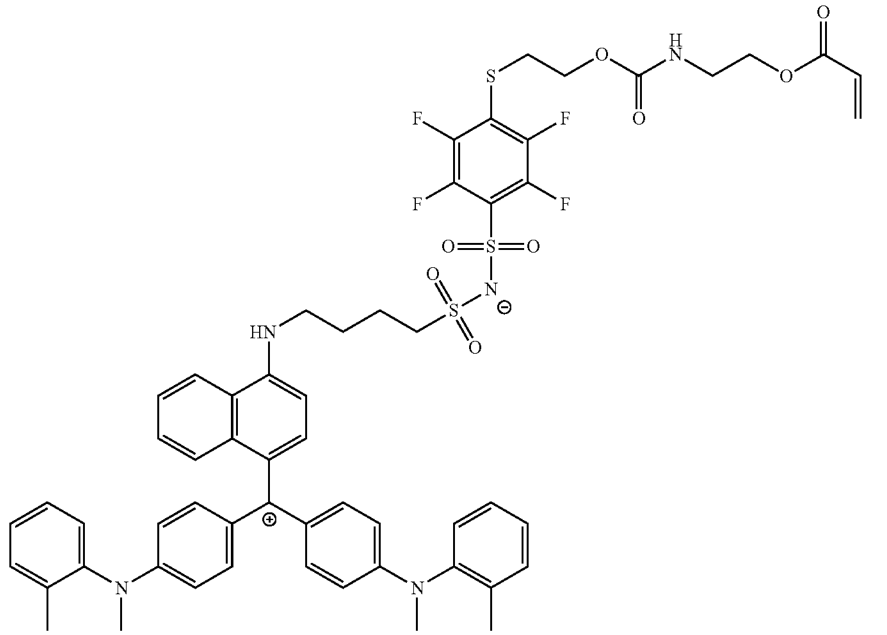

<<<<Xanthene Colorant>>>>

A preferred aspect of the colorant structure of the present invention is one having a partial structure derived from a xanthene colorant (a xanthene compound). Examples of the xanthene colorant include a colorant which has a partial structure derived from a xanthene compound represented by the following Formula (J) as a colorant structure.

General Formula (J)

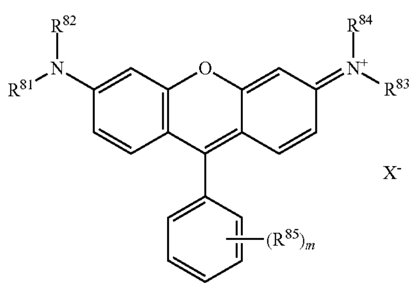

In Formula (J), $R^{81}$, $R^{82}$, $R^{83}$, and $R^{84}$ each independently represent a hydrogen atom or a monovalent substituent. $R^{85}$'s each independently represent a monovalent substituent, and in represents an integer of 0 to 5. $X^-$ represents a counter anion. In the case where $X^-$ is not present, at least one of $R^{81}$, or $R^{85}$ includes an anion.

Examples of the substituents which $R^{81}$ to $R^{85}$ can have in Formula (J) are the same as the substituents exemplified in the section of the substituent group A which will be described later.

In the compound represented by Formula (J), it is preferable that any one moiety of $R^{81}$ to $R^{85}$ is bonded to $R^2$ in General Formula (1).

In Formula (J), $R^{81}$ and $R^{82}$, $R^{83}$ and $R^{84}$, and $R^{85}$'s in a case where m is 2 or more may be each independently bonded to each other to form a 5-, 6-, or 7-membered saturated ring or a 5-, 6-, or 7-membered unsaturated ring. In the case where the formed 5-, 6-, or 7-membered ring is a group which can be further substituted, the ring may be substituted with the substituents described for $R^{81}$ to $R^{85}$. In the case where the ring is substituted with two or more substituents, these substituents may be the same as or different from each other.

In Formula (J), in the case where $R^{81}$ and $R^{82}$, $R^{83}$ and $R^{84}$, and $R^{85}$'s in a case where m is 2 or more are bonded to each other to form 5-, 6-, and 7-membered saturated rings not having a substituent or form 5-, 6-, and 7-membered unsaturated rings, examples of the 5-, 6-, and 7-membered saturated rings not having a substituent or the 5-, 6-, and 7-membered unsaturated rings include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and preferably a benzene ring and a pyridine ring.

It is particularly preferable that $R^{82}$ and $R^{83}$ are a hydrogen atom or a substituted or unsubstituted alkyl group, and $R^{81}$ and $R^{84}$ are a substituted or unsubstituted alkyl group or phenyl group. Further, $R^{85}$ is preferably a halogen atom, a linear or branched alkyl group having 1 to 5 carbon atoms, a sulfo group, a sulfonamide group, a carboxyl group, or an amide group, and more preferably a sulfo group, a sulfonamide group, a carboxyl group, or an amide group. $R^{85}$ is preferably bonded to an adjacent portion of carbon linked to a xanthene ring. The substituent contained in the phenyl group represented by $R^{81}$ and $R^{84}$ is particularly preferably a hydrogen atom, a halogen atom, a linear or branched alkyl group having 1 to 5 carbon atoms, a sulfo group, a sulfonamide group, or a carboxyl group.

The compounds having xanthene skeletons represented by Formula (J) may be synthesized using methods disclosed in the literature. Specifically, the methods disclosed in Tetrahedron Letters, 2003, vol. 44, No. 23, pp. 4355 to 4360; Tetrahedron, 2005, vol. 61, No. 12, pp. 3097 to 3106; and the like can be applied.

In the case where $X^-$ represents an anion, reference can be made to the description of a case where the counter anion which will be described later is a separate molecule. Further, in the case where $X^-$ is not present, at least one of $R^{81}$, $R^{82}$, $R^{83}$, or $R^{84}$ includes an anion, reference can be made to the description of a case where a counter anion is within the same structural unit.

Hereinafter, specific aspects (the first aspect and the second aspect) of the compound represented by Formula (J) will be described.

(First Aspect of Compound Represented by Formula (J))

The compound represented by Formula (J) may represent a group in which one of $R^{81}$ and $R^{83}$ is represented by the following General Formula (2), and the other of $R^{81}$ and $R^{83}$ represents a hydrogen atom, a group represented by the following General Formula (2), or an aryl or alkyl group other than the group represented by General Formula (2). In addition, $R^{82}$ and $R^{84}$ each independently represent a hydrogen atom, an alkyl group, or an aryl group.

General Formula (2)

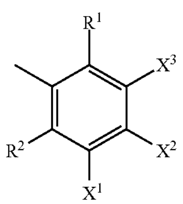

In General Formula (2), $R^1$ and $R^2$ each independently represent an alkyl group having 3 or more carbon atoms, an aryl group, or a heterocyclic group, and $X^1$ to $X^3$ each independently represent a hydrogen atom or a monovalent substituent. The colorant compound represented by General Formula (1) has a counter anion inside the molecule and/or outside the molecule.

In General Formula (1), one of $R^{81}$ and $R^{83}$ is a group represented by General Formula (2), and the other of $R^{81}$ and $R^{83}$ is a hydrogen atom, a group represented by the following General Formula (2) or an aryl group other than the group represented by General Formula (2), or an alkyl group, and may be a group represented by General Formula (2) or an aryl group other than the group represented by General Formula (2). Further, both of $R^{81}$ and $R^{83}$ may be the groups represented by General Formula (2). In the case where $R^{81}$ and $R^{83}$ the groups represented by General Formula (2), the two groups represented by General Formula (2) may be the same as or different from each other.

In General Formula (2), $R^1$ and $R^2$ each independently represent an alkyl group having 3 or more carbon atoms, an aryl group, or a heterocyclic group, and may be a secondary or tertiary alkyl group having 3 to 12 carbon atoms or an isopropyl group.

The alkyl group having 3 or more carbon atoms may be any one of linear, branched, or cyclic, and may have 3 to 24 carbon atoms, 3 to 18 carbon atoms, or 3 to 12 carbon atoms. Specific examples thereof include a propyl group, an isopropyl group, a butyl group (for example, a t-butyl group), a pentyl group, a hexyl group, a heptyl group, an octyl group, a 2-ethylhexyl group, a dodecyl group, a hexadecyl group, a cyclopropyl group, a cyclopentyl group, a cyclohexyl group, a 1-norbornyl group, and a 1-adamantyl group; and may be a propyl group, an isopropyl group, a butyl group, a t-butyl group, a pentyl group, a hexyl group, a heptyl group, an octyl group, a 2-ethylhexyl group, a dodecyl group, a cyclopropyl group, cyclopentyl group, or a cyclohexyl group, may be a propyl group, an isopropyl group, a butyl group (a t-butyl group), a pentyl group, a hexyl group, a heptyl group, an octyl group, or a 2-ethylhexyl group, and may be an isopropyl group, a t-butyl group, or a 2-ethylhexyl group.

Examples of the aryl group include a substituted or unsubstituted aryl group. The substituted or unsubstituted aryl group may be an aryl group having 6 to 30 carbon atoms, and examples thereof include a phenyl group and a naphthyl group. Examples of the substituent are the same as the substituent group A which will be described later.

The heterocycle of the heterocyclic group is preferably a 5- or 6-membered ring, and may or may not further be condensed. Further, it may be an aromatic heterocycle or a non-aromatic heterocycle, and examples thereof include a pyridine ring, a pyrazine ring, a pyridazine ring, a quinoline ring, an isoquinoline ring, a quinazoline ring, a cinnoline ring, a phthalazine ring, a quinoxaline ring, a pyrrole ring, an indole ring, a furan ring, a benzofuran ring, a thiophene ring, a benzothiophene ring, a pyrazole ring, an imidazole ring, a benzimidazole ring, a triazole ring, an oxazole ring, a benzoxazole ring, a thiazole ring, a benzothiazole ring, an isothiazole ring, a benzisothiazole ring, a thiadiazole ring, an isoxazole ring, a benzisoxazole ring, a pyrrolidine ring, a piperidine ring, a piperazine ring, an imidazolidine ring, and a thiazoline ring. Among these, the heterocycle may be an aromatic heterocyclic group, and examples thereof include a pyridine ring, a pyrazine ring, a pyridazine ring, a pyrazole ring, an imidazole ring, a benzimidazole ring, a triazole ring, a benzoxazole ring, a thiazole ring, a benzothiazole ring, an isothiazole ring, a benzisothiazole ring, and a thiadiazole ring; and the heterocycle may be a pyrazole ring, an imidazole ring, a benzoxazole ring, and a thiadiazole ring, or may be a pyrazole ring, a thiadiazole ring (a 1,3,4-thiadiazole ring or a 1,2,4-thiadiazole ring). These may have a substituent, and examples of the substituent include the same substituents as those of the aryl group, which will be described later.

$R^1$ and $R^2$ may be an alkyl group having 3 or more carbon atoms, or may be an alkyl group having 3 to 12 carbon atoms.

In General Formula (2), $X^1$ to $X^3$ each independently represent a hydrogen atom or a monovalent substituent. Examples of the substituent include the substituent group A which will be described later. $X^1$ to $X^3$ may be a halogen atom, an alkyl group, a hydroxyl group, an alkoxy group, an acyl group, an acyloxy group, an alkylthio group, or a sulfonamide group.

Examples of the aryl group other than the group represented by General Formula (2) include a phenyl group. The phenyl group may or may not have a substituent. Examples of the substituent include the substituent group A which will be described later, and may be an alkyl group or an aryl group.

$R^{82}$ and $R^{84}$ each independently represent a hydrogen atom, an alkyl group, or an aryl group, and the alkyl group and the aryl group may or may not have a substituent.

The substituted or unsubstituted alkyl group may be an alkyl group having 1 to 30 carbon atoms. Examples of the substituent include those which are the same groups as the substituent group A which will be described later. Examples of the alkyl group include a methyl group, an ethyl group, a propyl group, an isopropyl group, a butyl group (a t-butyl group), an n-octyl group, and a 2-ethylhexyl group.

The substituted or unsubstituted aryl group may be an aryl group having 6 to 30 carbon atoms, and examples thereof include a phenyl group and a naphthyl group. Examples of the substituent are the same as the substituent group A which will be described later.

$R^{82}$ and $R^{84}$ may be a hydrogen atom or an alkyl group, and may be a hydrogen atom.

(Second Aspect of Compound Represented by Formula (J))

For the compound represented by Formula (J), $R^{81}$ and $R^{83}$ may be each independently an aliphatic hydrocarbon group, and $R^{82}$ and $R^{84}$ may be each independently an aromatic hydrocarbon group.

Examples of $R^{81}$ and $R^{83}$ each independently include an aliphatic hydrocarbon group, and $R^{81}$ and $R^{83}$ may be an alkyl group having 1 to 10 carbon atoms or an alkyl group having 1 to 5 carbon atoms; may be a methyl group, an ethyl group, a propyl group, or a butyl group; or may be a methyl group, an ethyl group, an n-propyl group, an iso-propyl group, or an n-butyl group. $R^{81}$ and $R^{83}$ may be the same as or different from each other. The alkyl group as $R^{81}$ and $R^{83}$ may or may not have a substituent.

$R^{82}$ and $R^{84}$ are each independently an aromatic hydrocarbon group, and may be a phenyl group. The aromatic hydrocarbon group as $R^{82}$ and $R^{84}$ may have a substituent, and is selected from the substituent group A which will be described later. It may be an alkyl group having 1 to 5 carbon atoms; may be a methyl group, an ethyl group, a propyl group, or a butyl group; and may be a methyl group, an ethyl group, an n-propyl group, or an n-butyl group.

At least one of $R^{81}$ and $R^{83}$, or $R^{82}$ and $R^{84}$ may be represented by the following General Formula (A1-1-2).

General Formula (A1-1-2)

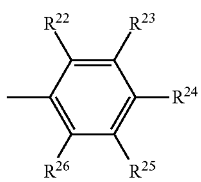

In General Formula (A1-1-2), $R^{23}$ to $R^{25}$ each independently represent a hydrogen atom, a halogen atom, a hydroxyl group, an alkoxy group, an alkyl group having 1 to 12 carbon atoms, a carbonyl group, a carbonylamide group, a sulfonyl group, a sulfonylamide group, a nitro group, an amino group, an aminocarbonyl group, an aminosulfonyl group, a sulfonylimido group, or a carbonylimido group, and $R^{22}$ and $R^{26}$ each independently represent an alkyl group having 1 to 5 carbon atoms.

In General Formula (A1-1-2), $R^{23}$ to $R^{25}$ may be a hydrogen atom or a halogen atom.

In General Formula (A1-1-2), $R^{22}$ and $R^{26}$ each independently represent an alkyl group having 1 to 5 carbon atoms. The alkyl group having 1 to 5 carbon atoms may be a methyl group, an ethyl group, a propyl group, or a butyl group; or may be a methyl group, an ethyl group, an n-propyl group, an iso-propyl group, or an n-butyl group.

$R^{85}$'s each independently represent a hydrogen atom, a halogen atom, an alkyl group, an aryl group, a carbonyl group, a nitro group, an amino group, an alkylamino group, an arylamino group, or a sulfonyl group. Examples of the halogen atom include a fluorine atom, a chlorine atom, and a bromine atom, and may be a fluorine atom or a chlorine atom. The aliphatic hydrocarbon group may be an aliphatic hydrocarbon group having 1 to 10 carbon atoms. Further, examples of the aliphatic hydrocarbon group include an alkyl group, an alkenyl group, and the aliphatic hydrocarbon group may be an alkyl group. The aromatic hydrocarbon group may be an aryl group or may be a phenyl group.

Specific examples of the xanthene compound are shown below, but the present invention is not limited thereto. In the following specific examples, X represents an anion. Further, any one hydrogen atom of the colorant structure is bonded to the polymer skeleton.

Further, since the cation is non-localized in the colorant structure, the cation is present on a nitrogen atom, or a carbon atom of the xanthene ring, for example, as shown below.

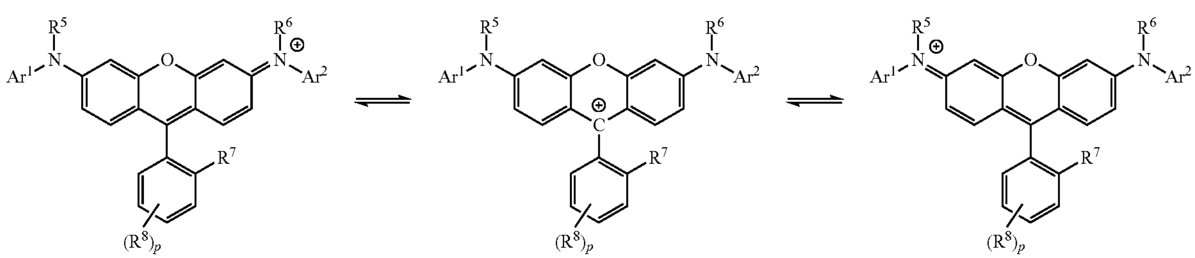

(A-xt-1)

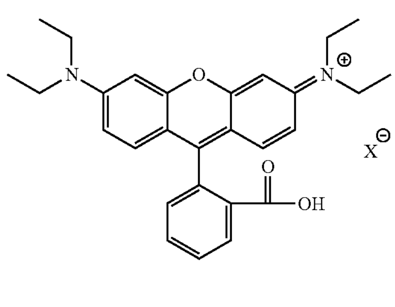

(A-xt-2)

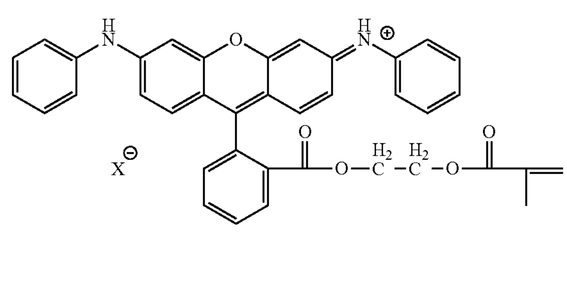

-continued
(A-xt-3)
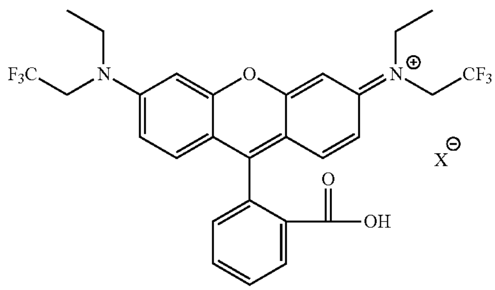
(A-xt-4)
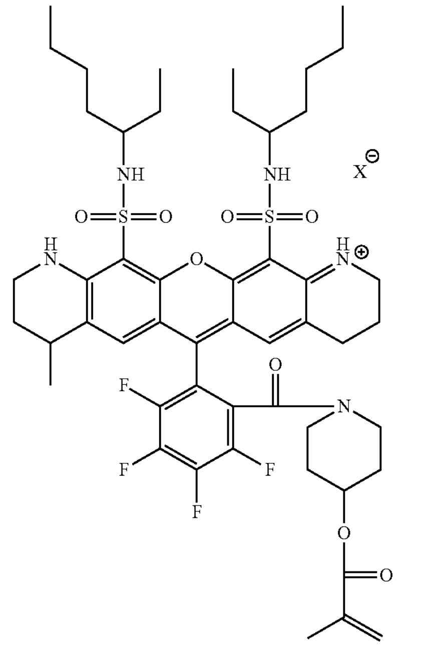
(A-xt-5)
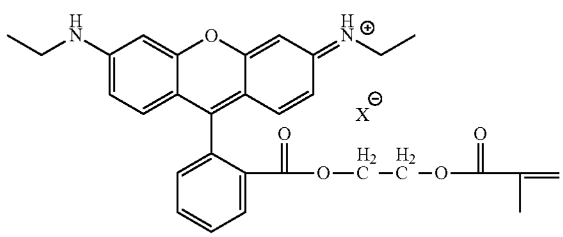
(A-xt-6)
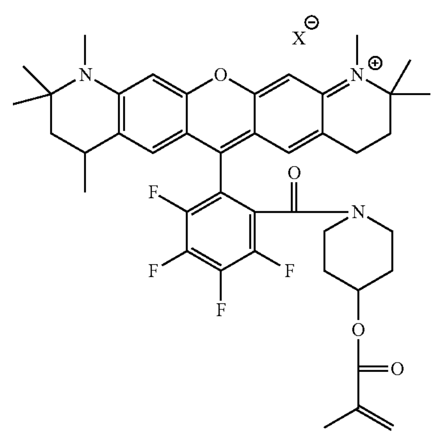
(A-xt-7)
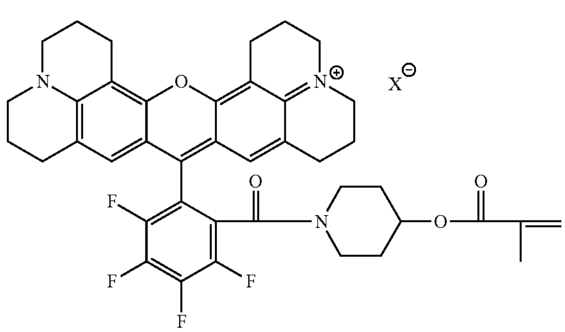

-continued
(A-xt-8)
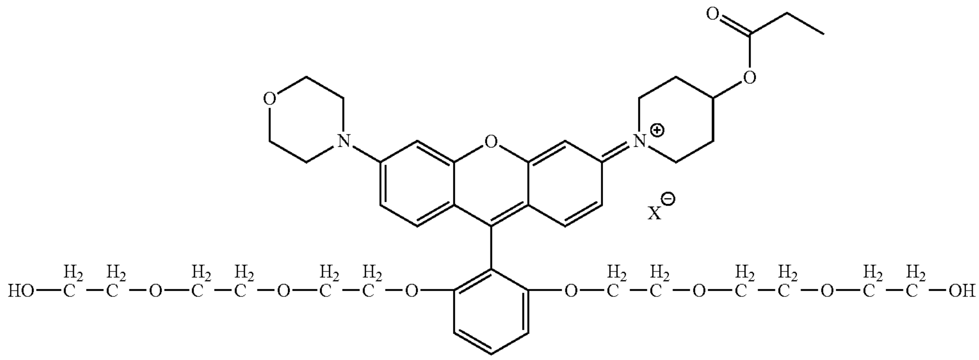
(A-xt-9)
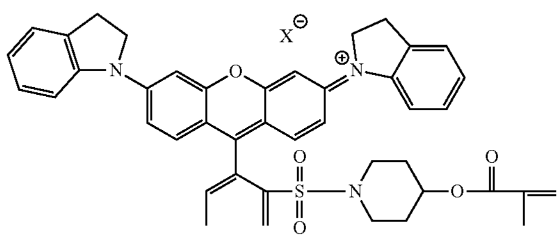
(A-xt-10)
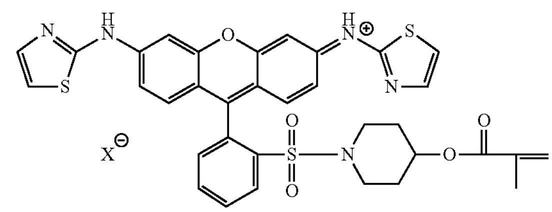
(A-xt-11)
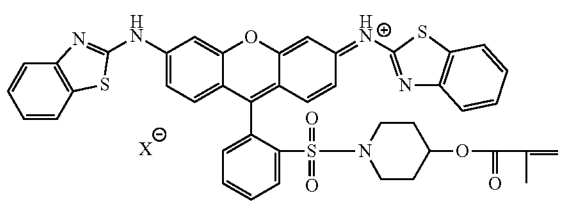
(A-xt-12)
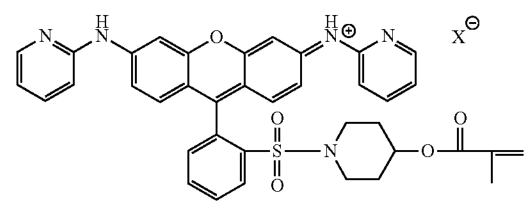
(A-xt-13)
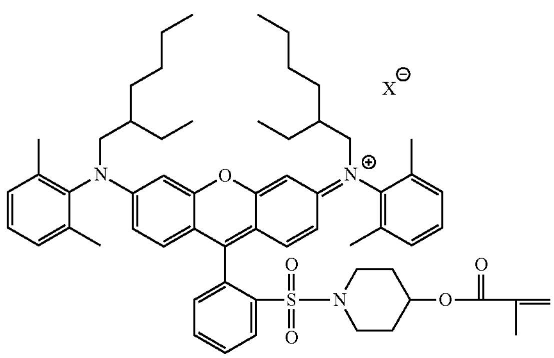
(A-xt-14)
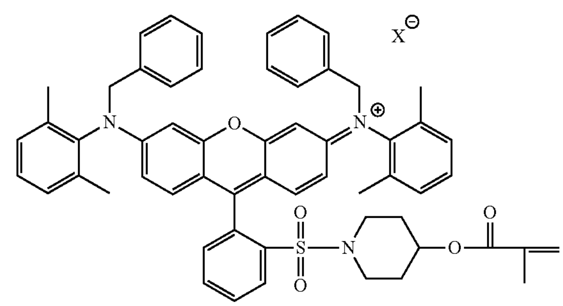
(A-xt-15)
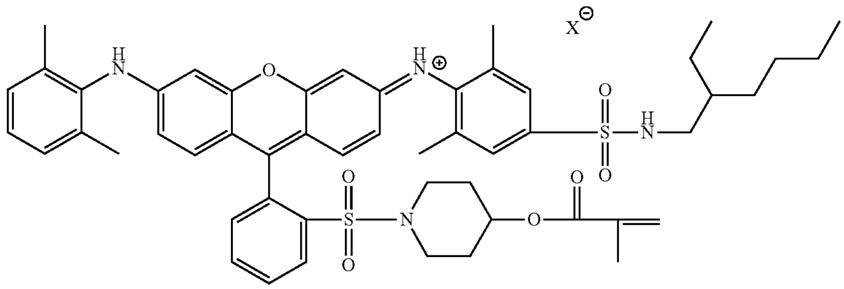

-continued
(A-xt-16)
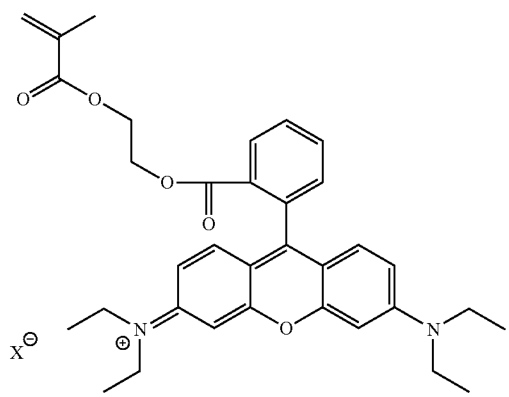
(A-xt-101)
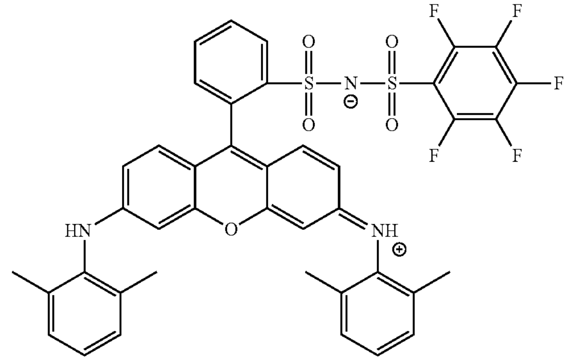
(A-xt-102)
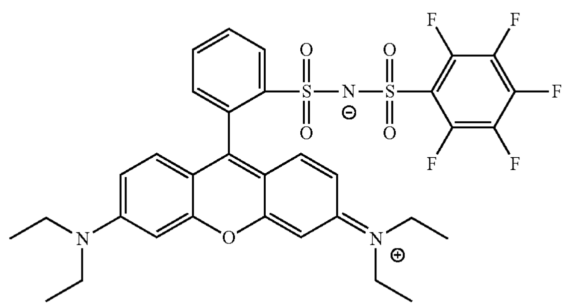
(A-xt-103)
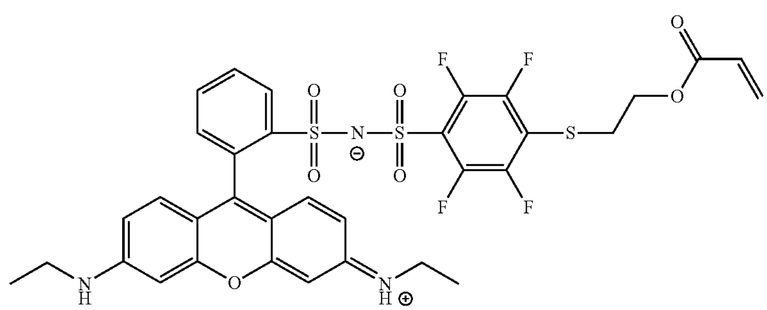
(A-xt-104)
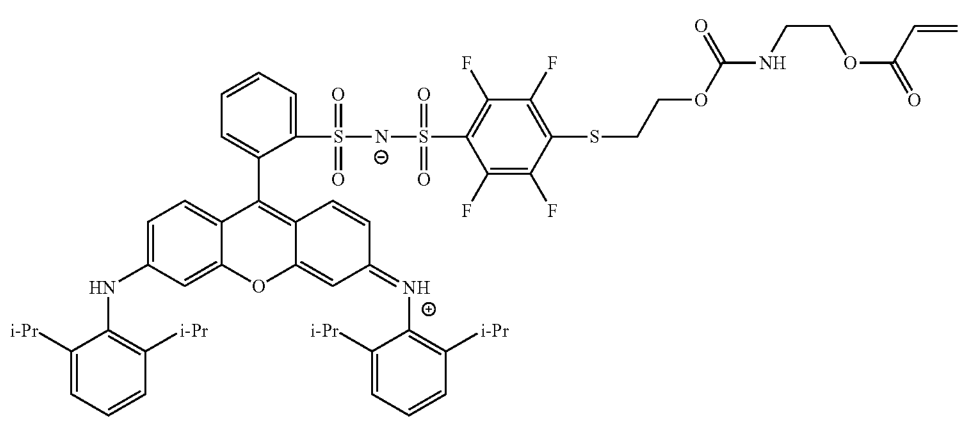

-continued
(A-xt-105)
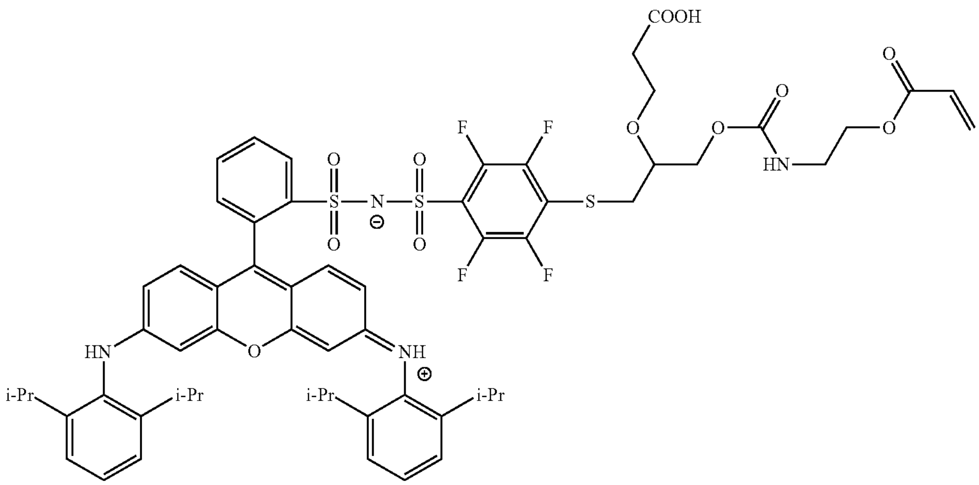
(A-xt-106)
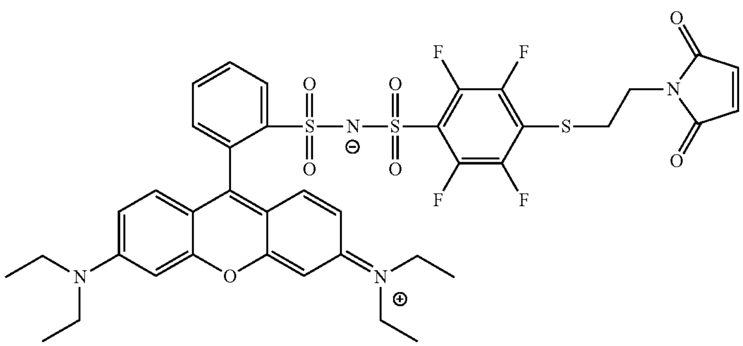
(A-xt-107)
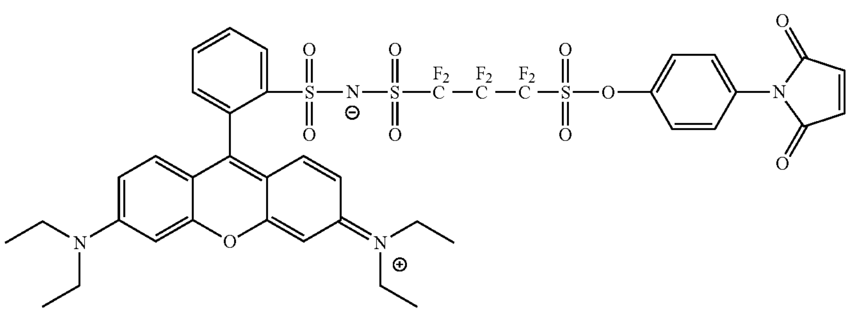
(A-xt-108)
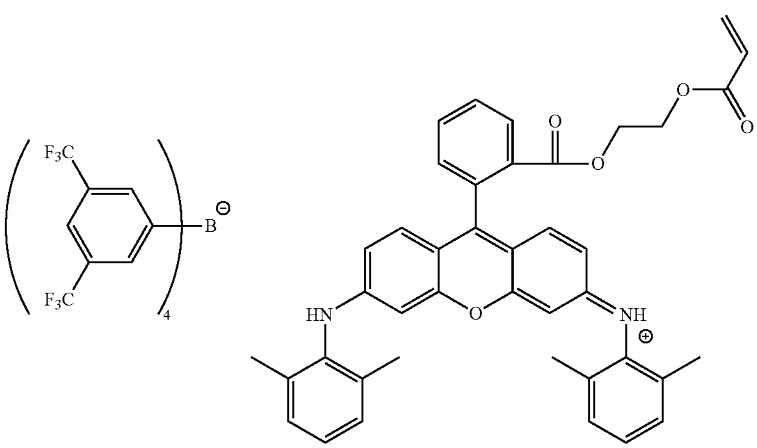

-continued
(A-xt-109)
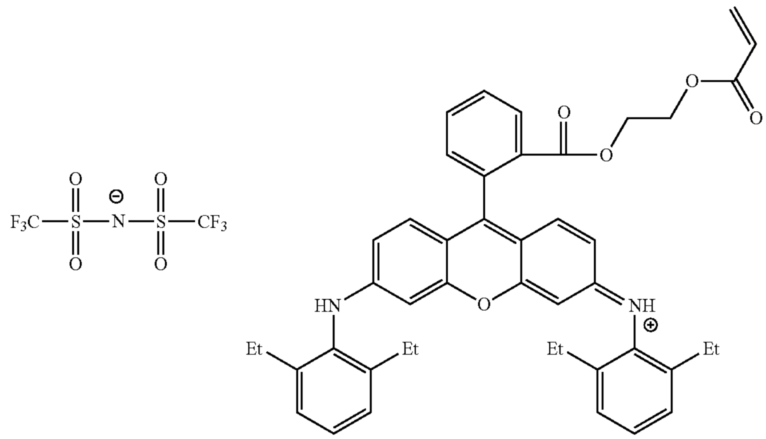
(A-xt-110)
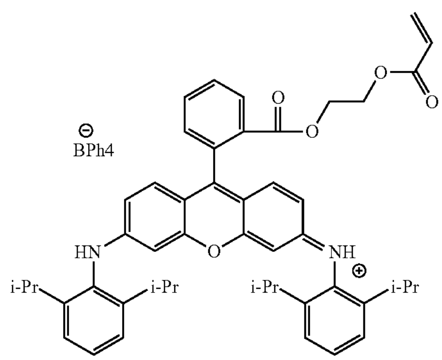
(A-xt-111)
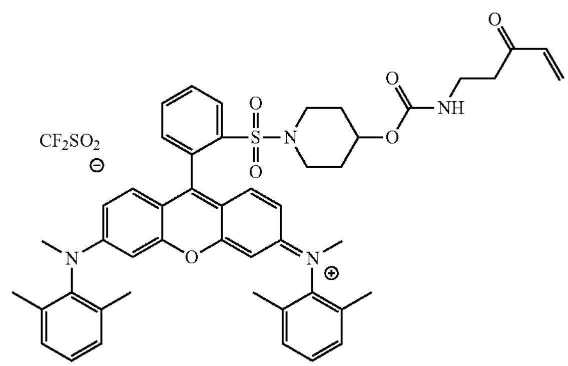
(A-xt-112)
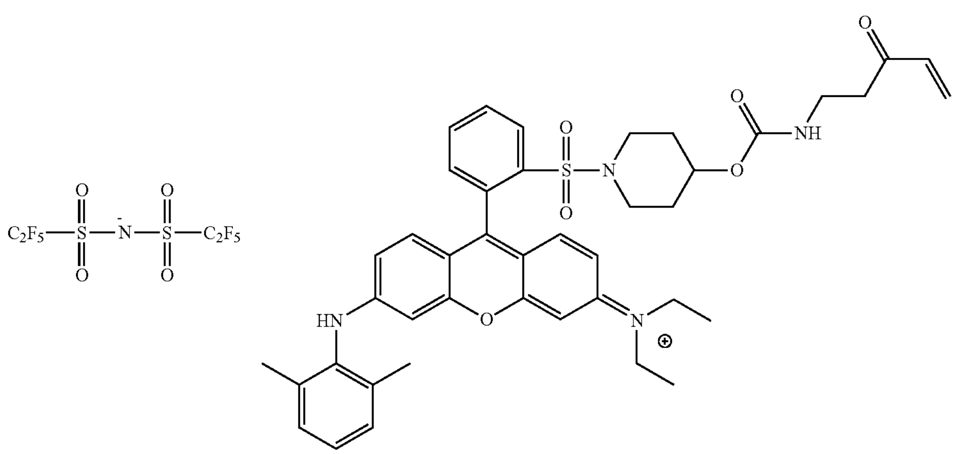
(A-xt-113)
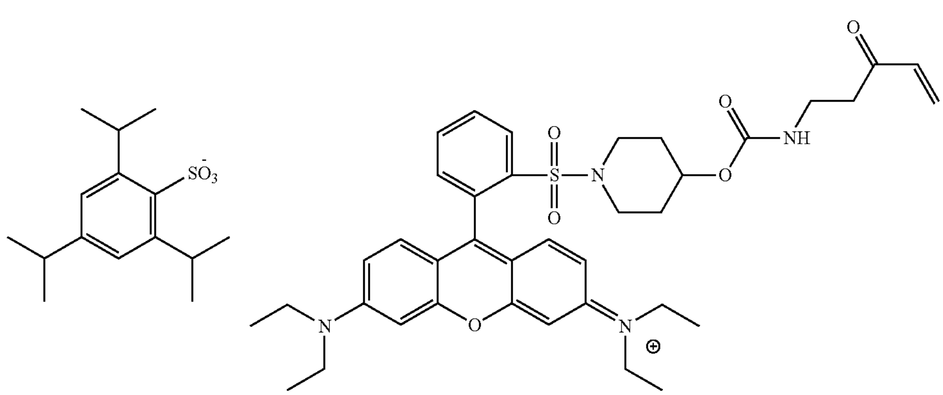

-continued (A-xt-114)

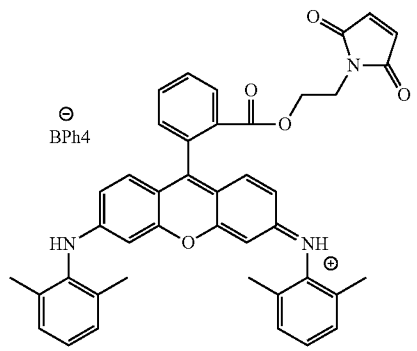

(A-xt-115)

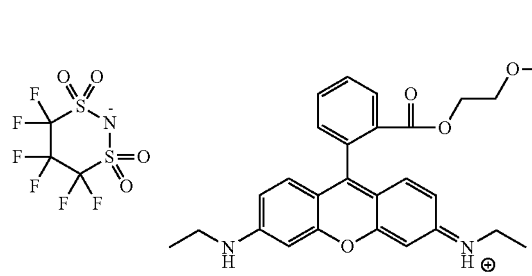

(A-xt-116)

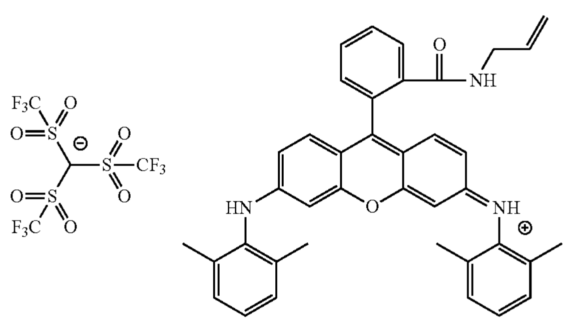

(A-xt-117)

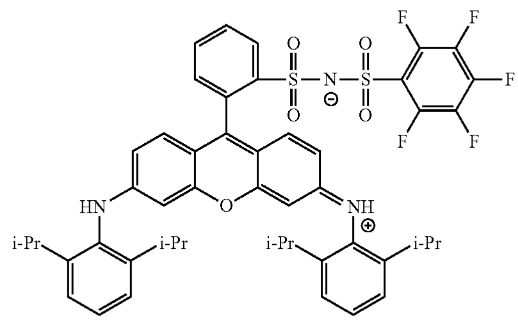

<<<<Anthraquinone Colorant>>>>

One of the aspects of the colorant structure for use in the present invention is one which has a partial structure derived from an anthraquinone colorant. As the one having a partial structure derived from the anthraquinone colorant (an anthraquinone compound), partial structures derived from compounds represented by the following General Formulae (AQ-1) to (AQ-3) are preferable. The anthraquinone compound collectively refers to compounds having a colorant moiety including an anthraquinone skeleton within the molecule.

General Formula (AQ-1)

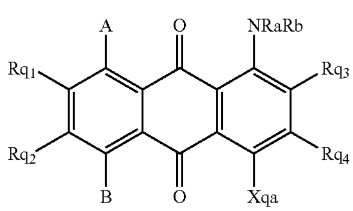

General Formula (AQ-2)

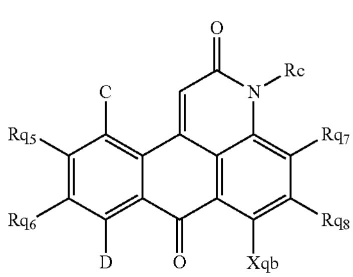

-continued

General Formula (AQ-3)

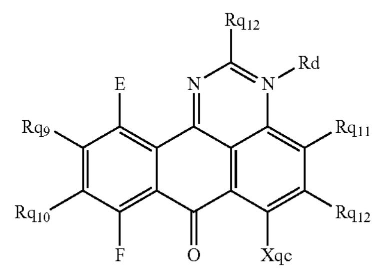

In General Formula (AQ-1), A and B each independently represent an amino group, a hydroxyl group, an alkoxy group, or a hydrogen atom. Xqa represents $ORqa^1$ or $NRqa^2Rqa^3$. $Rqa^1$ to $Rqa^3$ each independently represent a hydrogen atom, an alkyl group, or an aryl group. $Rq^1$ to $Rq^4$ represent substituents. The substituents that $Rq^1$ to $Rq^4$ can have are the same as the substituents exemplified in the section of the substituent group A which will be described later. Ra and Rb represent a hydrogen atom, an alkyl group, or an aryl group.

In General Formula (AQ-2), C and D are the same as A and B in General Formula (AQ-1), respectively. Xqb represents $ORqb^1$ or $NRqb^2Rqb^3$. $Rqb^1$ to $Rqb^3$ each independently represent a hydrogen atom, an alkyl group, or an aryl group. $Rq^5$ to $Rq^8$ represent a substituent. $Rq^5$ to $Rq^8$ are the same as $Rq^1$ to $Rq^4$, respectively, in General Formula (AQ-1). Rc is the same as the Ra or Rb in General Formula (AQ-1).

In General Formula (AQ-3), E and F are the same as A and B in General Formula (AQ-1), respectively. Xqc represents $ORqc^1$ or $NRqc^2Rqc^3$. $Rqc^1$ to $Rqc^3$ each independently represent a hydrogen atom, an alkyl group, or an aryl group.

$Rq^9$ to $Rq^{12}$ are the same as $Rq^1$ to $Rq^4$, respectively, in General Formula (AQ-1). Rd is the same as the Ra or Rb in General Formula (AQ-1).

As the preferred ranges of General Formulae (AQ-1), (AQ-2), and (AQ-3), reference can be made to, for example, paragraphs 0045 to 0047 of JP2013-29760A, the contents of which are incorporated herein by reference.

Specific examples of the anthraquinone colorant include the following ones. Further, reference can be made to, for example, paragraphs 0049 to 0050 of JP2013-29760A, the contents of which are incorporated herein by reference. Further, in the specific examples of the anthraquinone colorant, it is preferable that any one hydrogen atom in the structure of the anthraquinone colorant is bonded to $R^2$ of General Formula (1).

A-aq-1

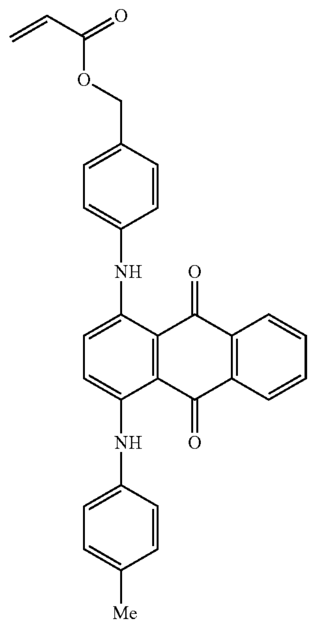

<<<<Cyanine Colorant>>>>

One of the aspects of the colorant structure for use in the present invention is one which has a partial structure derived from a cyanine colorant (a cyanine compound). As the one having a partial structure derived from the cyanine colorant (a cyanine compound), a compound represented by following General Formula (PM) are preferable. In the present invention, the cyanine compound collectively refers to compounds having a colorant moiety including a cyanine skeleton within the molecule.

General Formula (PM)

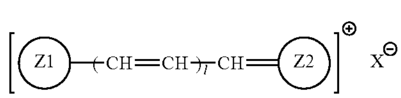

In General Formula (PM), Ring Z1 and Ring Z2 each independently represent a heterocycle which may have a substituent. l represents an integer from 0 to 3. $X^-$ represents an anion.

For the preferred range of General Formula (PM), reference can be made to, for example, paragraphs 0077 to 0084 of JP2013-29760A, the contents of which are incorporated herein by reference. Further, in the specific examples of the cyanine colorant described in paragraphs 0077 to 0084 of JP2013-29760A, any one hydrogen atom in the cyanine colorant structure is bonded to $R^2$ in General Formula (1).

<<<<Squarylium Colorant>>>>

One of the aspects of the colorant structure for use in the present invention is one which has a partial structure derived from a squarylium colorant (a squarylium compound). As the one having a partial structure derived from the squarylium colorant, a compound represented by following General Formula (K) (a squarylium compound) are preferable. In the present invention, the squarylium compound collectively refers to compounds having a colorant moiety including a squarylium skeleton within the molecule.

(K)

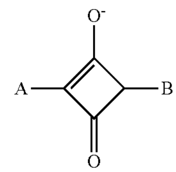

In General Formula (K), A and B each independently represent an aryl group or a heterocyclic group. The aryl group is preferably an aryl group having 6 to 48 carbon atoms, and more preferably an aryl group having 6 to 24 carbon atoms, and examples thereof include phenyl and naphthyl. Examples of the heterocyclic group include a heterocyclic group of five-membered ring or six-membered ring and, for example, pyrrolyl, imidazolyl, pyrazolyl, thienyl, pyridyl, pyrimidyl, pyridazyl, triazol-1-yl, furyl, and thiadiazoyl.

For the preferred range of General Formula (K), reference can be made to, for example, paragraphs 0088 to 0106 of JP2013-29760A, the contents of which are incorporated herein by reference.

Specific examples of the squarylium colorant include the following ones. Further, reference can be made to, for example, paragraph 0105 of JP2013-29760A. Further, in the specific examples of the squarylium colorant, any one hydrogen atom in the squarylium colorant structure is bonded to $R^2$ in General Formula (1).

A-k-1

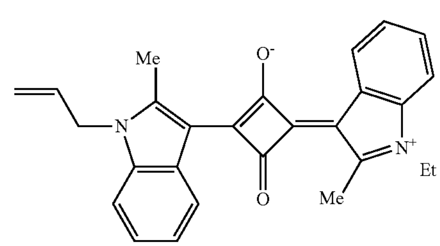

<<<<Quinophthalone Colorant>>>>

One of the aspects of the colorant structure for use in the present invention is one which has a partial structure derived from a quinophthalone colorant (a quinophthalone compound). As the one having a partial structure derived from the quinophthalone colorant, a compound represented by following General Formula (QP) (a quinophthalone compound) are preferable. In the present invention, the quinophthalone compound collectively refers to compounds having a colorant moiety including a quinophthalone skeleton within the molecule.

General Formula (QP)

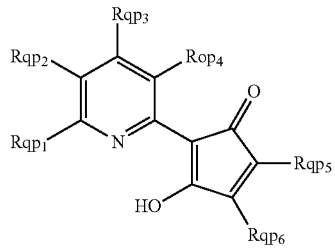

In General Formula (QP), $Rqp^1$ to $Rqp^6$ each independently represent a hydrogen atom or a substituent. In the case where at least two of $Rqp^1$ to $Rqp^6$ are adjacent to each other, they may be bonded to each other to form a ring and the formed ring may further have a substituent.

For the preferred range of General Formula (QP), reference can be made to, for example, paragraphs 0110 to 0114 of JP2013-29760A, the contents of which are incorporated herein by reference.

Specific examples of the quinophthalone colorant include the following ones. Further, reference can be made to, for example, paragraph 0113 of JP2013-29760A. Further, in the specific examples of the quinophthalone colorant, any one hydrogen atom in the quinophthalone colorant structure is bonded to $R^2$ in General Formula (1).

A-qp-1

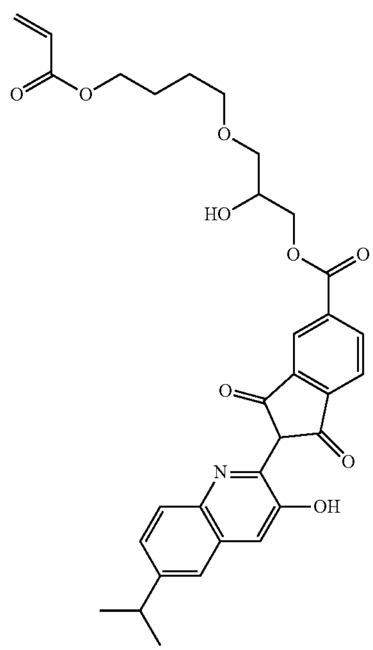

A-qp-2

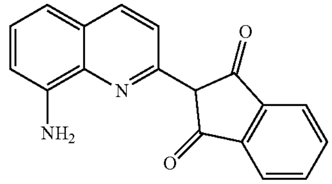

<<<<Phthalocyanine Colorant>>>>

One of the aspects of the colorant structure for use in the present invention is one which has a partial structure derived from a phthalocyanine colorant (a phthalocyanine compound). As the one having a partial structure derived from the phthalocyanine colorant, a compound represented by following General Formula (F) (a phthalocyanine compound) are preferable. In the present invention, the phthalocyanine compound collectively refers to compounds having a colorant moiety including a phthalocyanine skeleton within the molecule.

General Formula (F)

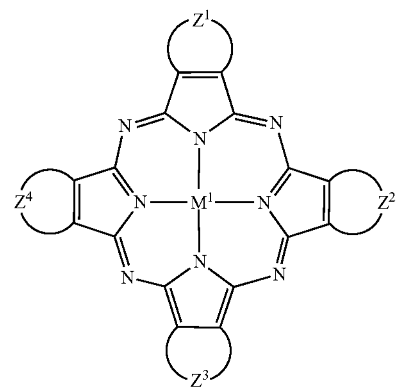

In General Formula (F), $M^1$ represents metals, $Z^1$, $Z^2$ $Z^3$, and $Z^4$ each independently represent an atomic group required to form a six-membered ring consisting of atoms selected from a carbon atom and a nitrogen atom.

For the preferred range of General Formula (F), reference can be made to, for example, paragraphs 0118 to 0124 of JP2013-29760A, the contents of which are incorporated herein by reference.

Specific examples of the phthalocyanine colorant include the following ones. Further, reference can be made to, for example, paragraph 0123 of JP2013-29760A. Further, in the specific examples of the phthalocyanine colorant, any one hydrogen atom in the phthalocyanine colorant structure is bonded to $R^2$ in General Formula (1).

A-f-1

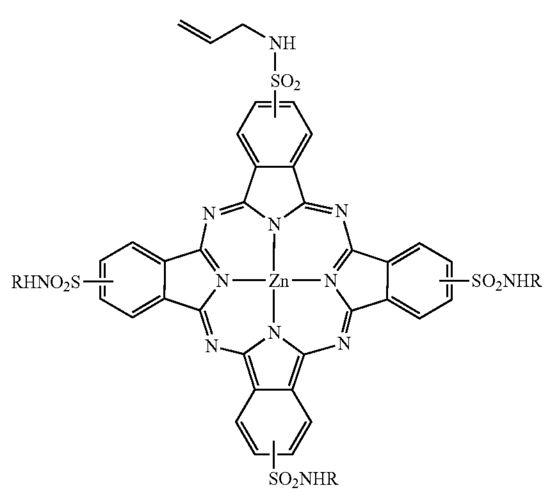

R = $CH_2CH_2CH_2OH$

<<<<Subphthalocyanine Colorant>>>>

One of the aspects of the colorant structure for use in the present invention is one which has a partial structure derived from a subphthalocyanine colorant (a subphthalocyanine compound). As the one having a partial structure derived from the subphthalocyanine colorant, a compound represented by following General Formula (SP) (a subphthalocyanine compound) are preferable. In the present invention, the subphthalocyanine compound collectively refers to compounds having a colorant moiety including a subphthalocyanine skeleton within the molecule.

General Formula (SP)

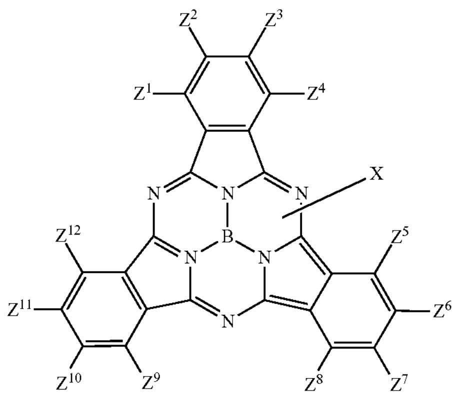

In General Formula (SP), $Z^1$ to $Z^{12}$ each independently represent a hydrogen atom, an alkyl group, an aryl group, a hydroxy group, a mercapto group, an amino group, an alkoxy group, an aryloxy group, or a thioether group. X represents an anion.

For the preferred range of General Formula (SP), reference can be made to, for example, paragraphs 0128 to 0133 of JP2013-29760A, the contents of which are incorporated herein by reference.

Specific examples of the subphthalocyanine colorant include the following ones. Further, reference can be made to, for example, paragraph 0132 of JP2013-29760A. Further, in the specific examples of the subphthalocyanine colorant, any one hydrogen atom in the subphthalocyanine colorant structure is bonded to $R^2$ in General Formula (1).

A-sp-1

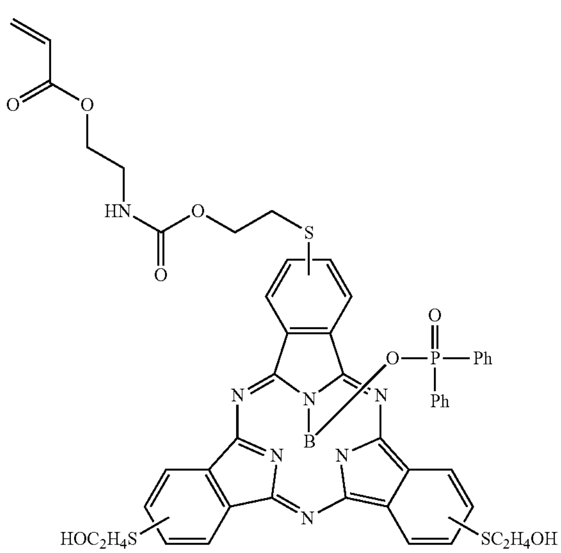

<<<<Azo Colorant>>>>

One of the aspects of the colorant structure for use in the present invention is one which has a partial structure derived from an azo colorant (an azo compound). In the present invention, the azo compound collectively refers to compounds having a colorant moiety including an N═N group within the molecule. As the azo colorant, one appropriately selected from known azo colorants (for example, substituted azobenzene) can be applied. For example, for the azo colorant, reference can be made to the descriptions of paragraphs 0084 to 0134 of JP2013-41097A, and paragraphs 0029 to 0136 of JP2011-162760A, the contents of which are incorporated herein by reference. Specific examples of the azo colorant include the following ones.

A-az-1

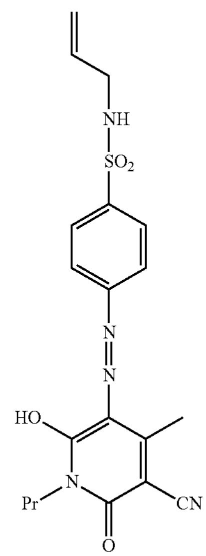

<<<<Dipyrromethene Colorant>>>>

One of the aspects of the colorant structure for use in the present invention is one which has a partial structure derived from a dipyrromethene colorant. As the dipyrromethene colorant, a dipyrromethene metal complex compound obtained from a dipyrromethene compound, and a dipyrromethene compound and a metal or metal compound is preferable. For example, for the dipyrromethene colorant, reference can be made to the descriptions of paragraphs 0033 to 0136 of JP2011-95732A, the contents of which are incorporated herein by reference.

In the colorant (A) of the present invention, a hydrogen atom in the colorant structure may be substituted with a substituent from the following substituent group A.

(Substituent Group A)

Examples of the substituent that the colorant (A) may have include a halogen atom (for example, fluorine, chlorine, and bromine), an alkyl group (preferably a linear, branched, or cyclic alkyl group having 1 to 48 carbon atoms, and more preferably a linear, branched, or cyclic alkyl group having 1 to 24 carbon atoms, for example, methyl, ethyl, propyl, isopropyl, and butyl groups (preferably a t-butyl group), pentyl, hexyl, heptyl, octyl, 2-ethylhexyl, dodecyl, hexadecyl, cyclopropyl, cyclopentyl, cyclohexyl, 1-norbornyl, and 1-adamantyl), an alkenyl group (preferably an alkenyl group having 2 to 48, and more preferably an alkenyl group having 2 to 18 carbon atoms, for example, vinyl, allyl, and 3-buten-1-yl), an alkanyl group (preferably an alkanyl group having 2 to 20, more preferably an alkynyl group having 2 to 12 carbon atoms, and particularly preferably an alkynyl group having 2 to 8 carbon atoms, for example, propargyl and 3-pentynyl), an aryl group (preferably an aryl group having 6 to 48 carbon atoms, and more preferably an aryl group having 6 to 24 carbon atoms, for example, phenyl and naphthyl), a heterocyclic group (preferably a heterocyclic group having 1 to 32 carbon atoms, and more preferably a heterocyclic group having 1 to 18 carbon atoms, for example, 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), a silyl group (preferably a silyl group having 3 to 38 carbon atoms, and more preferably a silyl group having 3 to 18 carbon atoms, for example, trimethylsilyl, triethylsilyl, tributylsilyl, t-butyldimethylsilyl, and t-hexyldimethylsilyl), a hydroxyl group, a cyano group, a nitro group, an alkoxy group (preferably an alkoxy group having 1 to 48 carbon atoms, and more preferably an alkoxy group having 1 to 24 carbon atoms, for example, methoxy, ethoxy, 1-butoxy, 2-butoxy, isopropoxy, t-butoxy, dodecyloxy, and cycloalkyloxy group, for example, cyclopentyloxy and cyclohexyloxy), an aryloxy group (preferably an aryloxy group having 6 to 48 carbon atoms, and more preferably an aryloxy group having 6 to 24 carbon atoms, for example, phenoxy and 1-naphthoxy), a heterocyclyloxy group (preferably a heterocyclyloxy group having 1 to 32 carbon atoms, and more preferably a heterocyclyloxy group having 1 to 18 carbon atoms, for example, 1-phenyltetrazol-5-oxy and 2-tetrahydropyranyloxy), a silyloxy group (preferably a silyloxy group having 1 to 32 carbon atoms, and more preferably a silyloxy group having 1 to carbon atoms, for example, trimethylsilyloxy, t-butyldimethylsilyloxy, and diphenylmethylsilyloxy), an acyloxy group (preferably an acyloxy group having 2 to 48 carbon atoms, and more preferably an acyloxy group having 2 to 24 carbon atoms, for example, acetoxy, pivaloyloxy, benzoyloxy, and dodecanoyloxy), an alkoxycarbonyloxy group (preferably an alkoxycarbonyloxy group having 2 to 48 carbon atoms, and more preferably an alkoxycarbonyloxy group having 2 to 24 carbon atoms, for example, ethoxycarbonyloxy, t-butoxycarbonyloxy, and cycloalkyloxycarbonyloxy groups, for example, cyclohexyloxycarbonyloxy), an aryloxycarbonyloxy group (preferably an aryloxycarbonyloxy group having 7 to 32 carbon atoms, and more preferably an aryloxycarbonyloxy group having 7 to 24 carbon atoms, for example, phenoxycarbonyloxy), a carbamoyloxy group (preferably a carbamoyloxy group having 1 to 48 carbon atoms, and more preferably a carbamoyloxy group having 1 to 24 carbon atoms, for example, N,N-dimethylcarbamoyloxy, N-butylcarbamoyloxy, N-phenylcarbamoyloxy, and N-ethyl-N-phenylcarbamoyloxy), a sulfamoyloxy group (preferably a sulfamoyloxy group having 1 to 32 carbon atoms, and more preferably a sulfamoyloxy group having 1 to 24 carbon atoms, for example, N,N-diethylsulfamoyloxy, N-propylsulfamoyloxy), an alkylsulfonyloxy group (preferably an alkylsulfonyloxy group having 1 to 38 carbon atoms, and more preferably an alkylsulfonyloxy group having 1 to 24 carbon atoms, for example, methylsulfonyloxy, hexadecylsulfonyloxy, and cyclohexylsulfonyloxy), an arylsulfonyloxy group (preferably an arylsulfonyloxy group having 6 to 32 carbon atoms, and more preferably an arylsulfonyloxy group having 6 to 24 carbon atoms, for example, phenylsulfonyloxy), an acyl group (preferably an acyl group having 1 to 48 carbon atoms, and more preferably an acyl group having 1 to 24 carbon atoms, for example, formyl, acetyl, pivaloyl, benzoyl, tetradecanoyl, and cyclohexanoyl), an alkoxycarbonyl group (preferably an alkoxycarbonyl group having 2 to 48 carbon atoms, and more preferably an alkoxycarbonyl group having 2 to 24 carbon atoms, for example, methoxycarbonyl, ethoxycarbonyl, octadecyloxycarbonyl, cyclohexyloxycarbonyl, and 2,6-di-tert-butyl-4-methylcyclohexyloxycarbonyl), an aryloxycarbonyl group (preferably an aryloxycarbonyl group having 7 to 32 carbon atoms, and more preferably an aryloxycarbonyl group having 7 to 24 carbon atoms, for example, phenoxycarbonyl), a carbamoyl group (preferably a carbamoyl group having 1 to 48 carbon atoms, and more preferably a carbamoyl group having 1 to 24 carbon atoms, for example, carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl, and N,N-dicyclohexylcarbamoyl), an amino group (preferably an amino group having 32 or less carbon atoms, and more preferably an amino group having 24 or less carbon atoms, for example, amino, methylamino, N,N-dibutylamino, tetradecylamino, 2-ethylhexylamino, and cyclohexylamino), an anilino group (preferably an anilino group having 6 to 32 carbon atoms, and more preferably an anilino group having 6 to 24 carbon atoms, for example, anilino and N-methylanilino), a heterocyclic amino group (preferably a heterocyclic amino group having 1 to 32 carbon atoms, and more preferably a heterocyclic amino group having 1 to 18 carbon atoms, for example, 4-pyridylamino), a carbonamide group (preferably a carbonamide group having 2 to 48 carbon atoms, and more preferably a carbonamide group having 2 to 24 carbon atoms, for example, acetamide, benzamide, tetradecanamide, pivaloylamide, and cyclohexanamide), a ureido group (preferably a ureido group having 1 to 32 carbon atoms, and more preferably a ureido group having 1 to 24 carbon atoms, for example, ureido, N,N-dimethylureido, and N-phenylureido), an imido group (preferably an imido group having 36 or less carbon atoms, and more preferably an imido group having 24 or less carbon atoms, for example, N-succinimide and N-phthalimide), an alkoxycarbonylamino group (preferably an alkoxycarbonylamino group having 2 to 48 carbon atoms, and more preferably an alkoxycarbonylamino group having 2 to 24 carbon atoms, for example, methoxycarbonylamino, ethoxycarbonylamino, t-butoxycarbonylamino, octadecyloxycarbonylamino, and cyclohexyloxycarbonylamino), an aryloxycarbonylamino group (preferably an aryloxycarbonylamino group having 7 to 32 carbon atoms, and more preferably an aryloxycarbonylamino group having 7 to 24 carbon atoms, for example, phenoxycarbonylamino), a sulfonamide group (preferably a sulfonamide group having 1 to 48 carbon atoms, and more preferably a sulfonamide group having 1 to 24 carbon atoms, for example, methanesulfonamide, butanesulfonamide, benzenesulfonamide, hexadecanesulfonamide, and cyclohexanesulfonamide), a sulfamoylamino group (preferably a sulfamoylamino group having 1 to 48 carbon atoms, and more preferably a sulfamoylamino group having 1 to 24 carbon atoms, for example, N,N-dipropylsulfamoylamino and N-ethyl-N-dodecylsulfamoylamino), an azo group (preferably an azo group having 1 to 32 carbon atoms, and more preferably an azo group having 1 to 24 carbon atoms, for example, phenylazo and 3-pyrazolylazo), an alkylthio group (preferably an alkylthio group having 1 to 48 carbon atoms, and more preferably an alkylthio group having 1 to 24 carbon atoms, for example, methylthio, ethylthio, octylthio, and cyclohexylthio), an arylthio group (preferably an arylthio group having 6 to 48 carbon atoms, and more preferably an arylthio group having 6 to 24 carbon atoms, for example, phenylthio), a heterocyclicthio group (preferably a heterocyclicthio group having 1 to 32 carbon atoms, and more preferably a heterocyclicthio group having 1 to 18 carbon atoms, for example, 2-benzothiazolylthio, 2-pyridylthio, and 1-phenyltetrazolylthio), an alkylsulfinyl group (preferably an alkylsulfinyl group having 1 to 32 carbon atoms, and more preferably an alkylsulfinyl group having 1 to 24 carbon atoms, for example, dodecanesulfinyl), an arylsulfinyl group (preferably an arylsulfinyl group having 6 to 32 carbon atoms, and more preferably an arylsulfinyl group having 6 to 24 carbon atoms, for example, phenylsulfinyl), an alkylsulfonyl group (preferably an alkylsulfonyl group having 1 to 48 carbon atoms, and more preferably an alkylsulfonyl group having 1 to 24 carbon atoms, for example, methylsulfonyl, ethylsulfonyl, propylsulfonyl, butylsulfonyl, isopropylsulfonyl, 2-ethylhexylsulfonyl, hexadecylsulfonyl, octylsulfonyl, and cyclohexylsulfonyl), an arylsulfonyl group (preferably an arylsulfonyl group having 6 to 48 carbon atoms, and more preferably an arylsulfonyl group having 6 to 24 carbon atoms, for example, phenylsulfonyl and 1-naphthylsulfonyl), a sulfamoyl group (preferably a sulfamoyl group having 32 or less carbon atoms, and more preferably a sulfamoyl group having 24 or less carbon atoms, for example, sulfamoyl, N,N-dipropylsulfamoyl, N-ethyl-N-dodecylsulfamoyl, N-ethyl-N-phenylsulfamoyl, and N-cyclohexylsulfamoyl), a sulfo group, a phosphonyl group (preferably a phosphonyl group having 1 to 32 carbon atoms, and more preferably a phosphonyl group having 1 to 24 carbon atoms, for example, phenoxyphosphonyl, octyloxyphosphonyl, and phenylphosphonyl), and a phosphinoylamino group (preferably a phosphinoylamino group having 1 to 32 carbon atoms, and more preferably a phosphinoylamino group having 1 to 24 carbon atoms, for example, diethoxyphosphinoylamino and dioctyloxyphosphinoylamino) and an alkyloxycarbonyloxy group (preferably an alkyloxycarbonyloxy group having 5 to 30 carbon atoms, and more preferably an alkyloxycarbonyloxy group having 5 to 10 carbon atoms).

These substituents may further be substituted. Further, in the case where there are two or more substituents, the substituents may be the same as or different from each other. In addition, if possible, the groups may be bonded to each other to form a ring.

For the details, reference can be made to, for example, paragraphs 0027 to 0038 of JP2013-29760A, the contents of which are incorporated herein by reference.

<<<<Counter Anion>>>>

In the case where the colorant structure D of General Formula (1) is constituted with a cation moiety and a counter anion, the counter anion is not particularly limited, but is preferably a non-nucleophilic anion from the viewpoint of heat resistance. As the non-nucleophilic counter anion, the known non-nucleophilic anions described in paragraph No. 0075 and the like of JP2007-310315A are preferable. Here, the non-nucleophilicity means properties not nucleophilically attaching colorants by heating.

As the counter anion, at least one selected from a sulfonic acid anion, a carboxylic acid anion, a sulfonylimide anion, a bis(alkylsulfonyl)imide anion, a tris(alkylsulfonyl)methide anion, a carboxylic acid anion, a tetraarylborate anion, —CON⁻CO—, $—CON^{-}SO_2—$, $BF_4^-$, $PF_6^-$, $SbF_6^-$, or $B^-(CN)_3OCH_3$ is preferable. It is more preferably at least one selected from a sulfonic acid anion, a sulfonylimide anion, a bis(alkylsulfonyl)imide anion, a tris(alkylsulfonyl) methide anion, a carboxylic acid anion, a tetraarylborate anion, $BF_4^-$, $PF_6^-$, or $SbF_6^-$.

Among these, as the counter anion, non-nucleophilic anions having structures represented by the following (AN-1) to (AN-5) are more preferable.

(AN-1)

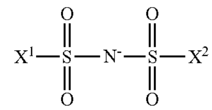

In Formula (AN-1), $X^1$ and $X^2$ each independently represent a fluorine atom or a fluorine atom-containing alkyl group having 1 to 10 carbon atoms. $X^1$ and $X^2$ may be bonded to each other to form a ring.

$X^1$ and $X^2$ each independently represent a fluorine atom, or a fluorine atom-containing alkyl group having 1 to 10 carbon atoms, and is preferably a fluorine atom-containing alkyl group having 1 to 10 carbon atoms, more preferably a perfluoroalkyl group having 1 to 10 carbon atoms, still more preferably a perfluoroalkyl group having 1 to 4 carbon atoms, and particularly preferably a trifluoromethyl group.

(AN-2)

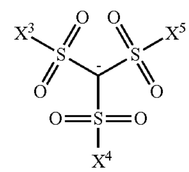

In Formula (AN-2), $X^3$, $X^4$, and $X^5$ each independently represent a fluorine atom, or a fluorine atom-containing alkyl group having 1 to 10 carbon atoms.

$X^3$, $X^4$, and $X^5$ each independently have the same definitions as $X^1$ and $X^2$, and preferred ranges thereof are also the same.

$$X^6—SO_3^- \quad \text{(AN-3)}$$

In Formula (AN-3), $X^6$ represents a fluorine atom-containing alkyl group having 1 to 10 carbon atoms.

$X^6$ is preferably a perfluoroalkyl group having 1 to 10 carbon atoms, and more preferably a perfluoroalkyl group having 1 to 4 carbon atoms.

$$O_3^-S—X^7—SO_3^- \quad \text{(AN-4)}$$

In Formula (AN-4), $X^7$ represents a fluorine atom-containing alkylene group having 1 to 10 carbon atoms.

$X^7$ is preferably a perfluoroalkylene group having 1 to 10 carbon atoms, and more preferably a perfluoroalkylene group having 1 to 4 carbon atoms.

(AN-5)

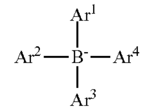

In Formula (AN-5), $Ar^1$, $Ar^2$, $Ar^3$, and $Ar^4$ each independently represent an aryl group.

$Ar^1$, $Ar^2$, $Ar^3$, and $Ar^4$ are each independently preferably an aryl group having 6 to 20 carbon atoms, more preferably an aryl group having 6 to 14 carbon atoms, and still more preferably an aryl group having 6 to 10 carbon atoms.

The aryl group represented by $Ar^1$, $Ar^2$, $Ar^3$, and $Ar^4$ may have a substituent. In the case where the aryl group has a substituent, examples of the substituent include a halogen atom, an alkyl group, an aryl group, an alkoxy group, a carbonyl group, a carbonyloxy group, a carbamoyl group, a sulfo group, a sulfonamide group, and a nitro group, among which a halogen atom and an alkyl group are preferable, a fluorine atom and an alkyl group are more preferable, and a fluorine atom and a perfluoroalkyl group having 1 to 4 carbon atoms are still more preferable.

$Ar^1$, $Ar^2$, $Ar^3$, and $Ar^4$ are each independently more preferably a phenyl group having a halogen atom and/or a halogen atom-containing alkyl group, and still more preferably a phenyl group having a fluorine atom and/or a fluorine atom-containing alkyl group.

The non-nucleophilic counter anion is preferably $—B(CN)_{n1}(OR^a)_{4-n1}$ ($R^a$ represents an alkyl group having 1 to 10 carbon atoms or an aryl group having 6 to 10 carbon atoms, and n1 represents an integer of 1 to 4). $R^a$ as alkyl group having 1 to 10 carbon atoms is preferably an alkyl group having 1 to 6 carbon atoms, and more preferably an alkyl group having 1 to 4 carbon atoms. $R^a$ as aryl group having 6 to 10 carbon atoms is preferably a phenyl group and a naphthyl group.

n1 is preferably 1 to 3, and more preferably 1 to 2.

The non-nucleophilic counter anion is preferably $—PF_6R^P_{(6-n2)}{}^-$ ($R^P$ represents a fluorinated alkyl group having 1 to 10 carbon atoms, and n2 represents an integer of 1 to 6). $R^P$ is preferably a fluorine atom-containing alkyl group having 1 to 6 carbon atoms, more preferably a fluorine atom-containing alkyl group having 1 to 4 carbon atoms, and still more preferably a perfluoroalkyl group having 1 to 3 carbon atoms.

n2 is preferably an integer of 1 to 4, and more preferably 1 or 2.

The mass per molecule of the non-nucleophilic counter anion used in the present invention is preferably 100 to 1,000, and more preferably 200 to 500.

The colorant (A) of the present invention may include one kind or two or more kinds of non-nucleophilic counter anion.

Specific examples of the non-nucleophilic counter anion used in the present invention are shown below, but the present invention is not limited thereto.

(IM-1)

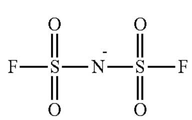

(IM-2)

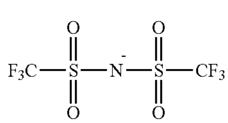

(IM-3)

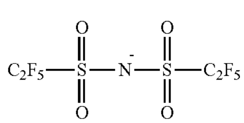

(IM-4)

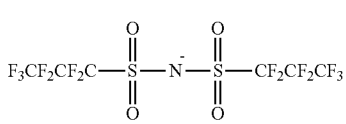

(IM-5)

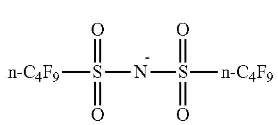

-continued (IM-6)

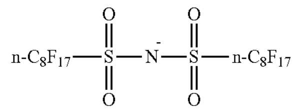

(IM-7)

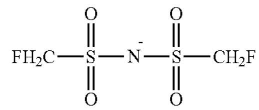

(IM-8)

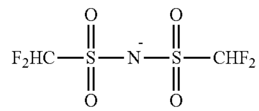

(IM-9)

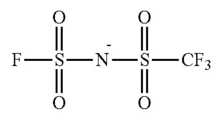

(IM-10)

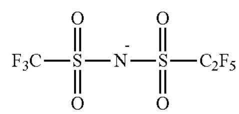

(IM-11)

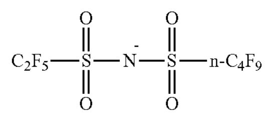

(IM-12)

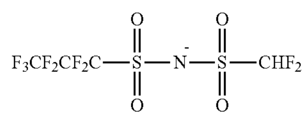

(IM-13)

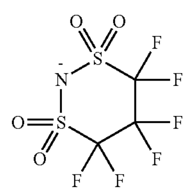

(IM-14)

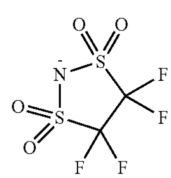

(IM-15)

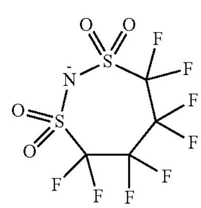

(MD-1)

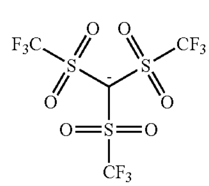

-continued
(MD-2)
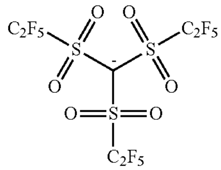
(MD-3)
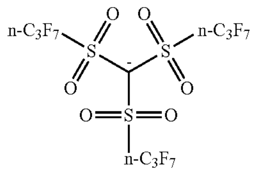
(MD-4)
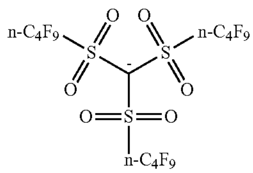
(MD-5)
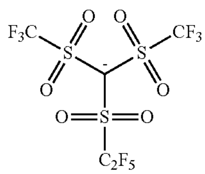
(MD-6)
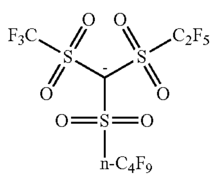
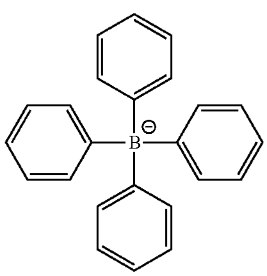
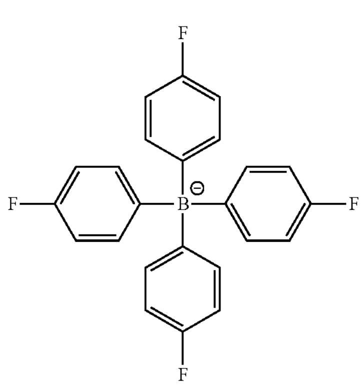
-continued
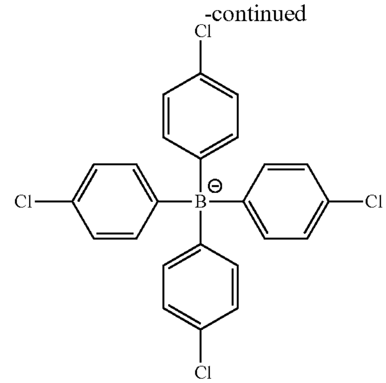
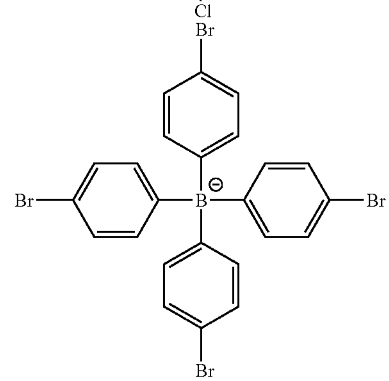
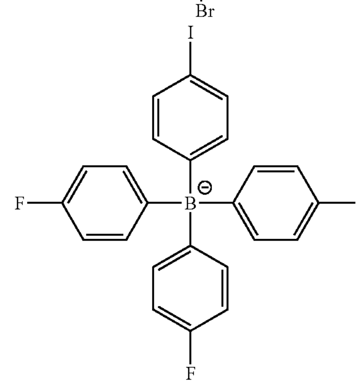
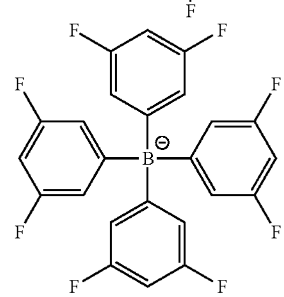
$CF_3SO_3^-$ (a-1)
$C_4F_{13}SO_3^-$ (a-2)
$C_8F_{17}SO_3^-$ (a-3)
(a-4)
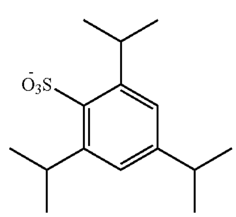

-continued (a-5)

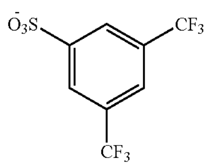

(a-6)

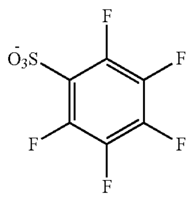

(a-7)

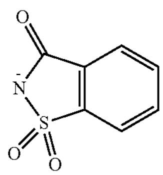

(a-8)

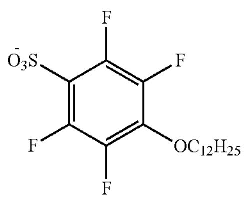

(a-9)

$^{-}O_3S—CF_2—SO_3^{-}$ (a-10)

$^{-}O_3S—CF_2CF_2—SO_3^{-}$ (a-11)

$^{-}O_3S—CF_2CF_2CF_2—SO_3^{-}$ (a-12)

$^{-}O_3S—CF_2CF_2CF_2CF_2—SO_3^{-}$ (a-13)

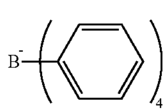

(a-14)

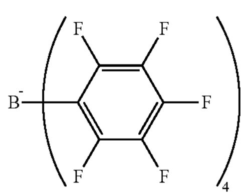

(a-15)

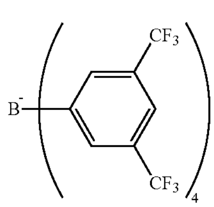

-continued (a-16)

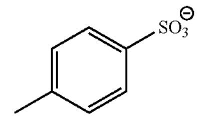

(a-17)

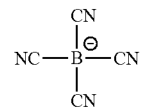

(a-18)

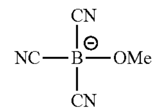

(a-19)

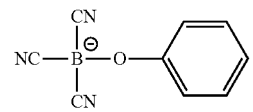

(a-20)

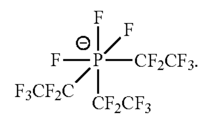

In the case where n in General Formula (I) is 2 or more, a plurality of D's may be the same as or different from each other. Examples of the case of a colorant structure where the plurality of D's are different from each other include (1) a case of a colorant structure where a plurality of D's are derived from a colorant compound having different nuclear structures, and (2) a case of a colorant structure where a plurality of D's are derived from a colorant compound having the same nuclear structure, but having different substituents, core metals, and the like.

In the case where n in General Formula (I) is 2 or more and a plurality of D's are different from each other, as a combination of the colorant structures, for example, a combination of a colorant structure derived from a triarylmethane colorant and a colorant structure derived from a xanthene colorant, a combination of a colorant structure derived from a triarylmethane colorant and a colorant structure derived from an azo colorant are preferable, and from the viewpoint of spectral properties, a combination of a colorant structure derived from a triarylmethane colorant and a colorant structure derived from a xanthene colorant is more preferable.

<<<<Polymerizable Group>>>>

The colorant structure D may have a polymerizable group.

As the polymerizable group, known polymerizable groups which can be crosslinked by a radical, an acid, or heat can be used, and examples thereof include a group including an ethylenically unsaturated bond, a cyclic ether group (an epoxy group and an oxetane group), and a methylol group. Particularly, a group having an ethylenically unsaturated bond is preferable, a (meth)acryloyl group is more preferable, and (meth)acryloyl groups derived from glycidyl (meth)acrylate and 3,4-epoxycyclohexyl methyl (meth)acrylate are particularly preferable.

The colorant residue D preferably has one polymerizable group per colorant structure.

The colorant (A) represented by General Formula (1) is preferably a colorant represented by the following General Formula (2).

$$(D\text{-}R^4\text{—}(S)_p)_n\text{—}R^3\text{—}(S\text{-}L^2\text{-}P)_m \quad (2)$$

$R^3$ in General Formula (2) represents an (m+n)-valent linking group. $R^3$ in General Formula (2) has the same definition as $R^1$ in General Formula (1) as described above, and preferred ranges thereof are the same.

P in General Formula (2) represents a monovalent substituent having repeating units derived from a vinyl compound. P in General Formula (2) has the same definition as P in General Formula (1) as described above, and preferred ranges thereof are the same.

D in General Formula (2) represents a colorant structure. D in General Formula (2) has the same definition as D in General Formula (1) as described above, and preferred ranges thereof are the same.

$R^4$ and $L^2$ in General Formula (2) each independently represent a single bond or a divalent linking group. $R^4$ and $L^2$ in General Formula (2) have the same definitions as $R^2$ and $L^1$ in General Formula (1) as described above, and preferred ranges thereof are the same.

S in General Formula (2) represents a sulfur atom.

In General Formula (2), m represents an integer of 1 to 13. m is preferably 1 to 5, more preferably 1 to 4, and particularly preferably 1 to 3.

In General Formula (2), n represents an integer of 2 to 14. n is preferably 2 to 8, more preferably 2 to 7, and particularly preferably 3 to 6.

In General Formula (2), m+n represents an integer of 2 to 15.

In General Formula (2), p represents 0 or 1.

<<Properties of Colorant (A)>>

The weight-average molecular weight of the colorant (A) is preferably 2,000 to 12,500, more preferably 2,000 to 11,000, and still more preferably 5,000 to 11,000. If the weight-average molecular weight is within the range, the color migration properties are better. Further, the developability is improved, and generation of development residues can further be reduced.

The acid value of the colorant (A) is preferably 10 mgKOH/g or more, more preferably 20 to 200 mgKOH/g, and particularly preferably 20 to 150 mgKOH/g. If the acid value is 20 mgKOH/g or more, the developability is improved, and generation of development residues can further be reduced.

Examples of the method for measuring the specific absorbance of the colorant (A) include a method in which the concentration of a solution including the colorant (A) is adjusted such that the maximum absorbance at 400 nm to 800 nm becomes 1.0 by using a solvent having a sufficient solubility for the colorant (A), and the absorbance of the solution at 25° C. is measured using a cell having an optical path length of 1 cm. As the solvent for measurement of a specific absorbance, one having a sufficient solubility for a dye can be appropriately used. Preferred examples of the solvent include tetrahydrofuran, methanol, isopropylalcohol, dimethyl sulfoxide, acetonitrile, ethyl acetate, hexane, toluene, water, concentrated sulfuric acid, and methanesulfonic acid. In the case where tetrahydrofuran has a sufficient solubility, the tetrahydrofuran is used.

The specific absorbance represented by the following formula ($A_\lambda$) nm is preferably 5 or more, preferably 10 or more, more preferably 20 or more, and particularly preferably 30 or more, at a maximum absorption wavelength of 400 nm to 800 nm. If the specific absorbance is 5 or more, the colorant can be suitably used as a coloring agent.

$$E=A/(c\times l) \ldots (A_\lambda)$$

In Formula ($A_\lambda$),

E represents the specific absorbance at a maximum absorption wavelength of 400 nm to 800 nm, A represents the absorbance at a maximum absorption wavelength of 400 nm to 800 nm, l represents the cell length in a unit of cm, and c represents the concentration in a unit of mg/ml of a colorant in the solution.

The colorant according to the present invention is preferably a dye. The dye refers to a colorant having a substantial solubility in water or an organic solvent, and in particular, a dye that is soluble in an organic solvent is preferable.

Examples of the organic solvent include esters (for example, methyl 3-ethoxypropionate, ethyl 3-ethoxypropionate, ethyl lactate, butyl acetate, and methyl 3-methoxypropionate); ethers (for example, methyl cellosolve acetate, ethyl cellosolve acetate, propylene glycol monomethyl ether, and propylene glycol monomethyl ether acetate); ketones (for example, methyl ethyl ketone, cyclohexanone, 2-heptanone, and 3-heptanone); and aromatic hydrocarbons (for example, toluene and xylene). The colorant (A) is preferably soluble in the organic solvent at 1 to 50% by mass, more preferably at 5 to 40% by mass, and still more preferably at 10 to 30% by mass. Within the above range, when the coloring composition of the present invention is applied to manufacture of a color filter or the like, suitable shape of the coated surface can be obtained and a decrease in the concentration due to elution after coating a coating liquid for the other color can further be reduced.

In the coloring composition of the present invention, the colorant (A) may be used alone or in combination of two or more kinds thereof.

The content of the colorant (A) in the coloring composition of the present invention is determined after considering the content ratio with respect to the pigment and the like in which will be described later.

The mass ration of the colorant to the pigment (colorant (A)/pigment) is preferably 0.1 to 5, more preferably 0.2 to 2, and still more preferably 0.3 to 1.

The content of the colorant (A) in the coloring composition of the present invention is preferably 1.0 to 50% by mass, more preferably 5.0 to 30% by mass, and particularly preferably 10 to 25% by mass, with respect to the total solid content of the coloring composition.

In the case where the colorant structure D of the colorant (A) of the present invention is a xanthene colorant, an azo colorant, or a squarylium colorant (preferably a xanthene colorant), a red coloring agent (preferably a red pigment) or a yellow coloring agent (preferably a yellow pigment) can also be used in combination therewith to form a coloring composition. In this case, the ratio (mass ratio) of the colorant (A) of the present invention to the red coloring agent and/or yellow coloring agent is preferably 10:90 to 90:10.

<<Method for Synthesizing Colorant (A)>>

The method for synthesizing the colorant represented by General Formula (1) is not particularly limited, and the colorant represented by General Formula (1) can be synthesized by the following methods or the like.

(1) A method including subjecting a polymer in which a functional group selected from a carboxyl group, a hydroxyl group, an amino group, and the like has been introduced to a terminal and an acid halide having a colorant structure, an isocyanate having a colorant structure, or the like to a polymer reaction.

(2) A method including subjecting a polymer in which a carbon-carbon double bond has been introduced to a terminal and a mercaptan having a colorant structure to a Michael addition reaction.

(3) A method including reacting a polymer in which a carbon-carbon double bond has been introduced to a terminal with a mercaptan having a colorant structure in the presence of a radical generator.

(4) A method including reacting a polymer in which plural mercaptan groups have been introduced to a terminal with a compound having a carbon-carbon double bond and a colorant structure in the presence of a radical generator.

(5) A method including subjecting a vinyl monomer to radical polymerization in the presence of a mercaptan compound having a colorant structure.

Among these, the synthesis methods of (2) to (5) are preferable, and the synthesis methods of (3) to (5) are more preferable, from the viewpoint of ease of synthesis. In particular, in the case where the colorant (A) of the present invention has a structure of General Formula (2), synthesis using the synthesis method of (5) is most preferable from the viewpoint of ease of synthesis.

As the synthesis method of (5), more specifically, a method of a vinyl compound to radical polymerization in the presence of a compound represented by the following General Formula (3) is preferable.

$$(D\text{-}R^4\text{—}(S)_p)_n\text{—}R^3\text{—}(SH)_m \qquad (3)$$

In General Formula (3), $R^3$ represents an (m+n)-valent linking group, D represents a colorant structure, $R^4$ represents a single bond or a divalent linking group, S represents a sulfur atom, SH represents a thiol group, m represents an integer of 1 to 13, n represents an integer of 2 to 14, in the case where n is 2 or more, a plurality of D's may be the same as or different from each other, m+n represents an integer of 2 to 15, and p represents 0 or 1.

In General Formula (3), D, $R^3$, $R^4$, m, and n each have the same definitions as D, $R^3$, $R^4$, m, and n in General Formula (2), and preferred aspects thereof are also the same.

The compound represented by General Formula (3) can be synthesized by the following methods or the like, and from the viewpoint of ease of synthesis, the following (7) method is more preferable.

(6) A method including converting a halide compound having a colorant structure into a mercaptan compound (such as a method including performing a reaction with thiourea, followed by hydrolysis, a method including performing a direct reaction with NaSH, and a method including performing a reaction with $CH_3COSNa$, followed by hydrolysis).

(7) A method including subjecting a compound having 2 to 15 mercapto groups in one molecule and a compound having a functional group capable of reacting with a mercapto group, followed by an addition reaction.

In (7) above, suitable examples of the "functional group capable of reacting with a mercapto group" include an acid halide, an alkyl halide, an isocyanate, and a carbon-carbon double bond.

It is particularly preferable that the "functional group capable of reacting with a mercapto group" is a carbon-carbon double bond and the addition reaction is a radical addition reaction. In addition, it is more preferable that the carbon-carbon double bond is a monosubstituted or disubstituted vinyl group from the viewpoint of the reactivity with a mercapto group.

Specific examples of the compound having 2 to 15 mercapto groups in one molecule include the following compounds.

(S-1)

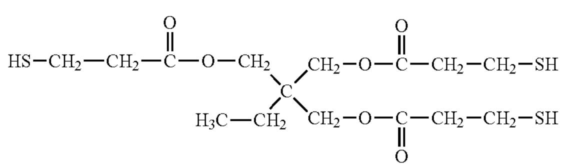

(S-2)

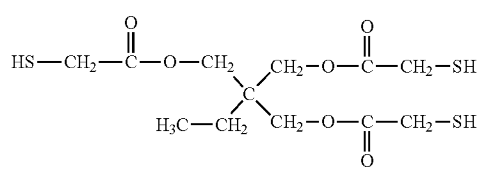

(S-3)

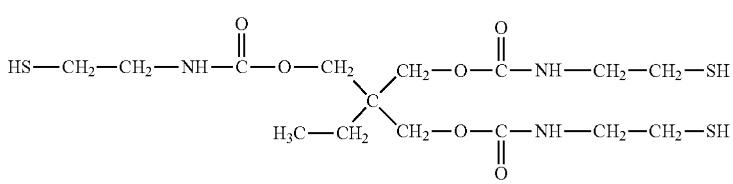

(S-4)

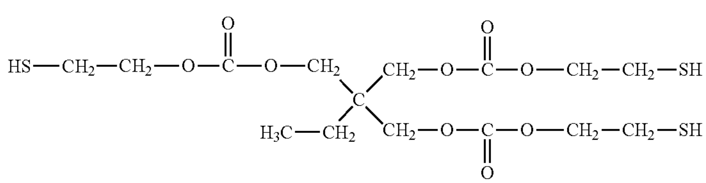

(S-5)

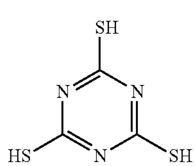

(S-6)

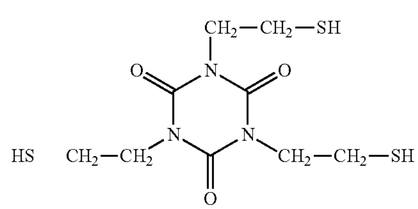

-continued
(S-7)
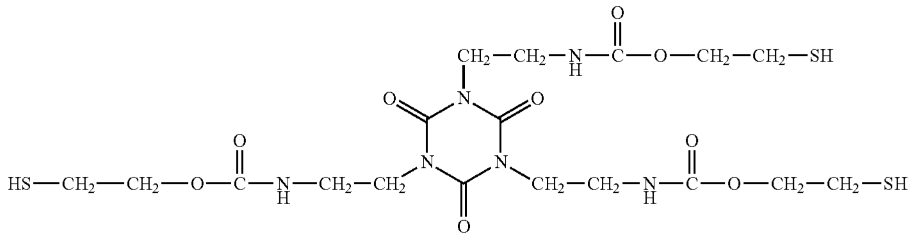
(S-8)
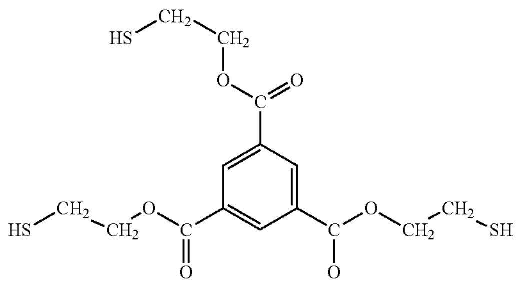
(S-9)
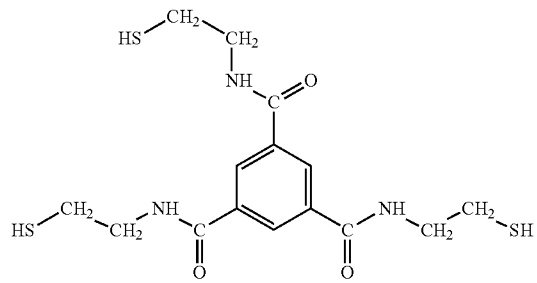
(S-10)
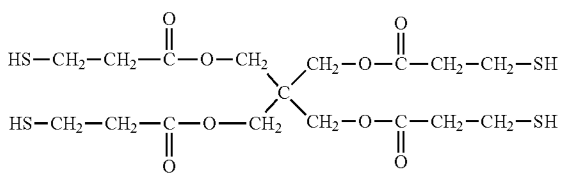
(S-11)
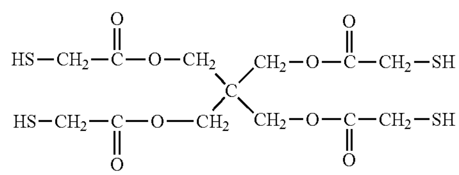
(S-12)
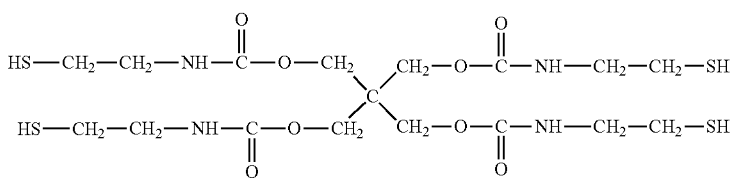
(S-13)
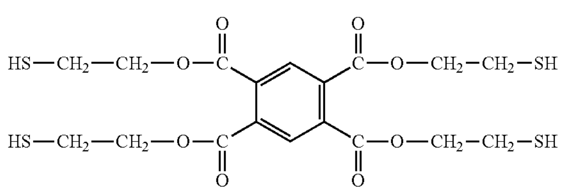
(S-14)
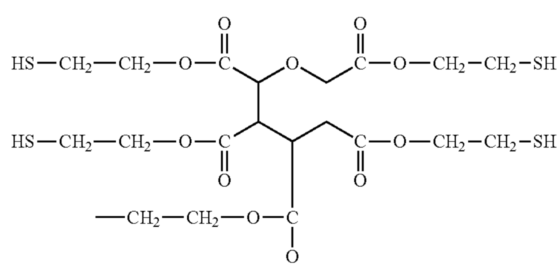
(S-15)
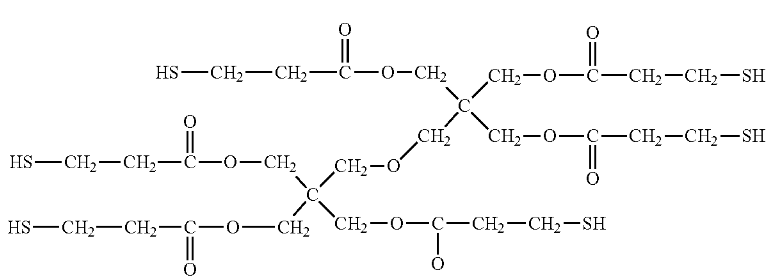

-continued
(S-16)
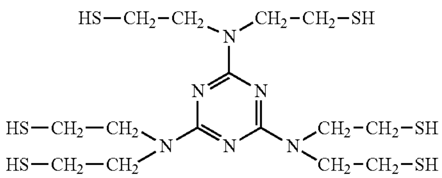
(S-17)
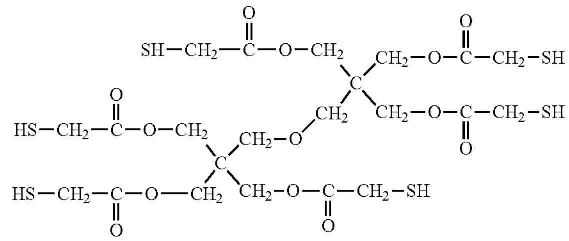
(S-18)
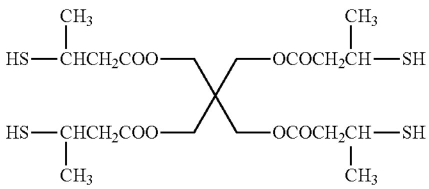
(S-19)
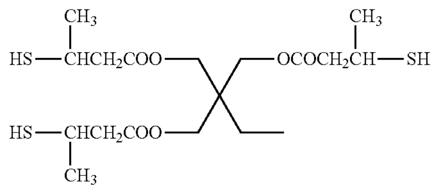
(S-20)
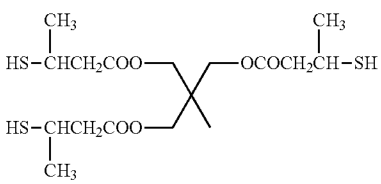
(S-21)
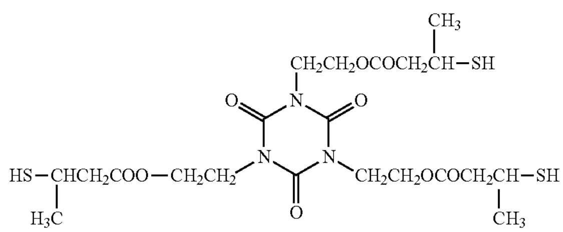
(S-22)
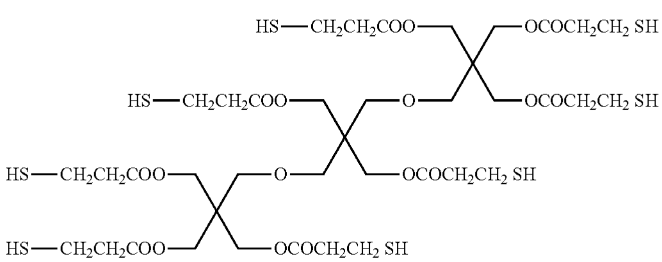
(S-23)
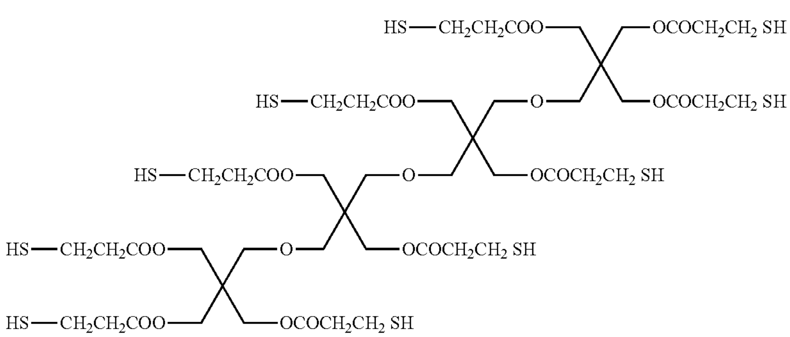

-continued
(S-24)
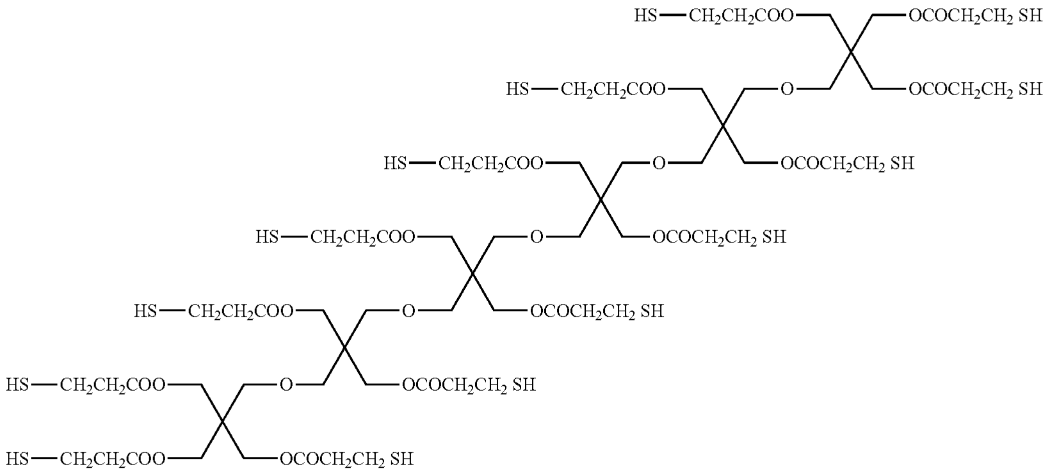
(S-25)
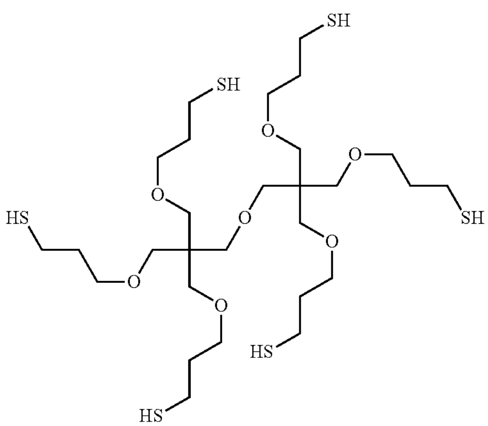
(S-26)
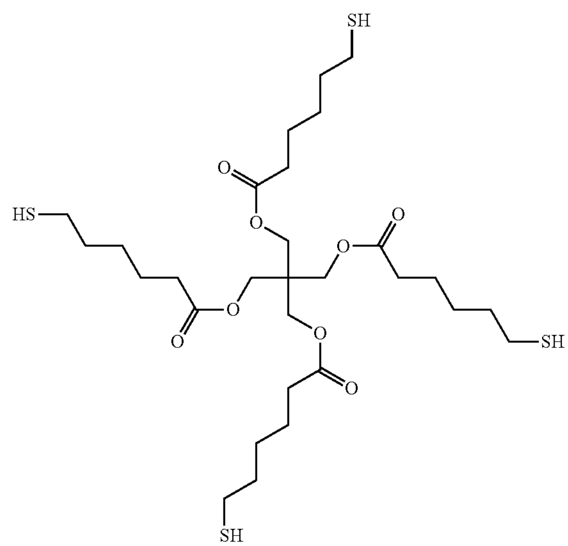
(S-27)
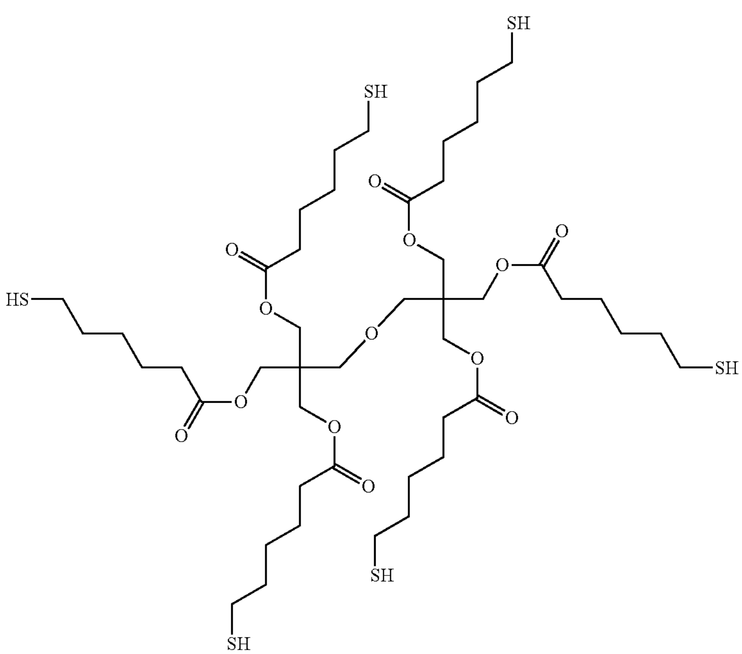

-continued (S-28)

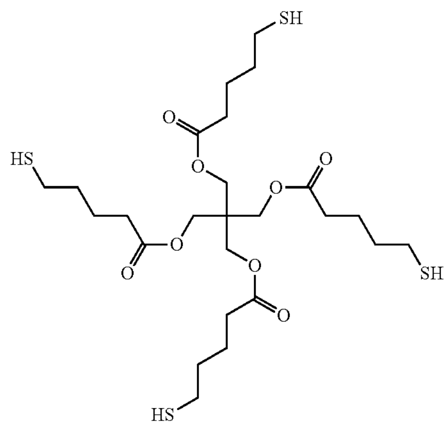

(S-29)

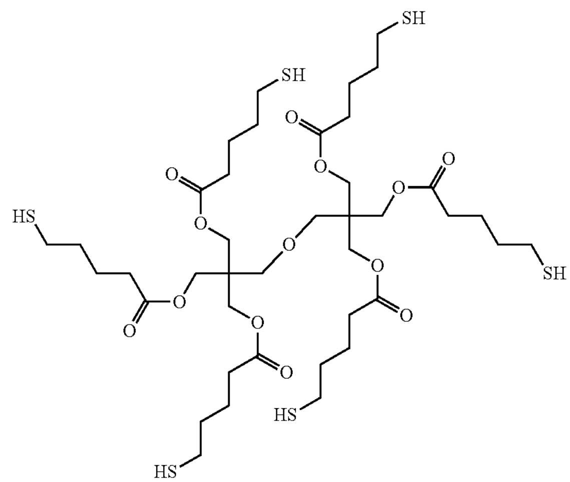

(S-30)

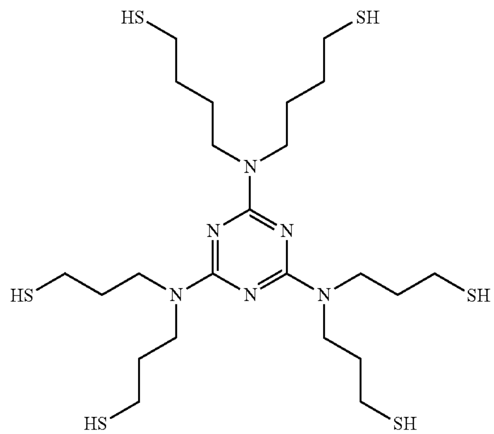

(S-31)

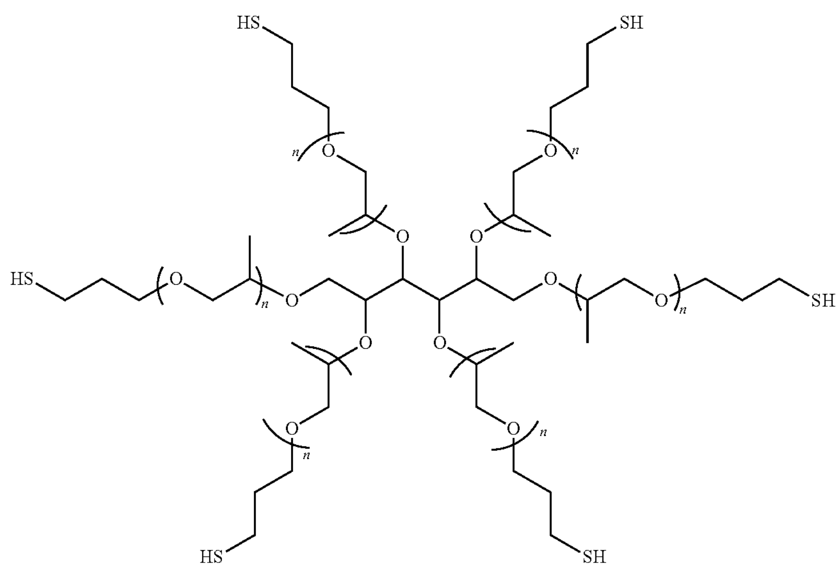

Among those, from the viewpoints of availability of raw materials, ease of synthesis, and solubility in various solvents, the compounds of (S-1), (S-2), (S-10), (S-11), (S-16) to (S-21), and (S-26) to (S-29) are particularly preferable.

The radical addition reaction product of the "compound having 2 to 15 mercapto groups in one molecule" and the "compound having a colorant structure and a functional group capable of reacting with a mercapto group" is obtained using, for example, a method including dissolving the "compound having 2 to 15 mercapto groups in one molecule" and the "compound having a colorant structure and a functional group capable of reacting with a mercapto group" in a suitable solvent, adding a radical generator thereto, and allowing the addition to proceed at about 50° C. to 100° C. (thiol-ene reaction method).

Examples of the suitable solvent used in the thiol-ene reaction method can be arbitrarily selected in accordance with the solubility of the "compound having 2 to 15 mercapto groups in one molecule" and the "compound having a colorant structure and a functional group capable of reacting with a mercapto group" to be used, and the solubility of the "radical addition reaction product to be produced."

Examples thereof include methanol, ethanol, propanol, isopropanol, 1-methoxy-2-propanol, 1-methoxy-2-propyl acetate, acetone, methyl ethyl ketone, methyl isobutyl ketone, methoxypropyl acetate, ethyl lactate, ethyl acetate, acetonitrile, tetrahydrofuran, dimethylformamide, chloroform, and toluene. These solvents may be used as a mixture of two or more kinds thereof.

In addition, as the radical generator, it is possible to use an azo compound such as 2,2'-azobis(isobutyronitrile) (AIBN), 2,2'-azobis-(2,4'-dimethylvaleronitrile) and dimethyl 2,2'-azobisisobutyrate, a peroxide such as benzoyl peroxide, and a persulfate such as potassium persulfate and ammonium persulfate.

The vinyl compound to be used in the synthesis method (5) is not particularly limited, and for example, the same vinyl compounds as those used for obtaining the polymer skeleton represented by P in General Formula (1) are used.

Only one kind of the vinyl compounds may be polymerized, or a combination of two or more kinds of the vinyl compounds may be copolymerized.

In addition, in the case where the polymer compound is applied to a photocurable composition requiring an alkali development treatment, it is more preferable to copolymerize one or more kinds of vinyl compounds having an acidic group and with one or more kinds of vinyl compounds having no acidic group.

The colorant (A) of the present invention is preferably obtained by carrying out polymerization using such the vinyl compound(s) and a compound represented by General Formula (3) by a known method according to an ordinary procedure. In addition, the compound represented by General Formula (3) is a compound that functions as a chain transfer agent, and thus the compound is also hereinafter simply referred to as a "chain transfer agent" in some cases.

The polymer compound is obtained, for example, using a method including dissolving such a vinyl monomer and the chain transfer agent in an appropriate solvent, adding a radical polymerization initiator thereto, and performing polymerization at about 50° C. to 220° C. in a solution (solution polymerization method).

Examples of the appropriate solvent for use in the solution polymerization method include methanol, ethanol, propanol, isopropanol, 1-methoxy-2-propanol, 1-methoxy-2-propyl acetate, acetone, methyl ethyl ketone, methyl isobutyl ketone, methoxypropyl acetate, ethyl lactate, ethyl acetate, acetonitrile, tetrahydrofuran, dimethylformamide, chloroform, and toluene. These solvents may be used as a mixture of two or more kinds thereof.

Moreover, as the radical polymerization initiator, an azo compound such as 2,2'-azobis(isobutyronitrile) (AIBN), 2,2'-azobis-(2,4'-dimethylvaleronitrile) and dimethyl 2,2'-azobisisobutyrate, a peroxide such as benzoyl peroxide, a persulfate such as potassium persulfate and ammonium persulfate, or the like can be used.

<<Curable Compound>>

<<<Polymerizable Compound>>>

The coloring composition of the present invention contains a curable compound. As the curable compound, known polymerizable compounds which can be crosslinked by a radical, an acid, or heat can be used. Examples thereof include polymerizable compounds including an ethylenically unsaturated bond, a cyclic ether (epoxy or oxetane), methylol, or the like. From the viewpoint of sensitivity, the polymerizable compound is suitably selected from compounds having at least one, and preferably two or more ethylenically unsaturated terminal bonds. Among these, polyfunctional polymerizable compounds having 4 or more functional groups are preferable, and polyfunctional polymerizable compounds having 5 or more functional groups are more preferable.

Such compound groups are widely known and can be used in the present invention without particular limitation. These may be in any type of chemical forms such as a monomer, a prepolymer, that is, a dimer, a trimer, an oligomer, a mixture thereof, and a multimer thereof. The polymerizable compound in the present invention may be used alone or in combination of two or more kinds thereof.

Examples of the monomer and prepolymer include unsaturated carboxylic acids (for example, acrylic acid, methacrylic acid, itaconic acid, crotonic acid, isocrotonic acid, and maleic acid) or esters thereof, amides, and multimers of these, and among these, an ester of unsaturated carboxylic acid and an aliphatic polyhydric alcohol compound, amides of unsaturated carboxylic acid and an aliphatic polyamine compound, and multimers of these are preferable. Moreover, products of an addition reaction between unsaturated carboxylic acid esters or amides having nucleophilic substituent such as a hydroxyl group, an amino group, and a mercapto group and monofunctional or polyfunctional isocyanates or epoxies, products of a dehydration condensation reaction between the unsaturated carboxylic acid esters or amides and a monofunctional or polyfunctional carboxylic acid, and the like are also suitably used. In addition, products of an addition reaction between unsaturated carboxylic acid esters or amides having an electrophilic substituent such as an isocyanate group and an epoxy group and monofunctional or polyfunctional alcohols, amines, or thiols, and products of a substitution reaction between unsaturated carboxylic acid esters or amides having an eliminatable substituent such as a halogen group and a tosyloxy group, and monofunctional or polyfunctional alcohols, amines, or thiols are also suitable. As other examples, instead of the above unsaturated carboxylic acid, vinyl benzene derivatives of unsaturated phosphonic acid, styrene, and the like and compound groups substituted with vinyl ether, allyl ether, or the like can also be used.

As these specific compounds, the compounds described in paragraph Nos. [0095] to [0108] of JP2009-288705A can also be suitably used in the present invention.

Furthermore, as the polymerizable compound, compounds having ethylenically unsaturated groups having a boiling point of 100° C. or higher at a normal pressure, which has at least one addition-polymerizable ethylene group, are also preferable. For examples thereof, reference can be made of, for example, paragraphs 0227 of JP2013-29760A, the contents of which are incorporated herein by reference.

Furthermore, for the compounds having ethylenically unsaturated groups that have a boiling point of 100° C. or higher at a normal pressure and have at least one addition-polymerizable ethylene group, reference can be made of, for example, paragraphs Nos. 0254 to 0257 of JP2008-292970A, the contents of which are incorporated herein by reference.

Among those, as the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E; manufactured by Shin-Nakamura Kayaku Co., Ltd.), and a structure in which ethylene glycol or a propylene glycol residue is interposed between these (meth)acryloyl groups (for example, SR454 and SR499, manufactured by Sartomer Company Inc.) are preferable. Oligomer types of these can also be used. Preferred aspects of the polymerizable compound are shown below.

Polymerizable compounds may also have an acid group such as a carboxyl group, a sulfonic acid group, and a phosphoric acid group as a polyfunctional monomer. If the polymerizable compound has an unreacted carboxyl group, this compound can be used as is, but if desired, a hydroxyl group of the polymerizable compound may be reacted with a non-aromatic carboxylic acid anhydride so as to introduce an acid group. In this case, specific examples of the non-aromatic carboxylic acid anhydride used include tetrahydrophthalic acid anhydride, alkylated tetrahydrophthalic acid anhydride, hexahydrophthalic acid anhydride, alkylated hexahydrophthalic acid anhydride, succinic acid anhydride, and maleic acid anhydride.

As a polymerizable compound having an acid group, an ester of an aliphatic polyhydroxy compound and an unsaturated carboxylic acid is preferable, and a polymerizable compound which is provided with an acid group by reacting an unreacted hydroxyl group of the aliphatic polyhydroxy compound with a non-aromatic carboxylic acid anhydride is also preferable. Further, it is particularly preferable that the aliphatic polyhydroxy compound in the ester is pentaerythritol and/or dipentaerythritol. Examples of commercially available products thereof include M-510 and M-520, which are polybasic acid-modified acryl oligomers manufactured by TOAGOSEI, CO., LTD.

The polymerizable compound having an acid group may be used alone, but since it is difficult to use a single compound in terms of production, a mixture of two or more kinds of monomers may also be used.

The acid value of the polymerizable compound having an acid group is preferably 0.1 mg KOH/g to 40 mg KOH/g, and particularly preferably 5 mg KOH/g to 30 mg KOH/g. If the acid value of the polyfunctional monomer is 0.1 mgKOH/g or more, the development solubility characteristics is good, and the acid value of 40 mgKOH/g or less is advantageous in terms of production. Further, the photopolymerization performance is good and curability such as surface smoothness of pixels is excellent. Therefore, in the case where a combination of two or more kinds of polymerizable compounds having different acid groups is used, or in the case where a combination of polymerizable compounds having no acid group is used, it is preferable that the acid group of all the polymerizable compound is adjusted to fall within the above range.

Moreover, in another preferred aspect, a polymerizable compound having a caprolactone structure is contained as such other polymerizable compound.

The polymerizable compound having a caprolactone structure is not particularly limited as long as it has a caprolactone structure within a molecule, and examples thereof include ε-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ε-caprolactone. Among these, a polymerizable compound having a caprolactone structure represented by the following General Formula (Z-1) is preferable.

(Z-1)

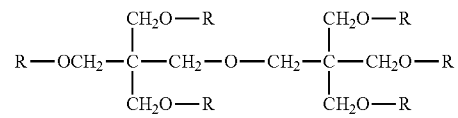

In General Formula (Z-1), all of six R's are a group represented by the following General Formula (Z-2), or one to five of six R's is/are a group represented by the following General Formula (Z-2) and the rest thereof is/are a group represented by the following General Formula (Z-3).

(Z-2)

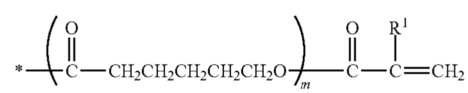

In General Formula (Z-2), $R^1$ represents a hydrogen atom or a methyl group, m represents 1 or 2, and "*" represents a bonding arm.

(Z-3)

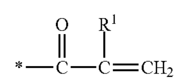

In General Formula (Z-3), $R^1$ represents a hydrogen atom or a methyl group, and "*" represents a bonding arm.

The polymerizable compound having a caprolactone structure is commercially available from Nippon Kayaku Co., Ltd., as a KAYARAD DPCA series, and examples thereof include DPCA-20 (a compound in which m is 1, the number of the group represented by Formula (Z-2) is 2, and all of $R^1$'s are hydrogen atoms in Formulae (Z-1) to (Z-3)), DPCA-30 (a compound in which m is 1, the number of the group represented by Formula (Z-2) is 3, and all of $R^1$'s are hydrogen atoms in Formulae (Z-1) to (Z-3)), DPCA-60 (a compound in which m is 1, the number of the group represented by Formula (Z-2) is 6, and all of $R^1$'s are hydrogen atoms in Formulae (Z-1) to (Z-3)), and DPCA-120 (a compound in which m is 2, the number of the group represented by Formula (2) is 6, and all of $R^1$'s are hydrogen atoms in Formulae (Z-1) to (Z-3)).

In the present invention, the polymerizable compound having a caprolactone structure can be used alone or as a mixture of two or more kinds thereof.

Moreover, the other polymerizable compound can use a compound represented by the following General Formula (Z-4) or (Z-5).

(Z-4)

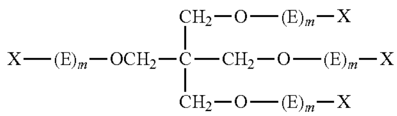

(Z-5)

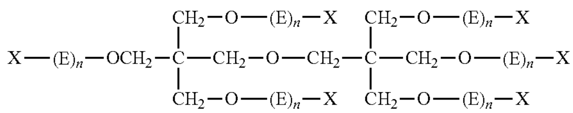

In General Formulae (Z-4) and (Z-5), E's each independently represent —($(CH_2)_yCH_2O$)— or —($(CH_2)_yCH(CH_3)O$)—, y's each independently represent an integer of 0 to 10, and X's each independently represent an acryloyl group, a methacryloyl group, a hydrogen atom, or a carboxyl group.

In General Formula (Z-4), the sum of the acryloyl group and the methacryloyl group is 3 or 4, m's each independently represent an integer of 0 to 10, and the sum of the respective m's is an integer of 0 to 40. Here, in the case where the sum of the respective m's is 0, any one of X's is a carboxyl group.

In General Formula (Z-5), the sum of the acryloyl group and the methacryloyl group is 5 or 6, n's each independently represent an integer of 0 to 10, and the sum of the respective n's is an integer of 0 to 60. Herein, in the case where the sum of the respective n's is 0, one of X's is a carboxyl group.

In General Formula (Z-4), m is preferably an integer of 0 to 6, and more preferably an integer of 0 to 4.

Further, the sum of the respective m's is preferably an integer of 2 to 40, more preferably an integer of 2 to 16, and particularly preferably an integer of 4 to 8.

In General Formula (Z-5), n is preferably an integer of 0 to 6, and more preferably an integer of 0 to 4.

Further, the sum of the respective n's is preferably an integer of 3 to 60, more preferably an integer of 3 to 24, and particularly preferably an integer of 6 to 12.

In addition, —($(CH_2)_yCH_2O$)— or —($(CH_2)_yCH(CH_3)O$)— in General Formula (Z-4) or (Z-5) is preferably in the form in which the terminal at an oxygen atom side binds to X.

The compound represented by General Formula (Z-4) or (Z-5) may be used alone or in combination of two or more kinds thereof. In particular, a form in which all of six X's in General Formula (Z-5) are acryloyl groups is preferable.

Moreover, the total content of the compound represented by General Formula (Z-4) or (Z-5) in the polymerizable compound is preferably 20% by mass or more, and more preferably 50% by mass or more.

The compound represented by General Formula (Z-4) or (Z-5) can be synthesized by steps known in the related art, which includes a step of binding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, a person skilled in the art can easily synthesize the compound represented by General Formula (Z-4) or (Z-5).

Among the compounds represented by General Formula (Z-4) or (Z-5), a pentaerythritol derivative and/or a dipentaerythritol derivative is/are more preferable.

Specific examples of the compounds include compounds represented by the following Formulae (a) to (f) (hereinafter also referred to as "exemplary compounds (a) to (f)"). Among these, the exemplary compounds (a), (b), (e), and (f) are preferable.

(a)

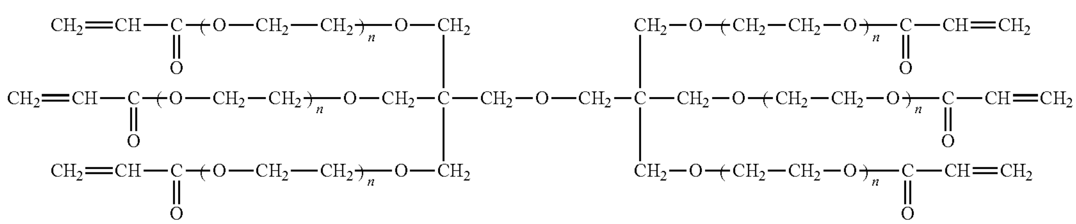

(the sum of the respective n's is 6)

(b)

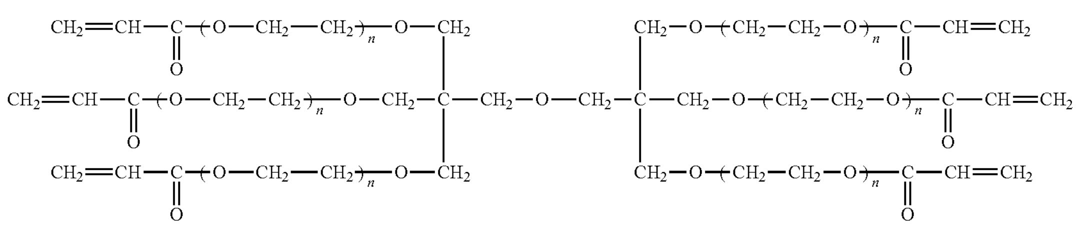

(the sum of the respective n's is 12)

-continued (c)

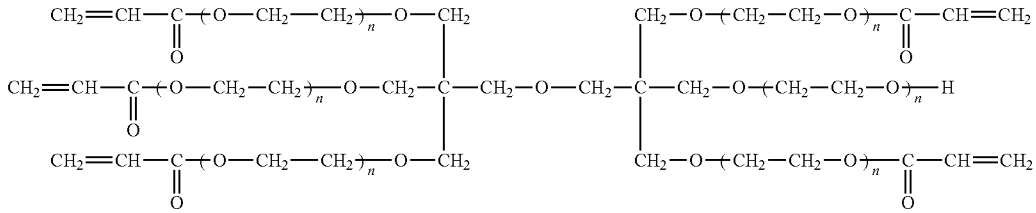

(the sum of the respective n's is 12)

(d)

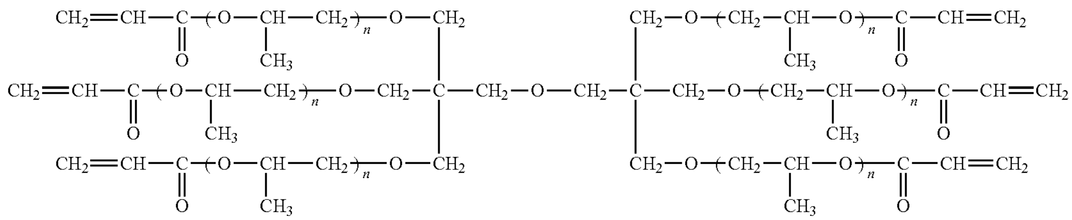

(the sum of the respective n's is 6)

(e)

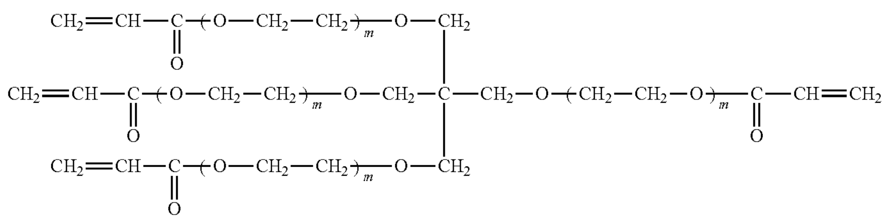

(the sum of the respective m's is 4)

(f)

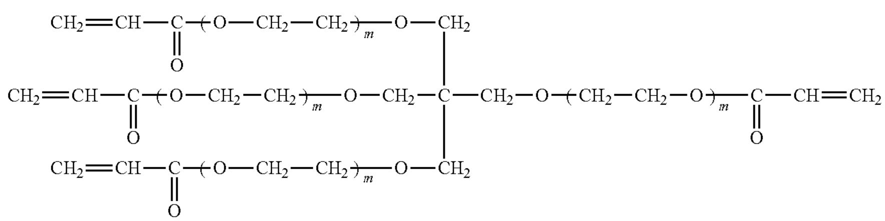

(the sum of the respective m's is 12)

Examples of commercially available products of the polymerizable compounds represented by General Formulae (Z-4) and (Z-5) include SR-494 which is a tetrafunctional acrylate having four ethyleneoxy chains, manufactured by Sartomer Company Inc., and DPCA-60 which is a hexafunctional acrylate having six pentyleneoxy chains, and TPA-330 which is a trifunctional acrylate having three isobutyleneoxy chains, manufactured by Nippon Kayaku Co., Ltd.

Moreover, in the present invention, a compound having an epoxy group can also be preferably used as the polymerizable compound. As the compound having an epoxy group, one having two or more epoxy groups within one molecule is preferable. By using the compound having two or more epoxy groups within one molecule, the effects of the present invention can be more effectively accomplished. The number of the epoxy groups within one molecule is preferably 2 to 10, more preferably 2 to 5, and particularly preferably 3.

In the present invention, as the compound having an epoxy group, one having a structure in which two benzene rings are linked via a hydrocarbon group is preferably used. As the hydrocarbon group, an alkylene group having 1 to 6 carbon atoms is preferable.

In addition, as the epoxy group, one linked via a linking group is preferably used. Examples of the linking group include groups including at least one selected from an alkylene group, an arylene group, —O—, a structure represented by —NR'— (R' represents a hydrogen atom, an alkyl group which may have a substituent, or an aryl group which may have a substituent, and preferably a hydrogen atom), $—SO_2—$, —CO—, —O—, or —S—.

The epoxy equivalents (=the molecular weight of the compound having an epoxy group/the number of epoxy groups) of the compound having an epoxy group is preferably 500 g/eq or less, more preferably 100 to 400 g/eq, and still more preferably 100 to 300 g/eq. By setting the upper limit of the epoxy equivalents of the compound having an epoxy group to 500 g/eq or less, the effects are obtained. Further, it is preferable to set the lower limit of the epoxy equivalents of the compound having an epoxy group to 100 g/eq or more in view of stability in practical use.

The compound having an epoxy group may be either a low molecular compound (for example, having a molecular weight of less than 2,000, and further, a molecular weight of less than 1,000), or a polymer compound (macromolecule) (for example, having a molecular weight of 1,000 or more, and in the case of the polymer, the weight-average molecular weight may be 1,000 or more). The weight-average molecular weight of the compound having an epoxy group is preferably 200 to 100,000, and more preferably 500 to 50,000.

As the compound having an epoxy group, which has a structure having two benzene rings linked via a hydrocarbon group, a compound represented by the following General Formula (2) is preferably used.

(2)

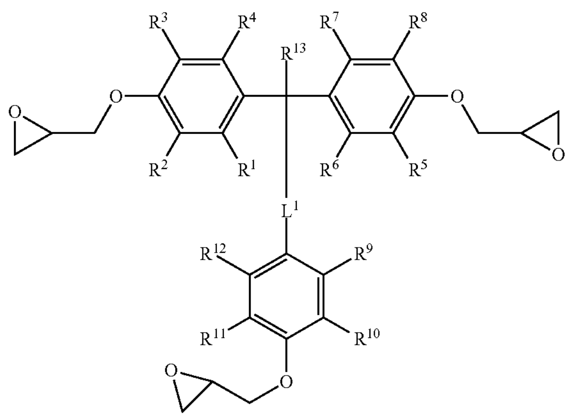

In General Formula (2), $R^1$ to $R^{13}$ each independently represent a hydrogen atom, an alkyl group, an alkoxy group, or halogen atom, and $L^1$ represents a single bond or a divalent linking group.

$R^1$ to $R^{13}$ in General Formula (2) each independently represent a hydrogen atom, an alkyl group, an alkoxy group, or a halogen atom.

As the alkyl group in $R^1$ to $R^{13}$, an alkyl group having 1 to 30 carbon atoms is preferable, and an alkyl group having 1 to 12 carbon atoms is more preferable.

The alkyl group is not limited to any one of linear, branched, and cyclic ones, but it is preferably linear or branched, and particularly preferably linear.

The alkyl group may have a substituent and may be unsubstituted, and preferably unsubstituted Examples of the substituent that the alkyl group may have include an alkyl group (preferably a linear, branched, or cyclic alkyl group having 1 to 48 carbon atoms, and more preferably a linear, branched, or cyclic alkyl group having 1 to 24 carbon atoms, for example, methyl, ethyl, propyl, isopropyl, n-butyl, tert-butyl, pentyl, hexyl, heptyl, octyl, 2-ethylhexyl, dodecyl, hexadecyl, cyclopropyl, cyclopentyl, cyclohexyl, 1-norbornyl, and 1-adamantyl), an alkenyl group (preferably an alkenyl group having 2 to 48, and more preferably an alkenyl group having 2 to 18 carbon atoms, for example, vinyl, allyl, and 3-buten-1-yl), an alkanyl group (preferably an alkanyl group having 2 to 20, more preferably an alkynyl group having 2 to 12 carbon atoms, and particularly preferably an alkynyl group having 2 to 8 carbon atoms, for example, propargyl and 3-pentynyl), an aryl group (preferably an aryl group having 6 to 48 carbon atoms, and more preferably an aryl group having 6 to 24 carbon atoms, for example, phenyl and naphthyl), a heterocyclic group (preferably a heterocyclic group having 1 to 32 carbon atoms, and more preferably a heterocyclic group having 1 to 18 carbon atoms, for example, 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), a silyl group (preferably a silyl group having 3 to 38 carbon atoms, and more preferably a silyl group having 3 to 18 carbon atoms, for example, trimethylsilyl, triethylsilyl, tributylsilyl, tert-butyldimethylsilyl, and tert-hexyldimethylsilyl), a hydroxyl group, a cyano group, a nitro group, an alkoxy group (preferably an alkoxy group having 1 to 48 carbon atoms, more preferably an alkoxy group having 1 to 24 carbon atoms, and still more preferably an alkoxy group having 1 to 3 carbon atoms, for example, methoxy, ethoxy, 1-butoxy, 2-butoxy, isopropoxy, tert-butoxy, dodecyloxy, and cycloalkyloxy group, for example, cyclopentyloxy and cyclohexyloxy), an aryloxy group (preferably an aryloxy group having 6 to 48 carbon atoms, and more preferably an aryloxy group having 6 to 24 carbon atoms, for example, phenoxy and 1-naphthoxy), a heterocyclyloxy group (preferably a heterocyclyloxy group having 1 to 32 carbon atoms, and more preferably a heterocyclyloxy group having 1 to 18 carbon atoms, for example, 1-phenyltetrazol-5-oxy and 2-tetrahydropyranyloxy), a silyloxy group (preferably a silyloxy group having 1 to 32 carbon atoms, and more preferably a silyloxy group having 1 to 18 carbon atoms, for example, trimethylsilyloxy, tert-butyldimethylsilyloxy, and diphenylmethylsilyloxy), an acyloxy group (preferably an acyloxy group having 2 to 48 carbon atoms, and more preferably an acyloxy group having 2 to 24 carbon atoms, for example, acetoxy, pivaloyloxy, 2-ethylhexanoyloxy, 2-methylpropanoyloxy, octanoyloxy group, a butanoyloxy group, 2-methylbutanoyloxy group, benzoyloxy, and dodecanoyloxy), an alkoxycarbonyloxy group (preferably an alkoxycarbonyloxy group having 2 to 48 carbon atoms, and more preferably an alkoxycarbonyloxy group having 2 to 24 carbon atoms, for example, ethoxycarbonyloxy, tert-butoxycarbonyloxy, and cycloalkyloxycarbonyloxy groups, for example, cyclohexyloxycarbonyloxy), an aryloxycarbonyloxy group (preferably an aryloxycarbonyloxy group having 7 to 32 carbon atoms, and more preferably an aryloxycarbonyloxy group having 7 to 24 carbon atoms, for example, phenoxycarbonyloxy), a carbamoyloxy group (preferably a carbamoyloxy group having 1 to 48 carbon atoms, and more preferably a carbamoyloxy group having 1 to 24 carbon atoms, for example, N,N-dimethylcarbamoyloxy, N-butylcarbamoyloxy, N-phenylcarbamoyloxy, and N-ethyl-N-phenylcarbamoyloxy), a sulfamoyloxy group (preferably a sulfamoyloxy group having 1 to 32 carbon atoms, and more preferably a sulfamoyloxy group having 1 to 24 carbon atoms, for example, N,N-diethylsulfamoyloxy and N-propylsulfamoyloxy), an alkylsulfonyloxy group (preferably an alkylsulfonyloxy group having 1 to 38 carbon atoms, and more preferably an alkylsulfonyloxy group having 1 to 24 carbon atoms, for example, methylsulfonyloxy, hexadecylsulfonyloxy, and cyclohexylsulfonyloxy), an arylsulfonyloxy group (preferably an arylsulfonyloxy group having 6 to 32 carbon atoms, and more preferably an arylsulfonyloxy group having 6 to 24 carbon atoms, for example, phenylsulfonyloxy), an acyl group (preferably an acyl group having 1 to 48 carbon atoms, and more preferably an acyl group having 1 to 24 carbon atoms, for example, formyl, acetyl, pivaloyl, benzoyl, tetradecanoyl, and cyclohexanoyl), an alkoxycarbonyl group (preferably an alkoxycarbonyl group having 2 to 48 carbon atoms, and more preferably an alkoxycarbonyl group having 2 to 24 carbon atoms, for example, methoxycarbonyl, ethoxycarbonyl, octadecyloxycarbonyl, cyclohexyloxycarbonyl, and 2,6-di-tert-butyl-4-methylcyclohexyloxycarbonyl), an aryloxycarbonyl group (preferably an aryloxycarbonyl group having 7 to 32 carbon atoms, and more preferably an aryloxycarbonyl group having 7 to 24 carbon atoms, for example, phenoxycarbonyl), a carbamoyl group (preferably a carbamoyl group having 1 to 48 carbon atoms, and more preferably a carbamoyl group having 1 to 24 carbon atoms, for example, carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl, and N,N-dicyclohexylcarbamoyl), an amino group (preferably an amino group having 32 or less carbon atoms, and more preferably an amino group having 24 or less carbon atoms, for example, amino, methylamino, N,N-dibutylamino, tetradecylamino, 2-ethylhexylamino, and cyclohexylamino), an anilino group (preferably an anilino group having 6 to 32 carbon atoms, and more preferably an anilino group having 6 to 24 carbon atoms, for example, anilino and N-methylanilino), a heterocyclic amino group (preferably a heterocyclic amino group having 1 to 32 carbon atoms, and more preferably a heterocyclic amino group having 1 to 18 carbon atoms, for example, 4-pyridylamino), a carbonamide group (preferably a carbonamide group having 2 to 48 carbon atoms, and more preferably a carbonamide group having 2 to 24 carbon atoms, for example, acetamide, benzamide, tetradecanamide, pivaloylamide, and cyclohexanamide), a ureido group (preferably a ureido group having 1 to 32 carbon atoms, and more preferably a ureido group having 1 to 24 carbon atoms, for example, ureido, N,N-dimethylureido, and N-phenylureido), an imido group (preferably an imido group having 36 or less carbon atoms, and more preferably an imido group having 24 or less carbon atoms, for example, N-succinimide and N-phthalimide), an alkoxycarbonylamino group (preferably an alkoxycarbonylamino group having 2 to 48 carbon atoms, and more preferably an alkoxycarbonylamino group having 2 to 24 carbon atoms, for example, methoxycarbonylamino, ethoxycarbonylamino, tert-butoxycarbonylamino, octadecyloxycarbonylamino, and cyclohexyloxycarbonylamino), an aryloxycarbonylamino group (preferably an aryloxycarbonylamino group having 7 to 32 carbon atoms, and more preferably an aryloxycarbonylamino group having 7 to 24 carbon atoms, for example, phenoxycarbonylamino), a sulfonamide group (preferably a sulfonamide group having 1 to 48 carbon atoms, and more preferably a sulfonamide group having 1 to 24 carbon atoms, for example, methane sulfonamide, butanesulfonamide, benzenesulfonamide, hexadecanesulfonamide, and cyclohexanesulfonamide), a sulfamoylamino group (preferably a sulfamoylamino group having 1 to 48 carbon atoms, and more preferably a sulfamoylamino group having 1 to 24 carbon atoms, for example, N,N-dipropylsulfamoylamino and N-ethyl-N-dodecylsulfamoylamino), an azo group (preferably an azo group having 1 to 32 carbon atoms, and more preferably an azo group having 1 to 24 carbon atoms, for example, phenylazo and 3-pyrazolylazo), an alkylthio group (preferably an alkylthio group having 1 to 48 carbon atoms, and more preferably an alkylthio group having 1 to 24 carbon atoms, for example, methylthio, ethylthio, octylthio, and cyclohexylthio), an arylthio group (preferably an arylthio group having 6 to 48 carbon atoms, and more preferably an arylthio group having 6 to 24 carbon atoms, for example, phenylthio), a heterocyclicthio group (preferably a heterocyclicthio group having 1 to 32 carbon atoms, and more preferably a heterocyclicthio group having 1 to 18 carbon atoms, for example, 2-benzothiazolylthio, 2-pyridylthio, and 1-phenyltetrazolylthio), an alkylsulfinyl group (preferably an alkylsulfinyl group having 1 to 32 carbon atoms, and more preferably an alkylsulfinyl group having 1 to 24 carbon atoms, for example, dodecanesulfinyl), an arylsulfinyl group (preferably an arylsulfinyl group having 6 to 32 carbon atoms, and more preferably an arylsulfinyl group having 6 to 24 carbon atoms, for example, phenylsulfinyl), an alkylsulfonyl group (preferably an alkylsulfonyl group having 1 to 48 carbon atoms, and more preferably an alkylsulfonyl group having 1 to 24 carbon atoms, for example, methylsulfonyl, ethylsulfonyl, propylsulfonyl, butylsulfonyl, isopropylsulfonyl, 2-ethylhexylsulfonyl, hexadecylsulfonyl, octylsulfonyl, and cyclohexylsulfonyl), an arylsulfonyl group (preferably an arylsulfonyl group having 6 to 48 carbon atoms, and more preferably an arylsulfonyl group having 6 to 24 carbon atoms, for example, phenylsulfonyl and 1-naphthylsulfonyl), a sulfamoyl group (preferably a sulfamoyl group having 32 or less carbon atoms, and more preferably a sulfamoyl group having 24 or less carbon atoms, for example, sulfamoyl, N,N-dipropylsulfamoyl, N-ethyl-N-dodecylsulfamoyl, N-ethyl-N-phenylsulfamoyl, and N-cyclohexylsulfamoyl), a sulfo group, a phosphonyl group (preferably a phosphonyl group having 1 to 32 carbon atoms, and more preferably a phosphonyl group having 1 to 24 carbon atoms, for example, phenoxyphosphonyl, octyloxyphosphonyl, and phenylphosphonyl), and a phosphinoylamino group (preferably a phosphinoylamino group having 1 to 32 carbon atoms, and more preferably a phosphinoylamino group having 1 to 24 carbon atoms, for example, diethoxyphosphinoylamino and dioctyloxyphosphinoylamino). These substituents may further be substituted. Further, in the case where there are two or more substituents, the substituents may be the same as or different from each other. In addition, if possible, the groups may be bonded to each other to form a ring.

As the alkoxy group in $R^1$ to $R^{13}$, an alkoxy group having 1 to 30 carbon atoms is preferable, and an alkyl group having 1 to 12 carbon atoms is particularly preferable.

The alkoxy group may have a substituent or may be unsubstituted, and is preferably unsubstituted. Specific examples of the substituent include the same ones as the substituents that the alkyl group may have.

Examples of the halogen atom in $R^1$ to $R^{13}$ include a fluorine atom, a chlorine atom, a bromine atom, and an iodine atom.

It is preferable that $R^1$ to $R^{13}$ are each independently any one of a hydrogen atom, a methyl group, an ethyl group, or a methoxy group. Further, $R^{13}$ is preferably a methyl group. In addition, $R^1$ to $R^{12}$ are preferably hydrogen atoms.

$L^1$ in General Formula (2) represents a single bond or a divalent linking group, and preferably a divalent linking group.

Examples of the divalent linking group include an alkylene group, an arylene group, —O—, a structure represented by —NR'— (R' represents a hydrogen atom, an alkyl group which may have a substituent, or an aryl group which may have a substituent, and is preferably a hydrogen atom), and a group including at least one selected from $—SO_2—$, —CO—, —O—, or —S—. These may have a substituent. Examples of the substituent include the same substituents as those described as the substituent which the alkyl group in $R^1$ to $R^{13}$ may have.

The alkylene group preferably has 1 to 30 carbon atoms, and more preferably has 1 to 12 carbon atoms.

The arylene group preferably has 6 to 30 carbon atoms, and more preferably has 6 to 12 carbon atoms.

The compound represented by General Formula (2) is more preferably a compound represented by the following General Formula (2a).

(2a)

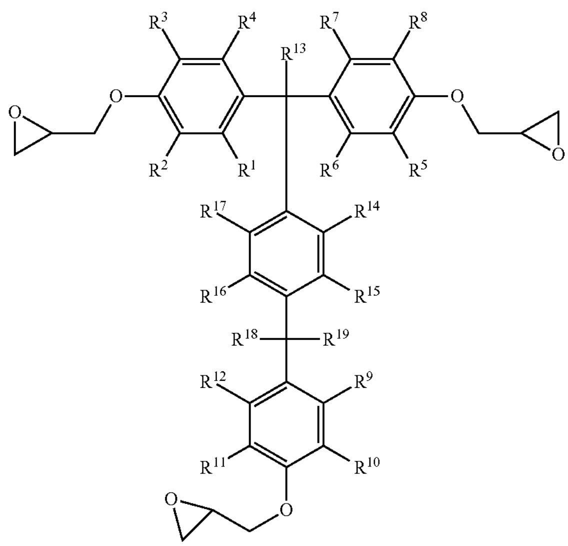

In General Formula (2a), $R^1$ to $R^{19}$ each independently represent a hydrogen atom, an alkyl group, an alkoxy group, or a halogen atom.

$R^1$ to $R^{19}$ in General Formula (2a) have the same definitions as $R^1$ to $R^{13}$ in General Formula (2).

In particular, it is preferable that $R^1$ to $R^{19}$ are each independently preferably any one of a hydrogen atom, a methyl group, an ethyl group, or a methoxy group. Further, it is more preferable that one or more selected from $R^{13}$, $R^{18}$, and $R^{19}$ are a methyl group. It is more preferable that $R^{13}$, $R^{18}$, and $R^{19}$ are a methyl group, and $R^1$ to $R^{12}$, $R^{14}$ to $R^{17}$ are a hydrogen atom.

Examples of the compound represented by General Formula (2a) include compounds obtained as a main component by the reaction of a phenol resin that has been obtained by the reaction of 1-[4-(1-hydroxy-1-methyl-ethyl)-phenyl] ethanone with phenols (unsubstituted phenols, or phenols having an alkyl group having 1 to 12 carbon atoms, an alkoxy group having 1 to 12 carbon atoms, or a halogen atom as a substituent) with epihalohydrin (at least one selected from epichlorohydrin or epibromohydrin). Examples of the commercially available product thereof include VG-3101L manufactured by Printec Corporation, and NC-6000 and NC-6300, both manufactured by Nippon Kayaku Co., Ltd.

As the compound having an epoxy group, for example, a compound represented by the following General Formula (EP1) can be used.

(EP1)

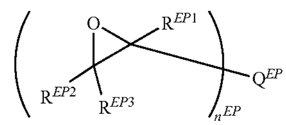

In Formula (EP1), $R^{EP1}$ to $R^{EP3}$ each represent a hydrogen atom, a halogen atom, or an alkyl group, in which the alkyl group may have a cyclic structure or may have a substituent. $R^{EP1}$ and $R^{EP2}$, or $R^{EP2}$ and $R^{EP3}$ may be bonded with each other to form a cyclic structure. Examples of the substituent which may be contained in the alkyl group include a hydroxyl group, a cyano group, an alkoxy group, an alkylcarbonyl group, an alkoxycarbonyl group, an alkylcarbonyloxy group, an alkylthio group, an alkylsulfone group, an alkylsulfonyl group, an alkylamino group, and an alkylamide group.

$Q^{EP}$ represents a single bond or an $n^{EP}$-valent organic group. $R^{EP1}$ to $R^{EP3}$ may also be bonded to $Q^{EP}$ to form a cyclic structure.

$n^{EP}$ represents an integer of 2 or more, preferably 2 to 10, and more preferably 2 to 6. Incidentally, in the case where $Q^{EP}$ is a single bond, $n^{EP}$ is 2.

In the case where $Q^{EP}$ is an $n^{EP}$-valent organic group, it is preferably a chained or cyclic $n^{EP}$-valent saturated hydrocarbon group (preferably having 2 to 20 carbon atoms); an $n^{EP}$-valent aromatic ring group (preferably having 6 to 30 carbon atoms); and an $n^{EP}$-valent organic group having a structure in which chained or cyclic saturated hydrocarbon or aromatic hydrocarbon is linked to a divalent linking group such as an ether group, an ester group, an amide group, a sulfonamide group, and an alkylene group (preferably having 1 to 4 carbon atoms, and more preferably a methylene group) linked to a trivalent linking group such as —N(−)$_2$ or linked to any combination of these groups.

Specific examples thereof are shown below, but the present invention is not limited thereto.

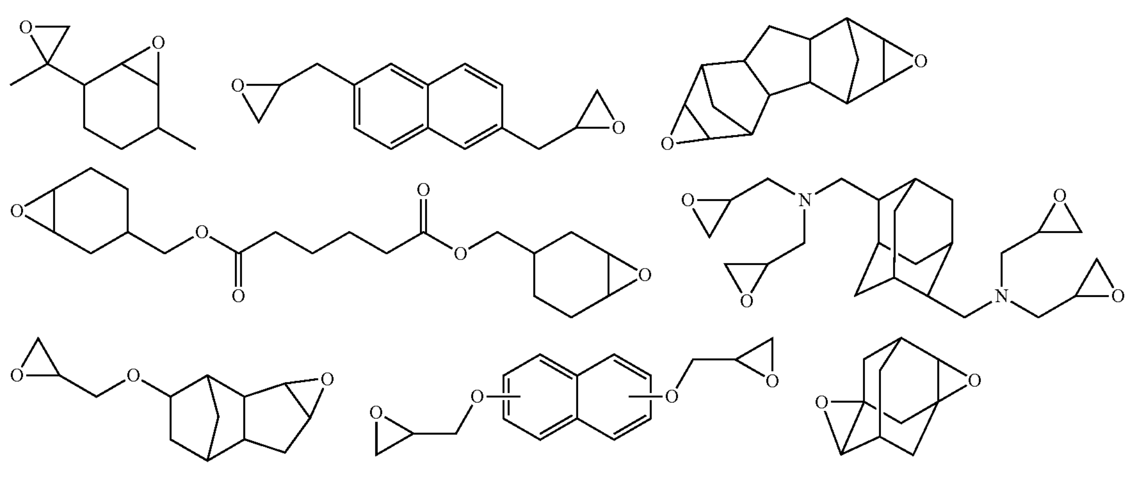

-continued
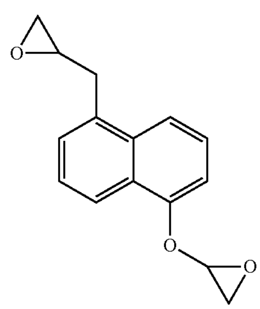
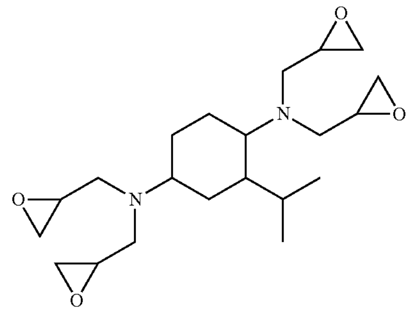
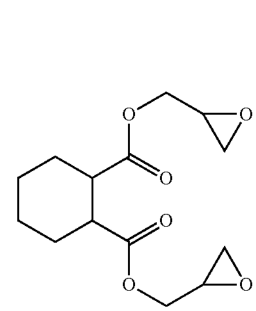
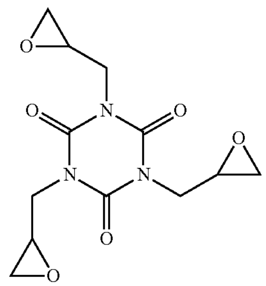
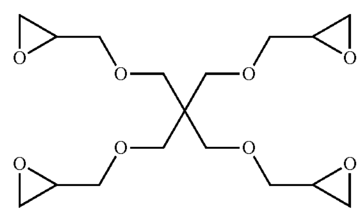
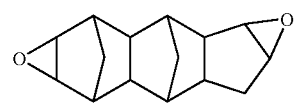
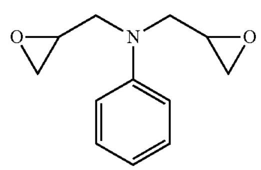
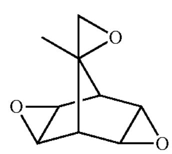
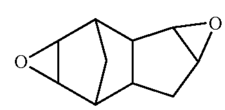
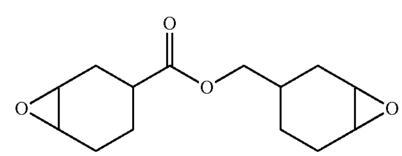
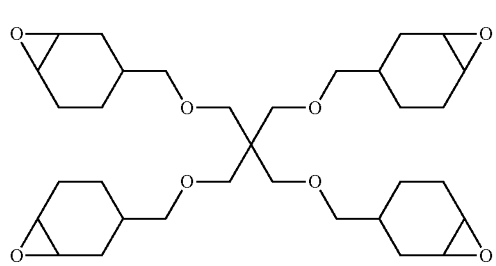
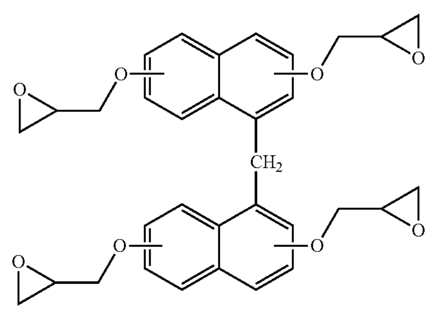
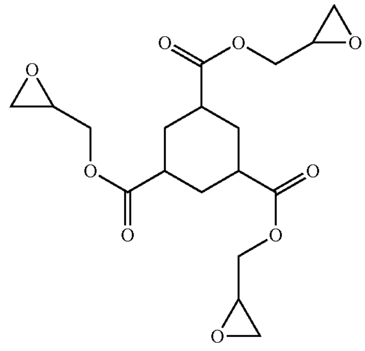

-continued
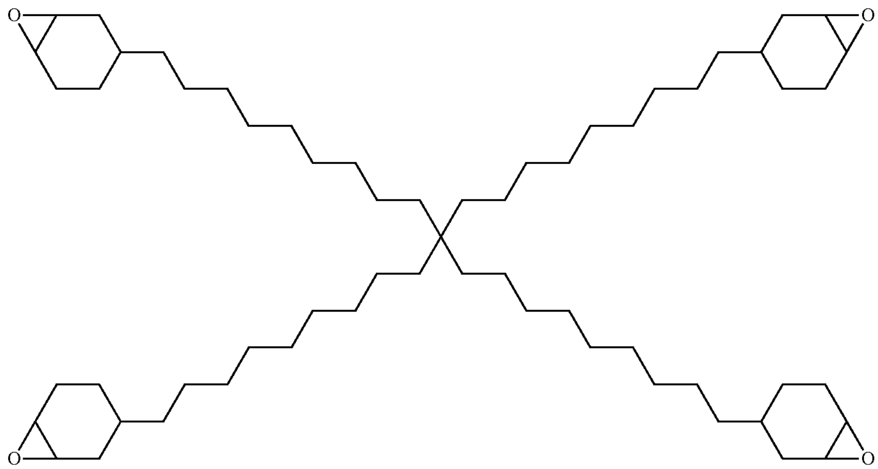
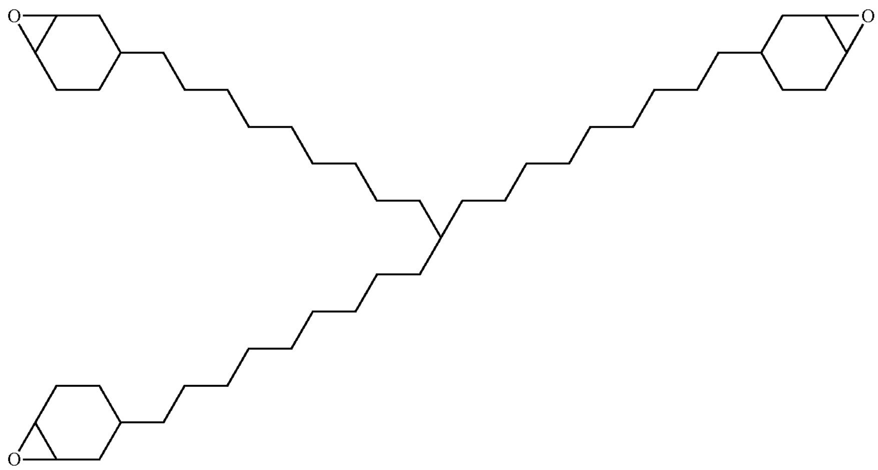
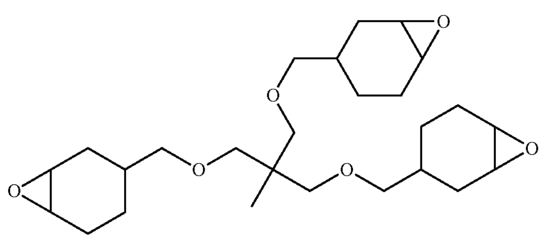
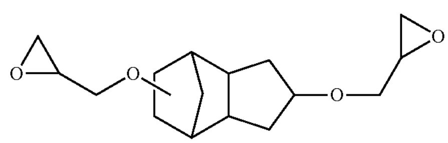
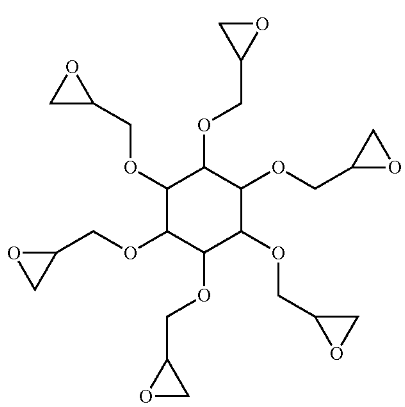
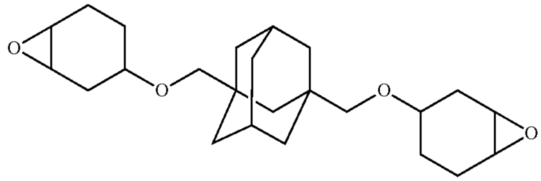

-continued

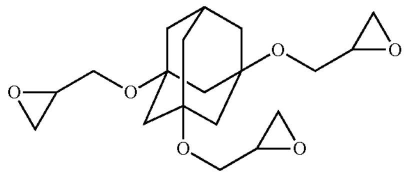

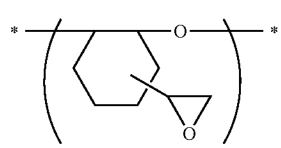

An oligomer or a polymer, having an epoxy group in the side chain, can also be preferably used as the compound having an epoxy group. Examples of such a compound include a bisphenol A type epoxy resin, a bisphenol F type epoxy resin, a phenol novolac type epoxy resin, a cresol novolac type epoxy resin, and an aliphatic epoxy resin.

As these compounds, commercially available products may be used or the compounds may also be obtained by introducing an epoxy group into the side chain of a polymer.

As the commercially available product, examples of the bisphenol A epoxy resin include JER827, JER828, JER834, JER1001, JER1002, JER1003, JER1055, JER1007, JER1009, and JER1010 (all manufactured by Japan Epoxy Resin Co., Ltd.), EPICLON860, EPICLON1050, EPICLON1051, and EPICLON1055 (all manufactured by DIC Corporation); examples of the bisphenol F epoxy resin include JER806, JER807, JER4004, JER4005, JER4007, and JER4010 (all manufactured by Japan Epoxy Resin Co., Ltd.), EPICLON830 and EPICLON835 (all manufactured by DIC Corporation), LCE-21 and RE-602S (all manufactured by Nippon Kayaku Co., Ltd.); examples of the phenol novolac type epoxy resin include JER152, JER154, JER157S70, and JER157S65 (all manufactured by Japan Epoxy Resin Co., Ltd.), EPICLON N-740, EPICLON N-770, and EPICLON N-775 (all manufactured by DIC Corporation); examples of the cresol novolac type epoxy resin include EPICLON N-660, EPICLON N-665, EPICLON N-670, EPICLON N-673, EPICLON N-680, EPICLON N-690, and EPICLON N-695 (all manufactured by DIC Corporation), EOCN-1020 (manufactured by Nippon Kayaku Co., Ltd.); and examples of the aliphatic epoxy resin include ADEKA RESIN EP-4080S, ADEKA RESIN EP-4085S, and ADEKA RESIN EP-4088S (all manufactured by ADEKA Corporation), CELLOXIDE 2021P, CELLOXIDE 2081, CELLOXIDE 2083, CELLOXIDE 2085, EHPE 3150, EPOLEAD PB 3600, and EPOLEAD PB 4700 (all manufactured by Daicel Corporation), DENACOL EX-212L, EX-214L, EX-216L, EX-321L, and EX-850L (all manufactured by Nagase ChemteX Corporation). Other examples include ADEKA RESIN EP-4000S, ADEKA RESIN EP-4003S, ADEKA RESIN EP-4010S, and ADEKA RESIN EP-4011S (all manufactured by ADEKA Corporation), NC-2000, NC-3000, NC-7300, XD-1000, EPPN-501, and EPPN-502 (all manufactured by ADEKA Corporation), and JER1031S (manufactured by Japan Epoxy Resin Co., Ltd.).

Furthermore, as the commercially available product of the compound having an epoxy group, JER1031S (manufactured by Mitsubishi Chemical Corporation), JER1032H60 (manufactured by Mitsubishi Chemical Corporation), EPICLON HP-4700 (manufactured by DIC Corporation), EPICLON N-695 (manufactured by DIC Corporation), EPICLON 840 (manufactured by DIC Corporation), EPICLON N660 (manufactured by DIC Corporation), EPICLON HP7200 (manufactured by DIC Corporation), or the like can also be preferably used.

In the case where an epoxy group is introduced into a polymer side chain to synthesize a compound having an epoxy group, the introduction reaction can be carried out, by using tertiary amines such as such as triethylamine and benzylmethylamine, quaternary ammonium salts such as dodecyl trimethyl ammonium chloride, tetramethylammonium chloride, and tetraethylammonium chloride, or pyridine as a catalyst, an organic solvent and triphenylphosphine or the like as a catalyst, and dissolving it in an organic solvent for one to several tens hours at a reaction temperature of 50° C. to 150° C. The amount of the alicyclic epoxy unsaturated compound to be introduced is preferably controlled to such a range that the acid value of the obtained polymer is in a range of 5 to 200 KOH·mg/g.

As the epoxy unsaturated compound, the compounds having a glycidyl group as an epoxy group, such as glycidyl (meth)acrylate and allylglycidyl ether, can be used, but an unsaturated compound having an alicyclic epoxy group is preferable. Examples of such the compound include the following compounds.

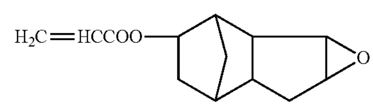

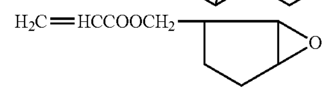

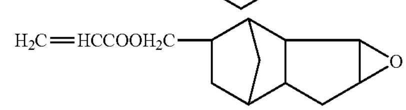

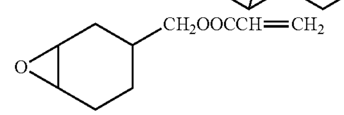

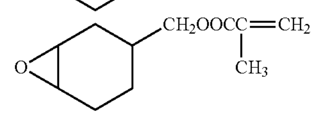

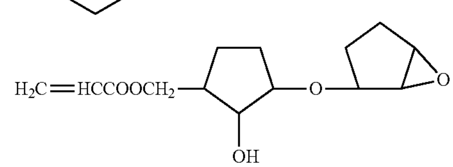

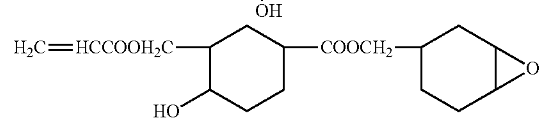

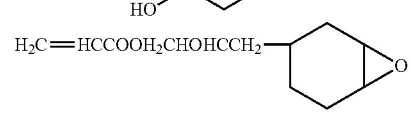

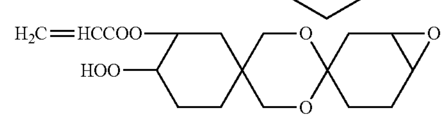

-continued

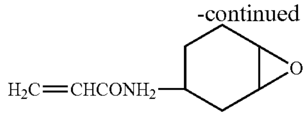

In the present invention, the compound having an epoxy group may be used alone or in combination of two or more kinds thereof.

In the case where the coloring composition of the present invention contains the compound having an epoxy group, the total content of the compound having an epoxy group in the coloring composition is preferably 0.1 to 20% by mass, more preferably 0.1 to 10% by mass, and particularly preferably 0.5 to 5% by mass, with respect to the total solid content (mass) of the coloring composition.

Moreover, in the present invention, as the polymerizable compound, the urethane acrylates described in JP1973-41708B (JP-S48-41708B), JP1976-37193A (JP-S51-37193A), JP1990-32293B (JP-H02-32293B), and JP1990-16765B (JP-H02-16765B), or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also suitable. In addition, by using addition-polymerizable compounds which have an amino structure or a sulfide structure in a molecule and are described in JP1988-277653A (JP-S63-277653A), JP1988-260909A (JP-S63-260909A), and JP1989-105238A (JP-H01-105238A), as the polymerizable compounds, a curable composition which is extremely excellent in photosensitization speed can be obtained.

In addition, a polymerizable compound having an oxetanyl group can also be used. Examples of the compound having an oxetanyl group include the compounds of paragraphs 0134 to 0145 of JP2008-224970A, the contents of which are incorporated herein by reference. As specific examples thereof, ARON OXETHANE OXT-121, OXT-221, OX-SQ, and PNOX (all manufactured by TOAGOSEI CO., LTD.) can be used.

Examples of commercially available products of the polymerizable compounds include urethane oligomers UAS-10 and UAB-140 (manufactured by Sanyo-Kokusaku Pulp, Co., Ltd.), UA-7200 (manufactured by SHIN-NAKAMURA CHEMICAL CO., LTD.), DPHA-40H (manufactured by Nippon Kayaku Co., Ltd.), and UA-306H, UA-306T, UA-306I, AH-600, T-600, and AI-600 (manufactured by KYOEISHA CHEMICAL CO., LTD.).

<<Polyfunctional Thiol Compound>>

The coloring composition of the present invention may include a polyfunctional thiol compound having two or more mercapto groups in the molecule for the purpose of promoting the reaction of the polymerizable compound. The polyfunctional thiol compounds are preferably secondary alkanethiols, and particularly preferably compounds having a structure represented by the following General Formula (I).

General Formula (T1)

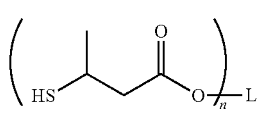

(In Formula (T1), n represents an integer of 2 to 4, and L represents a di- to tetra-valent linking group.)

In General Formula (T1), the linking group L is preferably an aliphatic group having 2 to 12 carbon atoms, n is 2, and L is particularly preferably an alkylene group having 2 to 12 carbon atoms. Specific examples of the polyfunctional thiol compound include the compounds represented by the following Structural Formulae (T2) to (T4), with the compound represented by (T2) being particularly preferable. These polyfunctional thiols can be used alone in combination of a plurality thereof.

(T2)

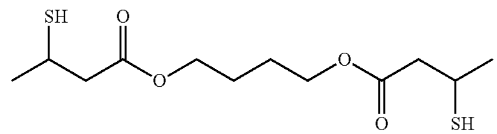

(T3)

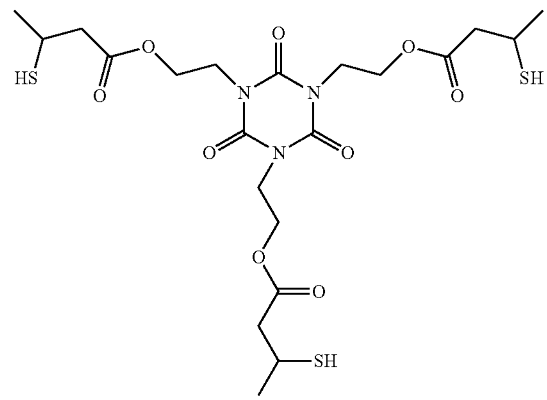

(T4)

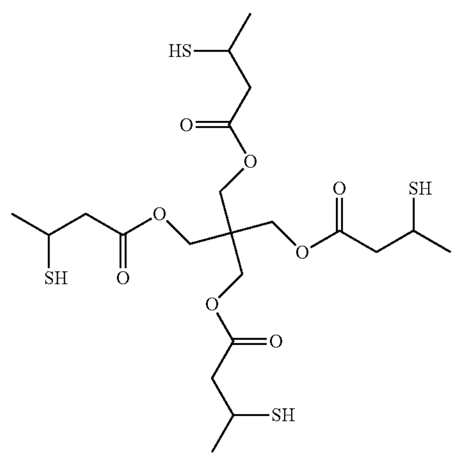

The blend amount of the polyfunctional thiol in the coloring composition of the present invention is preferably in a range of 0.3 to 8.9% by mass, and more preferably 0.8 to 6.4% by mass, with respect to the total solid content excluding the solvent. Further, the polyfunctional thiol may be added for the purpose of improving stability, odors, resolution, developability, adhesiveness, and the like.

<<Dye>>

The coloring composition of the present invention may include a known dye as a colorant other than the colorant (A). For example, the colorants disclosed in JP1989-90403A (JP-S64-90403A), JP1989-91102A (JP-S64-91102A), JP1989-94301A (JP-H01-94301A), JP1994-11614A (JP-H06-11614A), JP2592207B, U.S. Pat. Nos. 4,808,501A, 5,667,920A, 505950A, JP1993-333207A (JP-H05-333207A), JP1994-35183A (JP-H06-35183A), JP1994-51115A (JP-H06-51115A), JP1994-194828A (JP-H06-194828A), and the like can be used. In terms of the chemical structure, a pyrazolazo-based dye, a pyromethene-based dye, an anilinoazo-based dye, a triarylmethane-based dye, an anthraquinone-based dye, a benzylidene-based dye, an oxonol-based dye, a pyrazolotriazole azo-based dye, a pyridinoazo-based dye, a cyanine-based dye, a phenothiazine-based dye, a pyrrolopyrazole azomethane-based dye, or the like can be used.

<<Pigment>>

The coloring composition of the present invention may include a pigment as a colorant other than the colorant (A).

As the pigment used in the present invention, various inorganic or organic pigments known in the related art can be used, and the organic pigments are preferably used. As the pigment, one having a high transmittance is preferable.

Examples of the inorganic pigment include metal compounds represented by a metal oxide, a metal complex salt, or the like, or carbon black (C. I. Pigment Black 7). Specific examples of the metal compound include metal oxides of iron, cobalt, aluminum, cadmium, lead, copper, titanium, magnesium, chromium, zinc, antimony, and the like, and complex oxides of the metals.

Examples of the organic pigment include:

C. I. Pigment Yellow 11, 24, 31, 53, 83, 93, 99, 108, 109, 110, 138, 139, 147, 150, 151, 154, 155, 167, 180, 185, and 199;

C. I. Pigment Orange 36, 38, 43, and 71;

C. I. Pigment Red 81, 105, 122, 149, 150, 155, 171, 175, 176, 177, 209, 220, 224, 242, 254, 255, 264, and 270;

C. I. Pigment Violet 19, 23, 32, and 39;

C. I. Pigment Blue 1, 2, 15, 15:1, 15:3, 15:6, 16, 22, 60, and 66;

C. I. Pigment Green 7, 36, 37, and 58;

C. I. Pigment Brown 25 and 28; and

C. I. Pigment Black 1.

Examples of the pigment which can be preferably used in the present invention include the following ones, but the present invention is not limited thereto.

C. I. Pigment Yellow 11, 24, 108, 109, 110, 138, 139, 150, 151, 154, 167, 180, and 185, C. I. Pigment Orange 36 and 71, C. I. Pigment Red 122, 150, 171, 175, 177, 209, 224, 242, 254, 255, and 264, C. I. Pigment Violet 19, 23, and 32, C. I. Pigment Blue 15:1, 15:3, 15:6, 16, 22, 60, and 66, C. I. Pigment Green 7, 36, 37, and 58, and C. I. Pigment Black 1.

These organic pigments can be used singly or in various combinations for spectral adjustment or improvement of color purity. Specific examples of the combination are shown below. For example, as a red pigment, an anthraquinone-based pigment, a perylene-based pigment, or a diketopyrrolopyrrole-based pigment can be used singly or as a mixture of at least one kind of these with a disazo-based yellow pigment, an isoindoline-based yellow pigment, a quinophthalone-based yellow pigment, or a perylene-based red pigment. Examples of the anthraquinone-based pigment include C. I. Pigment Red 177, examples of the perylene-based pigment include C. I. Pigment Red 155, and C. I. Pigment Red 224, and examples of the diketopyrrolopyrrole-based pigment include C. I. Pigment Red 254. In view of chromatic resolving properties, a mixture of the above pigment with C. I. Pigment Yellow 139 is preferable. The mass ratio between the red pigment and the yellow pigment is preferably 100:5 to 100:50, and more preferably 100:10 to 100:30. In addition, in the case of a combination of red pigments, the mass ratio can be adjusted according to the required spectrum.

In addition, as a green pigment, a halogenated phthalocyanine-based pigment can be used singly or as a mixture of this pigment with a disazo-based yellow pigment, a quinophthalone-based yellow pigment, an azomethine-based yellow pigment, or an isoindoline-based yellow pigment. As an example of such pigments, a mixture of C. I. Pigment Green 7, 36, or 37 with C. I. Pigment Yellow 83, C. I. Pigment Yellow 138, C. I. Pigment Yellow 139, C. I. Pigment Yellow 150, C. I. Pigment Yellow 180, or C. I. Pigment Yellow 185 is preferable. The mass ratio between the green pigment and the yellow pigment is preferably 100:5 to 100:150, and more preferably in a range of 100:30 to 100:120.

As a blue pigment, a phthalocyanine-based pigment can be used singly or as a mixture of this pigment with a dioxazine-based violet pigment. For example, a mixture of C. I. Pigment Blue 15:6 with C. I. Pigment Violet 23 is preferable. The mass ratio between the blue pigment and the violet pigment is preferably 100:0 to 100:100.

In addition, as a pigment for a black matrix, carbon, titanium black, iron oxide, or titanium oxide may be used singly or as a mixture, and a combination of carbon with titanium black is preferable. The mass ratio between carbon and titanium black is preferably in a rage of 100:0 to 100:60.

In the case where the coloring composition is used for a color filter, the primary particle size of the pigment is preferably 100 nm or less from the viewpoint of color unevenness or contrast. From the viewpoint of dispersion stability, the primary particle size is preferably 5 nm or more. The primary particle size of the pigment is more preferably 5 to 75 nm, still more preferably 5 to 55 nm, and particularly preferably 5 to 35 nm.

The primary particle size of the pigment can be measured by a known method such as electron microscopy.

Among these, the pigment is preferably a pigment selected from an anthraquinone pigment, a diketopyrrolopyrrole pigment, a phthalocyanine pigment, a quinophthalone pigment, an isoindoline pigment, an azomethine pigment, and a dioxazine pigment. In particular, C. I. Pigment Red 177 (anthraquinone pigment), C. I. Pigment Red 254 (diketopyrrolopyrrole pigment), C. I. Pigment Green 7, 36, and 58, C. I. Pigment Blue 15:6 (phthalocyanine pigment), C. I. Pigment Yellow 138 (quinophthalone pigment), C. I. Pigment Yellow 139 and 185 (isoindoline pigments), C. I. Pigment Yellow 150 (azomethine pigment), and C. I. Pigment Violet 23 (dioxazine pigment) are particularly preferable.

In the case where the coloring composition of the present invention contains a pigment, the content of the pigment is preferably 10 to 70% by mass, more preferably 25 to 65% by mass, and still more preferably 35 to 55% by mass, with respect to the total amount of components excluding a solvent, contained in the coloring composition.

The coloring composition of the present invention may include one kind or two or more kinds of pigment. In the case where the composition includes two or more kinds of pigment, the total amount thereof is preferably within the range.

<<Pigment Dispersing Agent>>

In the case where the coloring composition of the present invention has a pigment, a pigment dispersing agent can be used in combination with other components, as desired.

Examples of the pigment dispersing agent which can be used in the present invention include polymer dispersing agents [for example, a polyamide amine and a salt thereof, a polycarboxylic acid and a salt thereof, a high-molecular-weight unsaturated acid ester, a modified polyurethane, a modified polyester, a modified poly(meth)acrylate, a (meth) acrylic copolymer, and a naphthalene sulfonate formalin condensate], surfactants such as a polyoxyethylene alkyl phosphoric acid ester, a polyoxyethylene alkylamine, and an alkanolamine, and pigment derivatives.

The polymer dispersing agents can be further classified into linear polymers, terminal-modified polymers, graft polymers, and block polymers, according to the structure.

Examples of the terminal-modified polymers which has a moiety anchored to the pigment surface include a polymer having a phosphoric acid group in the terminal as described in JP1991-112992A (JP-H03-112992A), JP2003-533455A, and the like, a polymer having a sulfonic acid group in the terminal as described in JP2002-273191A, a polymer having a partial skeleton or a heterocycle of an organic colorant as described in JP1997-77994A (JP-H09-77994A), and the like. Moreover, a polymer obtained by introducing two or more moieties (acid groups, basic groups, partial skeletons of an organic colorant, heterocycles, or the like) anchored to the pigment surface into a polymer terminal as described in JP2007-277514A is also preferable since this polymer is excellent in dispersion stability.

Examples of the graft polymers having a moiety anchored to the pigment surface include polyester-based dispersing agent and the like, and specific examples thereof include a reaction product between a poly(lower alkylenimine) and a polyester, which is described in JP1979-37082A (JP-S54-37082A), JP1996-507960A (JP-H08-507960A), JP2009-258668A, and the like, a reaction product between a polyallylamine and a polyester, which is described in JP1997-169821A (JP-H09-169821A) and the like, a copolymer of a macromonomer and a nitrogen atom monomer, which is described in JP1998-339949A (JP-H10-339949A), JP2004-37986A, and the like, a graft polymer having a partial skeleton or a heterocycle of an organic colorant, which is described in JP2003-238837A, JP2008-9426A, JP2008-81732A, and the like, and a copolymer of a macromonomer and an acid group-containing monomer, which is described in JP2010-106268A, and the like. From the viewpoint of dispersibility of a pigment dispersion liquid, dispersion stability, and developability which a coloring composition using the pigment exhibits, an amphoteric dispersion resin having basic and acid groups, which is described in JP2009-203462A, is particularly preferable.

As the macromonomer used in production of a graft type polymer having a moiety anchored to the pigment surface by radical polymerization, known macromonomers can be used. Examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile which has a methacryloyl group as a terminal group), and AB-6 (polybutyl acrylate having a methacryloyl group as a terminal group) manufactured by TOAGOSEI CO., LTD.; PLACCEL FM 5 (a product obtained by adding 5 molar equivalents of ε-caprolactone of 2-hydroxyethyl methacrylate) and FA10L (a product obtained by adding 10 molar equivalents of ε-caprolactone to 2-hydroxyethyl acrylate) manufactured by DAICEL CORPORATION; a polyester-based macromonomer described in JP1990-272009A (JP-H02-272009A), and the like. Among these, from the viewpoint of dispersibility of the pigment, dispersion stability, and the developability which the coloring composition using the pigment dispersion exhibits, the polyester-based macromonomer excellent in flexibility and solvent compatibility is particularly preferable. Further, a polyester-based macromonomer represented by the polyester-based macromonomer described in JP1990-272009A (JP-H02-272009A) is most preferable.

As the block polymer having a moiety anchored to the pigment surface, block polymers described in JP2003-49110A, JP2009-52010A, and the like are preferable.

The pigment dispersing agents which can be used in the present invention can be obtained in the form of commercially available products, and specific examples thereof include "DA-7301" manufactured by Kusumoto Chemicals, Ltd., "DISPERBYK-101 (polyamidamine phosphate), 107 (carboxylic acid ester), 110 (copolymer including an acid group), 130 (polyamide), 161, 162, 163, 164, 165, 166, and 170 (polymeric copolymer)", and "BYK-P104 and P105 (high-molecular-weight unsaturated polycarboxylic acid)", manufactured by BYK-Chemie, "EFKA 4047, 4050~4010~4165 (polyurethane-based dispersing agent), EFKA 4330 to 4340 (block copolymer), 4400 to 4402 (modified polyacrylate), 5010 (polyesteramide), 5765 (high-molecular-weight polycarboxylate), 6220 (aliphatic polyester), 6745 (phthalocyanine derivative), and 6750 (azo pigment derivative)" manufactured by EFKA, "AJISPER PB821, PB822, PB880, and PB881" manufactured by Ajinomoto Fine-Techno Co., Inc., "FLOWLEN TG-710 (urethane oligomer)" and "POLYFLOW No. 50E, No. 300 (acrylic copolymer), manufactured by KYOEISHA CHEMICAL CO., LTD., "DISPARLON KS-860, 873SN, 874, #2150 (aliphatic polyvalent carboxylic acid), #7004 (polyether ester), DA-703-50, DA-705, and DA-725", manufactured by Kusumoto Chemicals, Ltd., "DEMOL RN, N (naphthalene sulfonate formaldehyde condensate), MS, C, SN-B (aromatic sulfonate formaldehyde condensate)", "HOMOGENOL L-18 (polymeric polycarboxylic acid), "EMULGEN 920, 930, 935, and 985 (polyoxyethylene nonyl phenyl ether)", and "ACETAMINE 86 (stearylamine acetate)", manufactured by Kao Corporation, "SOLSPERSE 5000 (phthalocyanine derivative), 22000 (azo pigment derivative), 13240 (polyesteramine), 3000, 17000, and 27000 (polymers having a functional portion in the terminal portion), and 24000, 28000, 32000, and 38500 (graft polymers)", manufactured by Lubrizol Japan Ltd., "NIKKOL T106 (polyoxyethylene sorbitan monooleate) and MYS-IEX (polyoxyethylene monostearate)" manufactured by NIKKO CHEMICALS Co., Ltd., "HINOACT T-8000E" and the like manufactured by Kawaken Fine Chemicals Co., Ltd., "Organosiloxane Polymer KP341" manufactured by Shin-Etsu Chemical Co., Ltd., cationic surfactants such as "W001" manufactured by Yusho Co., Ltd., nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan aliphatic acid ester, and anionic surfactants such as "W004, W005, and W017", "EFKA-46, EFKA-47, EFKA-47EA, EFKA polymer 100, EFKA polymer 400, EFKA polymer 401, and EFKA polymer 450" manufactured by MORISHITA SANGYO Corporation, polymer dispersing agents such as "DISPERSE AID 6, DISPERSE AID 8, DISPERSE AID 15, and DISPERSE AID 9100" manufactured by SAN NOPCO Ltd., "ADEKA PLURONIC L31, F38, L42, L44, L61, L64, F68, L72, P95, F77, P84, F87, P94, L101, P103, F108, L121, and P-123" manufactured by ADEKA Corporation, and "IONET (trade name) S-20" manufactured by Sanyo Chemical Industries, Ltd.

These pigment dispersing agents may be used alone or in combination of two or more kinds thereof. In the present invention, it is particularly preferable to use a combination of a pigment derivative and a polymer dispersing agent. Further, the pigment dispersing agent may be used in combination with an alkali-soluble resin, together with a terminal-modified polymer having a moiety anchored to the pigment surface, a graft polymer, or a block polymer. Examples of the alkali-soluble resin include a (meth)acrylic acid copolymer, an itaconic acid copolymer, a crotonic acid copolymer, a maleic acid copolymer, a partially esterified maleic acid copolymer, and an acidic cellulose derivative having a carboxylic acid in a side chain, and a (meth)acrylic acid copolymer is particularly preferable. In addition, the N-position-substituted maleimide monomers copolymer described in JP1998-300922A (JP-H10-300922A), the ether dimer copolymers described in JP2004-300204A, and the alkali-soluble resins containing a polymerizable group described in JP1995-319161A (JP-H07-319161A) are also preferable. Specifically, alkali-soluble resins: a benzyl methacrylate/methacrylic acid/2-hydroxyethyl methacrylate copolymer is exemplified.

In the case where the coloring composition contains a pigment dispersing agent, the total content of the pigment dispersing agent in the coloring composition is preferably 1 to 80 parts by mass, more preferably 5 to 70 parts by mass, and still more preferably 10 to 60 parts by mass, with respect to 100 parts by mass of the pigment.

Specifically, in the case where a polymer dispersing agent is used, the amount of the polymer dispersing agent used is preferably 5 to 100 parts by mass, and more preferably 10 to 80 parts by mass, with respect to 100 parts by mass of the pigment.

Moreover, in the case where a pigment derivative is used in combination with other components, the amount of the pigment derivative used is preferably 1 to 30 parts by mass, more preferably 3 to 20 parts by mass, and particularly preferably 5 to 15 parts by mass, with respect to 100 parts by mass of the pigment.

In the coloring composition, from the viewpoint of curing sensitivity and color density, the total content of the coloring agent components and the dispersing agent components is preferably 50% by mass to 90% by mass, more preferably 55% by mass to 85% by mass, and still more preferably 60% by mass to 80% by mass, with respect to the total solid contents constituting the coloring composition.

<<Alkali-Soluble Resin>>

The coloring composition of the present invention may further contain an alkali-soluble resin.

The alkali-soluble resin can be appropriately selected from alkali-soluble resins which are linear organic high molecular-weight polymers and have at least one group promoting alkali-solubility in the molecule (preferably a molecule having an acryl-based copolymer or a styrene-based copolymer as a main chain). From the viewpoint of heat resistance, a polyhydroxystyrene-based resin, a polysiloxane-based resin, an acryl-based resin, an acrylamide-based resin, and an acryl/acrylamide copolymer resin are preferable. Further, from the viewpoint of controlling developability, an acryl-based resin, an acrylamide-based resin, and an acryl/acrylamide copolymer resin are preferable.

Examples of the group promoting alkali-solubility (hereinafter also referred to as an "acid group") include a carboxyl group, a phosphoric acid group, a sulfonic acid group, a phenolic hydroxyl group, and the like. The group promoting alkali-solubility is preferably a group which is soluble in an organic solvent and can be developed by an aqueous weak alkaline solution, and particularly preferred examples thereof include a (meth)acrylic acid. These acid groups may be used alone or in combination of two or more kinds thereof.

Examples of the monomer which can give the acid group after polymerization include monomers having a hydroxyl group, a such as 2-hydroxyethyl (meth)acrylate, monomers having an epoxy group, a such as glycidyl (meth)acrylate, and monomers having an isocyanate group, a such as 2-isocyanatoethyl (meth)acrylate. The monomers for introducing these acid groups may be used alone or in combination of two or more kinds thereof. In order to introduce the acid group into the alkali-soluble resin, for example, the monomer having the acid group and/or the monomer which can give the acid group after polymerization may be polymerized as a monomer component.

For production of the alkali-soluble resin, for example, a method using known radical polymerization can be applied. Various polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the linear organic high-molecular-weight polymer used as the alkali-soluble resin, polymers having a carboxylic acid in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxylic acid in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, an aryl (meth)acrylate, and a vinyl compound. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth) acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer disclosed in JP1998-300922A (JP-H10-300922A) include N-phenylmaleimide and N-cyclohexylmaleimide. Incidentally, other monomers copolymerizable with a (meth)acrylic acid may be used alone or in combination of two or more kinds thereof.

It is also preferable that the coloring composition includes, as the alkali-soluble resin, a polymer (a) obtained by polymerizing monomer components including a compound represented by the following General Formula (ED) and/or a compound represented by the following General Formula (ED2) (which may also be hereinafter referred to as an "ether dimer" in some cases) as an essential component.

General Formula (ED)

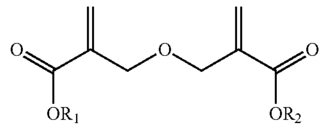

In General Formula (ED), $R^1$ and $R^2$ each independently represent a hydrogen atom or a hydrocarbon group having 1 to 25 carbon atoms, which may have a substituent.

General Formula (ED2)

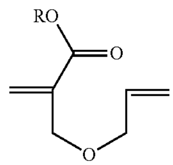

In General Formula (ED2), R represents a hydrogen atom or an organic group having 1 to 30 carbon atoms. With respect to specific examples of General Formula (ED2), reference can be made to the description of JP2010-168539A.

Thus, the coloring composition of the present invention can form a cured coating film which is extremely excellent in heat resistance as well as transparency. In General Formula (ED) which represents the ether dimer, the hydrocarbon group having 1 to 25 carbon atom, represented by $R^1$ and $R^2$, which may have a substituent, is not particularly limited, and examples thereof include linear or branched alkyl groups such as methyl, ethyl, n-propyl, isopropyl, n-butyl, isobutyl, tert-butyl, tert-amyl, stearyl, lauryl, and 2-ethylhexyl; aryl groups such as phenyl; alicyclic groups such as cyclohexyl, tert-butylcyclohexyl, dicyclopentadienyl, tricyclodecanyl, isobornyl, adamantyl, and 2-methyl-2-adamantyl; alkyl groups substituted with alkoxy such as 1-methoxyethyl and 1-ethoxyethyl; and alkyl groups substituted with an aryl group such as benzyl. Among these, from the viewpoints of heat resistance, substituents of primary or secondary carbon, which are not easily eliminated by an acid or heat, such as methyl, ethyl, cyclohexyl, and benzyl, are preferable.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(tert-butyl)-2,2'-[oxybis(methylene)]bis-2-propenoate, di(tert-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(tert-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are particularly preferable. These ether dimers may be used alone or in combination of two or more kinds thereof. The structure derived from the compound represented by General Formula (ED) may be copolymerized with other monomers.

The alkali-soluble resin may include a structural unit derived from an ethylenically unsaturated monomer represented by the following Formula (X).

General Formula (X)

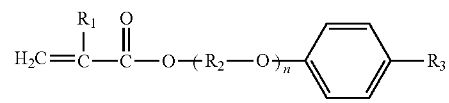

(In Formula (X), $R^1$ represents a hydrogen atom or a methyl group, $R^2$ represents an alkylene group having 2 to 10 carbon atoms, $R^3$ represents a hydrogen atom or an alkyl group having 1 to 20 carbon atoms, which may contain a benzene ring, and n represents an integer of 1 to 15.)

In Formula (X), the number of carbon atoms of the alkylene group of $R^2$ is preferably 2 to 3. Further, the number of carbon atoms of the alkyl group of $R^3$ is 1 to 20, and more preferably 1 to 10, and the alkyl group of $R^3$ may contain a benzene ring. Examples of the alkyl group containing a benzene ring, represented by $R^3$, include a benzyl group and a 2-phenyl(iso)propyl group.

Moreover, in order to improve the crosslinking efficiency of the coloring composition in the present invention, an alkali-soluble resin having a polymerizable group is preferably used. As the alkali-soluble resin having a polymerizable group, an alkali-soluble resins and the like containing an allyl group, a (meth)acryloyl group, an allyloxyalkyl group, and the like on a side chain thereof are useful. Examples of the polymer containing the above polymerizable group include DIANAL NR series (manufactured by Mitsubishi Rayon Co., Ltd.), PHOTOMER 6173 (a polyurethane acrylic oligomer containing COOH, manufactured by Diamond Shamrock Co., Ltd.), BISCOAT R-264 and KS RESIST 106 (all manufactured by OSAKA ORGANIC CHEMICAL INDUSTRY LTD.), CYCLOMER P series and PlACCEL CF200 series (all manufactured by DAICEL Corporation), and Ebecryl 3800 (manufactured by DAICEL-UCB Co., Ltd.). As the alkali-soluble resin containing a polymerizable group, a polymerizable double bond-containing acryl-based resin modified with urethane, which is a resin obtained by reacting an isocyanate group and an OH group in advance to leave one unreacted isocyanate group and performing a reaction between a compound having a (meth)acryloyl group and an acryl-based resin having a carboxyl group, an unsaturated bond-containing acryl-based resin which is obtained by a reaction between an acryl-based resin having a carboxyl group and a compound having both an epoxy group and a polymerizable double bond in a molecule, a polymerizable double bond-containing acryl-based resin which is obtained by a reaction between an acid pendant type epoxy acrylate resin, an acryl-based resin having an OH group, and a dibasic acid anhydride having a polymerizable double bond, a resin obtained by a reaction between an acryl-based resin having an OH group and a compound having isocyanate and a polymerizable group, a resin which is obtained by treating a resin, which has an ester group having an elimination group such as a halogen atom or a sulfonate group in an α-position or a β-position described in JP2002-229207A and JP2003-335814A on a side chain, with a base, and the like are preferable. In addition, ACRYCURE RD-F8 (manufactured by Nippon Shokubai Co., Ltd.) is also preferable.

As the alkali-soluble resin, a benzyl (meth)acrylate/(meth)acrylic acid copolymer or a multicomponent copolymer including benzyl (meth)acrylate/(meth)acrylic acid/other monomers is particularly suitable. Examples thereof also include a benzyl (meth)acrylate/(meth)acrylic acid/2-hydroxyethyl (meth)acrylate copolymer obtained by copolymerizing 2-hydroxyethyl methacrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer, and particularly preferably a benzyl methacrylate/methacrylic acid copolymer.

With respect to the alkali-soluble resin, reference can be made to the descriptions in paragraphs [0558] to [0571] of JP2012-208494A ([0685] to [0700] of the corresponding US2012/0235099A), the contents of which are hereby incorporated by reference.

Furthermore, it is preferable to use the copolymers (B) described in paragraph Nos. 0029 to 0063 of JP2012-32767A and the alkali-soluble resins used in Examples of the document; the binder resins described in paragraph Nos. 0088 to 0098 of JP2012-208474A and the binder resins used in Examples of the document; the binder resins described in paragraph Nos. 0022 to 0032 of JP2012-137531A and the binder resins in Examples of the document; the binder resins described in paragraph Nos. 0132 to 0143 of JP2013-024934A and the binder resins used in Examples of the document; binder resins described in paragraph Nos. 0092 to 0098 of JP2011-242752A and used in Examples; or the binder resins described in paragraph Nos. 0030 to 0072 of JP2012-032770A, the contents of which are hereby incorporated by reference. More specifically, the following resins are preferable.

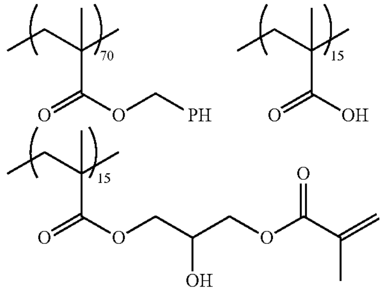

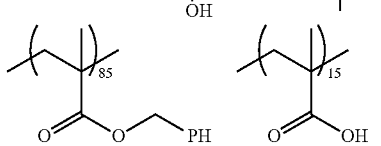

-continued

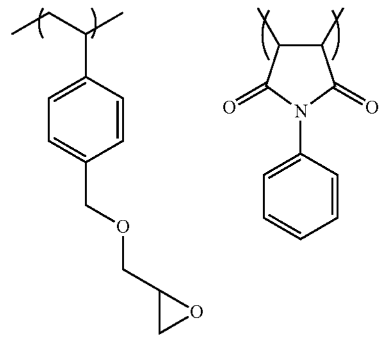

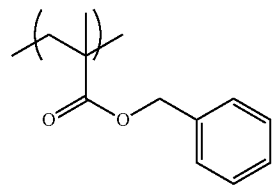

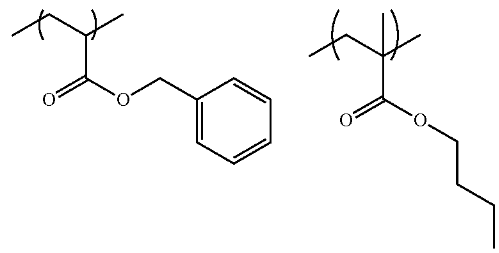

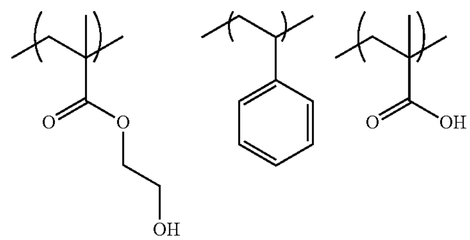

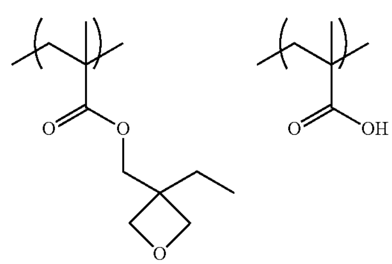

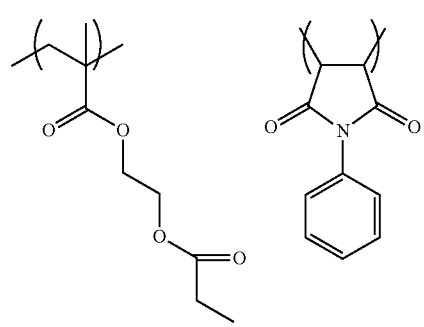

-continued
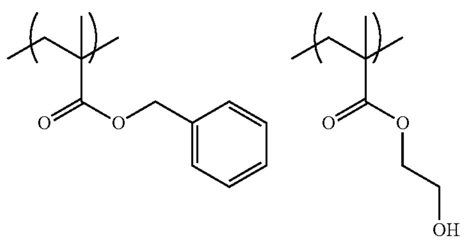
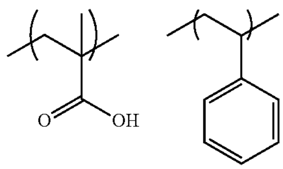
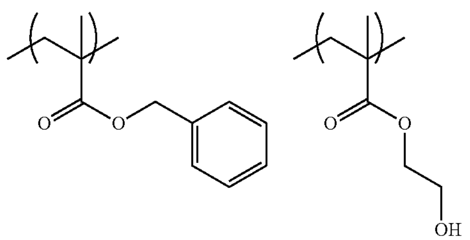
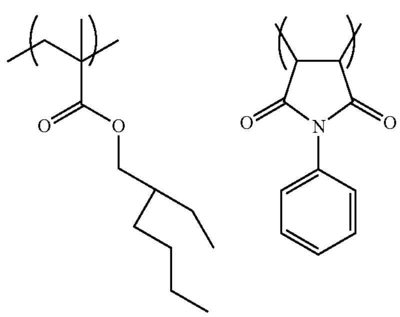
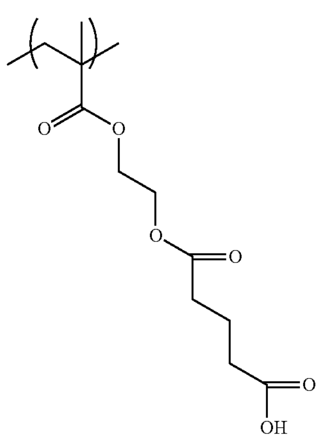
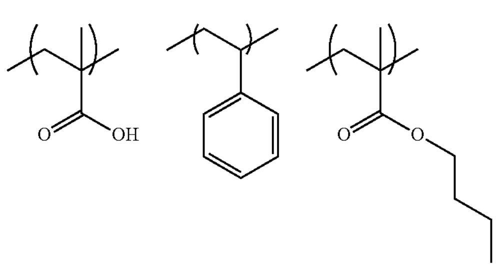
-continued
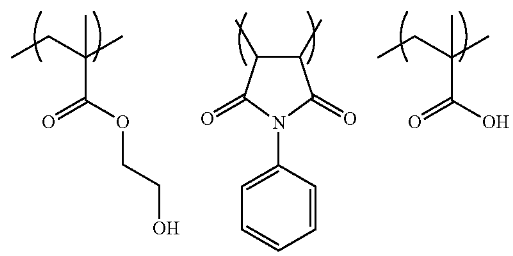
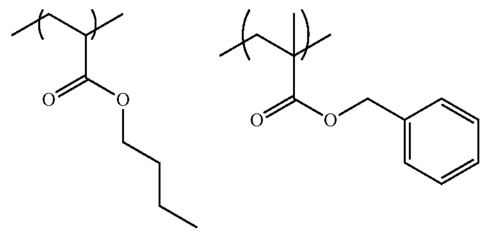
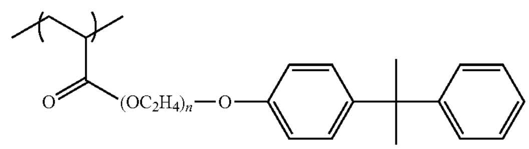
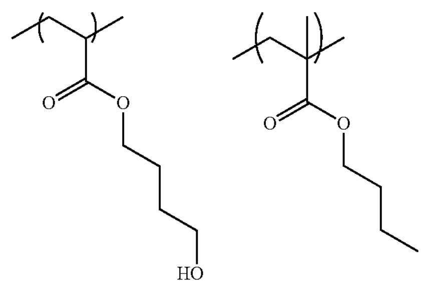
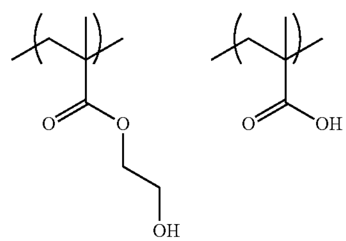
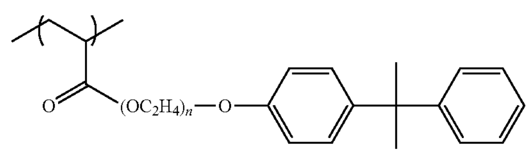
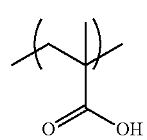
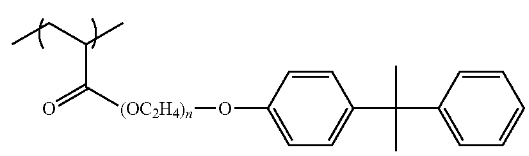

-continued

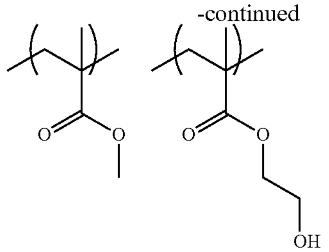

The acid value of the alkali-soluble resin is preferably 30 mgKOH/g to 200 mgKOH/g, more preferably 50 mgKOH/g to 150 mgKOH/g, and particularly preferably 70 mgKOH/g to 120 mgKOH/g.

Furthermore, the weight-average molecular weight (Mw) of the alkali-soluble resin is preferably 2,000 to 50,000, more preferably 5,000 to 30,000, and particularly preferably 7,000 to 20,000.

In the case where the coloring composition contains an alkali-soluble resin, the content of the alkali-soluble resin is preferably 1 to 15% by mass, more preferably 2 to 12% by mass, and particularly preferably 3 to 10% by mass, with respect to the total solid contents of the coloring composition.

The composition of the present invention may include one kind or two or more kinds of alkali-soluble resin. In the case where the composition includes two or more kinds of the alkali-soluble resin, the total amount thereof is preferably within the range.

<<Photopolymerization Initiator>>

The coloring composition of the present invention may further contain a photopolymerization initiator.

The photopolymerization initiator is not particularly limited as long as the photopolymerization initiator has a function of initiating polymerization of the polymerizable compound, and can be appropriately selected from known photopolymerization initiators. For example, photopolymerization initiators sensitive to light rays in a range from ultraviolet region to visible light are preferable. In addition, the photopolymerization initiator may be either an activator which interacts with a photo-excited sensitizer in any way and generates active radicals or an initiator which initiates cationic polymerization according to the type of monomer.

In addition, it is preferable that the photopolymerization initiator contains at least one kind of compound having at least a molar light absorption coefficient of about 50 in a range of about 300 nm to 800 nm (more preferably 330 nm to 500 nm).

Examples of the photopolymerization initiator include halogenated hydrocarbon derivatives (for example, a derivative having a triazine skeleton and a derivative having an oxadiazole skeleton), acyl phosphine compounds such as acyl phosphine oxide, biimidazole compounds, for example, hexaaryl biimidazole, oxime compounds such as oxime derivatives, organic peroxides, thio compounds, ketone compounds, aromatic onium salts, ketoxime ethers, aminoacetophenone compounds, and hydroxyacetophenone Furthermore, from the viewpoint of exposure sensitivity, the photopolymerization initiator is more preferably a compound selected from the group consisting of a trihalomethyltriazine compound, a benzyldimethylketal compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound and derivatives thereof, a cyclopentadiene-benzene-iron complex and salts thereof, a halomethyloxadiazole compound, and a 3-aryl-substituted coumarin compound.

The photopolymerization initiator is more preferably a trihalomethyltriazine compound, an α-aminoketone compound, an acylphosphine compound, a phosphine oxide compound, an oxime compound, a triarylimidazole dimer, an onium compound, a benzophenone compound, or an acetophenone compound, and particularly preferably at least one compound selected from the group consisting of a trihalomethyltriazine compound, an α-aminoketone compound, an oxime compound, a triarylimidazole dimer, or a benzophenone compound.

In particular, in the case where the coloring composition of the present invention is used for the manufacture of a color filter for a solid-state imaging device, a fine pattern needs to be formed in a sharp shape, and therefore, it is important that the coloring composition has curability and is developed without residues in an unexposed area. From this viewpoint, an oxime compound is particularly preferable as a photopolymerization initiator. In particular, in the case where a fine pattern is formed in the solid-state imaging device, stepper exposure is used for exposure for curing. However, the exposure machine used at this time is damaged by halogen in some cases, and thus, it is necessary to reduce the amount of a photopolymerization initiator added. In consideration of this point, in order to form a fine pattern as in a solid-state imaging device, it is particularly preferable to use an oxime compound. In addition, by using the oxime compound, color migration properties can be improved.

For specific examples of the photopolymerization initiator used in the present invention, reference can be made to, for example, paragraphs 0265 to 0268 of JP2013-29760A, the contents of which are incorporated herein by reference.

As the photopolymerization initiator, a hydroxyacetophenone compound, an aminoacetophenone compound, and an acyl phosphine compound can also be suitably used. More specifically, for example, the aminoacetophenone-based initiator described in JP1998-291969A (JP-H10-291969A), and the acyl phosphine oxide-based initiator described in JP4225898B can also be used.

As the hydroxyacetophenone-based initiator, IRGACURE-184, DAROCUR-1173, IRGACURE-500, IRGACURE-2959, and IRGACURE-127 (trade names, all manufactured by BASF) can be used. As the aminoacetophenone-based initiator, IRGACURE-907, IRGACURE-369, and IRGACURE-379 (trade names, all manufactured by BASF) which are commercially available products can be used. In addition, as the aminoacetophenone-based initiator, the compound described in JP2009-191179A, of which an absorption wavelength matches a light source of a long wavelength of 365 nm, 405 nm, or the like, can be used. Moreover, as the acyl phosphine-based initiator, IRGACURE-819 or DAROCUR-TPO (trade name, both manufactured by BASF) which are commercially available products can be used.

More preferred examples of the photopolymerization initiator include an oxime compound. As a specific example of the oxime compound, the compound described in JP2001-233842A, the compound described in JP2000-80068A, the compound described in JP2006-342166A, or the like can be used.

Examples of the oxime compound such as an oxime derivative, which is suitably used as the photopolymerization initiator in the present invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime compounds include the compounds described in J. C. S. Perkin II (1979) pp. 1653-1660, J. C. S. Perkin II (1979) pp. 156-162, Journal of Photopolymer Science and Technology (1995) pp 202-232, and JP2000-66385A, and the compounds described in each publication of JP2000-80068A, JP2004-534797A, and JP2006-342166A.

As the commercially available product, IRGACURE-OXE01 (manufactured by BASF Corporation) or IRGACURE-OXE02 (manufactured by BASF Corporation) is also suitably used. Further, TR-PBG-304 (manufactured by Changzhou Tronly New Electronic Materials Co., Ltd.), or ADEKA ARKLS NCI-831 or ADEKA ARKLS NCI-930 (manufactured by ADEKA Corporation) can also be used.

Furthermore, as oxime compounds other than the above, the compound described in JP2009-519904A in which oxime is linked to an N-position of carbazole, the compound described in U.S. Pat. No. 7,626,957B in which a hetero-substituent is introduced into a benzophenone moiety, the compounds described in JP2010-15025A and US2009/292039A in which a nitro group is introduced into a colorant moiety, the ketoxime compound described in WO2009/131189A, the compound described in U.S. Pat. No. 7,556,910B which contains a triazine skeleton and an oxime skeleton in the same molecule, the compound described in JP2009-221114A, which has maximum absorption at 405 nm and has excellent sensitivity to a light source of a g-ray, and the like may be used.

Preferably, reference can be made to, for example, paragraphs 0274 to 0275 of JP2013-29760A, the contents of which are incorporated herein by reference.

Specifically, as the oxime compound, a compound represented by the following Formula (OX-1) is preferable. Incidentally, the compound may be an oxime compound in which an N—O bond of oxime forms an (E) isomer, an oxime compound in which the N—O bond forms a (Z) isomer, or an oxime compound in which the N—O bond forms a mixture of an (E) isomer and a (Z) isomer.

(OX-1)

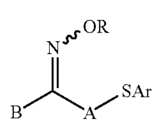

In General Formula (OX-1), R and B each independently represent a monovalent substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. Moreover, the substituents may be further substituted with other substituents.

Examples of the substituents include a halogen atom, an aryloxy group, an alkoxycarbonyl or aryloxycarbonyl group, an acyloxy group, an acyl group, an alkyl group, and an aryl group.

As the monovalent substituent represented by B in General Formula (OX-1), an aryl group, a heterocyclic group, an arylcarbonyl group, or a heterocyclic carbonyl group is preferable. These groups may have one or more substituents. Examples of the substituent include the above-mentioned substituents.

As the divalent organic group represented by A in General Formula (OX-1), an alkylene group having 1 to 12 carbon atoms, a cycloalkylene group, or an alkanylene group is preferable. These groups may have one or more substituents. Examples of the substituent include the above-mentioned substituents.

In the present invention, as the photopolymerization initiator, an oxime compound having a fluorine atom can also be used. Specific examples of the oxime compound having a fluorine atom include the compounds described in JP2010-262028A, the compounds described in JP2014-500852A, the compounds 24, and 36 to 40, and the compounds (C-3) described in JP2013-164471A, the contents of which are incorporated herein by reference.

In the present invention, as the photopolymerization initiator, a compound represented by the following General Formula (1) or (2) can also be used.

(1)

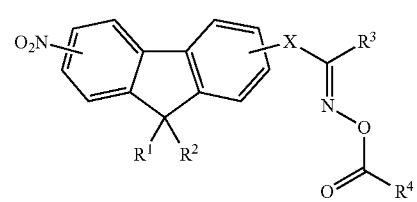

(2)

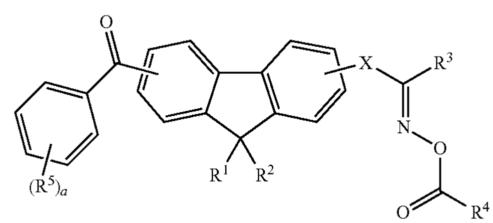

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms, and in the case where $R^1$ and $R^2$ are phenyl groups, the phenyl groups may be bonded to each other to form a fluorene group; and $R^3$ and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms; and X represents a direct bond or a carbonyl group.

In Formula (2), $R^1$, $R^2$, $R^3$, and $R^4$ have the same definitions as $R^1$, $R^2$, $R^3$, and $R^4$ in Formula (1); $R^5$ represents —$R^6$, —$OR^6$, —$SR^6$, —$COR^E$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group; $R^6$ represents an alkyl group having 1 to 20 carbon atoms, an aryl group having 6 to 30 carbon atoms, an arylalkyl group having 7 to 30 carbon atoms, or a heterocyclic group having 4 to 20 carbon atoms; X represents a direct bond or a carbonyl group; and a represents an integer of 0 to 4.

In Formulae (1) and (2), $R^1$ and $R^2$ are each independently preferably a methyl group, an ethyl group, an n-propyl group, an i-propyl, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Specific examples of the compounds represented by Formulae (1) and (2) include the compounds described in paragraphs Nos. 0076 to 0079 of JP2014-137466A, the contents of which are incorporated herein by reference.

In the present invention, specific examples of the oxime compound that is preferably used are shown below, but the present invention is not limited thereto.

(C-4)

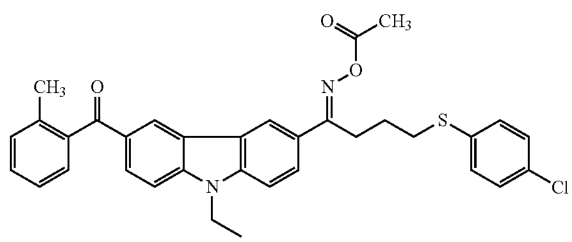

(C-5)

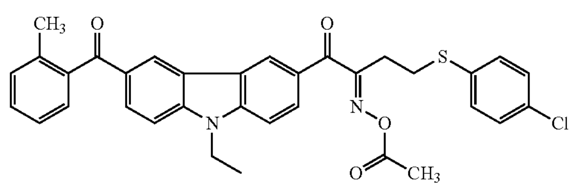

(C-6)

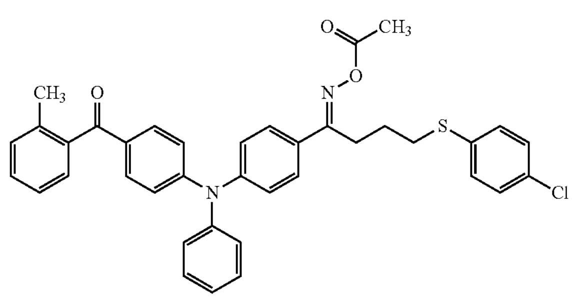

(C-7)

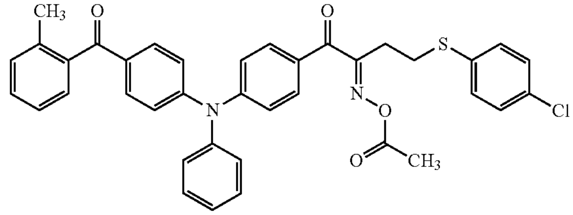

-continued (C-8)

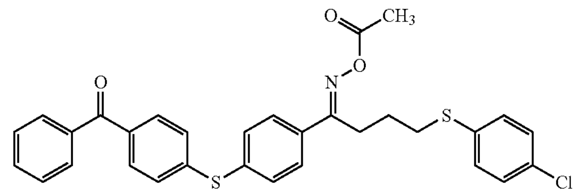

(C-9)

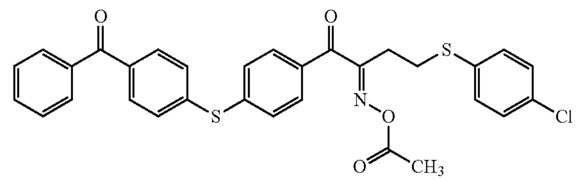

(C-10)

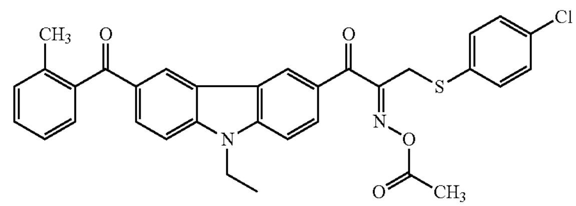

(C-11)

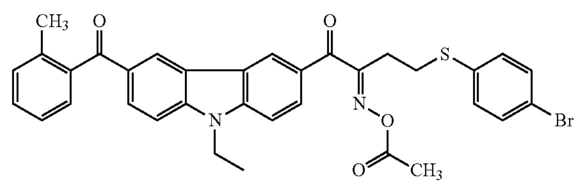

(C-12)

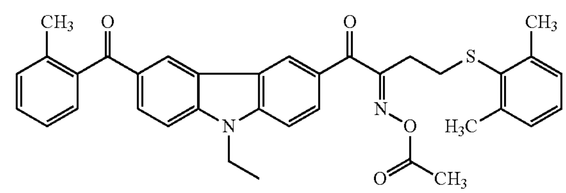

(C-13)

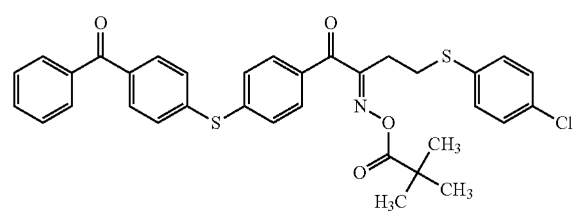

The oxime compound has a maximum absorption wavelength in a wavelength region of 350 nm to 500 nm and preferably has an absorption wavelength in a wavelength region of 360 nm to 480 nm, and an oxime compound showing a high absorbance at 365 nm and 455 nm is particularly preferable.

From the viewpoint of sensitivity, the molar light absorption coefficient at 365 nm or 405 nm of the oxime compound is preferably 1,000 to 300,000, and more preferably 2,000 to 300,000, and particularly preferably 5,000 to 200,000.

The molar light absorption coefficient of the compound can be measured using a known method, but specifically, it is preferable to measure the molar light absorption coefficient by means of, for example, a UV-visible spectrophotometer (Cary-5 spectrophotometer manufactured by Varian) by using an ethyl acetate solvent at a concentration of 0.01 g/L.

The photopolymerization initiator for use in the present invention is used in combination of two or more kinds thereof, as desired.

In the case where the coloring composition of the present invention contains the photopolymerization initiator, the content of the photopolymerization initiator is preferably 0.1 to 50% by mass, more preferably 0.5 to 30% by mass, and still more preferably 1 to 20% by mass, with respect to the total solid contents of the coloring composition. Within this range, improved sensitivity and pattern formability are obtained.

The composition of the present invention may include one kind or two or more kinds of photopolymerization initiator. In the case where the composition includes two or more kinds of the photopolymerization initiator, the total amount thereof is preferably within the range.

<<Other Components>>

The coloring composition of the present invention may further include other components such as an organic solvent, a crosslinking agent, a polymerization inhibitor, a surfactant, an organic carboxylic acid, and an organic carboxylic acid anhydride, in addition to the respective components as described above, within a range which does not diminish the effects of the present invention.

<<<Organic Solvent>>>

The coloring composition of the present invention may contain an organic solvent.

Basically, the organic solvent is not particularly limited as long as it satisfies the solubility of the respective components or the coatability of the coloring composition, but the organic solvent is preferably selected in consideration of the solubility, the coatability, and the safety of the colorant (A), the curable compound, or the like. In addition, when the coloring composition in the present invention is prepared, it preferably includes at least two kinds of organic solvents.

Suitable examples of the organic solvent include esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl oxyacetate (for example, methyl oxyacetate, ethyl oxyacetate, and butyl oxyacetate (for example, methyl methoxyacetate, ethyl methoxyacetate, butyl methoxyacetate, methyl ethoxyacetate, and ethyl ethoxyacetate)), alkyl 3-oxypropionic acid esters (for example, methyl 3-oxypropionate and ethyl 3-oxypropionate (for example, methyl 3-methoxypropionate, ethyl 3-methoxypropionate, methyl 3-ethoxypropionate, and ethyl 3-ethoxypropionate)), alkyl 2-oxypropionic acid esters (for example, methyl 2-oxypropionate, ethyl 2-oxypropionate, and propyl 2-oxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-oxy-2-methyl propionate and ethyl 2-oxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol methyl ether acetate, propylene glycol ethyl ether acetate, and propylene glycol propyl ether acetate; ketones such as methyl ethyl ketone, cyclohexanone, 2-heptanone, and 3-butanone; and aromatic hydrocarbons such as toluene and xylene.

From the viewpoints of the solubility of the colorant (A), the curable compound, or the like, and improvement of the shape of the coated surface, it is also preferable to mix two or more kinds of these organic solvents. In this case, a mixed solution consisting of two or more kinds selected from the aforementioned methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, and propylene glycol methyl ether acetate is particularly preferable.

In the present invention, it is preferable that the organic solvent has a content of peroxides of 0.8 mmol/L or less, and it is more preferable that the organic solvent does not substantially include peroxides.

From the viewpoint of coatability, the content of the solvent in the coloring composition is set such that the concentration of the total solid contents of the coloring composition preferably becomes 5 to 80% by mass, more preferably becomes 5 to 60% by mass, and particularly preferably becomes 10 to 50% by mass.

The coloring composition of the present invention may include one kind or two or more kinds of solvent. In the case where the composition includes two or more kinds of the solvents, the total amount thereof is preferably within the range.

<<<Crosslinking Agent>>>

The coloring composition of the present invention may also contain a crosslinking agent. By incorporating the crosslinking agent, the hardness of a cured film thus obtained can be increased.

The crosslinking agent is not particularly limited as long as it can cure a film by a crosslinking reaction. Examples thereof include (a) an epoxy resin, (b) a melamine compound, a guanamine compound, a glycoluril compound, or a urea compound, which is substituted by at least one type selected from a methylol group, an alkoxymethyl group, and an acyloxymethyl group, and (c) a phenol compound, a naphthol compound, or a hydroxyanthracene compound, which is substituted by at least one type selected from a methylol group, an alkoxymethyl group, or an acyloxymethyl group. Among these, a polyfunctional epoxy resin is preferable.

For the details of specific examples of the crosslinking agent and the like, reference can be made to the descriptions of paragraphs 0134 to 0147 of JP2004-295116A, the contents of which are incorporated herein by reference.

In the case where the coloring composition of the present invention contains a crosslinking agent, the content of the crosslinking agent is not particularly limited, but is preferably 2 to 30% by mass, and more preferably 3 to 20% by mass, with respect to the total solid content of the composition.

The coloring composition of the present invention may include one kind or two or more kinds of the crosslinking agent. In the case where the coloring composition includes two or more kinds of the crosslinking agent, the total amount thereof is preferably within the range.

<<<Polymerization Inhibitor>>>

It is preferable to add a small amount of a polymerization inhibitor to the coloring composition of the present invention in order to suppress the occurrence of unnecessary thermal polymerization of the polymerizable compound during production or storage of the coloring composition.

Examples of the polymerization inhibitor which can be used in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and a cerium (III) salt of N-nitrosophenyl hydroxylamine.

In the case where the coloring composition of the present invention contains a polymerization inhibitor, the amount of the polymerization inhibitor added is preferably about 0.01 to about 5% by mass, with respect to the total mass of the coloring composition.

The coloring composition of the present invention may include one kind or two or more kinds of polymerization inhibitor. In the case where the composition includes two or more kinds of the polymerization inhibitor, the total amount thereof is preferably within the range.

<<<Surfactant>>>

From the viewpoint of further improving coatability, various surfactants may be added to the coloring composition of the present invention. As the surfactants, it is possible to use various surfactants such as a fluorine-based surfactant, a nonionic surfactant, a cationic surfactant, an anionic surfactant, and a silicon-based surfactant.

In particular, if the coloring composition of the present invention contains a fluorine-based surfactant, liquid characteristics (particularly fluidity) are further improved when the composition is prepared as a coating liquid, whereby evenness of the coating thickness or liquid saving properties can be further improved.

That is, in the case where a coating liquid obtained by applying the coloring composition containing a fluorine-based surfactant is used to form a film, the surface tension between a surface to be coated and the coating liquid is reduced to improve wettability with respect to the surface to be coated, and enhance coatability with respect to the surface to be coated. Therefore, even in the case where a thin film of about several μm is formed of a small amount of liquid, the coloring composition containing a fluorine-based surfactant is effective in that a film with a uniform thickness which exhibits a small extent of thickness unevenness can be more suitably formed.

The fluorine content in the fluorine-based surfactant is preferably 3 to 40% by mass, more preferably 5 to 30% by mass, and particularly preferably 7 to 25% by mass. The fluorine-based surfactant in which the fluorine content is within this range is effective in terms of the uniformity of the thickness of the coating film or liquid saving properties, and the solubility of the surfactant in the coloring composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and MEGAFACE F781 (all manufactured by DIC Corporation); FLUORAD FC430, FLUORAD FC431, and FLUORAD FC171 (all manufactured by Sumitomo 3M); SURFLON S-382, SURFLON SC-101, SURFLON SC-103, SURFLON SC-104, SURFLON SC-105, SURFLON SC1068, SURFLON SC-381, SURFLON SC-383, SURFLON SC-393, and SURFLON KH-40 (all manufactured by ASAHI GLASS Co., Ltd.); and PF636, PF656, PF6320, PF6520, and PF7002 (manufactured by OMNOVA).

As the fluorine-based surfactant, a block polymer can also be used, and specific examples thereof include the compounds described in JP2011-89090A.

Specific examples of the nonionic surfactant include glycerol, trimethylolpropane, trimethylolethane, and ethoxylate and propoxylate thereof (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (PLURONIC L10, L31, L61, L62, 10R5, 17R2, and 25R2, and TETRONIC 304, 701, 704, 901, 904, and 150R1 manufactured by BASF), and SOLSEPERSE 20000 (manufactured by Lubrizol Japan Ltd.).

Specific examples of the cationic surfactant include phthalocyanine derivatives (trade name: EFKA-745 manufactured by MORISHITA SANGYO Corporation), organosiloxane polymer KP341 (manufactured by Shin-Etsu Chemical Co., Ltd.), (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.).

Examples of the silicon-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA", and "TORAY SILICONE SH8400", manufactured by Dow Corning Toray, "TSF-4440", "TSF-4300", "TSF-4445", "TSF-4460", and "TSF-4452", manufactured by Momentive Performance Materials Inc., "KP341", "KF6001", and "KF6002", manufactured by Shin-Etsu Silicones, and "BYK307", "BYK323", and "BYK330", manufactured by BYK-Chemie.

In the case where the coloring composition of the present invention contains a surfactant, the amount of the surfactant to be added is preferably 0.001 to 2.0% by mass, and more preferably 0.005 to 1.0% by mass, with respect to the total mass of the coloring composition.

The composition of the present invention may include one kind or two or more kinds of surfactant. In the case where the composition includes two or more kinds of the surfactant, the total amount thereof is preferably within the range.

<<<Organic Carboxylic Acid and Organic Carboxylic Acid Anhydride>>>

The coloring composition of the present invention may contain an organic carboxylic acid having a molecular weight of 1,000 or less, and/or an organic carboxylic acid anhydride. For specific examples of the organic carboxylic acid and the organic carboxylic acid anhydride, reference can be made to, for example, paragraphs 0338 to 0340 of JP2013-29760A, the contents of which are incorporated herein by reference.

If the coloring composition of the present invention contains an organic carboxylic acid or an organic carboxylic acid anhydride, the amount of the organic carboxylic acids and/or the organic carboxylic acid anhydrides added is generally in a range of 0.01 to 10% by weight, preferably 0.03 to 5% by weight, and more preferably 0.05 to 3% by weight in the total solid contents.

The composition of the present invention may include one kind or two or more kinds of each of an organic carboxylic acid and/or an organic carboxylic acid anhydride. In the case where the composition includes two or more kinds of the organic carboxylic acid and/or the organic carboxylic acid anhydride, the total amount thereof is preferably within the range.

If desired, various additives such as a filler, an adhesion promoting agent, an antioxidant, an ultraviolet absorbent, and an anti-aggregation agent may be blended into the coloring composition. Examples of these additives include those described in paragraphs 0155 and 0156 of JP2004-295116A, the contents of which are hereby incorporated by reference.

The coloring composition of the present invention can contain the sensitizer or the light stabilizer described in paragraph 0078 of JP2004-295116A, and the thermal polymerization inhibitor described in paragraph 0081 of JP2004-295116A.

In the case where a metal element is included in the coloring composition according to raw materials and the like, from the viewpoint of suppression of generation of defects, the content of Group 2 elements (calcium, magnesium, and the like) in the coloring composition is preferably 50 ppm or less, and preferably controlled to 0.01 to 10 ppm. Further, the total amount of the inorganic metal salts in the coloring composition is preferably 100 ppm or less, and preferably controlled to 0.5 to 50 ppm.

<Method for Preparing Coloring Composition>

The coloring composition of the present invention is prepared by mixing the aforementioned components.

Furthermore, when the coloring composition is prepared, the respective components constituting the coloring composition may be mixed together at the same time or mixed together sequentially after being dissolved and dispersed in a solvent. Further, the order of adding the components and the operation conditions during the mixing are not particularly restricted. For example, all the components may be dissolved and dispersed in a solvent at the same time to prepare the composition. Alternatively, if desired, the respective components may be appropriately prepared as two or more solutions or dispersion liquids and mixed at the time of use (at the time of coating) to prepare the composition.

It is preferable that the coloring composition of the present invention is filtered using a filter for the purpose of removing impurities or reducing deficit, for example. Filters that have been used in the related art for filtration use and the like may be used without particular limitation. Examples thereof include filters formed of a fluorine resin such as polytetrafluoroethylene (PTFE), a polyamide-based resin such as Nylon-6 and Nylon-6,6, and a polyhydric alcohol-efin resin (including a high density and a ultrahigh molecular weight) such as polyethylene and polypropylene (PP). Among these materials, polypropylene (including high density polypropylene) is preferable.

The pore diameter of the filter is suitably approximately 0.01 to 7.0 μm, preferably approximately 0.01 to 3.0 μm, and more preferably approximately 0.05 to 0.5 μm. By setting the pore diameter to this range, it is possible to reliably remove fine impurities which interfere with preparation of a uniform and smooth coloring composition in a subsequent step.

When a filter is used, other filters may be used in combination therewith. At that time, filtering at a first filter may be performed only once or two or more times.

In addition, first filters having different pore diameters within the aforementioned range may be combined. As the pore diameter herein, a reference may be made to nominal values of a filter maker. A commercially available filter may be selected from various filters provided by, for example, Pall Corporation, Advantec Toyo Kaisha, Ltd., Nihon Entegris K.K. (former Nippon Microlith Co., Ltd.), Kitz Micro Filter Corporation, or the like.

As a second filter, a filter formed of a material which is the same as the material for the aforementioned first filter and the like can be used.

For example, the filtering at the first filter may be performed with only the dispersion liquid, and the other components may be mixed and then the filtering of the second filter may be performed.

Since the coloring composition of the present invention can form a cured film having good light fastness, color migration properties, and flatness, it is suitably used for forming a colored layer of a color filter. Further, the coloring composition of the present invention can be suitably used for forming a colored pattern of a color filter or the like in a solid-state imaging device (for example, a CCD and a CMOS), an image display device such as a liquid crystal display device (LCD), an electroluminescent element (organic EL), or the like. In addition, the coloring composition can also be suitably used in applications of the manufacture of a print ink, an ink jet ink, a coating material, or the like. Among these, the coloring composition can be suitably used for the manufacture of a color filter for a solid-state imaging device such as a CCD and a CMOS.

<Cured Film, Color Filter, and Method for Manufacturing Color Filter>

Next, the cured film and the color filter in the present invention will be described in detail by an explanation of production methods thereof.

The cured film of the present invention is formed by curing the coloring composition of the present invention. Such a cured film is preferably used in a color filter.

A first aspect of the method for manufacturing a color filter of the present invention includes a step of applying the coloring composition of the present invention onto a support to form a coloring composition layer, a step of patternwise exposing the coloring composition layer, and a step of removing an unexposed area by development to form a colored pattern. In addition, the method may include a step of baking the coloring composition layer (prebaking step) and a step of baking the developed colored pattern (postbaking step), as desired. Hereinafter, these steps may be referred to as a pattern forming step in some cases.

Furthermore, a second aspect of the method for manufacturing a color filter of the present invention includes a step of applying the coloring composition of the present invention onto a support to form a coloring composition layer, followed by curing, to form a colored layer, a step of forming a photoresist layer on the colored layer, a step of patterning the photoresist layer by carrying out exposure and development to obtain a resist pattern, and a step of dry-etching the colored layer using the resist pattern as an etching mask.

The color filter of the present invention can be suitably obtained by the manufacturing method. Hereinafter, details of these will be described.

<<Coloring Composition Layer Forming Step>>

In the coloring composition layer forming step, the coloring composition of the present invention is applied onto a support to form a coloring composition layer.

Examples of the support include transparent substrates of glass, silicone, polycarbonic acid, polyester, aromatic polyamide, polyamideimide, polyimide, and the like. A thin film transistor may be formed on the transparent substrate for driving an organic EL element.

Furthermore, it is possible to use a substrate for a solid-state imaging device in which an imaging device (light-receiving element) such as a charge coupled device (CCD) and a complementary metal-oxide semiconductor (CMOS) onto a substrate (for example, a silicon substrate).

The colored pattern in the present invention may be formed on the surface (front surface) on which an imaging device is formed or on the surface (back surface) where an imaging device is not formed, of a substrate for a solid-state imaging device.

A light shielding film may be provided between the colored pattern in a solid-state imaging device or onto the back surface of the substrate for a solid-state imaging device.

In addition, if desired, an undercoat layer may be provided onto the support in order to improve adhesiveness between the support and the upper layer, prevent diffusion of substances, or planarize the substrate surface.

As the method for applying the coloring composition of the present invention onto the support, various coating methods such as slit coating, an ink jet method, spin coating, cast coating, roll coating, and a screen printing method can be applied.

Drying (prebaking) of the coloring composition layer applied onto the support can be carried out at a temperature of 50° C. to 140° C. for 10 seconds to 300 seconds, using a hot plate, an oven, or the like.

Moreover, heating of the coloring composition layer is carried out at preferably 120° C. or lower, more preferably 50° C. to 120° C., still more preferably 80° C. to 110° C., and particularly preferably 90° C. to 105° C. By carrying out heating at 120° C. or lower, characteristics can be more effectively maintained in the case of using an organic EL element as a light-emitting light source of an image display device or in the case of a configuration in which a photoelectric conversion film of an image sensor is formed of organic materials. The heating time in this case is preferably 10 seconds to 300 seconds, more preferably 40 seconds to 250 seconds, and still more preferably 80 seconds to 220 seconds.

<<Pattern Forming Step by Photolithography Method>>

<<<Exposing Step>>>

In the exposing step, the coloring composition layer formed in the coloring composition layer forming step is patternwise exposed through a mask having a predetermined mask pattern by using, for example, an exposure device such as a stepper. Thus, a cured film is obtained.

As radiation (light) that can be used upon exposure, in particular, ultraviolet rays such as a g-line and an i-line are preferably used (an i-line is particularly preferably used). The irradiation dose (exposure dose) is preferably 30 mJ/cm$^2$ to 1,500 mJ/cm$^2$, more preferably 50 mJ/cm$^2$ to 1,000 mJ/cm$^2$, and particularly preferably 80 mJ/cm$^2$ to 500 mJ/cm$^2$.

The film thickness of the cured film is preferably 1.0 μm or less, more preferably 0.1 μm to 0.9 μm, and still more preferably 0.2 μm to 0.8 μm.

It is preferable to set the film thickness to 1.0 μm or less since a high degree of resolution and adhesiveness are obtained.

Moreover, in this step, a cured film having a small film thickness of 0.7 μm or less can be suitably formed. Further, if the obtained cured film is subjected to a development process in a pattern forming step which will be described later, it is possible to obtain a thin film having a colored pattern which exhibits excellent developability and reduced surface roughness and has an excellent pattern shape.

<<<Pattern Forming Step>>>

Next, by carrying out an alkaline developing treatment, the coloring composition layer in an area not irradiated with light in the exposing step is eluted into an aqueous alkaline solution, and as a result, only a photocured area remains.

As a developing liquid, an organic alkaline developing liquid not damaging an imaging device, a circuit, or the like in an underlayer is preferable. The development temperature is usually from 20° C. to 30° C., and the development time is 20 seconds to 90 seconds in the related art. In order to further remove residues, development is recently carried out for 120 seconds to 180 seconds in some cases. Further, in order to improve residue removal properties, a step of sufficiently shaking the developing liquid every 60 seconds and newly supplying a developing liquid is repeated plural times in some cases.

Examples of an alkaline agent used for the developing liquid include organic alkaline compounds such as aqueous ammonia, ethylamine, diethylamine, dimethyl ethanolamine, tetramethyl ammonium hydroxide, tetraethyl ammonium hydroxide, tetrapropyl ammonium hydroxide, tetrabutyl ammonium hydroxide, benzyltrimethyl ammonium hydroxide, choline, pyrrole, piperidine, and 1,8-diazabicyclo-[5,4,0]-7-undecene. An aqueous alkaline solution obtained by diluting these alkaline agents with pure water so as to yield a concentration of the alkaline agent of 0.001% by mass to 10% by mass, and preferably 0.01% by mass to 1% by mass is preferably used as the developing liquid.

Incidentally, inorganic alkali may be used for the developing liquid, and as the inorganic alkali, for example, sodium hydroxide, potassium hydroxide, sodium carbonate, sodium hydrogen carbonate, sodium silicate, sodium metasilicate, and the like are preferable.

Furthermore, in the case where a developing liquid formed of such an aqueous alkaline solution is used, the pattern is generally cleaned (rinsed) with pure water after development.

Next, it is preferable to carry out a heating treatment (postbaking) after carrying out the drying. If a multi-colored pattern is formed, the above steps can be sequentially repeated for each color to produce a cured coat. Thus, a color filter is obtained.

The postbaking is a heating treatment performed after development so as to complete curing, and in the postbaking, a thermal curing treatment is carried out usually at 100° C. to 240° C., and preferably at 200° C. to 240° C.

The postbaking treatment can be carried out on the coating film obtained after development in a continuous or batch manner, by using heating means such as a hot plate, a convection oven (a hot-air circulation type drier), and a high-frequency heater under the conditions described above.

Incidentally, in the case of using an organic EL element as a light-emitting light source of an image display device or in the case of a configuration in which a photo-electric conversion film of an image sensor is formed of organic materials, the postbaking treatment is preferably carried out at 50° C. to 120° C. (more preferably carried out at 80° C. to 100° C., and still more preferably carried out 80° C. to 90° C.).

<<Case of Forming Pattern by Dry Etching Method>>

With the colored layer, the dry etching can be carried out with an etching gas, using a patterned photoresist layer as a mask. Specifically, a positive-type or negative-type radiation-sensitive composition is applied onto the colored layer and dried to from a photoresist layer. In the formation of the photoresist layer, it is preferable to further carry out a pre-bake treatment. In particular, as a process for forming a photoresist, a configuration in which a post-exposure heating treatment (PEB) or a post-development heating treatment (postbaking treatment) is carried out is preferable.

As the photoresist, for example, a positive-type radiation-sensitive composition is used. As the positive-type radiation-sensitive composition, a positive-type resist composition suitable for a positive-type photoresist, which responds to radiation, for example, an ultraviolet ray (a g-ray, an h-ray, or an i-ray), a far ultraviolet ray including an excimer laser and the like, an electron beam, an ion beam, or an X-ray, is used. Among the radiations, a g-ray, an h-ray, or an i-ray is preferable, among which the i-ray is more preferable for the exposure.

Specifically, as the positive-type radiation-sensitive composition, a composition containing a quinonediazide compound and an alkali-soluble resin is preferable. The positive-type radiation-sensitive composition containing a quinonediazide compound and an alkali-soluble resin utilizes that a quinonediazide group is decomposed into a carboxyl group by light irradiation at a wavelength of 500 nm or less and as a result, the quinonediazide compound is shifted from an alkali-insoluble state to an alkali-soluble state. Since this positive-type photoresist is remarkably excellent in the resolving power, it is used for the manufacture of an integrated circuit such as an IC and an LSI. Examples of the quinonediazide compound include a naphthoquinonediazide compound. Examples of commercially available products thereof include "FHi622BC" (manufactured by FUJIFILM Electronics Materials Co., Ltd.).

The thickness of the photoresist layer is preferably from 0.1 to 3 μm, more preferably from 0.2 to 2.5 μm, and still more preferably from 0.3 to 2 μm. Incidentally, coating of the photoresist layer can be suitably carried out using the coating method described with respect to the above-described colored layer.

Next, a resist pattern (patterned photoresist layer) in which a resist through-hole group is disposed is formed by exposing and developing the photoresist layer. The formation of the resist pattern can be carried out by appropriately optimizing heretofore known techniques of photolithography without particular limitation. By providing the resist through-hole group in the photoresist layer by carrying out exposure and development, the resist pattern which is used as an etching mask in the subsequent etching is provided on the colored layer.

Exposure of the photoresist layer can be carried out by exposing a positive-type or negative-type radiation-sensitive composition to a g-ray, an h-ray, or an i-ray, and preferably to an i-ray through a predetermined mask pattern. After the exposure, a development treatment is carried out using a developing liquid to remove the photoresist corresponding to the region where a colored pattern is to be formed.

As the developing liquid, any developing liquid which does not affect a colored layer containing a coloring agent and dissolves the exposed area of a positive resist or the uncured area of a negative resist may be used, and for example, a combination of various organic solvents or an aqueous alkaline solution is used. As the aqueous alkaline solution, an aqueous alkaline solution prepared by dissolving an alkaline compound to yield a concentration of 0.001 to 10% by mass, and preferably 0.01 to 5% by mass is suitable. Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene. Incidentally, in the case where an aqueous alkaline solution is used as the developing liquid, a cleaning treatment with water is generally carried out after development.

Next, the colored layer is patterned by dry etching so as to form a through-hole group in the colored layer using the resist pattern as an etching mask. Thus, a colored pattern is formed. The through-hole group is provided checkerwise in the colored layer. Accordingly, a first colored pattern having the through-hole group provided in the colored layer has a plurality of first quadrangular colored pixels checkerwise.

It is preferable that the dry etching is carried out in a configuration as described below from the viewpoint of forming a pattern cross-section closer to that of a rectangle or of further reducing damage to a support.

A configuration is preferable, which includes a first-stage etching of etching up to an area (depth) where the support is not revealed by using a mixed gas of a fluorine-based gas and a oxygen gas ($O_2$), a second-stage etching of preferably etching up to the vicinity of an area (depth) where the support is revealed by using a mixed gas of a nitrogen gas ($N_2$) and an oxygen gas ($O_2$) after the first-stage etching; and an over-etching carried out after the support has been revealed. A specific manner of the dry etching as well as the first-stage etching, the second-stage etching, and the over-etching will be described below.

The dry etching is carried out according to etching conditions preliminarily determined by the following techniques.

(1) The etching rate (nm/min) in the etching of the first step, and the etching rate (nm/min) in the etching of the second step are respectively estimated.

(2) The time required for etching a desired thickness in the etching of the first step, and the time required for etching a desired thickness in the etching of the second step are respectively estimated.

(3) The etching of the first step is carried out according to the etching time estimated in (2).

(4) The etching of the second step is carried out according to the etching time estimated in (2). Alternatively, the etching time may be determined by endpoint detection, and the etching of the second step may be carried out according to the determined etching time.

(5) The over-etching time is estimated based on the total time of (3) and (4), based on which the over-etching is carried out.

The mixed gas used in the first-stage etching step preferably contains a fluorine-based gas and an oxygen gas ($O_2$) from the viewpoint of processing an organic material of the film to be etched into a rectangle shape. The first-stage etching step may avoid damage to the support by adopting the configuration of etching up to an area where the support is not revealed. After the etching is carried out up to an area where the support is not revealed by the mixed gas of a fluorine-based gas and an oxygen gas in the first-stage etching step, etching treatment in the second-stage etching step and etching treatment in the over-etching step are preferably carried out by using the mixed gas of a nitrogen gas and an oxygen gas from the viewpoint of avoiding damage to the support.

It is important that a ratio between the etching amount in the first-stage etching step and the etching amount in the second-stage etching step is determined so as not to deteriorate the linearity by the etching treatment in the first-stage etching step. The ratio of the etching amount in the second-stage etching step in the total etching amount (the sum of the etching amount in the first-stage etching step and the etching amount in the second-stage etching step) is preferably in a range of more than 0% and 50% or less, and more preferably from 10% to 20%. The etching amount means an amount determined by a difference between the remaining film thickness of the film etched and the film thickness of the film before the etching.

Furthermore, the etching preferably includes an over-etching treatment. The over-etching treatment is preferably carried out by determining an over-etching rate. The over-etching rate is preferably calculated from an etching treatment time which is carried out at first. Although the over-etching rate may be arbitrarily determined, it is preferably 30% or less, more preferably 5% to 25%, and particularly preferably 10% to 15%, of the etching processing time in the etching steps from the viewpoint of etching resistance of the photoresist and preservation of the linearity of the etched pattern.

Next, the resist pattern (that is, the etching mask) remaining after the etching is removed. The removal of the resist pattern preferably includes a step of supplying a stripping solution or a solvent on the resist pattern to make the resist pattern be in a removable state, and a step of removing the resist pattern using cleaning water.

The step of supplying a stripping solution or a solvent on the resist pattern to make the resist pattern be in a removable state includes, for example, a step of puddle development by supplying a stripping solution or a solvent at least on the resist pattern and retaining for a predetermined time. The time for retaining the stripping solution or a solvent is not particularly limited, but is preferably from several tens of seconds to several minutes.

Moreover, the step of removing the resist pattern using cleaning water includes, for example, a step of removing the resist pattern by spraying cleaning water from a spray-type or shower-type spray nozzles onto the resist pattern. As the cleaning water, pure water is preferably used. The spray nozzles include a spray nozzles having a spray area which covers the entire support and mobile spray nozzles having a mobile area which covers the entire support. In the case where the spray nozzles are mobile spray nozzles, the resist pattern can be more effectively removed by moving the mobile spray nozzles twice or more from the center of support to the edge of the support to spray cleaning water in the step of removing the resist pattern.

The stripping solution generally contains an organic solvent and may further contain an inorganic solvent. Examples of the organic solvent include 1) a hydrocarbon-based compound, 2) a halogenated hydrocarbon-based compound, 3) an alcohol-based compound, 4) an ether- or acetal-based compound, 5) a ketone- or aldehyde-based compound, 6) an ester-based compound, 7) a polyhydric alcohol-based compound, 8) a carboxylic acid- or its acid anhydride-based compound, 9) a phenol-based compound, 10) a nitrogen-containing compound, 11) a sulfur-containing compound, and 12) a fluorine-containing compound. The stripping solution preferably contains a nitrogen-containing compound, and more preferably contains an acyclic nitrogen-containing compound and a cyclic nitrogen-containing compound.

The acyclic nitrogen-containing compound is preferably an acyclic nitrogen-containing compound having a hydroxyl group. Specific examples thereof include monoisopropanolamine, diisopropanolamine, triisopropanolamine, N-ethylethanolamine, N,N-dibutylethanolamine, N-butylethanolamine, monoethanolamine, diethanolamine, and triethanolamine, among which monoethanolamine, diethanolamine, and triethanolamine are preferable, and monoethanolamine ($H_2NCH_2CH_2OH$) is more preferable. Further, examples of the cyclic nitrogen-containing compound include isoquinoline, imidazole, N-ethylmorpholine, ε-caprolactam, quinoline, 1,3-dimethyl-2-imidazolidinone, α-picoline, β-picoline, γ-picoline, 2-pipecoline, 3-pipecoline, 4-pipecoline, piperazine, piperidine, pyrazine, pyridine, pyrrolidine, N-methyl-2-pyrrolidone, N-phenyl morpholine, 2,4-lutidine, and 2,6-lutidine, among which N-methyl-2-pyrrolidone and N-ethylmorpholine are preferable, and N-methyl-2-pyrrolidone (NMP) is more preferable.

The stripping solution preferably contains both the acyclic nitrogen-containing compound and the cyclic nitrogen-containing compound, more preferably contains at least one selected from monoethanolamine, diethanolamine, or triethanolamine as the acyclic nitrogen-containing compound, and at least one selected from N-methyl-2-pyrrolidone or N-ethylmorpholine as the cyclic nitrogen-containing compound, and still more preferably contains monoethanolamine and N-methyl-2-pyrrolidone.

In the case of the removal with a stripping solution, it is sufficient that the resist pattern formed on the first colored pattern is removed, and in a case where a deposit of an etching product is attached to the side wall of the first colored pattern, it is not always necessary to completely remove the deposit. The deposit means an etching product attached and deposited to the side wall of colored layer.

For the stripping solution, it is preferable that the content of the acyclic nitrogen-containing compound is from 9 parts by mass to 11 parts by mass based on 100 parts by mass of the stripping solution, and the content of the cyclic nitrogen-containing compound is from 65 parts by mass to 70 parts by mass based on 100 parts by mass of the stripping solution. The stripping solution is preferably one prepared by diluting a mixture of the acyclic nitrogen-containing compound and the cyclic nitrogen-containing compound with pure water.

If desired, the method for manufacturing a color filter of the present invention may include, as a step other than the above steps, a step known as a method for producing a color filter for a solid-state imaging device. For example, in the production method, if desired, a curing step of curing the formed colored pattern by heating and/or exposure may be carried out after the coloring composition layer forming step, the exposing step, and the pattern forming step are carried out.

Furthermore, in the case where the coloring composition according to the present invention is used, for example, a nozzle of an ejection portion or a piping portion of a coating device is clogged, or the coloring composition or a pigment adheres to or is precipitated or dried inside the coating machine, and as a result, contamination and the like occur in some cases. Therefore, in order to efficiently clean off the contamination caused by the coloring composition of the present invention, it is preferable to use the aforementioned solvent relating to the present composition as a cleaning liquid. In addition, the cleaning liquids described in JP1995-128867A (JP-H07-128867A), JP1995-146562A (JP-H07-146562A), JP1996-278637A (JP-H08-278637A), JP2000-273370A, JP2006-85140A, JP2006-291191A, JP2007-2101A, JP2007-2102A, JP2007-281523A, and the like can also be suitably used to clean and remove the coloring composition according to the present invention.

Among the above, alkylene glycol monoalkyl ether carboxylate and alkylene glycol monoalkyl ether are preferable.

These solvents may be used alone or as a mixture of two or more kinds thereof. In the case where two or more kinds thereof are mixed, it is preferable to mix a solvent having a hydroxyl group with a solvent not having a hydroxyl group. The mass ratio between the solvent having a hydroxyl group and the solvent not having a hydroxyl group is 1/99 to 99/1, preferably 10/90 to 90/10, and still more preferably 20/80 to 80/20. A mixed solvent in which propylene glycol monomethyl ether acetate (PGMEA) is mixed with propylene glycol monomethyl ether (PGME) at a ratio of 60/40 is particularly preferable. Incidentally, in order to improve the permeability of the cleaning liquid with respect to the contaminant, it is preferable to add the aforementioned surfactants relating to the coloring composition of the present invention to the cleaning liquid.

Since the color filter of the present invention uses the coloring composition of the present invention, light fastness, color migration properties, and flatness are excellent.

The color filter of the present invention can be suitably used for a solid-state imaging device such as a CCD and a CMOS, and is particularly preferable for a CCD, a CMOS, and the like with a high resolution, having more than 1,000,000 pixels. The color filter for a solid-state imaging device of the present invention can be used as, for example, a color filter disposed between a light-receiving portion of each pixel constituting a CCD or a CMOS and a microlens for condensing light.

Furthermore, the color filter of the present invention can be preferably used for an organic EL element. As the organic EL element, a white organic EL element is preferable. The organic EL element preferably has a tandem structure. The tandem structure of the organic EL element is described in JP2003-45676A, "Forefront of Organic EL Technology Development—Know-How Collection of High Brightness/High Precision/Long Life—," reviewed by Mikami Akiyoshi, Technical Information Institute, pp. 326-328, 2008, and the like. Examples of the tandem structure of the organic EL element include a structure in which an organic EL layer is provided between a lower electrode with light reflectivity and an upper electrode with light transmission on one side of a substrate. The lower electrode is preferably configured with a material having a sufficient reflection rate in a visible light wavelength region. The organic EL layer preferably has laminate layer structure (tandem structure) including a plurality of light emitting layers, with the light emitting layers laminated. The plurality of light emitting layers of the organic EL layer can include, for example, a red light emitting layer, a green light emitting layer, and a blue light emitting layer. Further, the organic EL layer preferably has a plurality of light emitting auxiliary layers for light emission of the light emitting layers, in addition with the plurality of light emitting layers. The organic EL layer can have, for example, a lamination structure in which a light emitting layer and a light-emitting auxiliary layer are alternately laminated. An organic EL element having an organic EL layer such a structure can emit white light. In this case, it is preferable that a spectrum of white light which the organic EL element emits has strong maximum light emitting peaks at a blue region (430 nm to 485 nm), a green region (530 nm to 580 nm), and a yellow region (580 nm to 620 nm). It is more preferable that the spectrum additionally has a strong maximum light emitting peak at a red region (650 nm to 700 nm), in addition the light emitting peaks. By combining an organic EL element (white organic EL element) that emits white light with the color filter of the present invention, an excellent spectrum in terms of color reproducibility is obtained, and thus, a clear image or image can be displayed.

The film thickness of the colored pattern (colored pixel) in the color filter of the present invention is preferably 2.0 μm or less, more preferably 1.0 μm or less, and still more preferably 0.7 μm or less.

Moreover, the size (pattern width) of the colored pattern (colored pixel) is preferably 2.5 μm or less, more preferably 2.0 μm or less, and particularly preferably 1.7 μm or less.

<Solid-State Imaging Device>

The solid-state imaging device of the present invention includes the color filter of the present invention. The constitution of the solid-state imaging device of the present invention is not particularly limited as long as the solid-state imaging device is constituted to include the color filter in the present invention and functions as a solid-state imaging device. However, for example, the solid-state imaging device can be configured as below.

The solid-state imaging device has a configuration which has a plurality of photodiodes constituting a light-receiving area of a solid-state imaging device (a CCD image sensor, a CMOS image sensor, or the like) and a transfer electrode formed of polysilicon or the like, on a support; a light shielding film formed of tungsten or the like onto the photodiodes and the transfer electrodes, which has openings only over the light-receiving portion of the photodiode; a device protecting film formed of silicon nitride or the like, which is formed to cover the entire surface of the light shielding film and the light receiving portion of the photodiodes, on the light shielding film; and the color filter for a solid-state imaging device of the present invention on the device protecting film.

In addition, the solid-state imaging device may have a configuration in which a light-collecting means (for example, a micro lens or the like, the same applies hereinafter) is disposed on the device protecting film and under the color filter (side a side closer to the support), a configuration in which a light-condensing means is disposed on the color filter, and the like.

<Image Display Device>

The color filter of the present invention can be used not only for a solid-state imaging device, but also for an image display device such as a liquid crystal display device and an organic EL display device. In particular, the color filter is suitable in the applications of a liquid crystal display device. The liquid crystal display device including the color filter of the present invention can display a high-quality image showing a good hue of a display image and having excellent display characteristics.

The definition of display devices or details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter of the present invention may be used for a liquid crystal display device using a color TFT system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching driving system such as IPS and a pixel division system such as MVA, or to STN, TN, VA, OCS, FFS, R-OCB, and the like.

In addition, the color filter in the present invention can also be used in a Color-filter On Array (COA) system which is a bright and high-definition system. In the liquid crystal display device of the COA system, the characteristics required for a color filter layer need to include characteristics required for an interlayer insulating film, that is, a low dielectric constant and resistance to a stripping solution in some cases, in addition to the generally required characteristics as described above. In the color filter of the present invention, since a colorant having an excellent hue is used, the color purity, the light-transmitting properties, and the like are excellent, and the tone of the colored pattern (pixel) is excellent. Accordingly, a liquid crystal display device of a COA system which has a high resolution and excellent long-term durability can be provided. Further, in order to satisfy the characteristics required for a low dielectric constant, a resin coat may be provided on the color filter layer.

These image display systems are described in, for example, p. 43 of "EL, PDP, and LCD Display Technologies and Recent Trend in Market (TORAY RESEARCH CENTER, Research Department, published in 2001)", and the like.

The liquid crystal display device including the color filter in the present invention is constituted with various members such as an electrode substrate, a polarizing film, a phase difference film, a backlight, a spacer, and a view angle compensation film, in addition to the color filter of the present invention. The color filter of the present invention can be applied to a liquid crystal display device constituted with these known members. These members are described in, for example, "94 Market of Peripheral Materials And Chemicals of Liquid Crystal Display (Kentaro Shima, CMC Publishing Co., Ltd., published in 1994)" and "2003 Current Situation of Market Relating to Liquid Crystal and Prospects (Vol. 2) (Ryokichi Omote, Fuji Chimera Research Institute, Inc., published in 2003)".

The backlight is described in SID Meeting Digest 1380 (2005) (A. Konno, et al.), December Issue of Monthly "Display", 2005, pp. 18-24 (Yasuhiro Shima) and pp. 25-30 (Takaaki Yagi) of the documents, and the like.

If the color filter in the present invention is used in a liquid crystal display device, high contrast can be realized when the color filter is combined with a three-wavelength tube of a cold cathode tube known in the related art. In addition, if a diode light source in red, green, and blue (RGB-LED) is used as a backlight, a liquid crystal display device having high luminance, high color purity, and good color reproducibility can be provided.

EXAMPLES

Hereinafter, the present invention will be described in more detail with reference to Examples, but the present invention is not limited to Examples below as long as the gist of the present invention is not impaired. Further, "%" and "part (s)" are based on mass unless otherwise specified.

<Method for Measuring Weight-Average Molecular Weight>

The weight-average molecular weight was measured by Gel Permeation Chromatography (GPC) measurement as a value in terms of polystyrene. Specifically, it was determined using HLC-8220 (manufactured by TOSOH CORPORATION) with TSKgel Super AWM-H (manufactured by Tosoh Corporation, 6.0 mm ID×15.0 cm) and a 10 mmol/L lithium bromide N-methylpyrrolidinone (NMP) solution as an eluent.

<Method for Measuring Acid Value>

The acid value represents the weight of potassium hydroxide required to neutralize acidic components per gram of the solid content. Specifically, a measurement sample was dissolved in a mixed solvent of tetrahydrofuran/water=9/1, and the obtained solution was neutralization-titrated with a 0.1 M sodium hydroxide solution at 25° C., using a potentiometric titrator (trade name: AT-510, manufactured by KYOTO ELECTRONICS MANUFACTURING CO., LTD.). The acid value was calculated by the following equation, defining the inflection point of a titration pH curve as a titration endpoint.

$$A=56.11\times Vs\times 0.1\times f/w$$

A: Acid value (mgKOH/g)

Vs: Use Amount (mL) of a 0.1 mol/l aqueous sodium hydroxide solution required for titration f: Titer of the 0.1 mol/l aqueous sodium hydroxide solution w: Mass (g) (in terms of solid content) of a measurement sample <Measurement of Absorbance>

The absorbance at 25° C. was measured with a UV-Vis-NIR spectrophotometer (trade name: Cary 5000, manufactured by Agilent Technologies, Inc.), using a cell having an optical path length of 1 cm.

<Synthesis Examples of Triarylmethane Compounds (A-tp-1) to (A-tp-9)>

In the same manner as the method described in JP2000-162429A, triarylmethane compounds (A-tp-1) to (A-tp-9) were synthesized.

<Synthesis Example of Xanthene Compound (A-xt-104)>

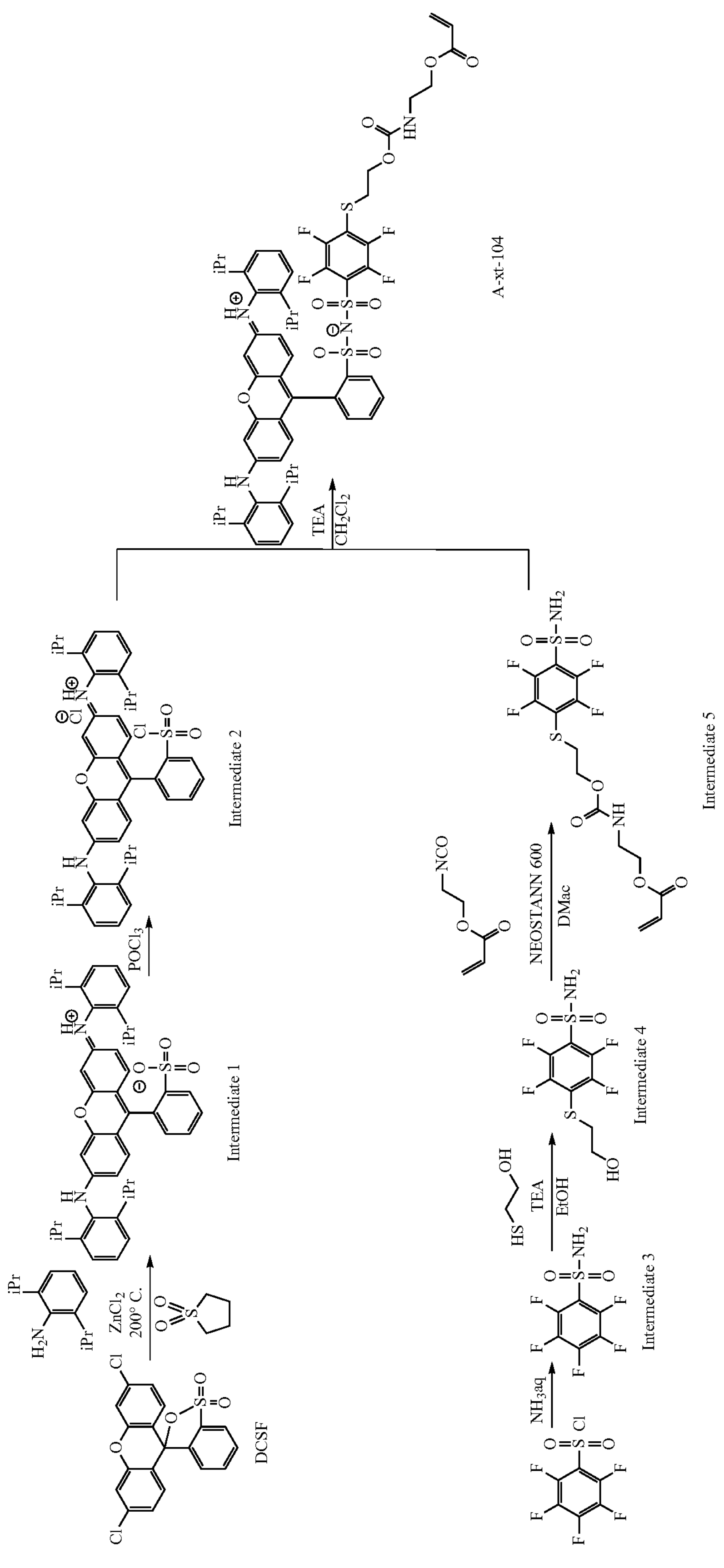
DCSF
ZnCl$_2$
200° C.
Intermediate 1
POCl$_3$
Intermediate 2
NH$_3$aq
Intermediate 3
TEA
EtOH
Intermediate 4
NEOSTANN 600
DMac
Intermediate 5
TEA
CH$_2$Cl$_2$
A-xt-104

<<Synthesis of Intermediate 1>>

31 parts of DCSF (manufactured by Chugai Kasei Co., Ltd.), 67 parts of 2,6-diisopropylaniline, 17 parts of zinc chloride, and 120 parts of sulfolane were put into a flask, and the mixture was stirred at an outer temperature of 200° C. for 8 hours. Thereafter, the mixture was left to be cooled to room temperature, the reaction liquid was added dropwise to 600 parts of 2 N aqueous hydrochloric acid, and the precipitated crystals were separated by filtration. The crystals were dispersed and washed at 40° C. with 600 parts of acetonitrile, collected by filtration, and blast-dried for 10 hours to obtain 42.5 parts (yield: 82%) of an intermediate 1.

<<Synthesis of Intermediate 2>>

11 parts of the intermediate 1 and 50 parts of phosphorus oxychloride were put into a flask, and the mixture was stirred at 60° C. for 4 hours. The mixture was left to be cooled to room temperature, the reaction liquid was added dropwise to 150 parts of ice water, and the mixture was stirred for 30 minutes. The obtained crystals separated by filtration and washed with 20 parts of water, and then the obtained crystals were dissolved in 150 parts of chloroform and filtered through Celite. The filtrate was liquid-separated, and washed with 100 parts of 5% brine and 100 parts of 15% brine. The resultant was dried over sodium sulfate and then concentrated under reduced pressure to obtain 12.1 parts (yield: 91%) of an intermediate 2.

<<Synthesis of Intermediate 3>>

15 parts of pentafluorobenzenesulfonyl chloride and 300 parts of tetrahydrofuran (THF) were put into a flask and the inner temperature was cooled to −10° C. 6.8 parts of 28% aqueous ammonia was added thereto while keeping the reaction liquid at 0° C. or lower. After dropwise addition and stirring at 0° C. for 1 hour, the reaction liquid was filtered. The obtained filtrate was concentrated under reduced pressure to remove THF, then 100 parts of water was added thereto, and the mixture was stirred. The obtained solid was filtered, washed with water, and then blast-dried for 10 hours to obtain 11.7 parts (yield: 84%) of an intermediate 3.

<<Synthesis of Intermediate 4>>

15 parts of the intermediate 3, 4.9 parts of 2-mercaptoethanol, and 100 parts of methanol were added into a flask, and the mixture was stirred at room temperature. 6.5 parts of triethylamine was added dropwise thereto while keeping the temperature of the reaction liquid to no higher than 30° C. The mixture was stirred at room temperature for 1 hour and concentrated under reduced pressure, and then 90 parts of ethyl acetate, 80 parts of saturated saline, and 10 parts of saturated aqueous sodium bicarbonate were added to thereto to perform a liquid separation operation. The aqueous layer was extracted with 90 parts of ethyl acetate, and then magnesium sulfate was added to the obtained organic layer. After filtration, the filtrate was concentrated under reduced pressure and blast-dried for 10 hours to obtain 17 parts (yield: 92%) of an intermediate 4.

<<Synthesis of Intermediate 5>>

49 parts of the intermediate 4, 25 parts of 2-isocyanatoethyl acrylate (AOI, manufactured by Showa Denko K. K.), 0.2 parts of dibutylhydroxytoluene (BHT), 95 parts of dimethylacetamide, and 0.1 parts of NEOSTANN U-600 (manufactured by Nitto Kasei Co., Ltd.) were added into a flask, and the mixture was stirred at 85° C. for 1 hour. Subsequently, 500 parts of ethyl acetate and 500 parts of saturated saline were added thereto to perform a liquid separation operation. Sodium sulfate was added to the obtained organic layer and then filtered, and the filtrate was concentrated under reduced pressure. The obtained solid was suspended and washed with 170 parts of chloroform, then filtered, and blast-dried to obtain 60 parts (yield: 84%) of an intermediate 5.

<<Synthesis of Xanthene Compound (A-xt-104)>>

5 parts of intermediate 5, 50 parts of methylene chloride, 3.4 parts of triethylamine were added into a flask, and the mixture was stirred at room temperature. 10.8 parts of intermediate 2 was added thereto and the mixture was stirred at room temperature for 2 hours. After completion of the reaction, 200 parts of chloroform, 500 parts of pure water, and 200 parts of saturated saline were added thereto to perform a liquid separation operation. Sodium sulfate was added to the obtained organic layer, followed by dehydration and then separation by filtration, and the filtrate was concentrated under reduced pressure. The obtained solid was dissolved in chloroform and purified by column chromatography using chloroform/ethyl acetate as a solvent to obtain 12.5 parts (yield: 86%) of A-xt-104.

<Synthesis Examples of Xanthene Compounds (A-xt-101) to (A-xt-103), (A-xt-105) to (A-xt-116)>

Xanthene compounds (A-xt-101) to (A-xt-103), and (A-xt-105) to (A-xt-116) were synthesized in the same manner as for the xanthene compound (A-xt-104).

<Synthesis of Compound Having Mercapto Group>

As shown below, compounds (S-25) and (S-27) having a mercapto group were synthesized.

Synthesis of (S-25)

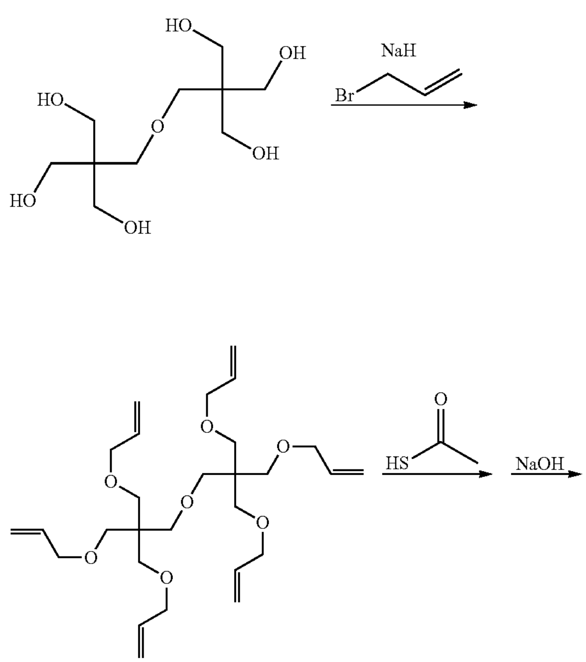

Intermediate 11

-continued

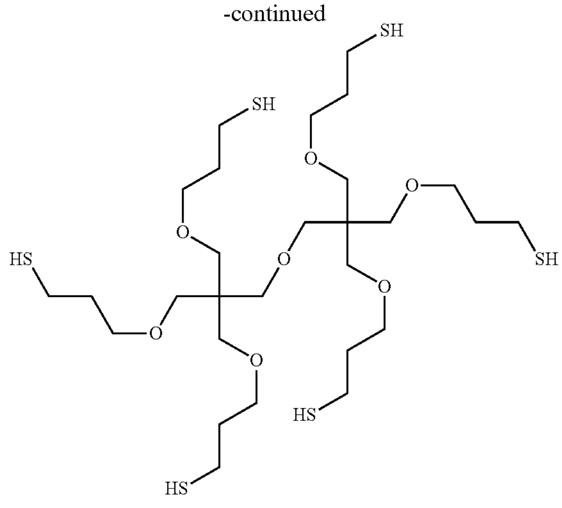

(S-25)

15 parts of dipentaerythritol, 270 parts of dehydrated N,N-dimethylformamide (DMF), and 86 parts of allyl bromide were added into a three-neck flask, and the mixture was stirred in a water bath at 20° C. in a nitrogen atmosphere. A total amount of 35 parts of sodium hydride (a 60% oil dispersion liquid) was added thereto while not keeping the temperature at no higher than 35° C., and then the mixture was stirred at room temperature for 2 hours. The reaction liquid was portionwise added to 200 parts of 1 N aqueous hydrochloric acid to stop the reaction, and then 200 parts of ethyl acetate was added thereto to perform a liquid separation operation. Subsequently, the organic layer was washed with 200 parts of 1 N aqueous hydrochloric acid, 200 parts of water, and 200 parts of saturated saline. Sodium sulfate was added to the obtained organic layer, followed by separation by filtration, and the filtrate was concentrated under reduced pressure to obtain 28 parts of an intermediate 11.

Subsequently, 25 parts of the intermediate 11 and 58 parts of thioacetic acid were dissolved in 125 parts of dehydrated tetrahydrofuran (THF), and the solution was stirred at 70° C. for 30 minutes in a nitrogen atmosphere. Then, 2 parts of azobisisobutyronitrile was added thereto and the mixture was stirred at 70° C. for 4 hours. The obtained reaction liquid was concentrated under reduced pressure, followed by addition of dehydrated methanol, and 19 parts of sodium methoxide (28% methanol solution) was added thereto. After 1 hour, the reaction solution was added dropwise to 120 parts of 1 N aqueous hydrochloric acid in an ice bath, and then 200 parts of ethyl acetate was added thereto to perform a liquid separation operation. Subsequently, the organic layer was washed with 200 parts of 1 N aqueous hydrochloric acid, 200 parts of water, and 200 parts of saturated saline. Sodium sulfate was added to the obtained organic layer, then the mixture was separated by filtration, and the filtrate was concentrated under reduced pressure to obtain 13 parts of S-25.

Synthesis of (S-27)

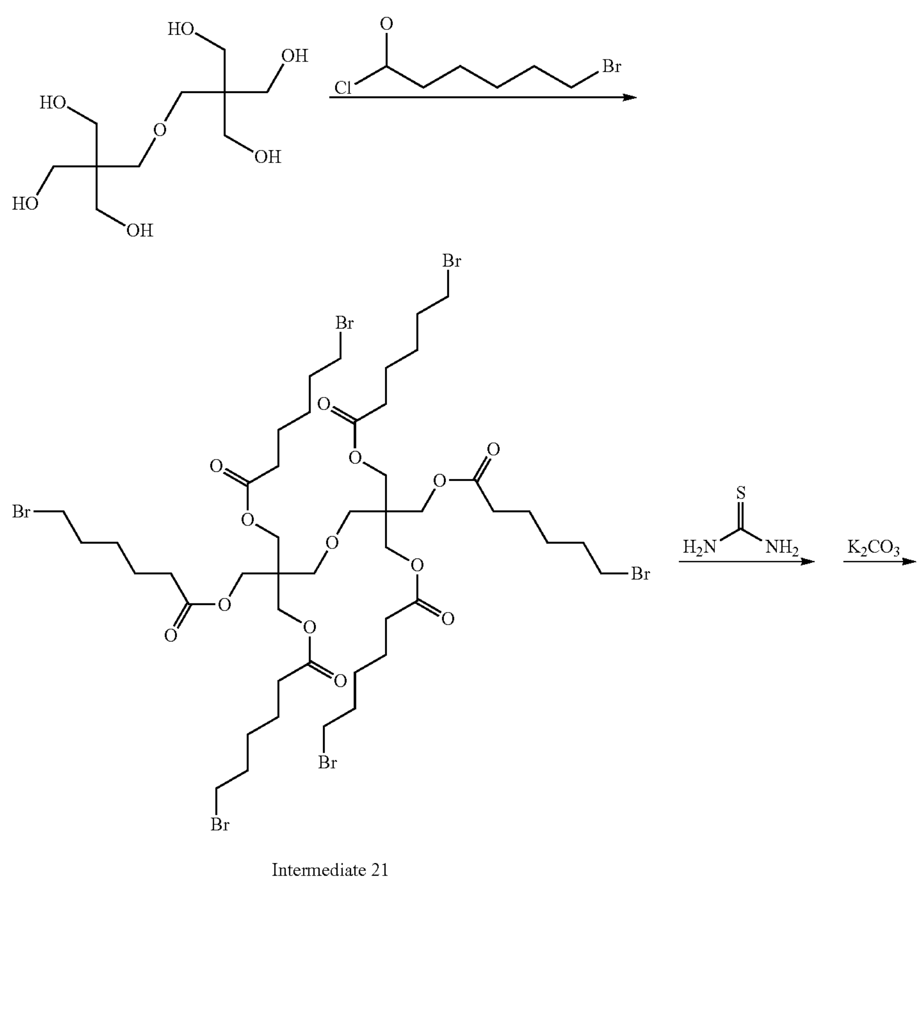

Intermediate 21

-continued

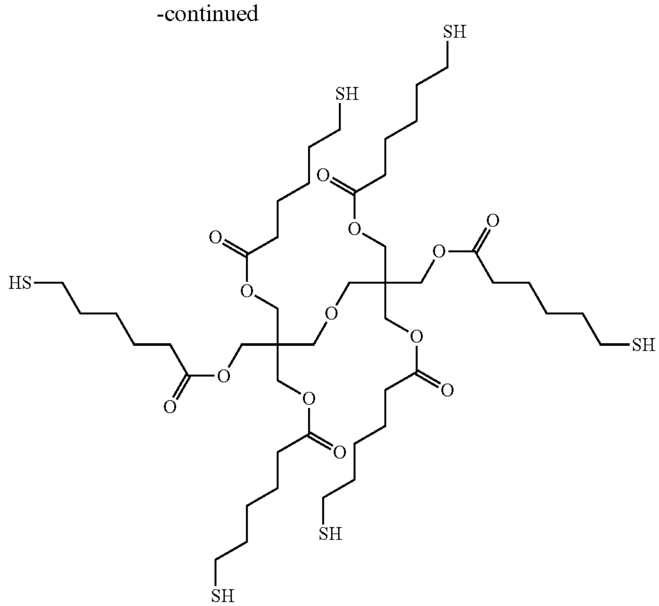

(S-27)

5 parts of dipentaerythritol and 80 parts of dimethylacetamide were added into a three-neck flask, and the mixture was stirred in a water bath at 20° C. in a nitrogen atmosphere. 31 parts of 6-bromohexanoyl chloride was added dropwise thereto while not keeping the temperature at no higher than 30° C., and then the mixture was stirred at room temperature for 2 hours. The reaction liquid was portionwise added to 350 parts of 1 N aqueous hydrochloric acid to stop the reaction, and then 500 parts of ethyl acetate was added thereto to perform a liquid separation operation. Subsequently, the organic layer was washed with 250 parts of saturated aqueous sodium bicarbonate, 250 parts of water, and 150 parts of saturated saline. Sodium sulfate was added to the obtained organic layer, followed by separation by filtration, and the filtrate was concentrated under reduced pressure to obtain 24 parts of an intermediate 21.

Subsequently, 20 parts of the intermediate 21, 8.9 parts of thiourea, 200 parts of ethanol, and 17.6 parts of potassium iodide were added into a three-neck flask, and the mixture was reacted for 18 hours under heating and refluxing in a nitrogen atmosphere. Thereafter, 81 parts of a 20% aqueous potassium carbonate solution was added thereto, and the mixture was reacted at 70° C. for 3 hours, and then cooled. Subsequently, 150 parts of 1 N aqueous hydrochloric acid and 300 parts of chloroform were added thereto to perform a liquid separation operation. The mixture was washed twice with 150 parts of saturated saline, sodium sulfate was added to the organic layer, followed by separation by filtration, and the filtrate was concentrated under reduced pressure to obtain 14.7 parts of S-27.

<Synthesis of Mercaptan Compound Represented by General Formula (3)>

As shown below, chain transfer agents B-1 to B-44 (mercaptan compounds represented by General Formula (3)) were synthesized.

Synthesis Example B-1

2.0 parts of dipentaerythritol hexakis(3-mercaptopropionate) [DPMP; manufactured by SC Organic Chemical Co., Ltd.], 12.0 parts of a triarylmethane compound (A-tp-1), and 1.68 parts of triethylamine were dissolved in 50.0 parts of N-methylpyrrolidinone (NMP), and the mixture was heated at 50° C. for 12 hours. After cooling to room temperature, the reaction solution was added dropwise to a mixed solvent of 250 parts of hexane and 250 parts of ethyl acetate, and the mixture was reprecipitated to obtain 12.5 parts of the mercaptan compound shown below (chain transfer agent B-1). The ratio of the colorant moiety to the $R^3$ moiety in the NMR measurement was found to be 5.

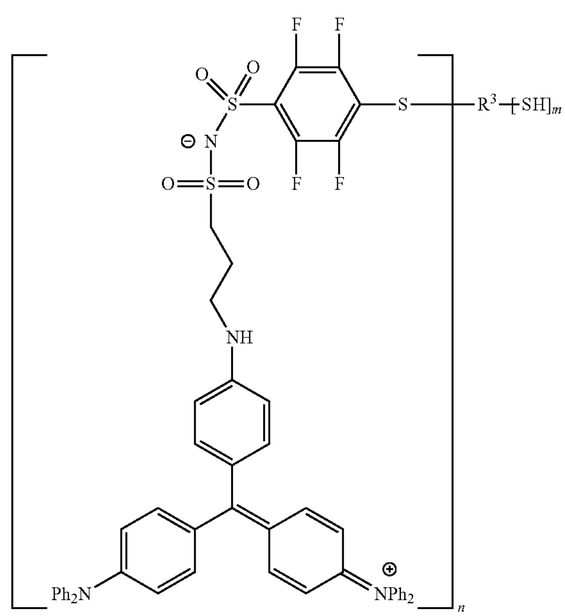

-continued

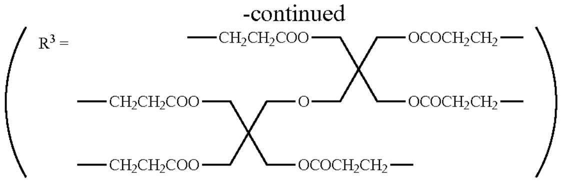

(B-1) n = 5, m = 1
(B-2) n = 4, m = 2
(B-3) n = 3, m = 3
(B-4) n = 2, m = 4

Synthesis Example B-2

In the same manner as in Synthesis Example B-1 except that 12.0 parts of the triarylmethane compound (A-tp-1) and 1.68 parts of triethylamine were changed to 9.6 parts of the triarylmethane compound (A-tp-1) and 1.34 parts of triethylamine in Synthesis Example B-1, 10.5 parts of the mercaptan compound shown above (chain transfer agent B-2) was obtained. The ratio of the colorant moiety to the $R^3$ moiety in the NMR measurement was found to be 4.

Synthesis Example B-3

In the same manner as in Synthesis Example B-1 except that 12.0 parts of the triarylmethane compound (A-tp-1) and 1.68 parts of triethylamine were changed to 7.2 parts of the triarylmethane compound (A-tp-1) and 1.01 parts of triethylamine in Synthesis Example B-1, 8.3 parts of the mercaptan compound shown above (chain transfer agent B-3) was obtained. The ratio of the colorant moiety to the $R^3$ moiety in the NMR measurement was found to be 3.

Synthesis Example B-4

In the same manner as in Synthesis Example B-1 except that 12.0 parts of the triarylmethane compound (A-tp-1) and 1.68 parts of triethylamine were changed to 4.8 parts of the triarylmethane compound (A-tp-1) and 0.67 parts of triethylamine in Synthesis Example B-1, 6.0 parts of the mercaptan compound shown above (chain transfer agent B-4) was obtained. The ratio of the colorant moiety to the $R^3$ moiety in the NMR measurement was found to be 2.

Synthesis Example B-5

In the same manner as in Synthesis Example B-1 except that 12.0 parts of the triarylmethane compound (A-tp-1) and 1.68 parts of triethylamine were changed to 8.2 parts of the triarylmethane compound (A-tp-2) and 1.3 parts of triethylamine in Synthesis Example B-1, 9.2 parts of the mercaptan compound shown above (chain transfer agent B-5) was obtained. The ratio of the colorant moiety to the $R^3$ moiety in the NMR measurement was found to be 4.

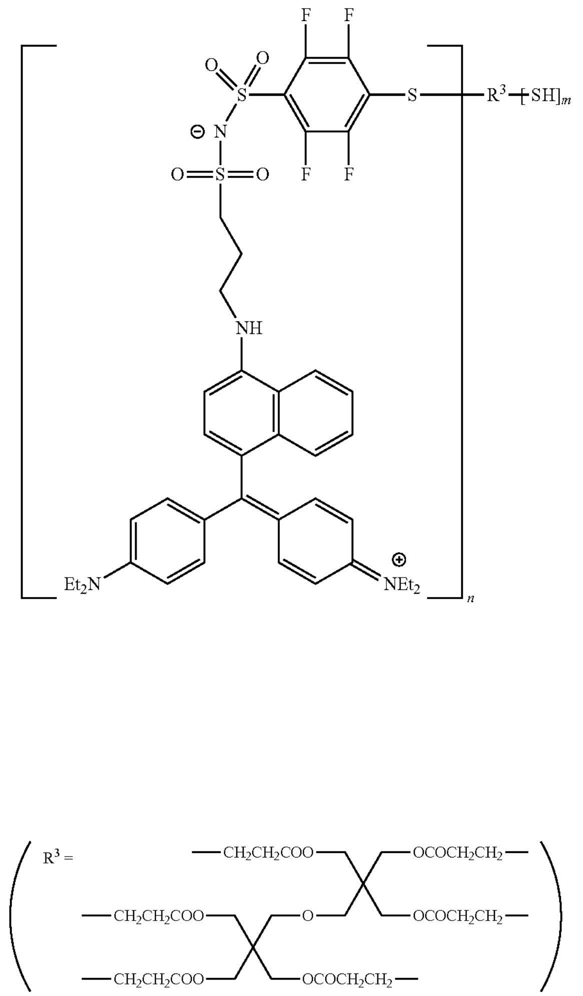

(B-5) n = 4, m = 2

Synthesis Example B-6

2.0 parts of dipentaerythritol hexakis(3-mercaptopropionate) [DPMP; manufactured by SC Organic Chemical Co., Ltd.], 11.6 parts of a triarylmethane compound (A-tp-3), and 0.21 parts of triethylamine were dissolved in 50.0 parts of N-methylpyrrolidinone (NMP), and the mixture was heated at 50° C. for 12 hours. After cooling to room temperature, the reaction solution was added dropwise to a mixed solvent of 250 parts of hexane and 250 parts of ethyl acetate, and the mixture was reprecipitated to obtain 12.3 parts of a mercaptan compound (chain transfer agent B-6).

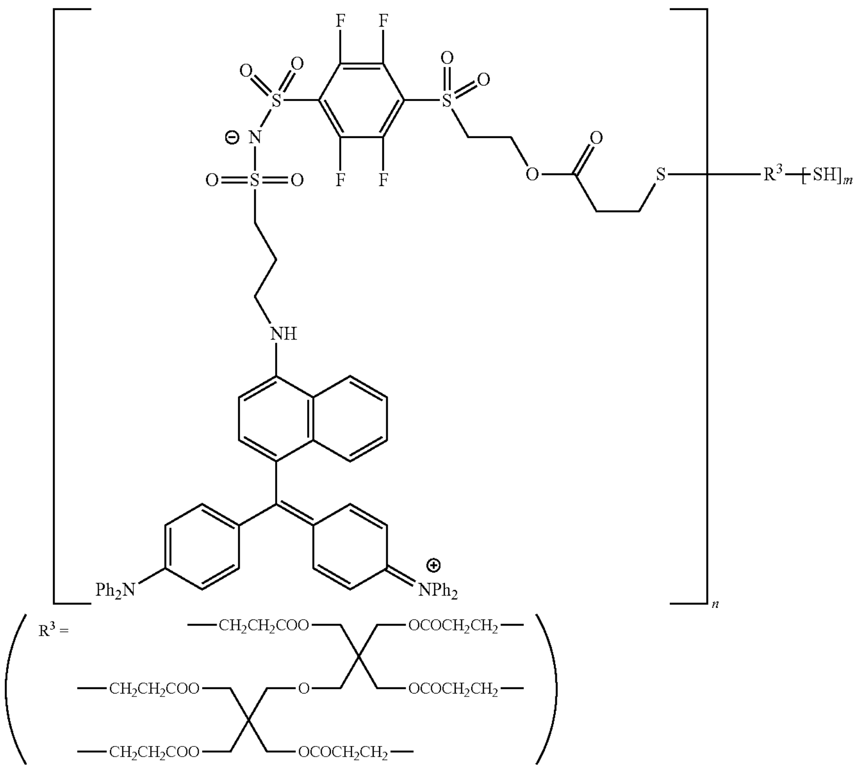
(B-6) n = 4, m = 2
Synthesis Example B-7
In the same manner as in Synthesis Example B-6 except that 11.6 parts of the triarylmethane compound (A-tp-3) was changed to 10.5 parts of the triarylmethane compound (A-tp-4) in Synthesis Example B-6, 11.3 parts of a mercaptan compound (chain transfer agent B-7) was obtained.
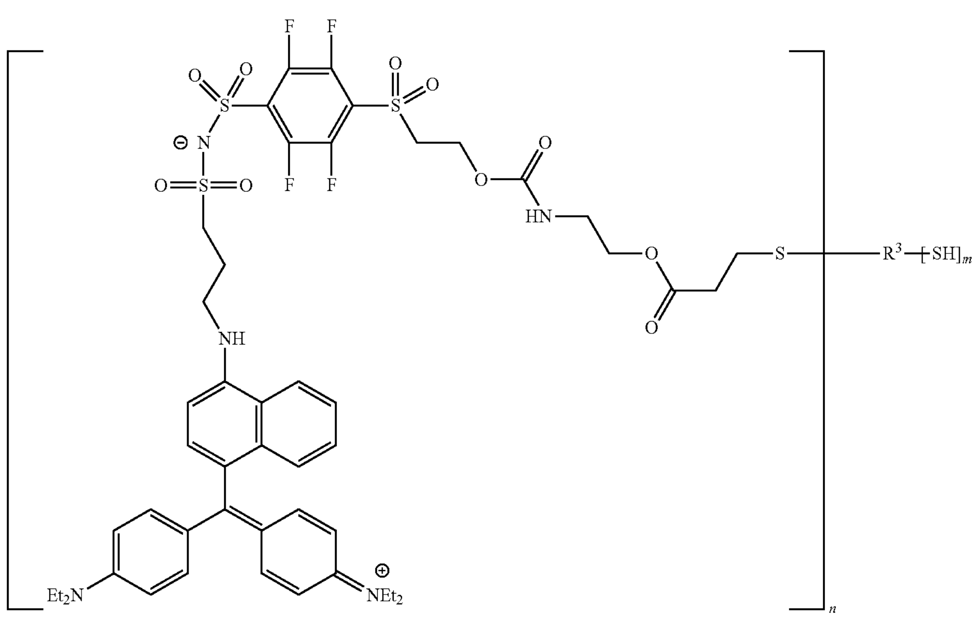

-continued

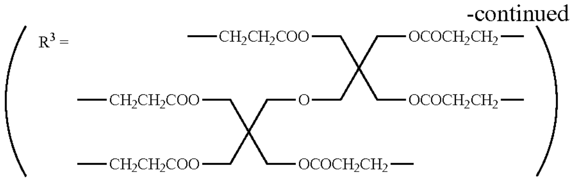
(B-7) n = 4, m = 2

Synthesis Example B-8

In the same manner as in Synthesis Example B-6 except that 11.6 parts of the triarylmethane compound (A-tp-3) was changed to 10.8 parts of the triarylmethane compound (A-tp-5) in Synthesis Example B-6, 11.0 parts of a mercaptan compound (chain transfer agent B-8) was obtained.

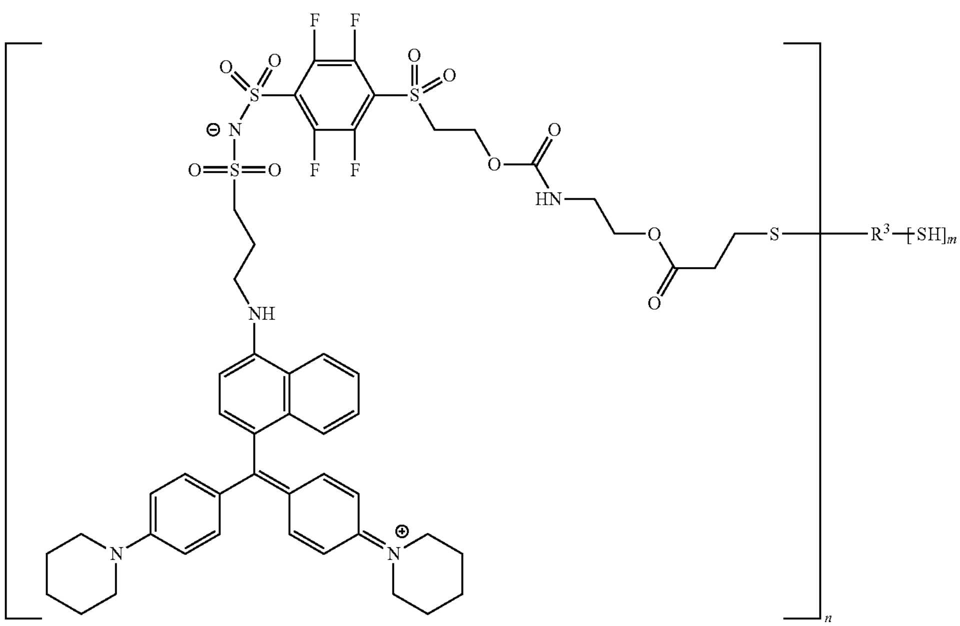

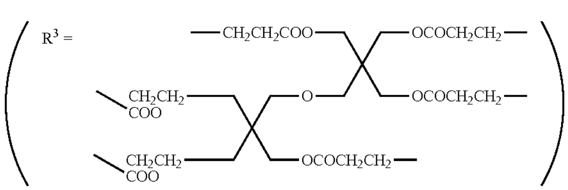
(B-8) n = 4, m = 2

Synthesis Example B-9

In the same manner as in Synthesis Example B-6 except that 11.6 parts of the triarylmethane compound (A-tp-3) was changed to 9.5 parts of the triarylmethane compound (A-tp-6) in Synthesis Example B-6, 10.4 parts of a mercaptan compound (chain transfer agent B-9) was obtained.

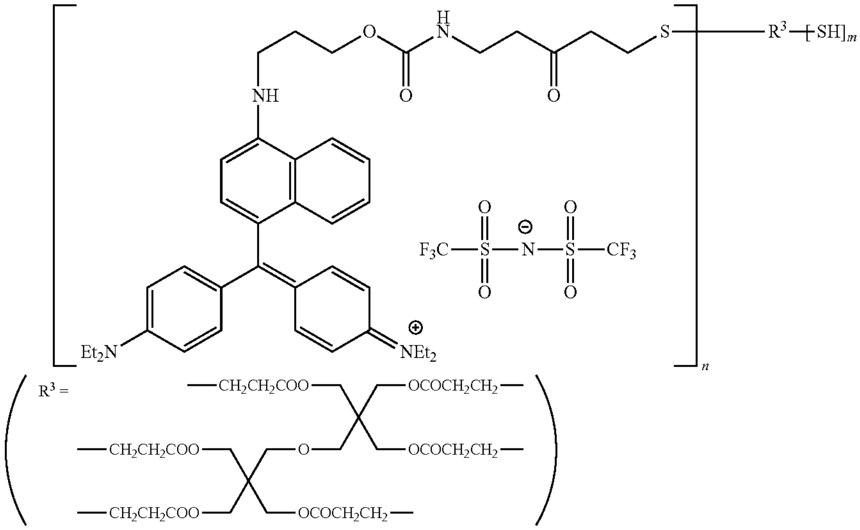

(B-9) n = 4, m = 2

Synthesis Example B-10

In the same manner as in Synthesis Example B-6 except that 2.0 parts of dipentaerythritol hexakis(3-mercaptopropionate) [DPMP; manufactured by SC Organic Chemical Co., Ltd.], 11.6 parts of the triarylmethane compound (A-tp-3), and 0.21 parts of triethylamine were changed to 2.0 parts of pentaerythritol tetra(3-mercaptopropionate) [PEMP; manufactured by SC Organic Chemical Co., Ltd.], 9.5 parts of the triarylmethane compound (A-tp-6), and 0.25 parts of triethylamine in Synthesis Example B-6, 12.1 parts of a mercaptan compound (chain transfer agent B-10) was obtained.

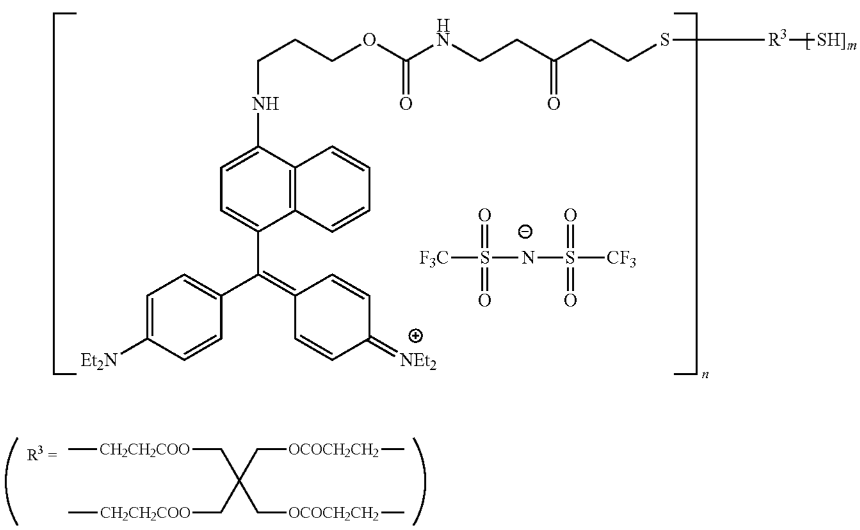

(B-10) n = 3, m = 1

Synthesis Example B-11

In the same manner as in Synthesis Example B-6 except that 2.0 parts of dipentaerythritol hexakis(3-mercaptopropionate) [DPMP; manufactured by SC Organic Chemical Co., Ltd.], 11.6 parts of the triarylmethane compound (A-tp-3), and 0.21 parts of triethylamine were changed to 2.0 parts of pentaerythritol tetrakis(3-mercaptobutyrate) [KARENZ MTPE1; manufactured by Showa Denko Co., Ltd.], 8.5 parts of the triarylmethane compound (A-tp-6), and 0.19 parts of triethylamine in Synthesis Example B-6, 9.5 parts of a mercaptan compound (chain transfer agent B-11) was obtained.

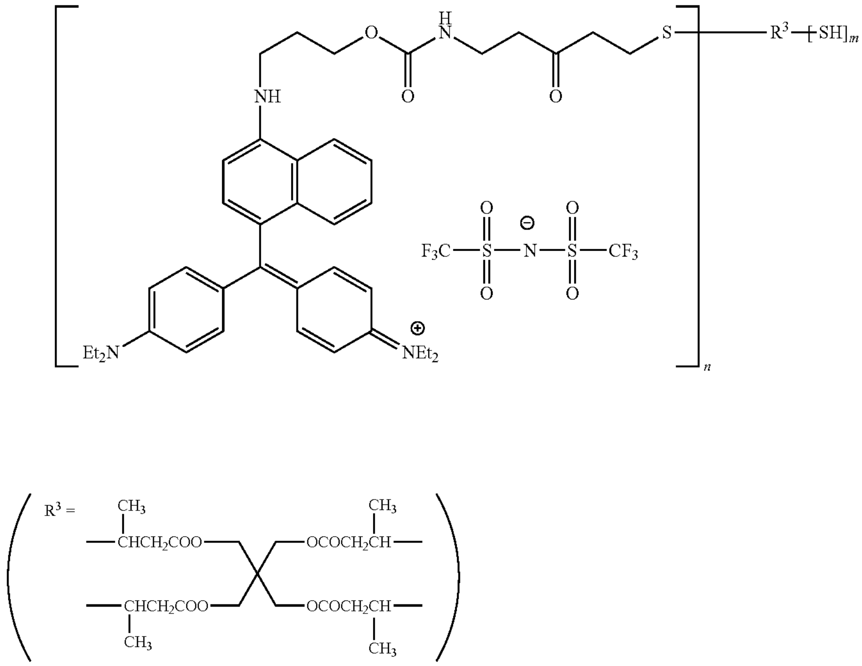

(B-11) n = 2.5, m = 1.5

Synthesis Example B-12

In the same manner as in Synthesis Example B-6 except that 2.0 parts of dipentaerythritol hexakis(3-mercaptopropionate) [DPMP; manufactured by SC Organic Chemical Co., Ltd.], 11.6 parts of the triarylmethane compound (A-tp-3), and 0.21 parts of triethylamine were changed to 2.0 parts of 1,3,5-tris(3-mercaptobutyryloxyethyl)-1,3,5-triazine-2,4,6-(1H,3H,5H)-trione [KARENZ MT NR1; manufactured by Showa Denko Co., Ltd.], 6.6 parts of the triarylmethane compound (A-tp-6), and 0.14 parts of triethylamine in Synthesis Example B-6, 7.7 parts of a mercaptan compound (chain transfer agent B-12) was obtained.

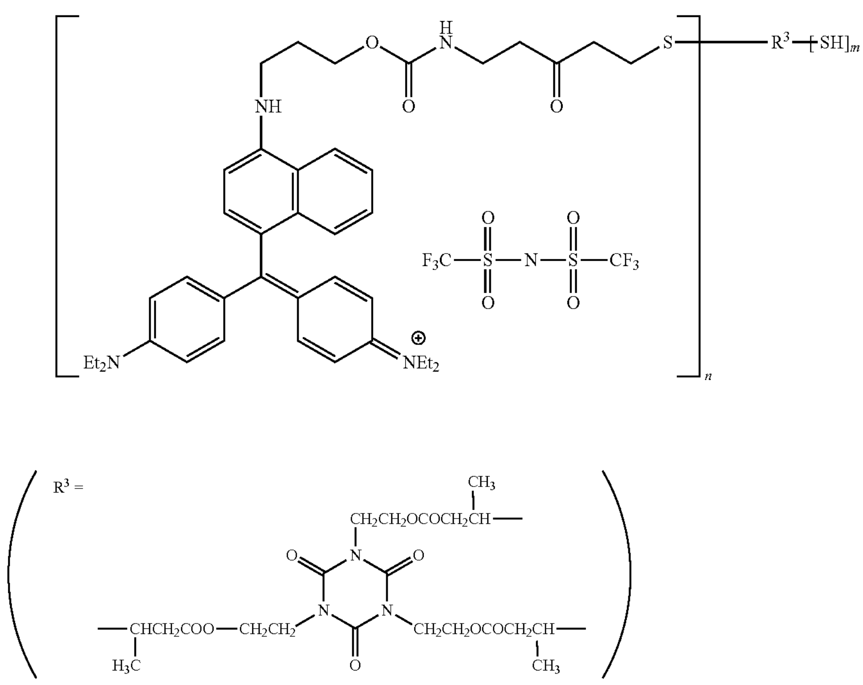

(B-12) n = 2, m = 1

Synthesis Example B-13

In the same manner as in Synthesis Example B-6 except that 11.6 parts of the triarylmethane compound (A-tp-3) was changed to 9.4 parts of the triarylmethane compound (A-tp-7) in Synthesis Example B-6, 10.2 parts of a mercaptan compound (chain transfer agent B-13) was obtained.

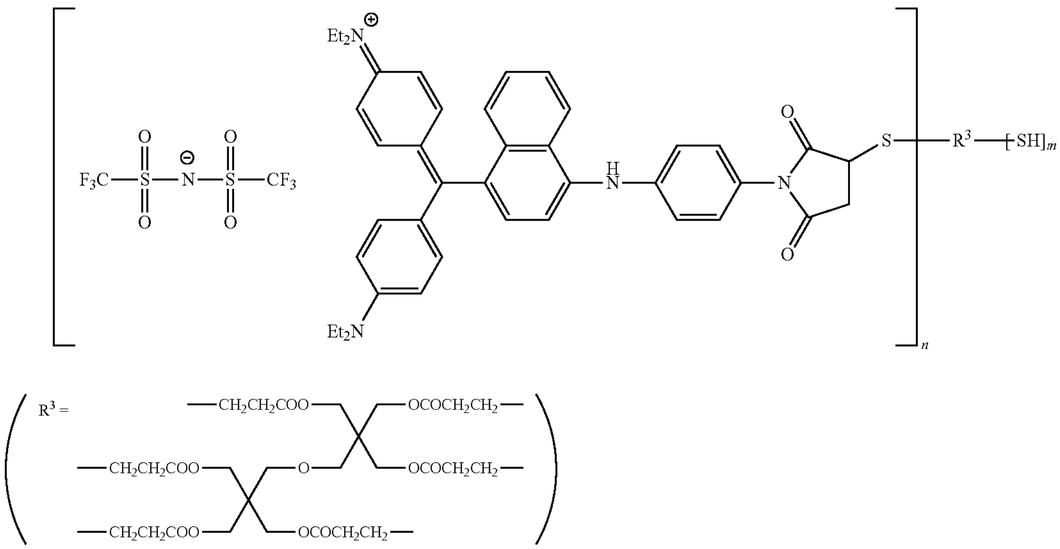

(B-13) n = 4, m = 2

Synthesis Example B-14

2.0 parts of dipentaerythritol hexakis(3-mercaptopropionate) [DPMP; manufactured by SC Organic Chemical Co., Ltd.] and 9.4 parts of a triarylmethane compound (A-tp-8) were dissolved in 50.0 parts of N-methylpyrrolidinone (NMP), and the mixture was heated at 80° C. in a nitrogen atmosphere. 0.13 parts of dimethyl 2,2'-azobis(isobutyrate) [V-601; manufactured by Wako Pure Chemical Industries, Ltd.] was added thereto, and then the mixture was heated and stirred at 80° C. for 2 hours. Further, 0.13 parts of V-601 was added thereto, and the mixture was heated and stirred at 80° C. for 2 hours, and then cooled to room temperature. The reaction solution was added dropwise to a mixed solvent of 250 parts of hexane and 250 parts of ethyl acetate, and the mixture was reprecipitated to obtain 10.2 parts of a mercaptan compound (chain transfer agent B-14).

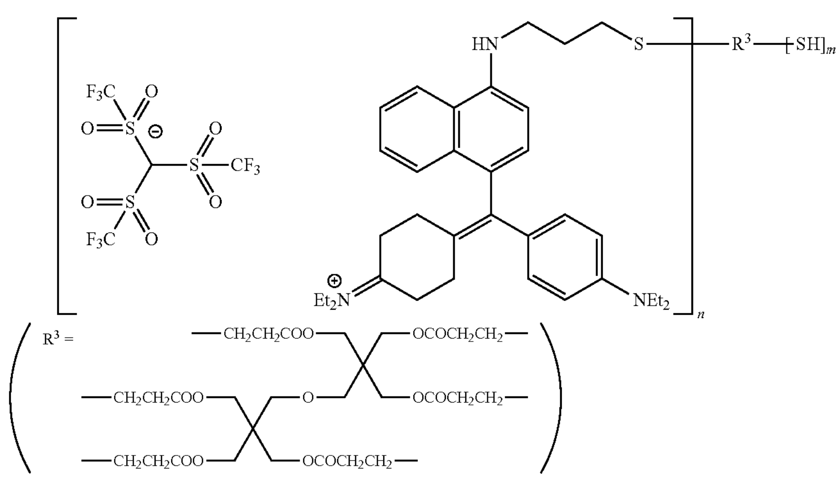

(B-14) n = 4, m = 2

Synthesis Example B-15

In the same manner as in Synthesis Example 13-14 except that 9.4 parts of the triarylmethane compound (A-tp-8) was changed to 7.5 parts of the triarylmethane compound (A-tp-9) in Synthesis Example B-14, 8.4 parts of a mercaptan compound (chain transfer agent B-15) was obtained.

(B-15)
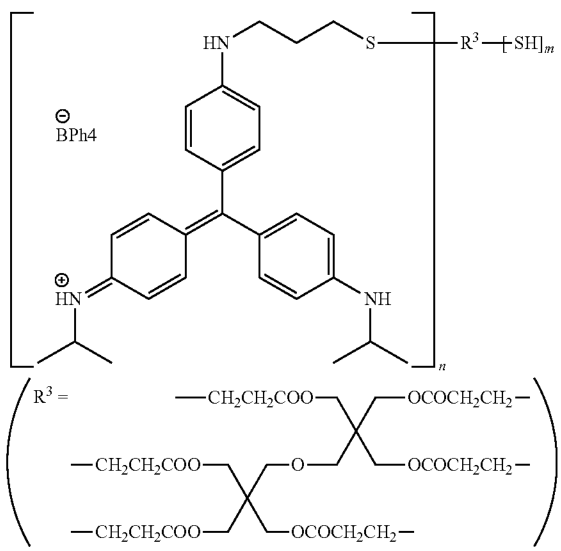
n = 4, m = 2
Synthesis Example B-16
In the same manner as in Synthesis Example B-1 except that 12.0 parts of the triarylmethane compound (A-tp-1) and 1.68 parts of triethylamine were changed to 8.2 parts of the xanthene compound (A-xt-101) and 1.34 parts of triethylamine in Synthesis Example B-1, 9.2 parts of a mercaptan compound (chain transfer agent B-16) was obtained.
(B-16)
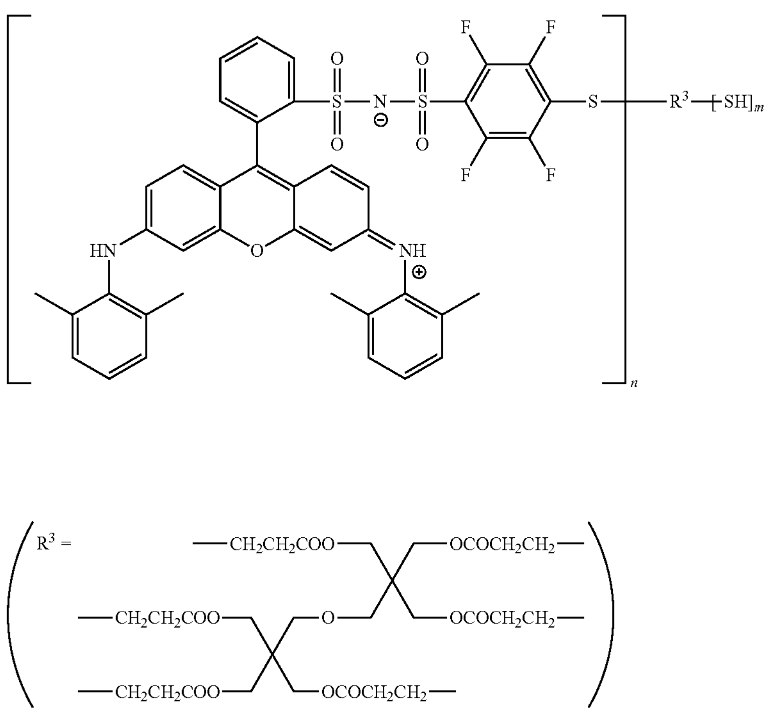
n = 4, m = 2

Synthesis Example B-17

In the same manner as in Synthesis Example B-1 except that 2.0 parts of dipentaerythritol hexakis(3-mercaptopropionate) [DPMP; manufactured by SC Organic Chemical Co., Ltd.], 12.0 parts of the triarylmethane compound (A-tp-1), and 1.68 parts of triethylamine were changed to 2.0 parts of pentaerythritol tetra(3-mercaptopropionate) [PEMP; manufactured by SC Organic Chemical Co., Ltd.], 9.9 parts of the xanthene compound (A-xt-101), and 1.62 parts of triethylamine in Synthesis Example B-1, 10.7 parts of a mercaptan compound (chain transfer agent B-17) was obtained.

(B-17)

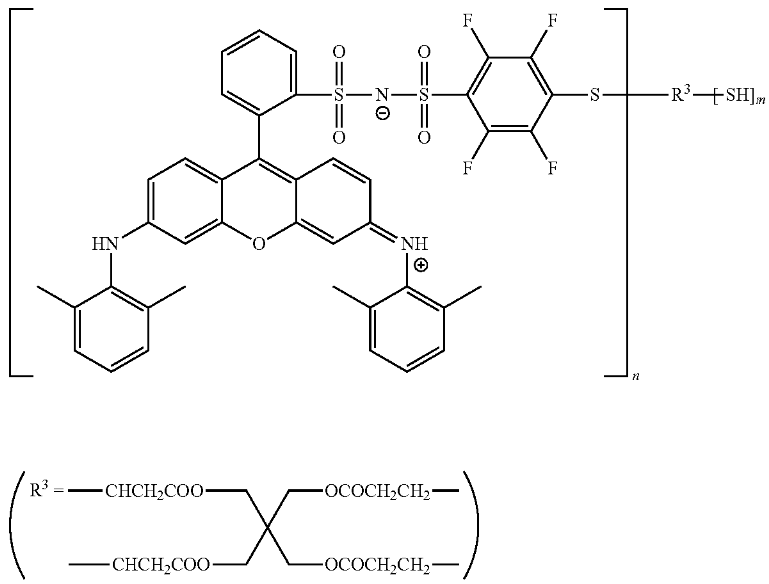

n = 3, m = 1

Synthesis Example B-18

In the same manner as in Synthesis Example B-1 except that 12.0 parts of the triarylmethane compound (A-tp-1) and 1.68 parts of triethylamine were changed to 7.2 parts of the xanthene compound (A-xt-102) and 1.34 parts of triethylamine in Synthesis Example B-1, 8.3 parts of a mercaptan compound (chain transfer agent B-18) was obtained.

(B-18)

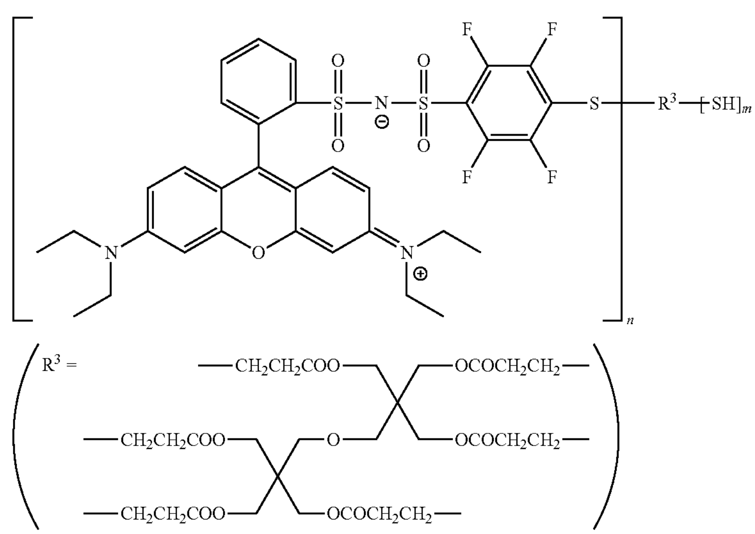

n = 4, m = 2

Synthesis Example B-19

In the same manner as in Synthesis Example B-6 except that 11.6 parts of the triarylmethane compound (A-tp-3) was changed to 7.8 parts of the xanthene compound (A-xt-103) in Synthesis Example B-6, 8.8 parts of a mercaptan compound (chain transfer agent B-19) was obtained.

(B-19)

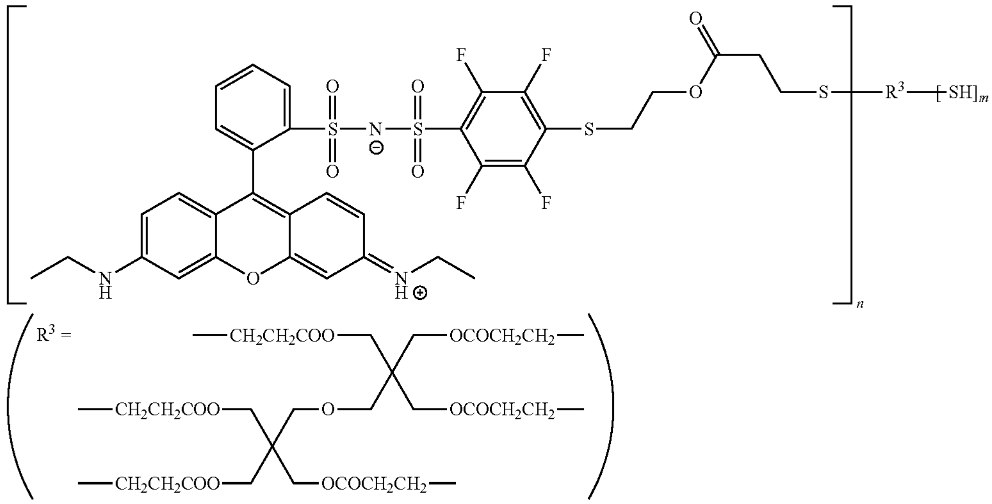

n = 4, m = 2

Synthesis Example B-20

In the same manner as in Synthesis Example B-6 except that 11.6 parts of the triarylmethane compound (A-tp-3) and 0.21 parts of triethylamine were changed to 14.2 parts of the xanthene compound (A-xt-104) and 0.26 parts of triethylamine in Synthesis Example B-6, 14.4 parts of a mercaptan compound (chain transfer agent B-20) was obtained.

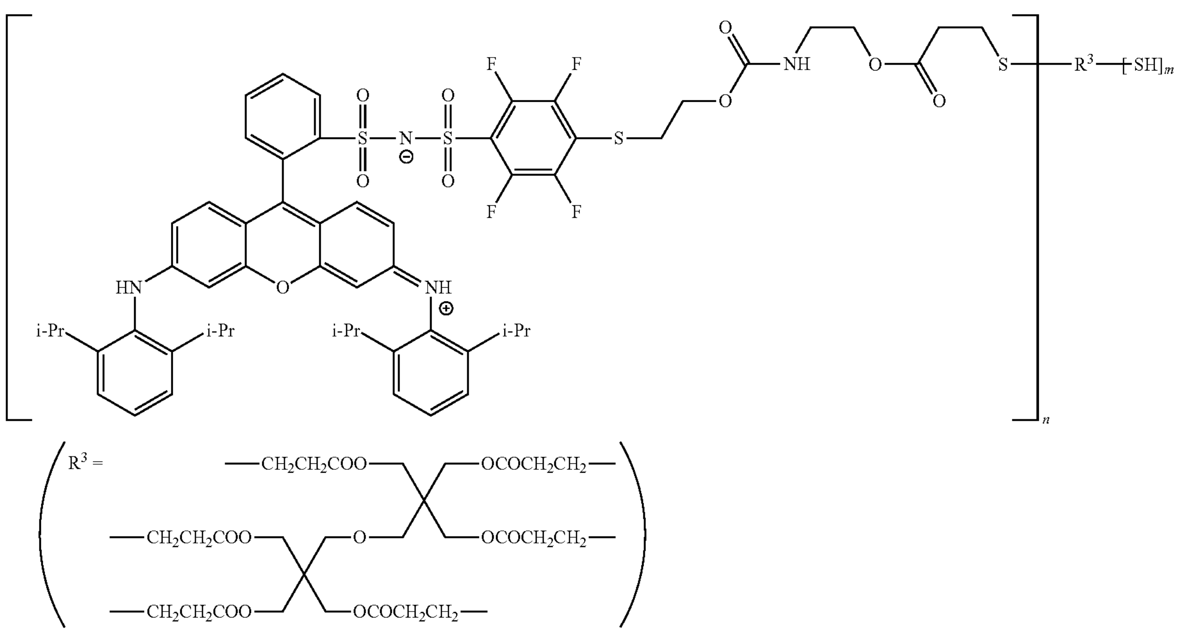

(B-20) n = 5, m = 1
(B-21) n = 4, m = 2
(B-22) n = 3, m = 3

Synthesis Example B-21

In the same manner as in Synthesis Example B-6 except that 11.6 parts of the triarylmethane compound (A-tp-3) and 0.21 parts of triethylamine were changed to 11.4 parts of the xanthene compound (A-xt-104) and 0.21 parts of triethylamine in Synthesis Example B-6, 12.1 parts of a mercaptan compound (chain transfer agent B-21) was obtained.

Synthesis Example B-22

In the same manner as in Synthesis Example B-6 except that 11.6 parts of the triarylmethane compound (A-tp-3) and 0.21 parts of triethylamine were changed to 8.6 parts of the xanthene compound (A-xt-104) and 0.16 parts of triethylamine in Synthesis Example B-6, 9.5 parts of a mercaptan compound (chain transfer agent B-22) was obtained.

Synthesis Example B-23

In the same manner as in Synthesis Example B-6 except that 2.0 parts of dipentaerythritol hexakis(3-mercaptopropionate) [DPMP; manufactured by SC Organic Chemical Co., Ltd.], 11.6 parts of the triarylmethane compound (A-tp-3), and 0.21 parts of triethylamine were changed to 2.0 parts of pentaerythritol tetrakis(3-mercaptobutyrate) [KARENZ MTPE1; manufactured by Showa Denko Co., Ltd.], 10.2 parts of the xanthene compound (A-xt-104), and 0.19 parts of triethylamine in Synthesis Example B-6, 11.0 parts of a mercaptan compound (chain transfer agent B-23) was obtained.

(B-23)

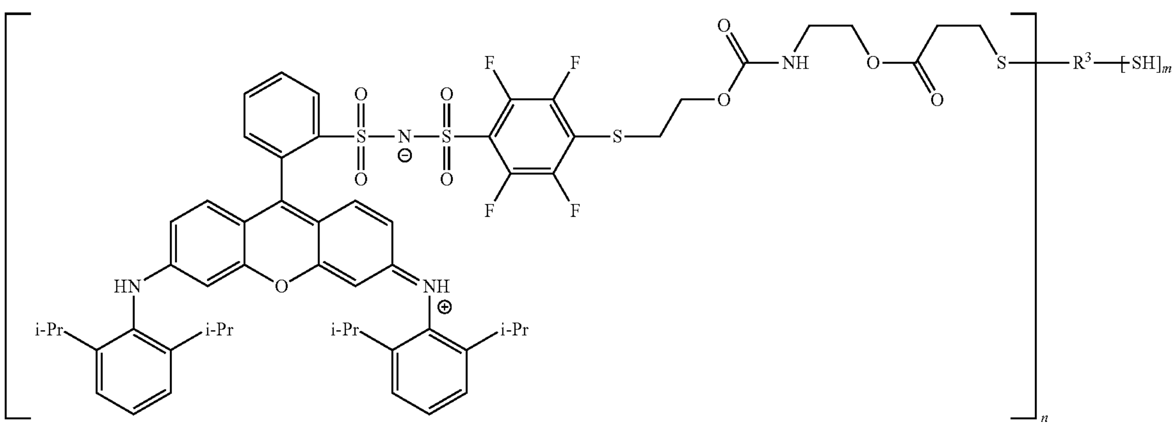

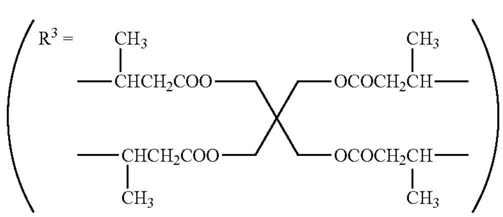

n = 2.5, m = 1.5

Synthesis Example B-24

In the same manner as in Synthesis Example B-6 except that 11.6 parts of the triarylmethane compound (A-tp-3) was changed to 12.4 parts of the xanthene compound (A-xt-105) in Synthesis Example B-6, 13.0 parts of a mercaptan compound (chain transfer agent B-24) was obtained.

(B-24)

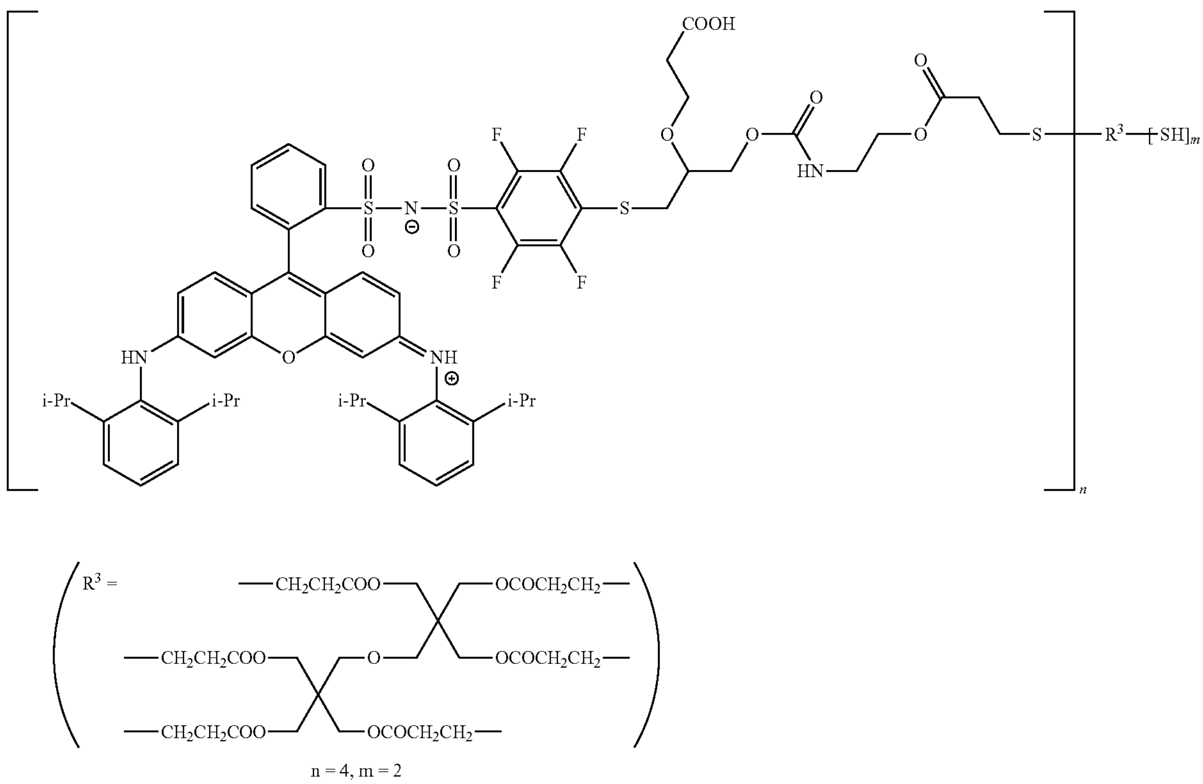

Synthesis Example B-25

In the same manner as in Synthesis Example B-6 except that 11.6 parts of the triarylmethane compound (A-tp-3) was changed to 8.6 parts of the xanthene compound (A-xt-106) in Synthesis Example B-6, 9.6 parts of a mercaptan compound (chain transfer agent B-25) was obtained.

(B-25)

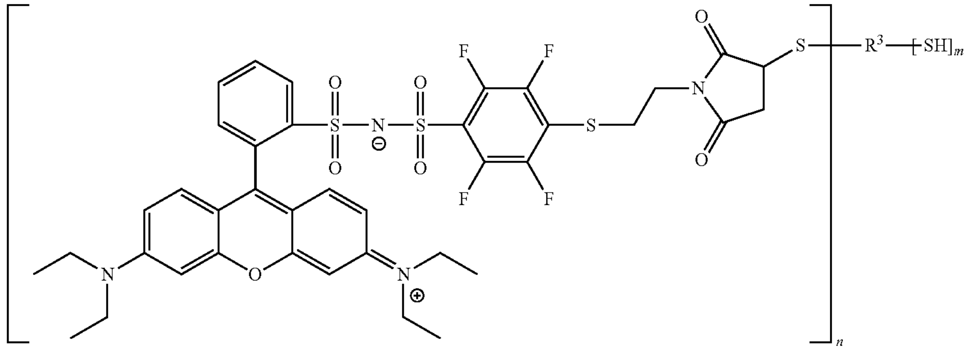

-continued

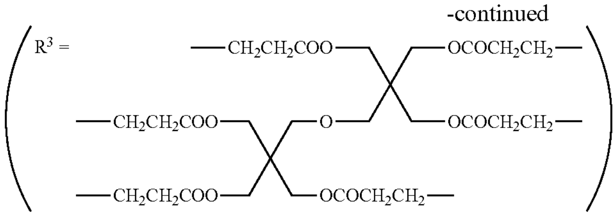

n = 4, m = 2

Synthesis Example B-26

In the same manner as in Synthesis Example B-6 except that 11.6 parts of the triarylmethane compound (A-tp-3) was changed to 9.6 parts of the xanthene compound (A-xt-107) in Synthesis Example B-6, 10.6 parts of a mercaptan compound (chain transfer agent B-26) was obtained.

(B-26)

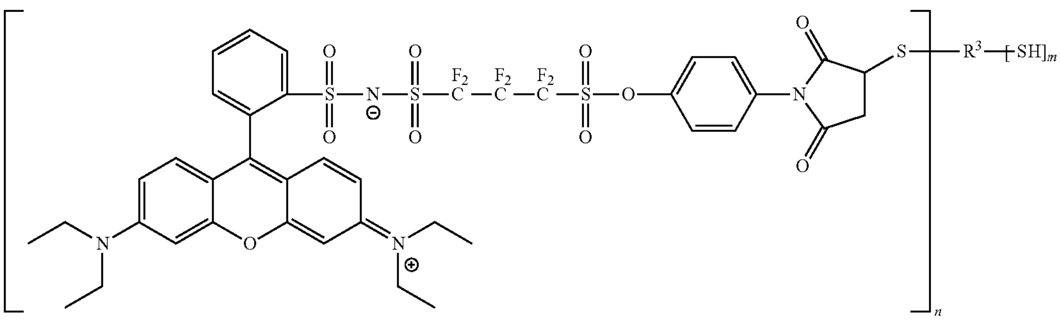

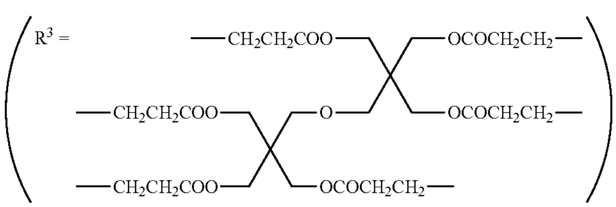

n = 4, m = 2

Synthesis Example B-27

In the same manner as in Synthesis Example B-6 except that 11.6 parts of the triarylmethane compound (A-tp-3) was changed to 13.5 parts of the xanthene compound (A-xt-108) in Synthesis Example B-6, 13.6 parts of a mercaptan compound (chain transfer agent B-27) was obtained.

(B-27)

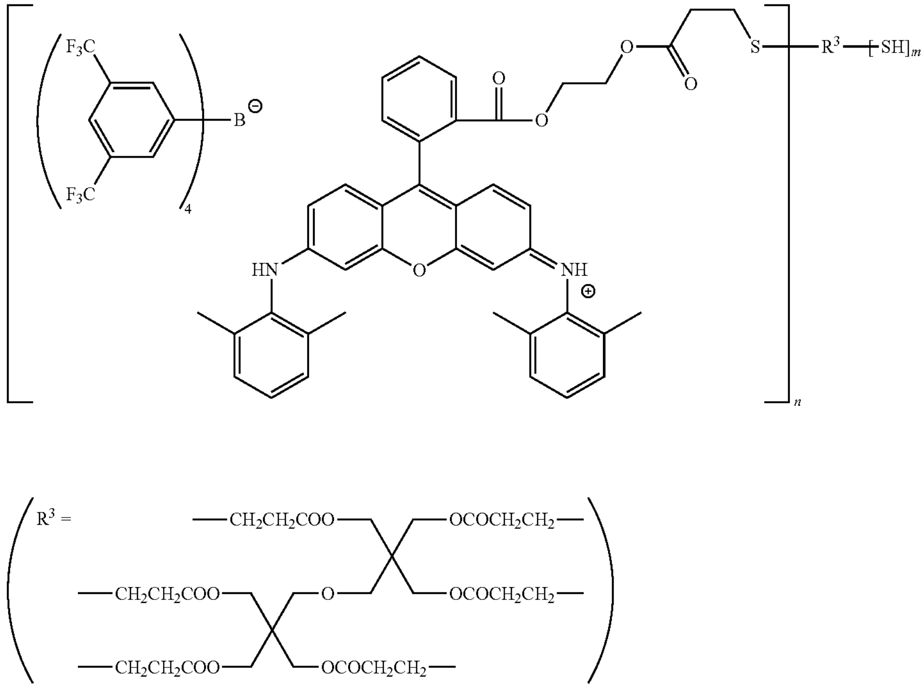

n = 4, m = 2

Synthesis Example B-28

In the same manner as in Synthesis Example B-6 except that 11.6 parts of the triarylmethane compound (A-tp-3) was changed to 10.1 parts of the xanthene compound (A-xt-109) in Synthesis Example B-6, 10.9 parts of a mercaptan compound (chain transfer agent B-28) was obtained.

Synthesis Example B-29

In the same manner as in Synthesis Example B-6 except that 11.6 parts of the triarylmethane compound (A-tp-3) was changed to 9.8 parts of the xanthene compound (A-xt-111) in Synthesis Example B-6, 10.6 parts of a mercaptan compound (chain transfer agent B-29) was obtained.

(B-28)

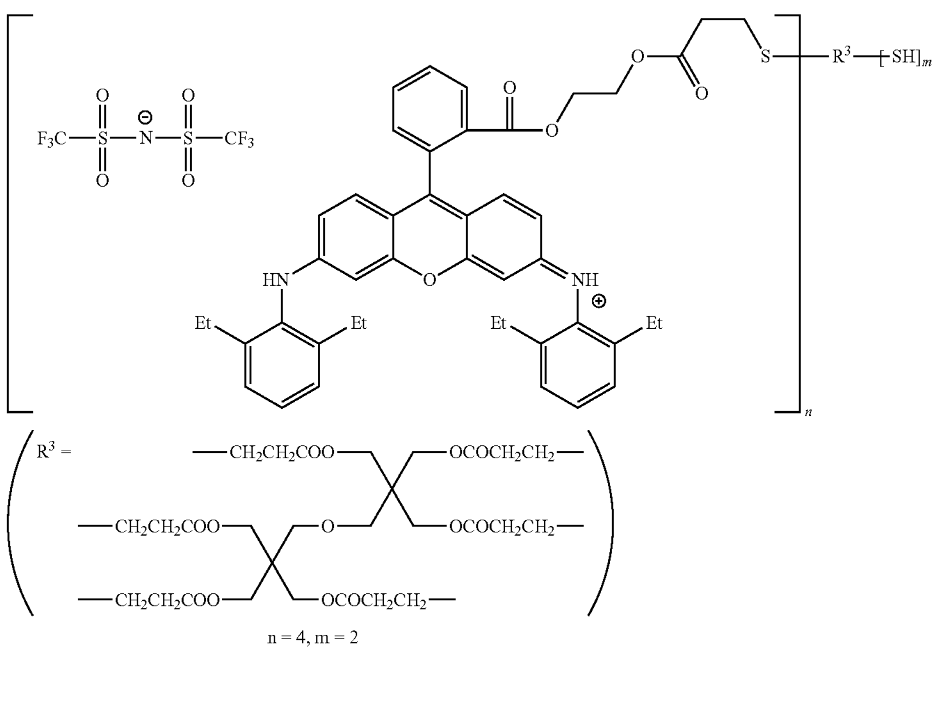

n = 4, m = 2

(B-29)

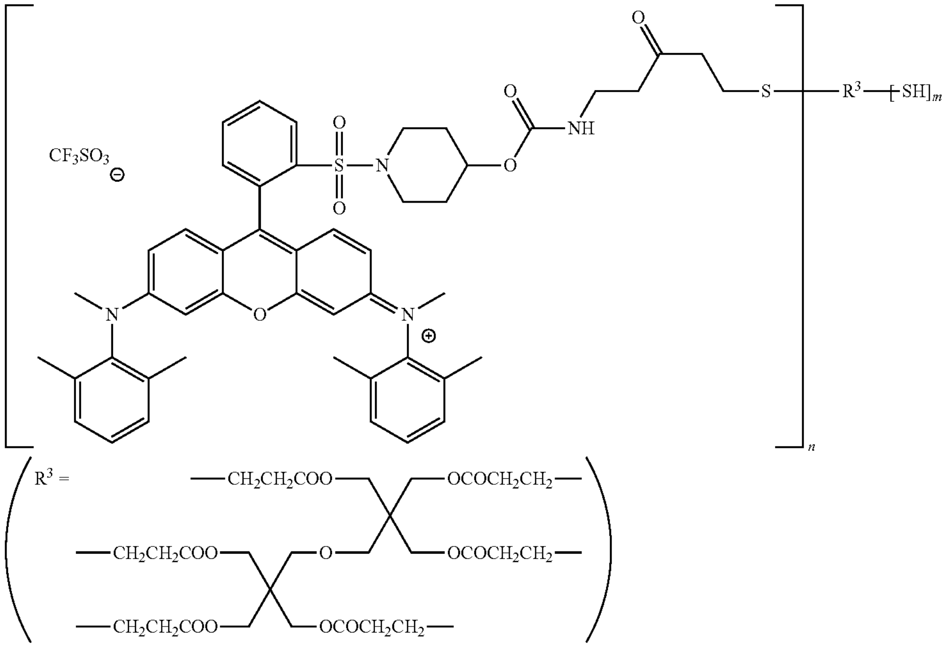

n = 4, m = 2

Synthesis Example B-30

In the same manner as in Synthesis Example B-6 except that 11.6 parts of the triarylmethane compound (A-tp-3) was changed to 11.4 parts of the xanthene compound (A-xt-112) in Synthesis Example B-6, 12.1 parts of a mercaptan compound (chain transfer agent B-30) was obtained.

Synthesis Example B-31

In the same manner as in Synthesis Example B-6 except that 11.6 parts of the triarylmethane compound (A-tp-3) was changed to 9.9 parts of the xanthene compound (A-xt-113) in Synthesis Example B-6, 10.7 parts of a mercaptan compound (chain transfer agent B-31) was obtained.

(B-30)

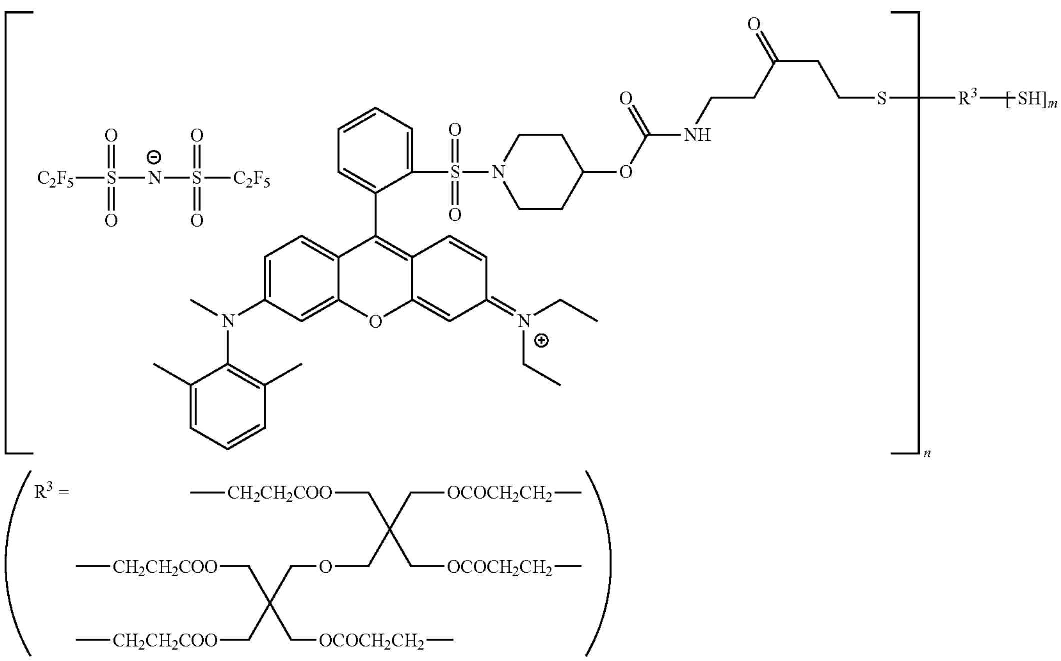

n = 4, m = 2

(B-31)

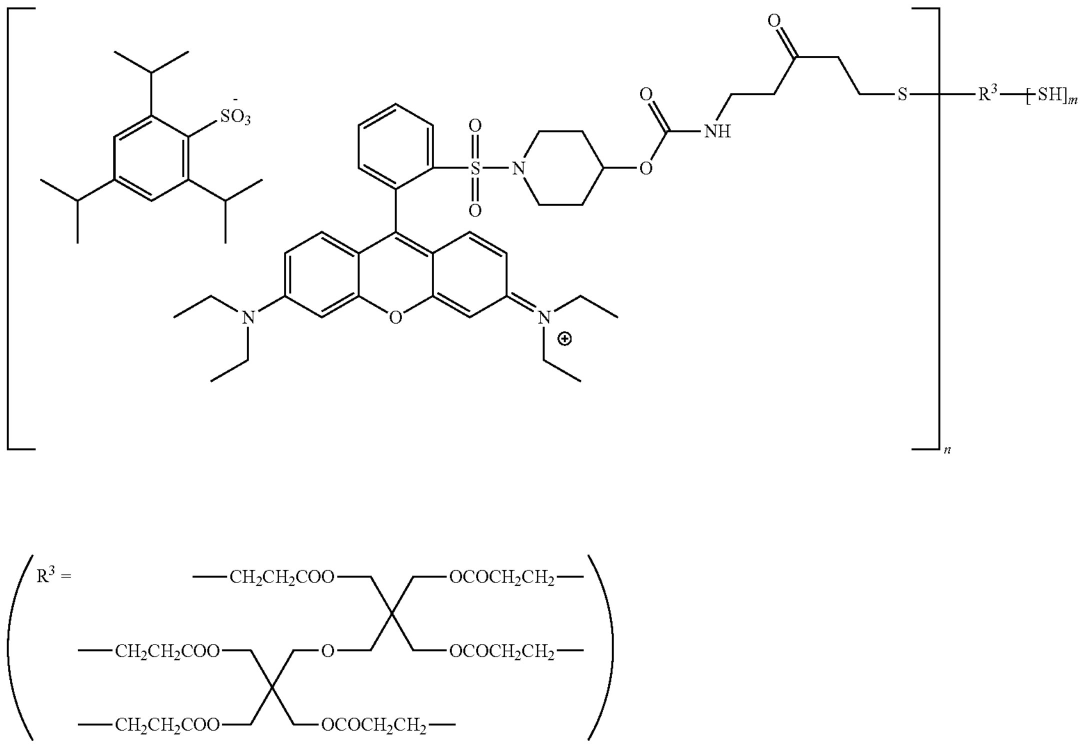

n = 4, m = 2

Synthesis Example B-32

In the same manner as in Synthesis Example B-14 except that 9.4 parts of the triarylmethane compound (A-tp-8) was changed to 10.3 parts of the xanthene compound (A-xt-116) in Synthesis Example B-14, 11.1 parts of a mercaptan compound (chain transfer agent B-32) was obtained.

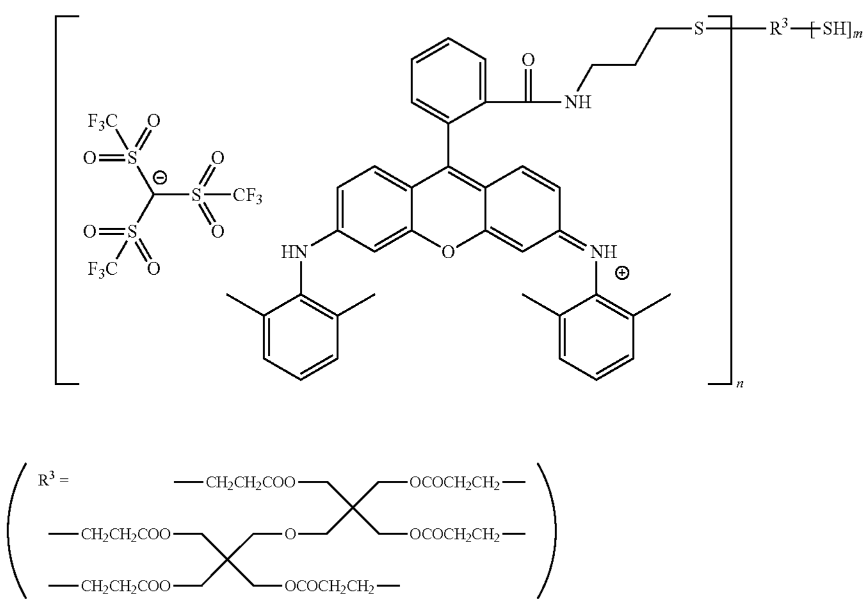

(B-32) n = 4, m = 2

Synthesis Example B-33

2.0 parts of a compound (S-25) having a mercapto group, 10.5 parts of a xanthene compound (A-xt-17), and 1.74 parts of diazabicycloundecene were dissolved in 50.0 parts of dimethylformamide (DMF), and the mixture was stirred at 25° C. for 2 hours. After the reaction, the reaction solution was added dropwise to a mixed solvent of 250 parts of 1 N aqueous hydrochloric acid, and the mixture was reprecipitated and filtered. The obtained solid was put into 250 parts of acetonitrile, followed by suspending and washing, and filtered again to obtain 11.2 parts of the mercaptan compound shown below (chain transfer agent B-33). The ratio of the colorant moiety to the $R^3$ moiety in the NMR measurement was found to be 4.

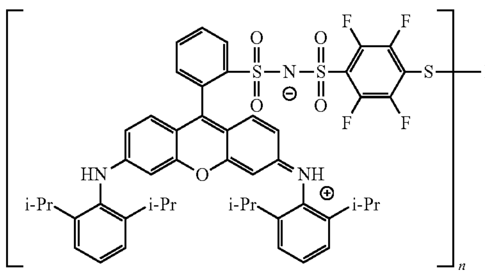

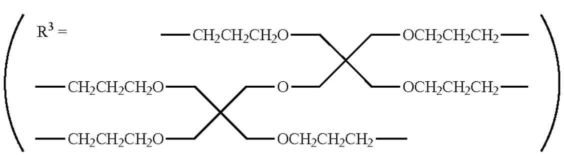

(B-33) n = 4, m = 2

Synthesis Example B-34

2.0 parts of the compound (S-27) having a mercapto group, 7.8 parts of a xanthene compound (A-xt-17), and 1.32 parts of diazabicycloundecene were dissolved in 39.8 parts of dimethylformamide (DMF), and the mixture was stirred at 25° C. for 2 hours. After the reaction, the reaction solution was added dropwise to a mixed solvent of 250 parts of 1 N aqueous hydrochloric acid, and the mixture was reprecipitated and filtered. The obtained solid was put into 250 parts of acetonitrile, followed by suspending and washing, and filtered again to obtain 9.0 parts of the mercaptan compound shown below (chain transfer agent B-34). The ratio of the colorant moiety to the $R^3$ moiety in the NMR measurement was found to be 4.5.

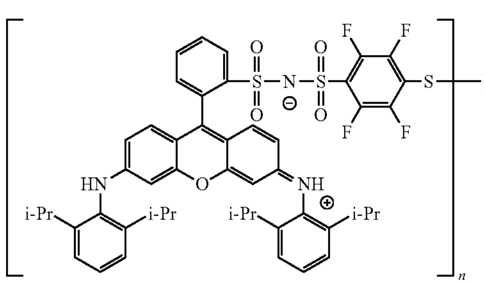

-continued

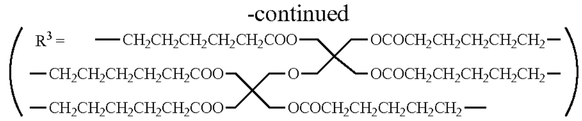

(B-34) n = 4.5, m = 1.5
(B-35) n = 4.0, m = 2.0
(B-36) n = 3.5, m = 2.5

Synthesis Example B-35

In the same manner as in Synthesis Example B-34 except that 7.8 parts of the xanthene compound (A-xt-17) and 1.32 parts of diazabicycloundecene were changed to 7.1 parts of the xanthene compound (A-xt-17) and 1.18 parts of diazabicycloundecene in Synthesis Example B-34, 8.2 parts of the mercaptan compound shown above (chain transfer agent B-35) was obtained. The ratio of the colorant moiety to the $R^3$ moiety in the NMR measurement was found to be 4.

Synthesis Example B-36

In the same manner as in Synthesis Example B-34 except that 7.8 parts of the xanthene compound (A-xt-17) and 1.32 parts of diazabicycloundecene were changed to 6.2 parts of the xanthene compound (A-xt-17) and 1.03 parts of diazabicycloundecene in Synthesis Example B-34, 7.4 parts of the mercaptan compound shown above (chain transfer agent B-36) was obtained. The ratio of the colorant moiety to the $R^3$ moiety in the NMR measurement was found to be 3.5.

Synthesis Example B-37

2.0 parts of the compound (S-27) having a mercapto group and 7.8 parts of the xanthene compound (A-xt-17) were dissolved in 39.1 parts of N-methylpyrrolidinone (NMP), and the mixture was heated at 80° C. in a nitrogen atmosphere. 0.10 parts of dimethyl 2,2'-azobis(isobutyrate) [V-601; manufactured by Wako Pure Chemical Industries, Ltd.] was added thereto, and then the mixture was heated and stirred at 80° C. for 2 hours. Further, 0.10 parts of V-601 was added thereto, and the mixture was heated and stirred at 80° C. for 2 hours, and then cooled to room temperature. The reaction solution was added dropwise to a mixed solvent of 250 mL of hexane and 250 mL of ethyl acetate, and the mixture was reprecipitated to obtain 8.8 parts of a mercaptan compound (chain transfer agent B-37).

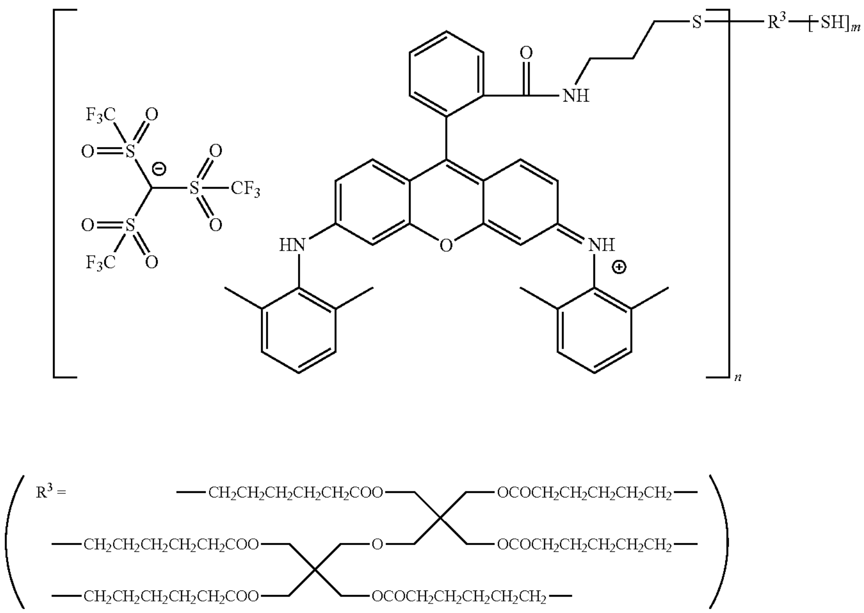

(B-37) n = 4, m = 2

Synthesis Example B-38

In the same manner as in Synthesis Example B-6 except that 11.6 parts of the triarylmethane compound (A-tp-3) was changed to 5.0 parts of an anthraquinone compound (A-aq-1) in Synthesis Example B-6, 6.3 parts of a mercaptan compound (chain transfer agent B-38) was obtained.

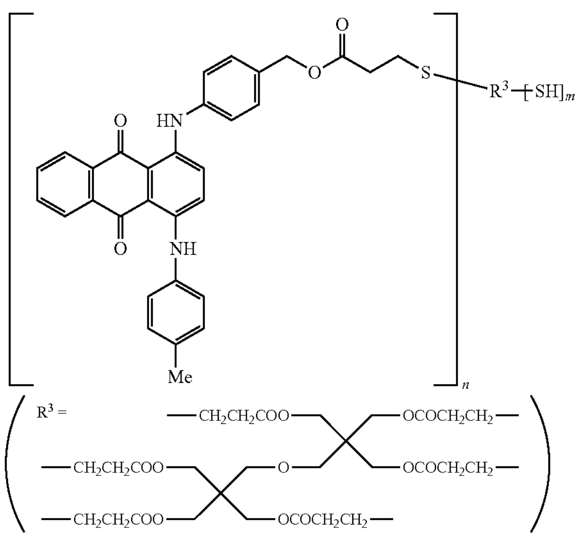

(B-38) n = 4, m = 2

Synthesis Example B-39

In the same manner as in Synthesis Example B-14 except that 9.4 parts of the triarylmethane compound (A-tp-8) was changed to 4.2 parts of an azo compound (A-az-1) in Synthesis Example B-14, 5.6 parts of a mercaptan compound (chain transfer agent B-39) was obtained.

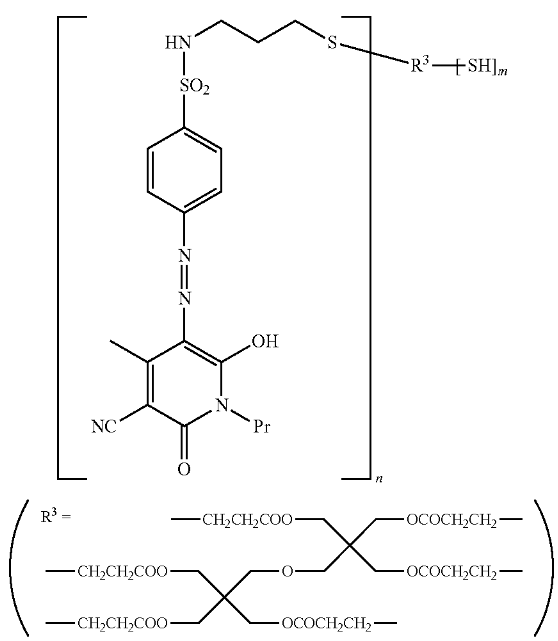

(B-39) n = 4, m = 2

Synthesis Example B-40

In the same manner as in Synthesis Example B-14 except that 9.4 parts of the triarylmethane compound (A-tp-8) was changed to 4.2 parts of a squarylium compound (A-k-1) in Synthesis Example B-14, 5.6 parts of a mercaptan compound (chain transfer agent B-40) was obtained.

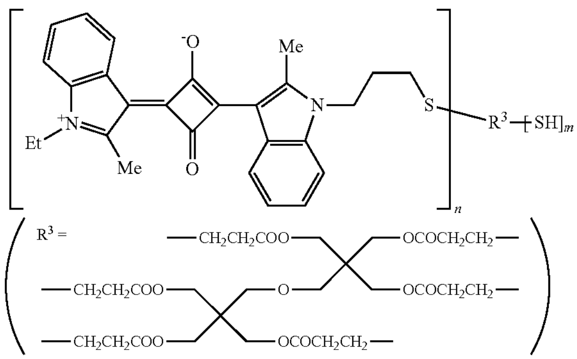

(B-40) n = 4, m = 2

Synthesis Example B-41

In the same manner as in Synthesis Example B-14 except that 9.4 parts of the triarylmethane compound (A-tp-8) was changed to 10.8 parts of a phthalocyanine compound (A-f-1) in Synthesis Example B-14, 11.5 parts of a mercaptan compound (chain transfer agent B-41) was obtained.

(B-41)

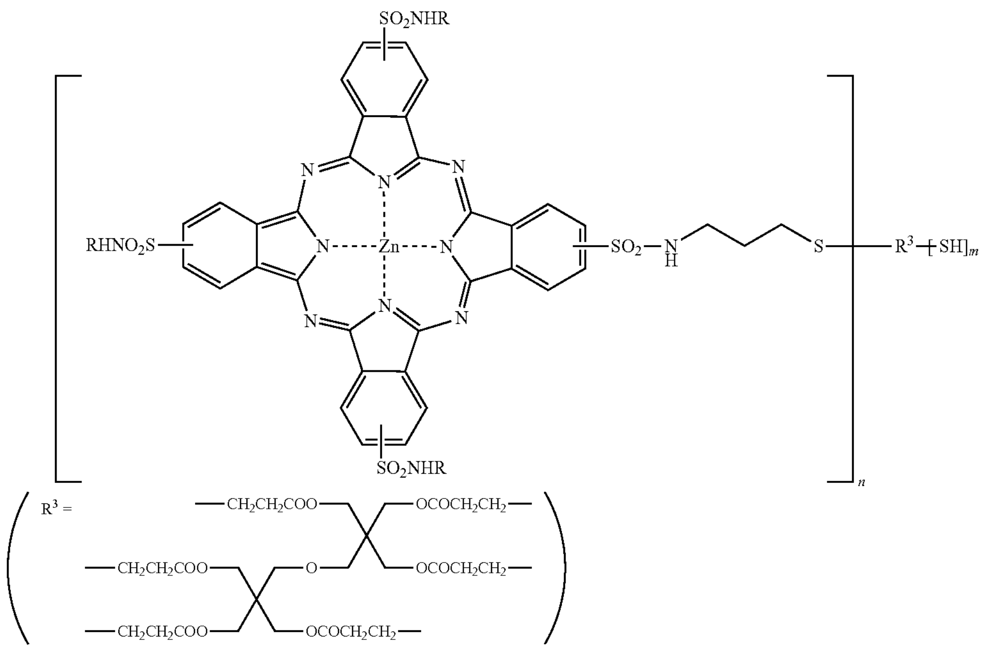

n = 4, m = 2

R = $CH_2CH_2CH_2OH$

Synthesis Example B-42

In the same manner as in Synthesis Example B-6 except that 11.6 parts of the triarylmethane compound (A-tp-3) was changed to 10.5 parts of a subphthalocyanine compound (A-sp-1) in Synthesis Example 13-6, 11.3 parts of a mercaptan compound (chain transfer agent B-42) was obtained.

(B-42)

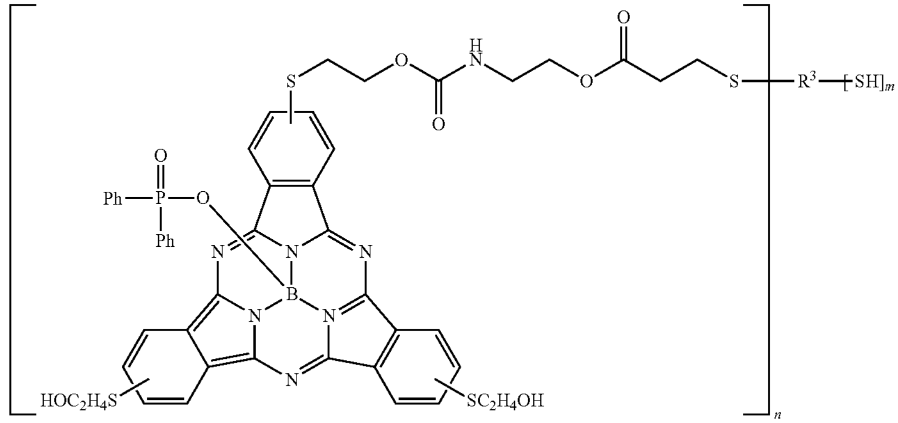

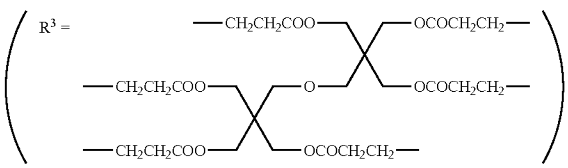

n = 4, m = 2

Synthesis Example B-43

In the same manner as in Synthesis Example B-34 except that 7.8 parts of the xanthene compound (A-xt-17) and 1.32 parts of diazabicycloundecene were changed to 4.5 parts of the quinophthalone compound (A-qp-1) and 0.78 parts of triethylamine in Synthesis Example B-34, 5.8 parts of the mercaptan compound shown below (chain transfer agent B-43) was obtained. The ratio of the colorant moiety to the $R^3$ moiety in the NMR measurement was found to be 4.

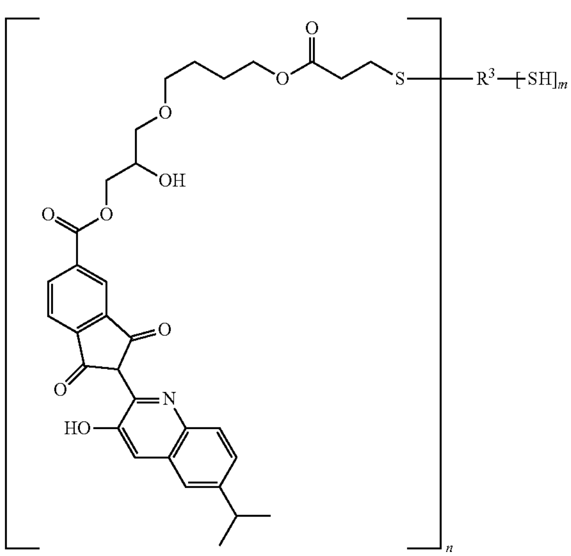

-continued

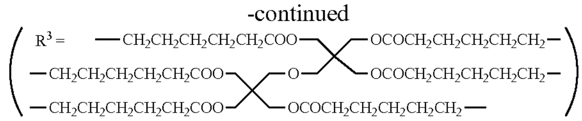

(B-43) n = 4, m = 2

Synthesis Example B-44

3.9 parts of the intermediate 21 of S-27 and 2.5 parts of the quinophthalone compound (A-qp-2) were dissolved in 20 parts of dimethylacetamide. Further, 0.52 parts of N,N-diisopropylethylamine was added thereto, and the mixture was heated and stirred at 50° C. for 6 hours. Then, the reaction solution was added dropwise to a mixed solvent of 250 parts of 1 N aqueous hydrochloric acid, and the mixture was reprecipitated and filtered. The obtained solid was put into 250 parts of acetonitrile, followed by suspending and washing, and filtered again. The obtained solid was dissolved in 20 parts of dimethylacetamide, and 0.30 parts of thiourea and 0.60 parts of potassium iodide were added into a three-neck flask. The mixture was reacted at 80° C. for 18 hours in a nitrogen atmosphere. Thereafter, 3.0 parts of a 20% aqueous potassium carbonate solution was added thereto, and the mixture was reacted at 70° C. for 3 hours and then cooled. The reaction solution was added dropwise to a mixed solvent of 250 parts of 1 N aqueous hydrochloric acid, and the mixture was reprecipitated and filtered. The obtained solid was put into 250 parts of acetonitrile, followed by suspending and washing, and filtered again to obtain 4.0 parts of the mercaptan compound shown below (chain transfer agent B-44). The ratio of the colorant moiety to the $R^3$ moiety in the NMR measurement was found to be 4.

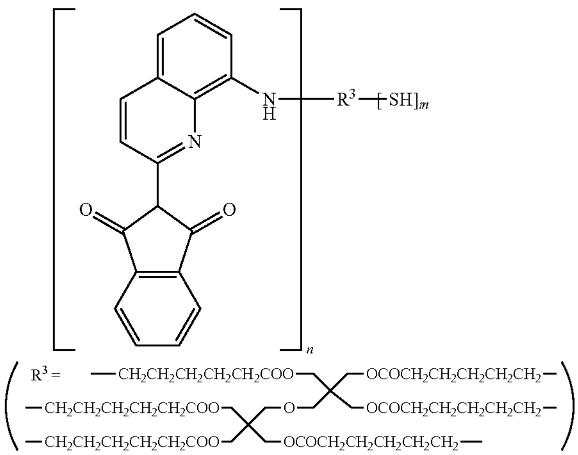

(B-44) n = 4, m = 2

Synthesis Example B-45

In the same manner as in Synthesis Example B-34 except that 7.8 parts of the xanthene compound (A-xt-17) and 1.32 parts of diazabicycloundecene were changed to 7.5 parts of the triarylmethane compound (A-tp-11) and 1.18 parts of diazabicycloundecene in Synthesis Example B-34, 8.6 parts of the mercaptan compound shown below (chain transfer agent B-45) was obtained. The ratio of the colorant moiety to the $R^3$ moiety in the NMR measurement was found to be 4.

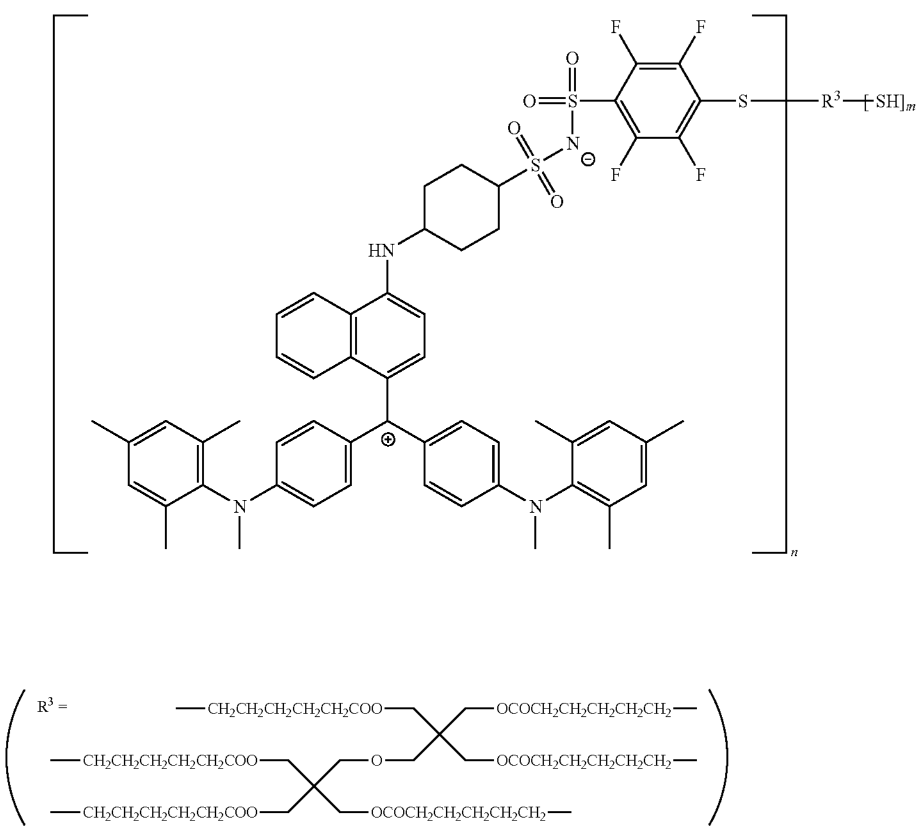

(B-45) n = 4.0, m = 2.0

Synthesis Example B-46

In the same manner as in Synthesis Example B-37 except that 7.8 parts of the xanthene compound (A-xt-17) was changed to 7.4 parts of the triarylmethane compound (A-tp-10) in Synthesis Example B-37, 8.4 parts of the mercaptan compound shown below (chain transfer agent B-46) was obtained. The ratio of the colorant moiety to the $R^3$ moiety in the NMR measurement was found to be 4.

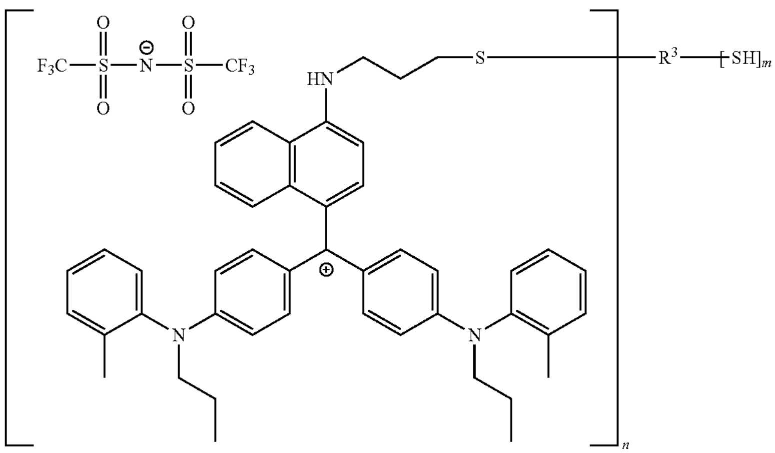

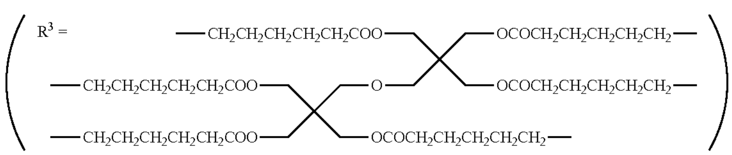

(B-46) n = 4.0, m = 2.0

Synthesis Example B-47

In the same manner as in Synthesis Example B-34 except that 7.8 parts of the xanthene compound (A-xt-17) and 1.32 parts of diazabicycloundecene were changed to 3.5 parts of the xanthene compound (A-xt-17), 3.8 parts of the triarylmethane compound (A-tp-11), and 1.18 parts of and diazabicycloundecene in Synthesis Example B-34, 8.6 parts of the mercaptan compound shown below (chain transfer agent B-47) was obtained. The ratio of the colorant moiety to the $R^3$ moiety in the NMR measurement was found to be each 2.

(B-47)

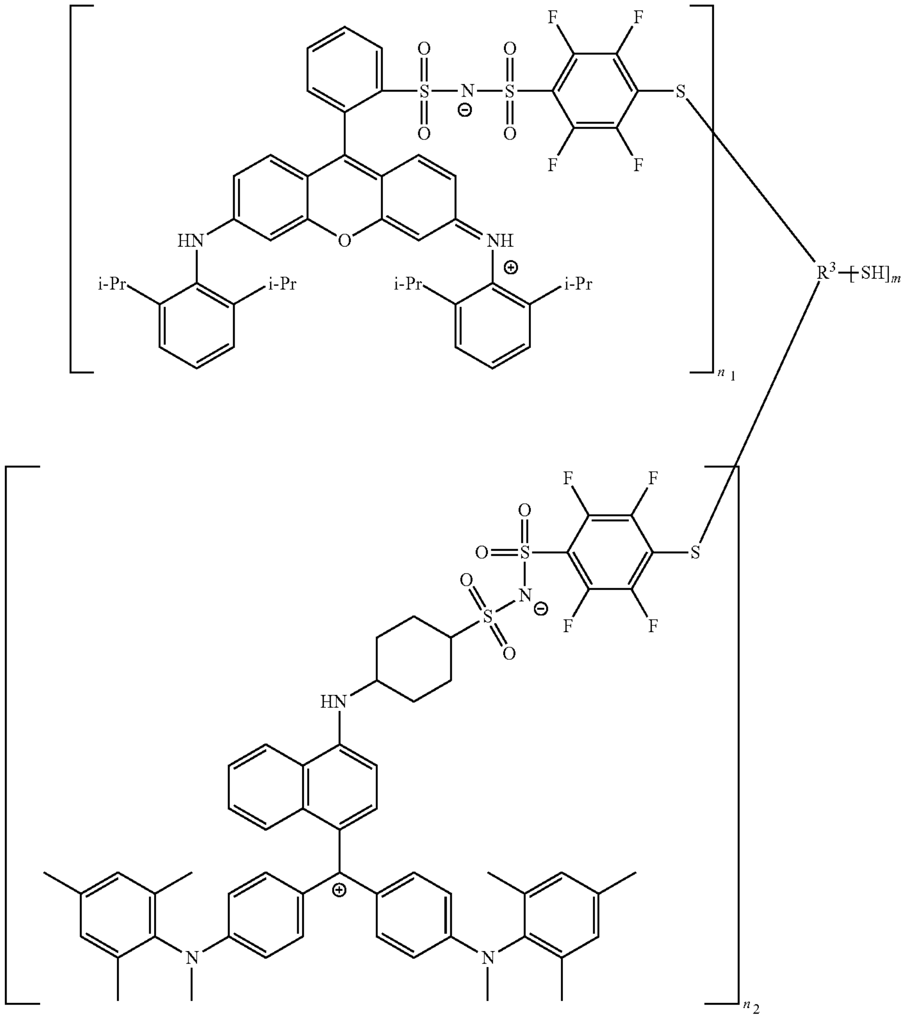

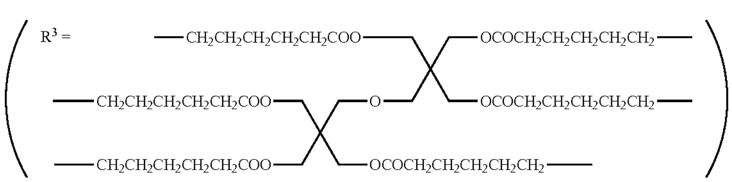

$n_1 = 2.0$, $n_2 = 2.0$, $m = 2.0$

Synthesis Example B-48

In the same manner as in Synthesis Example B-34 except that 7.8 parts of the xanthene compound (A-xt-17) and 1.32 parts of diazabicycloundecene were changed to 1.89 parts of the anthraquinone compound (A-aq-1), 3.8 parts of the triarylmethane compound (A-tp-11), and 1.18 parts of diazabicycloundecene in Synthesis Example B-34, 8.6 parts of the mercaptan compound shown below (chain transfer agent B-48) was obtained. The ratio of the colorant moiety to the $R^3$ moiety in the NMR measurement was found to be each 2.

(B-48)

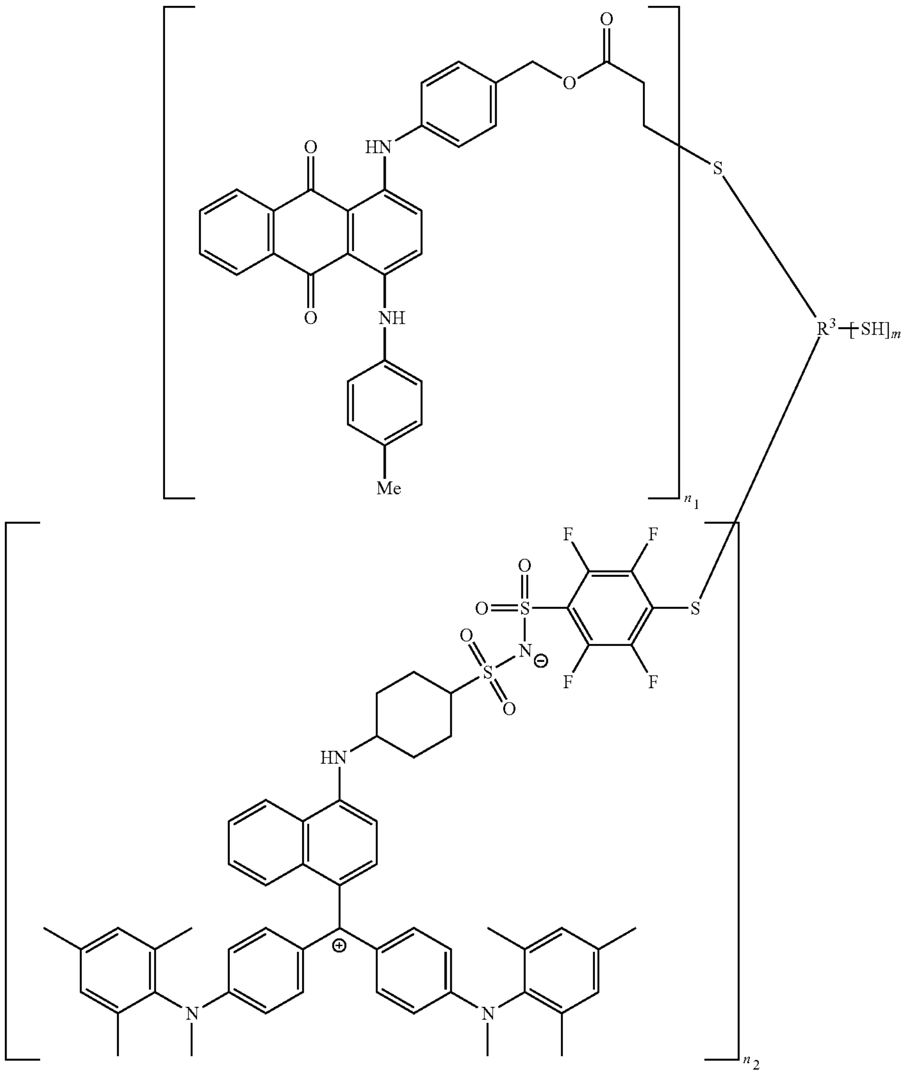

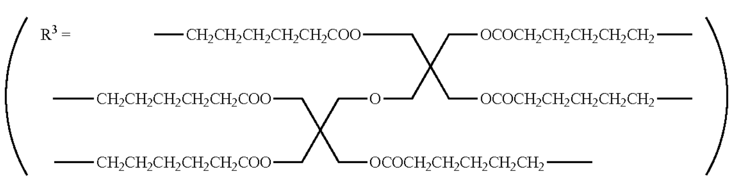

$n_1 = 2.0$, $n_2 = 2.0$, $m = 2.0$

Synthesis Example B-49

In the same manner as in Synthesis Example B-37 except that 7.8 parts of the xanthene compound (A-xt-17) was changed to 3.9 parts of the xanthene compound (A-xt-116) and 1.6 parts of the azo compound (A-az-1) in Synthesis Example B-37, 6.7 parts of the mercaptan compound shown below (chain transfer agent B-49) was obtained. The ratio of the colorant moiety to the $R^3$ moiety in the NMR measurement was found to be each 2.

(B-49)
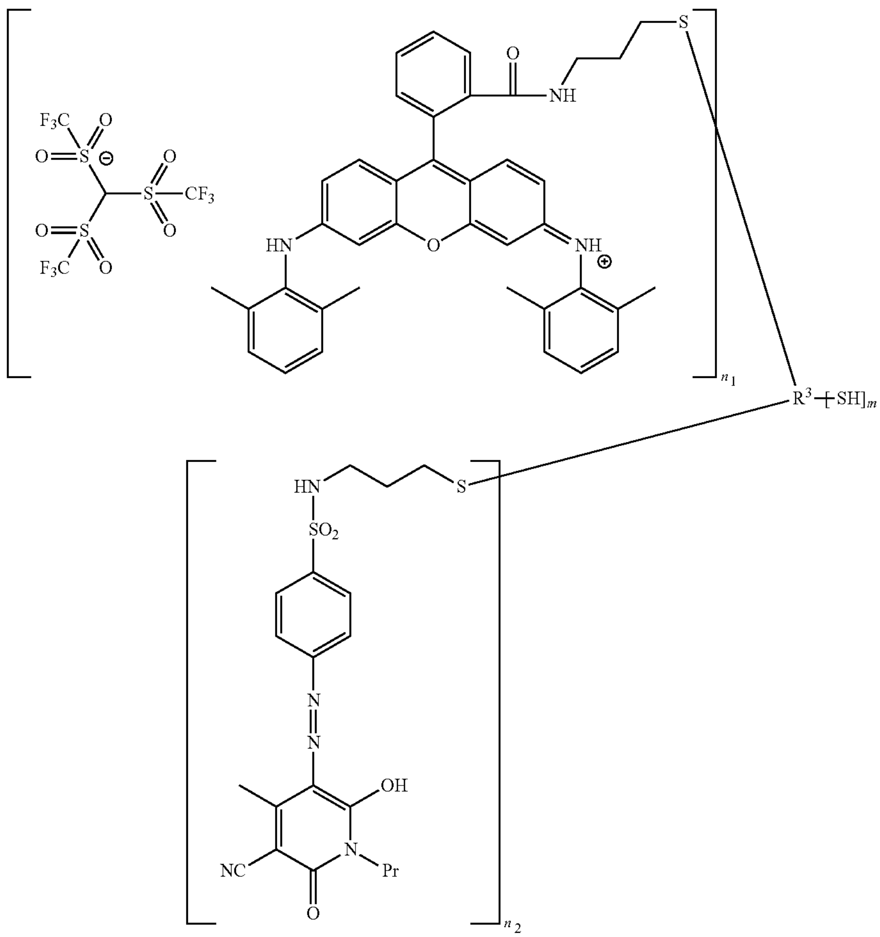
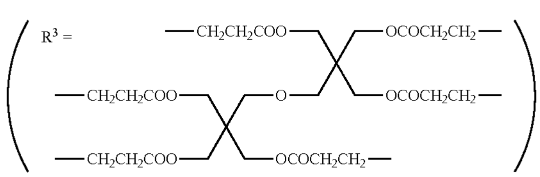
$n_1 = 2.0$, $n_2 = 2.0$, $m = 2.0$

Triarylmethane Compounds (A-tp-1) to (A-tp-11): The Following Structures
(A-tp-1)
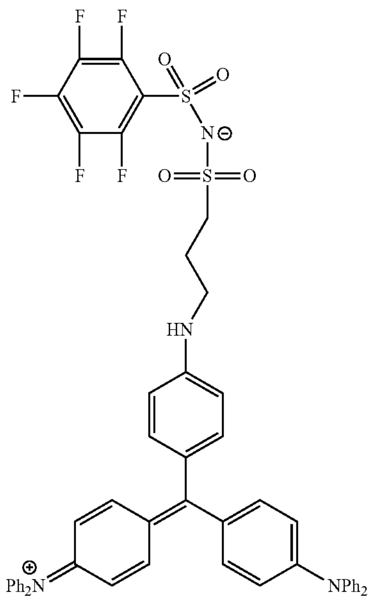
(A-tp-2)
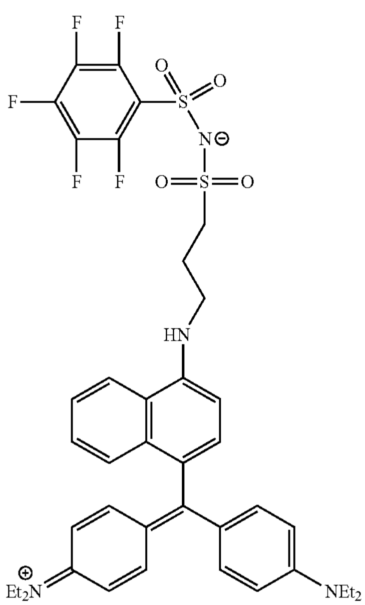
-continued
(A-tp-3)
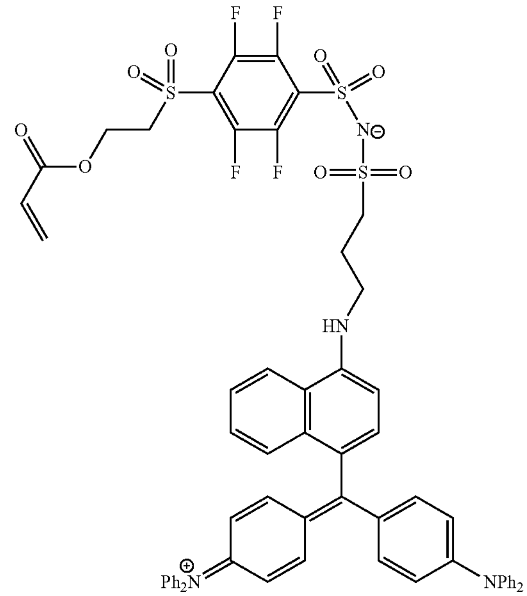
(A-tp-4)
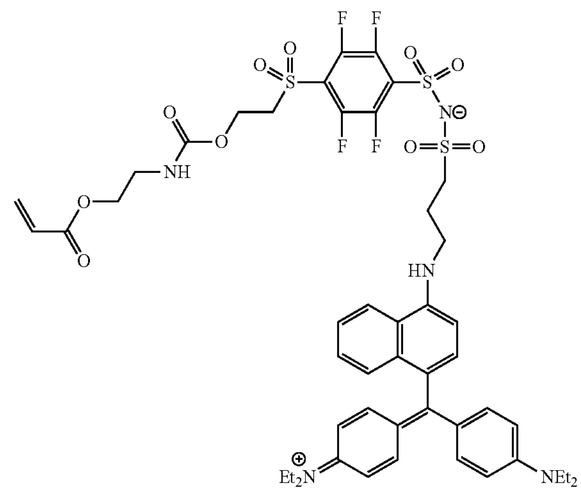
(A-tp-5)
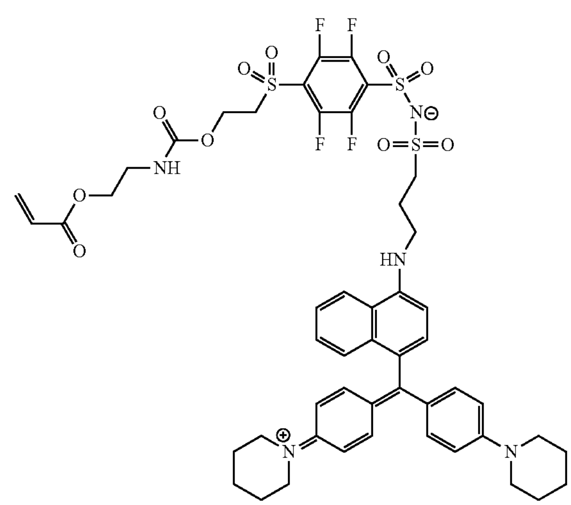

-continued
(A-tp-6)
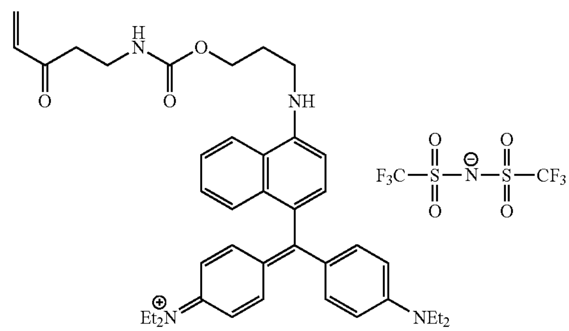
(A-tp-7)
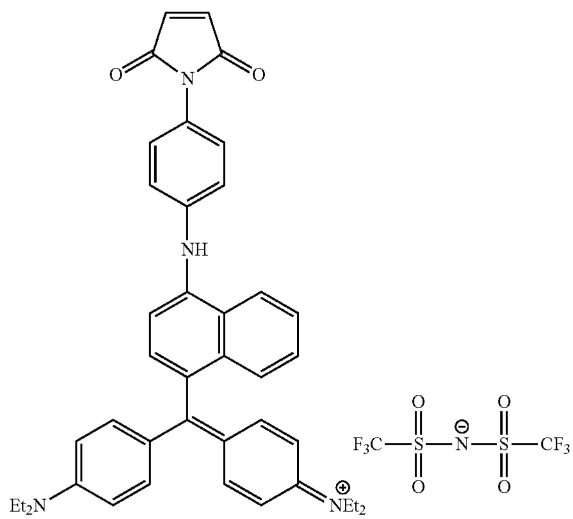
(A-tp-8)
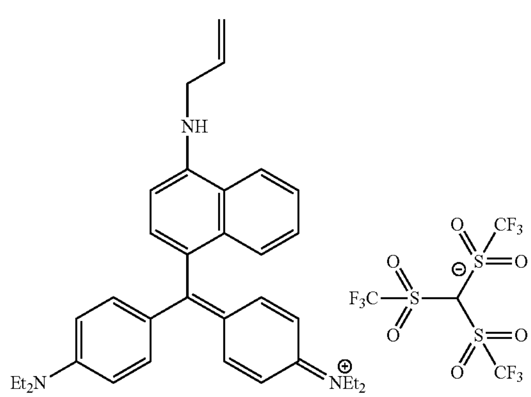
-continued
(A-tp-9)
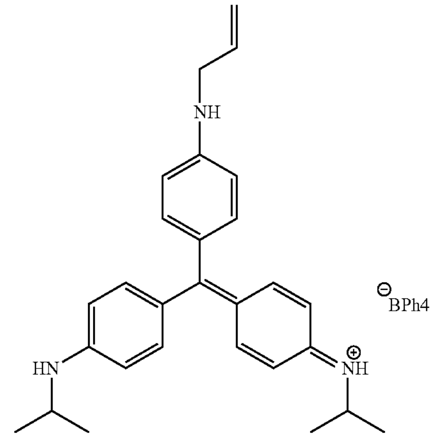
(A-tp-10)
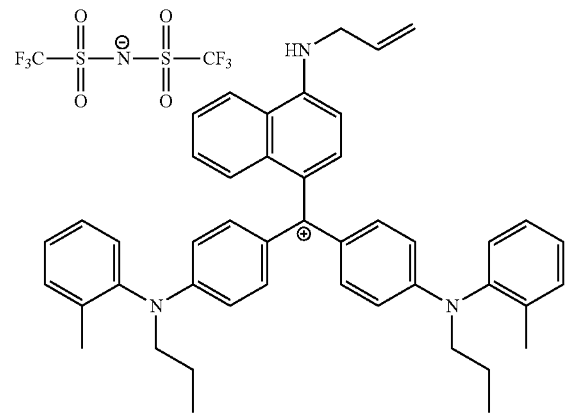
(A-tp-11)
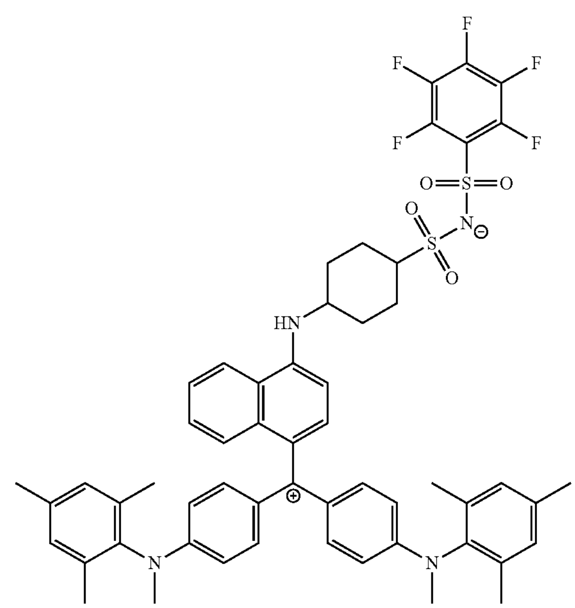
Xanthene Compounds (A-xt-101) to (A-xt-109), (A-xt-111) to (A-xt-113), (A-xt-116), and (A-xt-17): The Following Structures (A-xt-101)
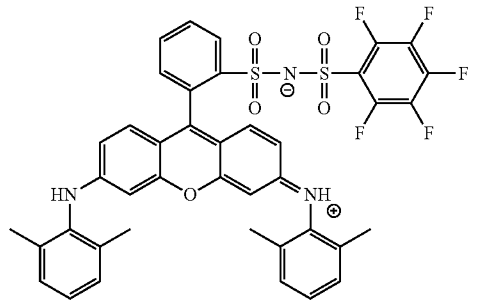
(A-xt-102)
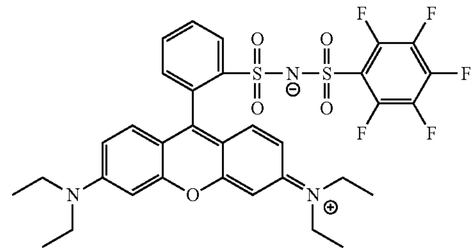
(A-xt-103)
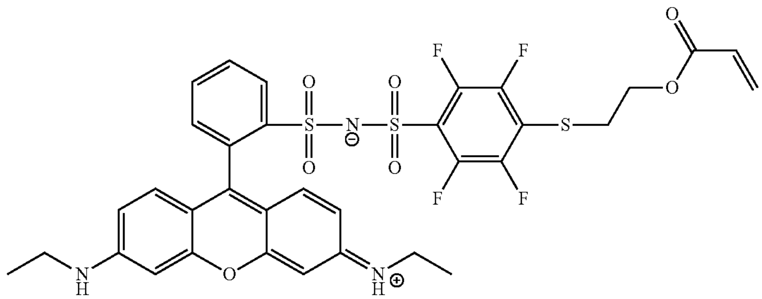
(A-xt-104)
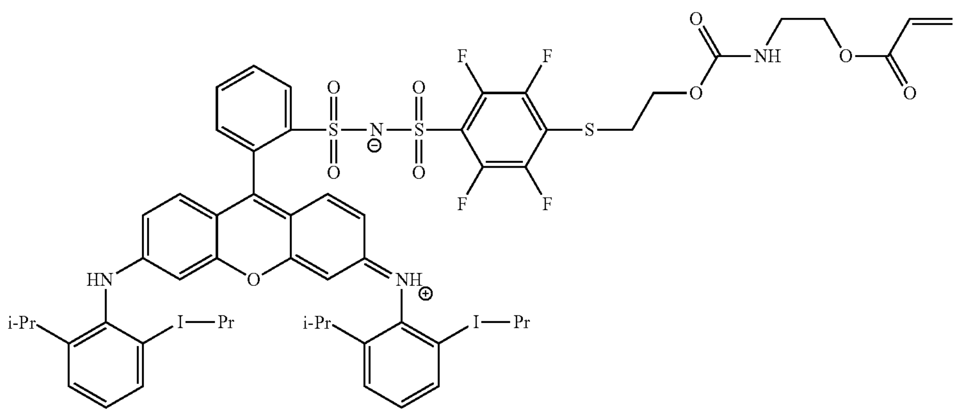
(A-xt-105)
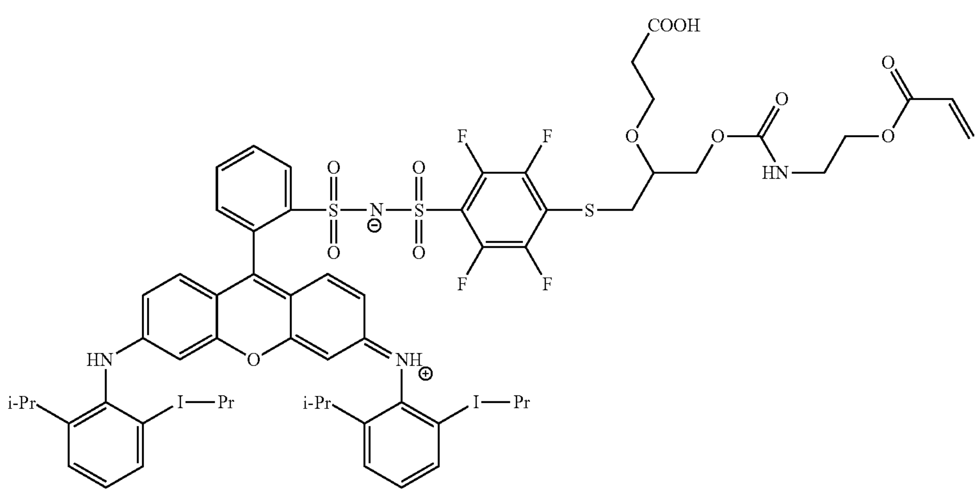

-continued
(A-xt-106)
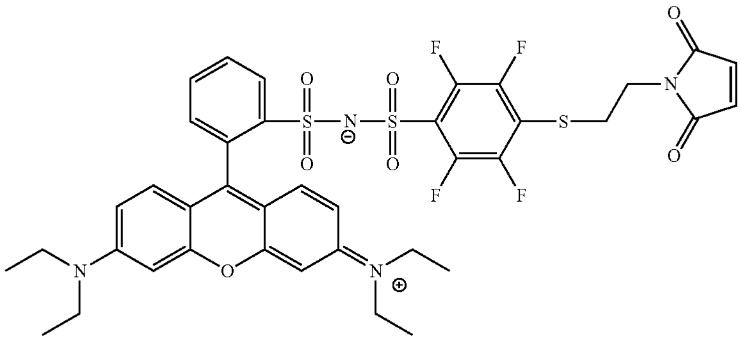
(A-xt-107)
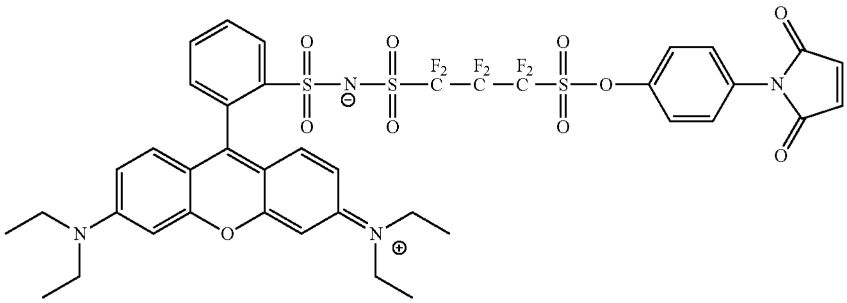
(A-xt-108)
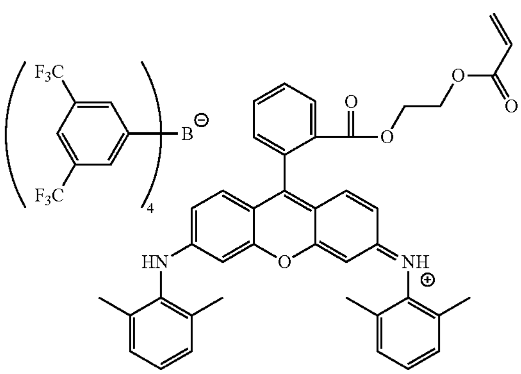
(A-xt-109)
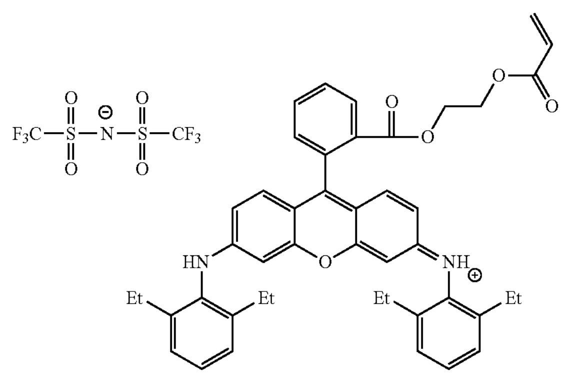
(A-xt-111)
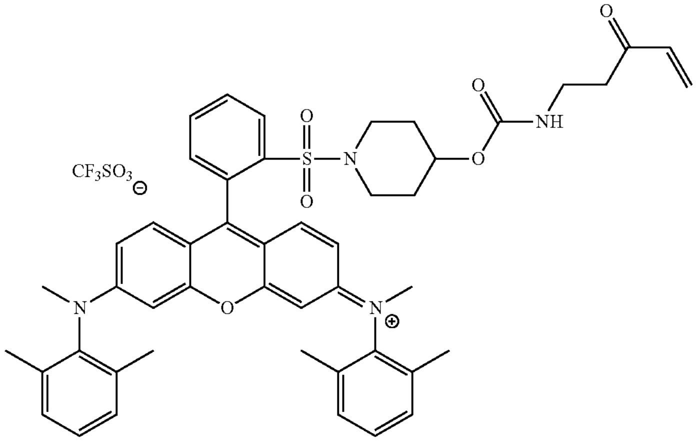

-continued
(A-xt-112)
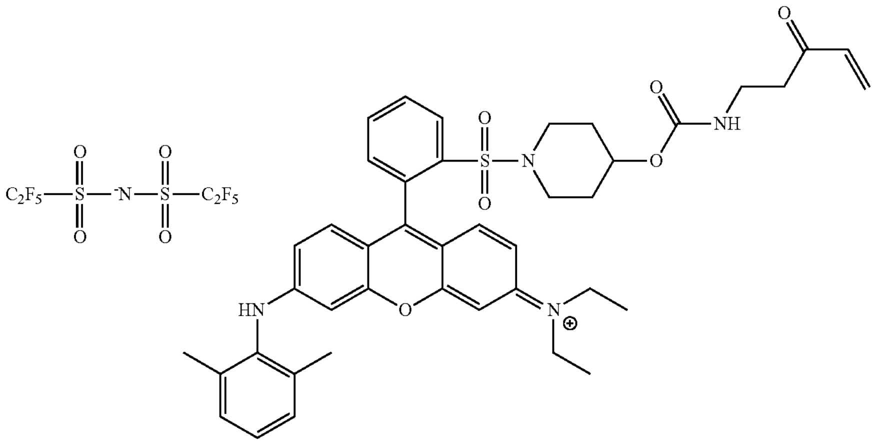
(A-xt-116)
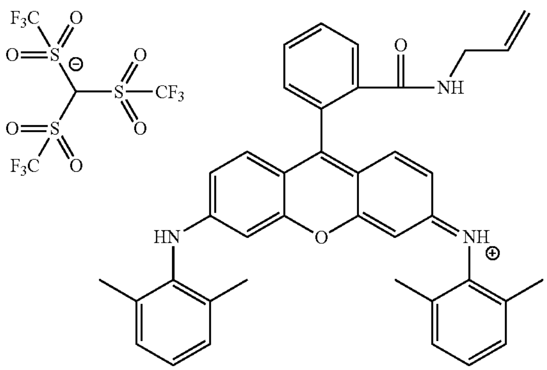
(A-xt-113)
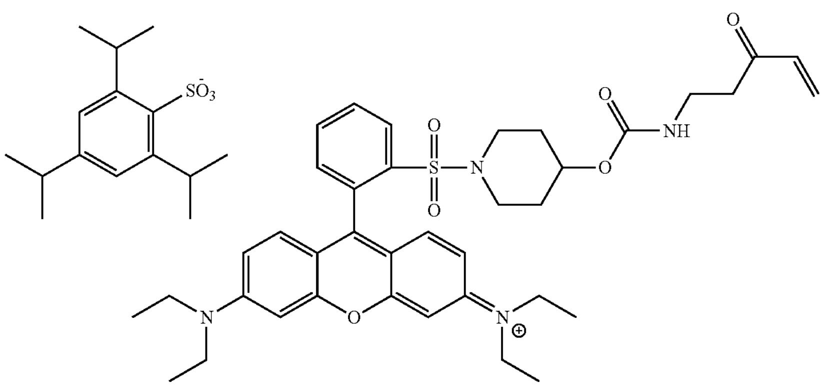
(A-xt-17)
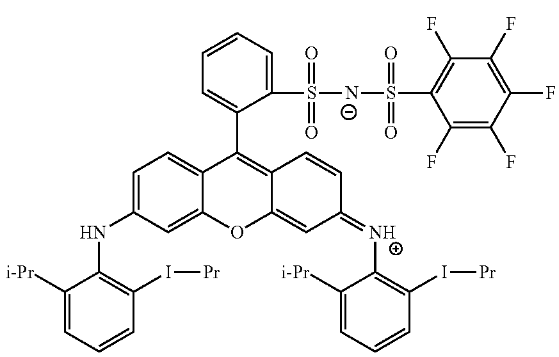

Anthraquinone Compound (A-aq-1), Azo Compound (A-az-1), Squarylium Compound (A-k-1), Phthalocyanine Compound (A-f-1), Subphthalocyanine Compound (A-sp-1), and Quinophthalone Compound (A-qp-1) to (A-qp-2): The Following Structures
A-aq-1
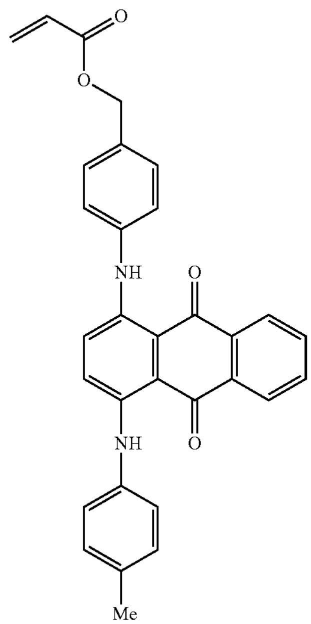
A-az-1
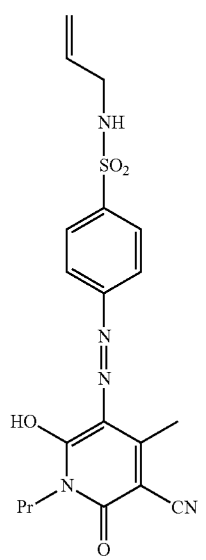
A-k-1
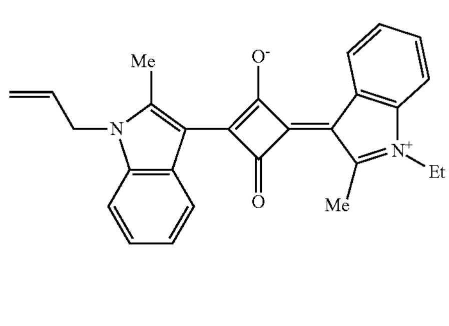
-continued
A-f-1
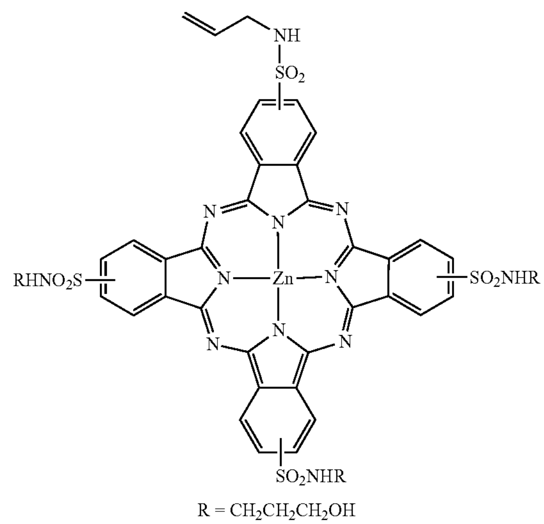
A-sp-1
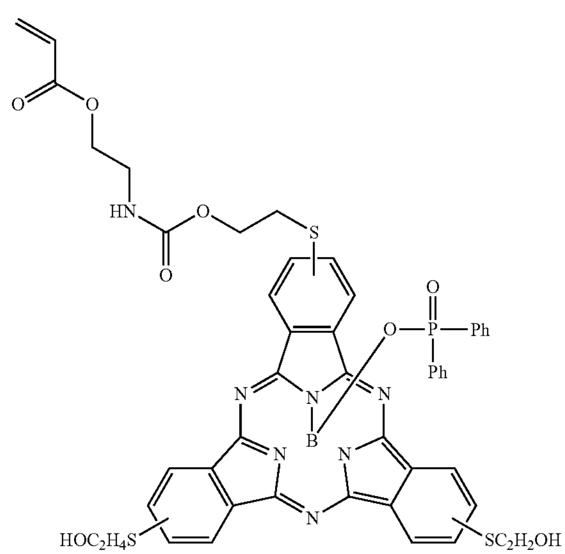

-continued

A-qp-1

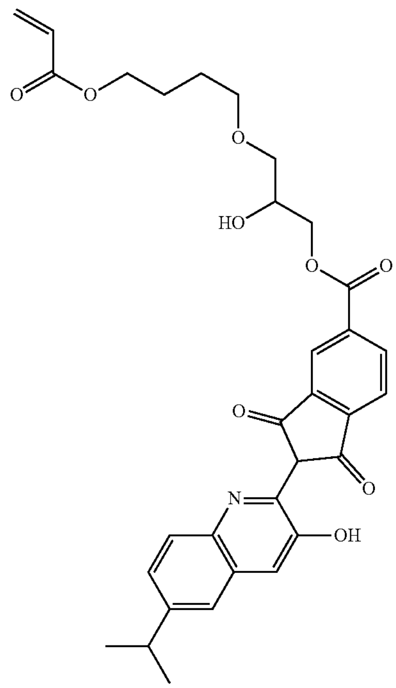

A-qp-2

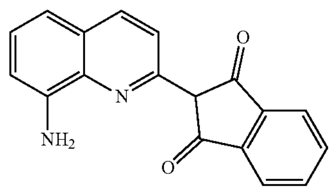

Synthesis of Colorant Represented by General Formula (1)

Synthesis Example C-1

A mixed solution of 5.0 parts of the chain transfer agent B-1 obtained in Synthesis Example B-1, 0.96 parts of methacrylic acid (MAA), and 9.0 parts of cyclohexanone was heated at 80° C. in a nitrogen stream. 0.077 parts of dimethyl 2,2'-azobis(isobutyrate) [V-601; manufactured by Wako Pure Chemical Industries, Ltd.] was added thereto, and then the mixture was heated and stirred at 80° C. for 2 hours. Further, after the addition of 0.077 parts of V-601, the mixture was heated and stirred at 80° C. for 2 hours, and further heated and stirred at 90° C. for 2 hours. After cooling to room temperature, 303 parts of cyclohexanone, 0.14 parts of tetrabutylammonium bromide (TBAB), and 0.79 parts of glycidyl methacrylate (GMA) were added thereto, and then the mixture was heated and stirred at 80° C. for 18 hours. After cooling to room temperature, the reaction solution was added dropwise to a mixed solvent of 250 parts of hexane and 250 parts of ethyl acetate, and the mixture was reprecipitated to obtain a colorant (C-1) according to the present invention, shown below. The weight-average molecular weight (value in terms of polystyrene) of C-1 was 11,600, and the acid value from titration using a 0.1 N aqueous sodium hydroxide solution was 46 mgKOH/g. Further, the molar ratio of the colorant structure/MAA/adducts of MAA and GMA from NMR was 5/6/6, and the repetition number of the P moieties was calculated to be 12 on average. In addition, a solution including 0.01 mg/ml of the colorant (C-1) dissolved in tetrahydrofuran (THF) was prepared (at a concentration controlled such that the maximum absorbance became 1.0), and the absorbance of the solution at 25° C. was measured using a 1-cm cell having an optical path length of 1 cm. As a result, the maximum absorption wavelength (λmax) was 615 nm and the specific absorbance at the maximum absorption wavelength (λmax) was 60.

(C-1)

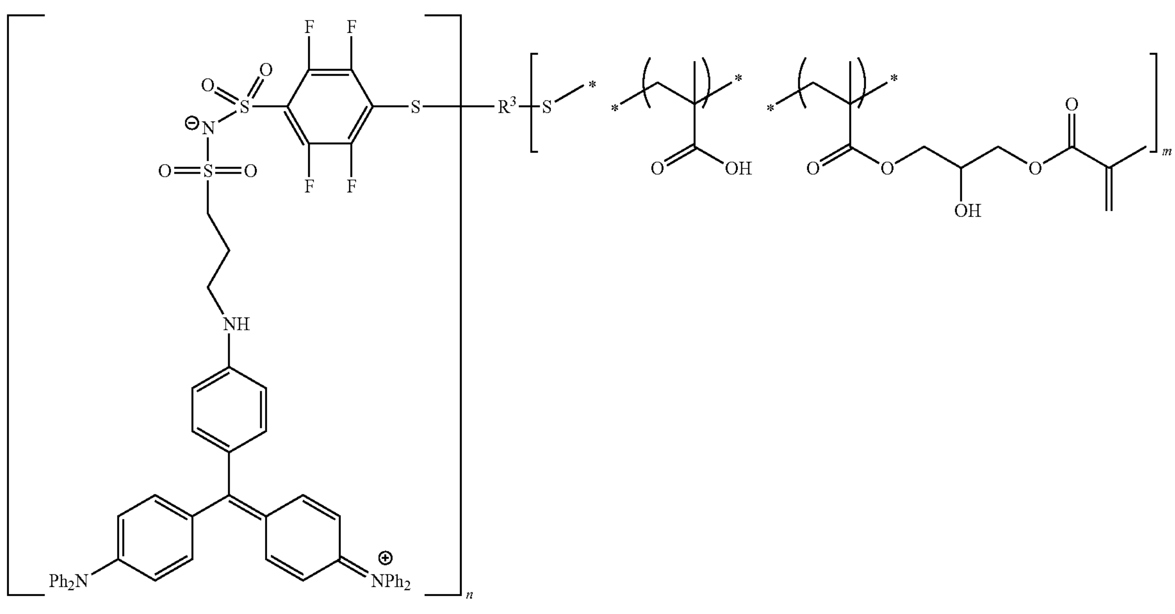

-continued

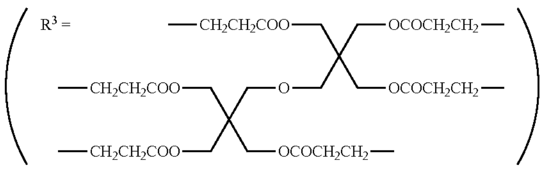

Synthesis Examples C-2 to 44

In the same manner as in Synthesis Example C-1 except that the chain transfer agent, the amount of the monomers, the amount of V-601, the amount of glycidyl methacrylate, and the amount of tetrabutylammonium bromide were changed as shown in the following Table 1, colorants C-2 to C-44 of the present invention were obtained.

<Measurement of Specific Absorbance>

The respective colorants were dissolved in tetrahydrofuran (THF), and adjusted to a concentration such that the maximum absorbance at a wavelength of 400 nm to 800 nm became 1.0, and the absorbance of the solution at 25° C. was measured on the basis of the following formula ($A_\lambda$), using a 1-cm cell having an optical path length of 1 cm.

$$E=A/(c\times l)\ \ldots\ (A_\lambda)$$

In Formula ($A_\lambda$),

E represents the specific absorbance at a maximum absorption wavelength of 400 inn to 800 nm, A represents the absorbance at a maximum absorption wavelength of 400 nm to 800 nm, l represents the cell length in a unit of cm, and c represents the concentration in a unit of mg/ml of a colorant in the solution.

TABLE 1

| | Mercaptan compound | | | | Monomer | | | | | | |
|---|---|---|---|---|---|---|---|---|---|---|---|
| Synthesis Example | Name | Introduction amount (parts) | m | n | Component 1 | Component 1 (parts) | Component 2 | Component 2 (parts) | V-601 (parts) | GMA (parts) | TBAB (parts) |
| C-1 | B-1 | 5.00 | 1 | 5 | M-4 | 0.96 | | | 0.077 | 0.79 | 0.14 |
| C-2 | B-2 | 5.00 | 2 | 4 | M-4 | 0.96 | | | 0.077 | 0.79 | 0.14 |
| C-3 | B-3 | 5.00 | 3 | 3 | M-4 | 0.97 | | | 0.078 | 0.80 | 0.15 |
| C-4 | B-4 | 5.00 | 4 | 2 | M-4 | 1.39 | | | 0.112 | 1.35 | 0.25 |
| C-5 | B-5 | 5.00 | 2 | 4 | M-4 | 1.21 | M-10 | 1.64 | 0.150 | 1.09 | 0.20 |
| C-6 | B-6 | 5.00 | 2 | 4 | M-4 | 0.81 | O-1 | 0.33 | 0.078 | 0.80 | 0.15 |
| C-7 | B-7 | 5.00 | 2 | 4 | M-4 | 1.05 | | | 0.084 | 0.29 | 0.05 |
| C-8 | B-8 | 5.00 | 2 | 4 | M-4 | 0.69 | | | 0.055 | 0.57 | 0.10 |
| C-9 | B-9 | 5.00 | 2 | 4 | M-4 | 0.48 | | | 0.038 | 0.47 | 0.09 |
| C-10 | B-10 | 5.00 | 1 | 3 | M-4 | 1.58 | | | 0.126 | 1.30 | 0.24 |
| C-11 | B-11 | 5.00 | 1.5 | 2.5 | M-4 | 1.80 | O-4 | 2.72 | 0.289 | 1.49 | 0.27 |
| C-12 | B-12 | 5.00 | 1 | 2 | M-4 | 0.71 | | | 0.057 | 0.59 | 0.11 |
| C-13 | B-13 | 5.00 | 2 | 4 | M-5 | 2.07 | | | 0.062 | 0.48 | 0.09 |
| C-14 | B-14 | 5.00 | 2 | 4 | M-4 | 0.97 | | | 0.077 | 0.96 | 0.17 |
| C-15 | B-15 | 5.00 | 2 | 4 | M-4 | 1.16 | | | 0.093 | 1.15 | 0.21 |
| C-16 | B-16 | 5.00 | 2 | 4 | M-4 | 1.32 | | | 0.106 | 1.09 | 0.20 |
| C-17 | B-17 | 5.00 | 1 | 3 | M-4 | 0.61 | | | 0.049 | 0.50 | 0.09 |
| C-18 | B-18 | 5.00 | 2 | 4 | M-4 | 1.22 | | | 0.098 | 1.21 | 0.22 |
| C-19 | B-19 | 5.00 | 2 | 4 | M-4 | 1.35 | O-1 | 1.38 | 0.162 | 1.11 | 0.20 |
| C-20 | B-20 | 5.00 | 1 | 5 | M-4 | 0.81 | | | 0.065 | 0.67 | 0.12 |
| C-21 | B-21 | 5.00 | 2 | 4 | M-4 | 0.66 | | | 0.053 | 0.41 | 0.07 |
| C-22 | B-22 | 5.00 | 3 | 3 | M-4 | 2.09 | M-10 | 1.04 | 0.201 | 1.03 | 0.19 |
| C-23 | B-23 | 5.00 | 1.5 | 2.5 | M-4 | 0.52 | | | 0.041 | 0.43 | 0.08 |
| C-24 | B-24 | 5.00 | 2 | 4 | M-4 | 0.46 | | | 0.037 | 0.50 | 0.09 |
| C-25 | B-25 | 5.00 | 2 | 4 | M-5 | 2.77 | | | 0.083 | 0.85 | 0.15 |
| C-26 | B-26 | 5.00 | 2 | 4 | M-4 | 1.13 | O-2 | 0.84 | 0.121 | 0.94 | 0.17 |
| C-27 | B-27 | 5.00 | 2 | 4 | M-4 | 0.36 | | | 0.029 | 0.12 | 0.02 |
| C-28 | B-28 | 5.00 | 2 | 4 | M-4 | 1.09 | O-3 | 0.44 | 0.117 | 0.90 | 0.16 |
| C-29 | B-29 | 5.00 | 2 | 4 | M-4 | 0.56 | O-4 | 0.56 | 0.075 | 0.31 | 0.06 |
| C-30 | B-30 | 5.00 | 2 | 4 | M-4 | 0.98 | | | 0.079 | 0.81 | 0.15 |
| C-31 | B-31 | 5.00 | 2 | 4 | M-4 | 1.11 | O-5 | 0.61 | 0.118 | 0.91 | 0.17 |
| C-32 | B-32 | 5.00 | 2 | 4 | M-4 | 1.07 | | | 0.086 | 0.89 | 0.16 |
| C-33 | B-33 | 5.00 | 2 | 4 | M-4 | 2.01 | M-10 | 1.00 | 0.193 | 0.99 | 0.18 |
| C-34 | B-34 | 5.00 | 1.5 | 4.5 | M-4 | 0.51 | | | 0.041 | 0.28 | 0.05 |
| C-35 | B-35 | 5.00 | 2 | 4 | M-4 | 0.93 | | | 0.075 | 0.61 | 0.11 |
| C-36 | B-36 | 5.00 | 2.5 | 3.5 | M-5 | 2.76 | | | 0.083 | 0.85 | 0.15 |
| C-37 | B-37 | 5.00 | 2 | 4 | M-4 | 1.02 | O-2 | 0.75 | 0.109 | 0.84 | 0.15 |
| C-38 | B-38 | 5.00 | 2 | 4 | M-4 | 0.79 | | | 0.063 | 0.26 | 0.05 |

TABLE 1-continued

| | | | | | | | | | | | |
|---|---|---|---|---|---|---|---|---|---|---|---|
| C-39 | B-39 | 5.00 | 2 | 4 | M-4 | 2.11 | O-4 | 1.06 | 0.226 | 1.74 | 0.32 |
| C-40 | B-40 | 5.00 | 2 | 4 | M-4 | 1.07 | O-1 | 0.73 | 0.114 | 0.59 | 0.11 |
| C-41 | B-41 | 5.00 | 2 | 4 | M-4 | 1.03 | | | 0.083 | 0.85 | 0.15 |
| C-42 | B-42 | 5.00 | 2 | 4 | M-4 | 1.05 | O-3 | 0.42 | 0.113 | 0.87 | 0.16 |
| C-43 | B-43 | 5.00 | 2 | 4 | M-4 | 1.55 | | | 0.124 | 1.28 | 0.23 |
| C-44 | B-44 | 5.00 | 2 | 4 | M-5 | 6.73 | | | 0.202 | 2.08 | 0.38 |

| | Molar ratio (NMR) | | | | P moieties | Acid | | Yield | Maximum | |
|---|---|---|---|---|---|---|---|---|---|---|
| Synthesis Example | Colorant structure | Component 1 | Component 2 | GMA adduct | Repetition number | value mgKOH/g | GPC Mw | amount (parts) | absorption wavelength | Specific absorbance |
| C-1 | 5 | 6 | 0 | 6 | 12.0 | 46 | 11600 | 6.1 | 615 | 60 |
| C-2 | 4 | 5 | 0 | 5 | 5.0 | 46 | 9600 | 6.1 | 615 | 58 |
| C-3 | 3 | 4 | 0 | 4 | 2.7 | 47 | 7600 | 6.1 | 615 | 55 |
| C-4 | 2 | 3.5 | 0 | 5 | 2.1 | 48 | 6500 | 7.0 | 615 | 43 |
| C-5 | 4 | 5 | 6 | 6 | 8.5 | 40 | 11100 | 8.1 | 605 | 50 |
| C-6 | 4 | 4 | 2 | 6 | 6.0 | 30 | 11800 | 6.2 | 620 | 47 |
| C-7 | 4 | 10 | 0 | 2 | 6.0 | 90 | 9900 | 5.7 | 610 | 56 |
| C-8 | 4 | 4 | 0 | 4 | 4.0 | 36 | 10000 | 5.6 | 610 | 56 |
| C-9 | 4 | 2 | 0 | 3 | 2.5 | 21 | 8500 | 5.4 | 610 | 66 |
| C-10 | 3 | 6 | 0 | 6 | 12.0 | 65 | 8200 | 7.1 | 610 | 51 |
| C-11 | 2.5 | 6 | 12 | 6 | 16.0 | 53 | 10100 | 9.9 | 610 | 34 |
| C-12 | 2 | 2 | 0 | 2 | 4.0 | 37 | 4800 | 5.7 | 610 | 58 |
| C-13 | 4 | 5 | 0 | 3 | 4.0 | 42 | 10700 | 6.8 | 610 | 52 |
| C-14 | 4 | 4 | 0 | 6 | 5.0 | 36 | 9800 | 6.2 | 610 | 57 |
| C-15 | 4 | 4 | 0 | 6 | 5.0 | 41 | 8600 | 6.6 | 595 | 65 |
| C-16 | 4 | 6 | 0 | 6 | 6.0 | 58 | 9200 | 6.7 | 535 | 55 |
| C-17 | 3 | 2 | 0 | 2 | 4.0 | 32 | 5500 | 5.5 | 535 | 70 |
| C-18 | 4 | 4 | 0 | 6 | 5.0 | 43 | 8400 | 6.7 | 525 | 61 |
| C-19 | 4 | 6 | 6 | 6 | 9.0 | 50 | 10800 | 8.0 | 520 | 47 |
| C-20 | 5 | 6 | 0 | 6 | 12.0 | 41 | 12000 | 5.8 | 535 | 53 |
| C-21 | 4 | 5 | 0 | 3 | 4.0 | 44 | 10100 | 5.5 | 535 | 51 |
| C-22 | 3 | 14 | 4 | 6 | 8.0 | 104 | 12000 | 8.2 | 535 | 32 |
| C-23 | 2.5 | 2 | 0 | 2 | 2.7 | 28 | 6300 | 5.3 | 535 | 51 |
| C-24 | 4 | 2 | 0 | 4 | 3.0 | 17 | 10700 | 5.4 | 535 | 48 |
| C-25 | 4 | 5 | 0 | 5 | 5.0 | 39 | 11400 | 7.8 | 525 | 45 |
| C-26 | 4 | 6 | 4 | 6 | 8.0 | 47 | 11500 | 7.1 | 525 | 44 |
| C-27 | 4 | 4 | 0 | 1 | 2.5 | 34 | 10500 | 4.9 | 535 | 49 |
| C-28 | 4 | 6 | 4 | 6 | 8.0 | 48 | 11200 | 6.7 | 535 | 45 |
| C-29 | 4 | 4 | 4 | 2 | 5.0 | 38 | 9500 | 5.8 | 545 | 59 |
| C-30 | 4 | 6 | 0 | 6 | 6.0 | 47 | 11400 | 6.1 | 530 | 45 |
| C-31 | 4 | 6 | 4 | 6 | 8.0 | 47 | 11300 | 6.9 | 525 | 49 |
| C-32 | 4 | 6 | 0 | 6 | 6.0 | 50 | 10700 | 6.3 | 535 | 48 |
| C-33 | 4 | 14 | 4 | 6 | 12.0 | 102 | 12300 | 8.1 | 535 | 50 |
| C-34 | 4.5 | 4 | 0 | 2 | 4.0 | 38 | 9300 | 5.2 | 535 | 74 |
| C-35 | 4 | 6 | 0 | 4 | 5.0 | 56 | 9600 | 5.9 | 535 | 63 |
| C-36 | 3.5 | 5 | 0 | 5 | 4.0 | 39 | 11500 | 7.7 | 535 | 47 |
| C-37 | 4 | 6 | 4 | 6 | 8.0 | 44 | 12300 | 6.9 | 535 | 50 |
| C-38 | 4 | 4 | 0 | 1 | 2.5 | 68 | 5200 | 5.4 | 640 | 20 |
| C-39 | 4 | 6 | 4 | 6 | 8.0 | 69 | 7700 | 8.9 | 430 | 33 |
| C-40 | 4 | 4 | 2 | 2 | 4.0 | 63 | 5700 | 6.6 | 580 | 33 |
| C-41 | 4 | 6 | 0 | 6 | 6.0 | 49 | 11000 | 6.2 | 630 | 29 |
| C-42 | 4 | 6 | 4 | 6 | 8.0 | 47 | 11500 | 6.6 | 450 | 39 |
| C-43 | 4 | 6 | 0 | 6 | 6.0 | 64 | 8300 | 7.0 | 440 | 30 |
| C-44 | 4 | 6 | 0 | 6 | 6.0 | 59 | 9000 | 12.4 | 440 | 28 |

Synthesis Example C-45

A mixed solution of 5.0 parts of the chain transfer agent B-1 obtained in Synthesis Example B-1, 0.96 parts of methacrylic acid (MAA), and 9.0 parts of cyclohexanone was heated at 80° C. in a nitrogen stream. 0.077 parts of dimethyl 2,2'-azobis(isobutyrate) [V-601; manufactured by Wako Pure Chemical Industries, Ltd.] was added thereto, and then the mixture was heated and stirred at 80° C. for 2 hours. Further, after the addition of 0.077 parts of V-601, the mixture was heated and stirred at 80° C. for 2 hours, and further heated and stirred at 90° C. for 2 hours. After cooling to room temperature, the reaction solution was added dropwise to a mixed solvent of 250 parts of hexane and 250 parts of ethyl acetate, and the mixture was reprecipitated to obtain a colorant (C-45) according to the present invention, shown below. The weight-average molecular weight (value in terms of polystyrene) of C-45 was 10,200, and the acid value from titration using a 0.1 N aqueous sodium hydroxide solution was 105 mgKOH/g. Further, the molar ratio of adducts of the colorant structure/MAA from NMR was 5/12, and the repetition number of the P moieties was calculated to be 12 on average. In addition, a solution including 0.01 mg/ml of the colorant (C-45) dissolved in tetrahydrofuran (THF) was prepared (at a concentration controlled such that the maximum absorbance became 1.0), and the absorbance of the solution at 25° C. was measured using a 1-cm cell having an optical path length of 1 cm. As a result, the maximum absorption wavelength (λmax) was 615 nm and the specific absorbance at the maximum absorption wavelength (λmax) was 60.

(C-45)

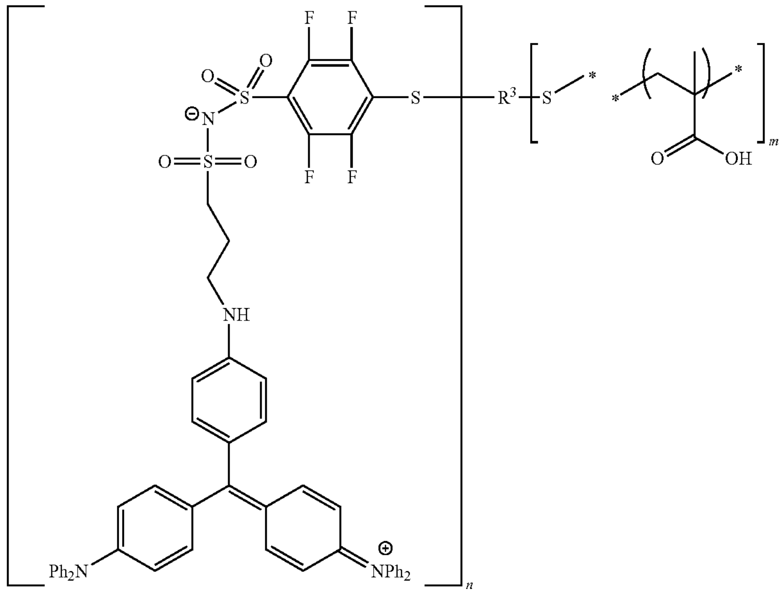

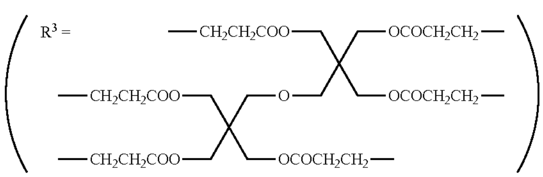

Synthesis Examples C-46 and 47

In the same manner as in Synthesis Example C-45 except that the chain transfer agent, the amount of the monomers, and the amount of V-601 were changed as shown in the following Table 2, colorants C-46 to C-47 of the present invention were obtained.

Synthesis Example C-48

A mixed solution of 5.0 parts of the chain transfer agent B-35 obtained in Synthesis Example B-35, 0.74 parts of methacrylic acid (MAA), 1.81 parts of ethylene glycol mono-2-bromoisobutyrate monomethacrylate (0-7), and 9.0 parts of cyclohexanone was heated at 90° C. in a nitrogen stream. 0.105 parts of dimethyl 2,2'-azobis(isobutyrate) [V-601; manufactured by Wako Pure Chemical Industries, Ltd.] was added thereto, and then the mixture was heated and stirred at 90° C. for 1.5 hours. Further, after the addition of 0.105 parts of V-601, the mixture was heated and stirred at 90° C. for 1.5 hours, 0.105 parts of V-601 was added thereto, and the mixture was heated and stirred at 90° C. for 2 hours. After cooling to room temperature, 10.0 parts of diazabicycloundecene (DBU) was slowly added thereto, and the mixture was stirred at room temperature for 14 hours. Thereafter, the mixture was cooled to 5° C. or lower in an ice bath, and 6.3 parts of methanesulfonic acid was slowly added thereto. After the reaction, the reaction solution was added dropwise to a mixed solvent of 250 parts of 1 N aqueous hydrochloric acid, and the mixture was reprecipitated and filtered. The obtained solid was put into 250 parts of acetonitrile, suspended, and washed, and filtered again to obtain a colorant (C-49) according to the present invention. The weight-average molecular weight (value in terms of polystyrene) of C-49 was 10,400, and the acid value from titration using a 0.1 N aqueous sodium hydroxide solution was 69 mgKOH/g. Further, the molar ratio of adducts of the colorant structure/MAA/O-7 from NMR was 4/8/6, and the repetition number of the P moieties was calculated to be 7 on average. In addition, a solution including 0.01 mg/ml of the colorant (C-48) dissolved in tetrahydrofuran (THF) was prepared (at a concentration controlled such that the maximum absorbance became 1.0), and the absorbance of the solution at 25° C. was measured using a 1-cm cell having an optical path length of 1 cm. As a result, the maximum absorption wavelength (λmax) was 535 nm and the specific absorbance at the maximum absorption wavelength (λmax) was 59.

(C-48)

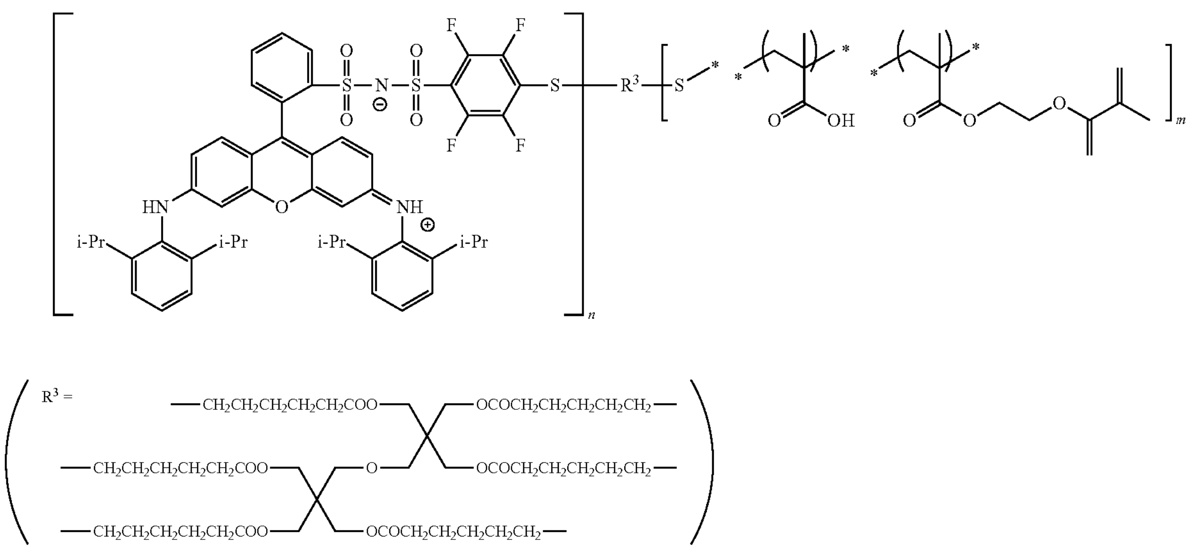

Synthesis Examples C-49 and 50

In the same manner as in Synthesis Example C-48 except that the chain transfer agent, the amount of the monomers, and the amount of V-601 were changed as shown in the following Table 2, colorants C-49 to C-50 of the present invention were obtained.

Synthesis Example C-51

A mixed solution of 5.0 parts of the chain transfer agent B-36 obtained in Synthesis Example B-36, 0.72 parts of methyl methacrylate (O-6), 2.67 parts of ethylene glycol mono-2-bromoisobutyrate monomethacrylate (O-7), and 9.0 parts of cyclohexanone was heated at 90° C. in a nitrogen stream. 0.116 parts of dimethyl 2,2'-azobis(isobutyrate) [V-601; manufactured by Wako Pure Chemical Industries, Ltd.] was added thereto, and then the mixture was heated and stirred at 90° C. for 1.5 hours. Further, after the addition of 0.116 parts of V-601, the mixture was heated and stirred at 90° C. for 1.5 hours, 0.116 parts of V-601 was added thereto, and the mixture was heated and stirred at 90° C. for 2 hours. After cooling to room temperature, 10.0 parts of diazabicycloundecene (DBU) was slowly added thereto, and the mixture was stirred at room temperature for 14 hours. Thereafter, the mixture was cooled to 5° C. or lower in an ice bath, and 6.3 parts of methanesulfonic acid was slowly added thereto. After the reaction, the reaction solution was added dropwise to a mixed solvent of 250 parts of 1 N aqueous hydrochloric acid, and the mixture was reprecipitated and filtered. The obtained solid was put into 250 parts of acetonitrile, followed by suspending and washing, and filtered again to obtain a colorant (C-51) according to the present invention, shown below. The weight-average molecular weight (value in terms of polystyrene) of C-51 was 10,100, and the acid value from titration using a 0.1 N aqueous sodium hydroxide solution was 0 mgKOH/g. Further, the molar ratio of adducts of the colorant structure/O-6/O-7 from NMR was 4/8/6, and the repetition number of the P moieties was calculated to be 5.6 on average. In addition, a solution including 0.01 mg/ml of the colorant (C-48) dissolved in tetrahydrofuran (THF) was prepared (at a concentration controlled such that the maximum absorbance became 1.0), and the absorbance of the solution at 25° C. was measured using a 1-cm cell having an optical path length of 1 cm. As a result, the maximum absorption wavelength (λmax) was 535 nm and the specific absorbance at the maximum absorption wavelength (λmax) was 54.

(C-51)

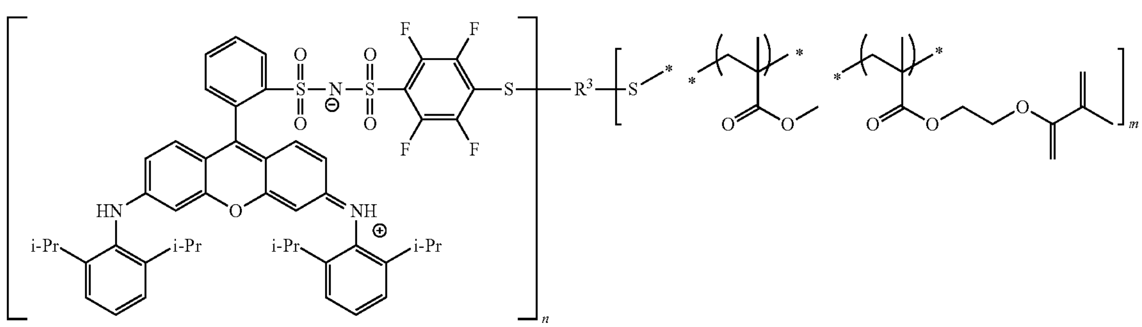

-continued

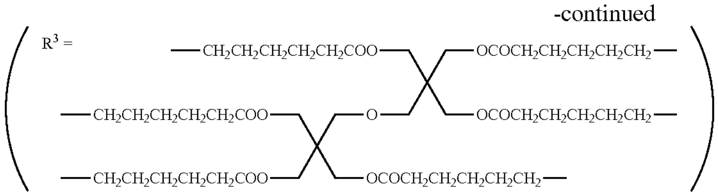

Synthesis Examples C-52 to 56

In the same manner as in Synthesis Example C-48 except that the chain transfer agent, the amount of the monomers, and the amount of V-601 were changed as shown in the following Table 2, colorants C-52 to C-56 of the present invention were obtained.

TABLE 2

| Synthesis Example | Mercaptan compound Name | Introduction amount (parts) | m | n | Monomer Component 1 | Component 1 (parts) | Component 2 | Component 2 (parts) | V-601 (parts) | Molar ratio (NMR) Colorant structure |
|---|---|---|---|---|---|---|---|---|---|---|
| C-45 | B-1 | 5.00 | 1 | 5 | M-4 | 0.96 | | | 0.077 | 5 |
| C-46 | B-35 | 5.00 | 2 | 4 | M-4 | 0.56 | O-1 | 0.38 | 0.060 | 4 |
| C-47 | B-43 | 5.00 | 2 | 4 | M-4 | 1.55 | | | 0.124 | 4 |
| C-48 | B-35 | 5.00 | 2 | 4 | M-4 | 0.74 | O-7 | 1.81 | 0.105 | 4 |
| C-49 | B-36 | 5.00 | 2.5 | 3.5 | M-4 | 0.62 | O-7 | 2.67 | 0.116 | 3.5 |
| C-50 | B-37 | 5.00 | 2 | 4 | M-4 | 0.77 | O-7 | 3.34 | 0.145 | 4 |
| C-52 | B-45 | 5.00 | 2 | 4 | M-4 | 0.71 | O-7 | 1.22 | 0.105 | 4 |
| C-53 | B-46 | 5.00 | 2 | 4 | M-4 | 0.54 | O-7 | 1.66 | 0.116 | 4 |
| C-54 | B-47 | 5.00 | 2 | 4 | M-4 | 0.73 | O-7 | 1.25 | 0.105 | 4 |
| C-55 | B-48 | 5.00 | 2 | 4 | M-4 | 0.56 | O-7 | 1.71 | 0.116 | 4 |
| C-56 | B-49 | 5.00 | 2 | 4 | M-4 | 1.44 | O-7 | 1.90 | 0.145 | 4 |

| Synthesis Example | Molar ratio (NMR) Component 1 | Component 2 | P moieties Repetition number | Acid value mgKOH/g | GPC Mw | Yield amount (parts) | Maximum absorption wavelength | Specific absorbance |
|---|---|---|---|---|---|---|---|---|
| C-45 | 12 | 0 | 12.0 | 105 | 10200 | 5.4 | 615 | 68 |
| C-46 | 6 | 2 | 4.0 | 61 | 8700 | 5.3 | 535 | 0 |
| C-47 | 12 | 0 | 6.0 | 154 | 6900 | 5.9 | 440 | 0 |
| C-48 | 8 | 6 | 7.0 | 69 | 10400 | 6.3 | 535 | 59 |
| C-49 | 6 | 8 | 5.6 | 54 | 10000 | 6.8 | 535 | 55 |
| C-50 | 6 | 8 | 7.0 | 62 | 8700 | 7.3 | 440 | 29 |
| C-52 | 8 | 6 | 7.0 | 67 | 10700 | 6.2 | 560 | 50 |
| C-53 | 6 | 8 | 7.0 | 49 | 11000 | 6.5 | 560 | 45 |
| C-54 | 8 | 6 | 7.0 | 68 | 10500 | 6.3 | 535 | 40 |
| C-55 | 6 | 8 | 7.0 | 50 | 9500 | 6.5 | 535 | 40 |
| C-56 | 14 | 8 | 11.0 | 113 | 10500 | 7.5 | 535 | 35 |

The kinds of the monomers described in Tables 1 and 2 are shown below.

(M-4)

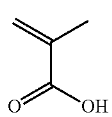

(M-5)

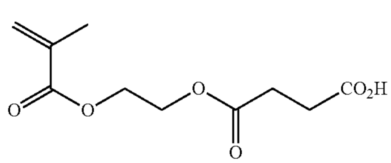

-continued (M-10)

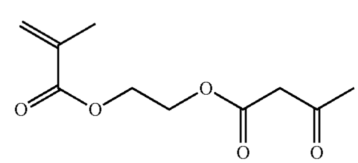

(O-1)

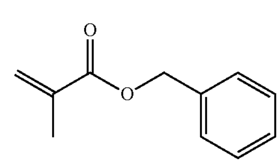

-continued
(O-2)
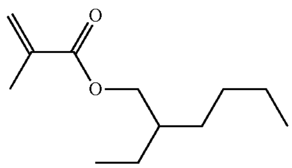
(O-3)
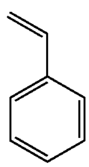
(O-4)
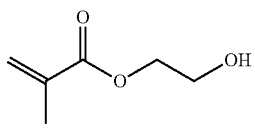
-continued
(O-5)
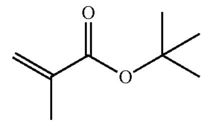
(O-6)
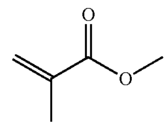
(O-7)
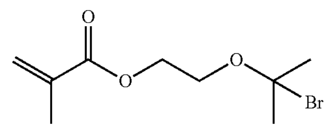
Comparative Colorant 1: Triarylmethane Compound (A-tp-1): The Following Structure
Comparative Colorant 2: Xanthene Compound (A-xt-105): The Following Structure
(A-tp-1)
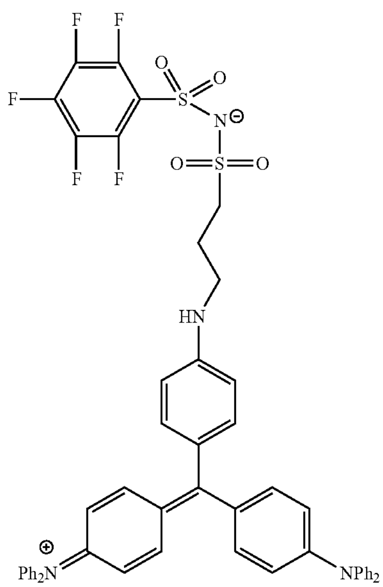
(A-xt-105)
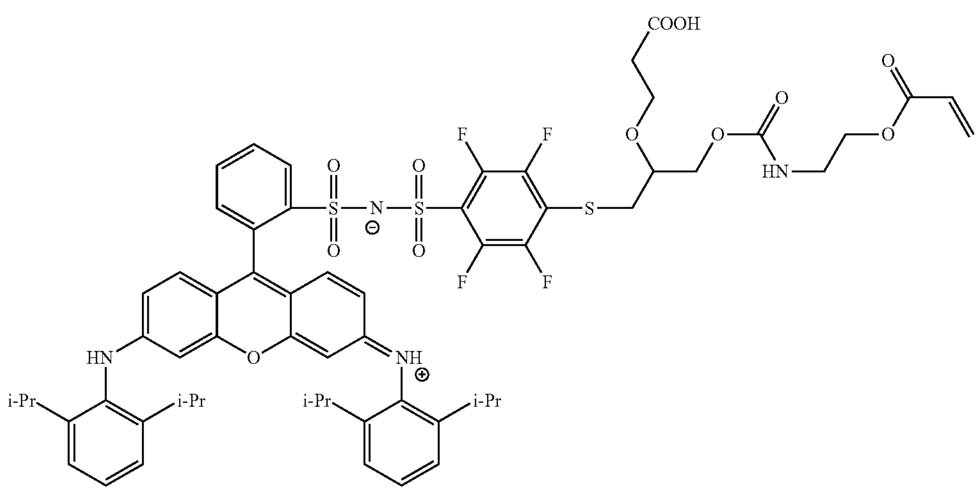

Comparative Colorant 3: The Following Structure

A comparative colorant 3 that is a colorant multimer having a structure shown below was synthesized using a triarylmethane compound (A-tp-101) as a colorant. Hereinafter, the detailed operation will be described.

Comparative colorant 3

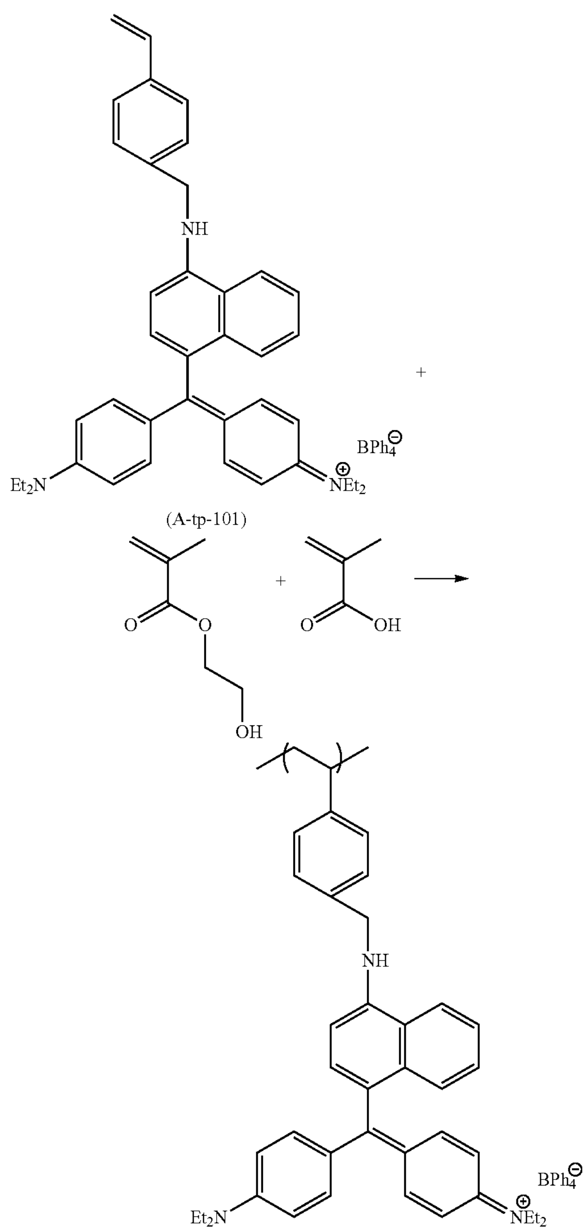

-continued

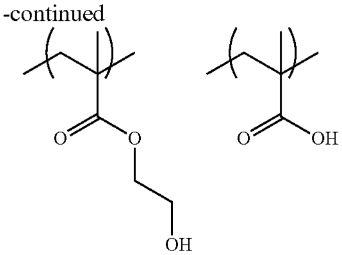

(Synthesis Example of Comparative Colorant 3)

In accordance with the method described in 22000-162429A, a triarylmethane compound (A-tp-101) was synthesized.

A triarylmethane compound (A-tp-101) (15 g), hydroxyethyl methacrylate (10 g), methacrylic acid (5.5 g), and azobisisobutyronitrile (5 g) were added to N-ethylpyrrolidone (70 g), and the mixture was stirred at room temperature for 30 minutes and dissolved (a polymerization solution for dropwise addition).

Separately, a triarylmethane compound (A-tp-101) (15 g), hydroxyethyl methacrylate (10 g), methacrylic acid (5.5 g) were dissolved, and the solution was stirred at 80° C. The polymerization solution for dropwise addition, prepared above, was added dropwise thereto for 3 hours, and the mixture was stirred for 1 hour. Then, azoisobutyronitrile (2.5 g) was added thereto, the mixture was further reacted for 2 hours and the reaction was stopped. After cooling to room temperature, the solvent was removed by distillation to obtain a comparative colorant 3. The weight-average molecular weight (Mw) of the comparative colorant 3 was 18,000, and the acid value from titration using a 0.1 N aqueous sodium hydroxide solution was 1.81 mgKOH/g.

(Synthesis Example of Comparative Colorants 4 to 6)

The comparative colorants 4 to 6 having the structural formulae shown below were synthesized by the method described in paragraphs Nos. 0272 to 0326 of JP2007-277514A.

Comparative colorant 4: the following structure (Synthesis Example C-9 of JP2007-277514A)

In formula, m=1 and n=5

Comparative colorant 5: the following structure (Synthesis Example C-25 of JP2007-277514A)

In formula, m=1 and n=3

Comparative colorant 6: the following structure (Synthesis Example C-4 of JP2007-277514A)

In formula, m=1 and n=5

(Comparative colorant 4)

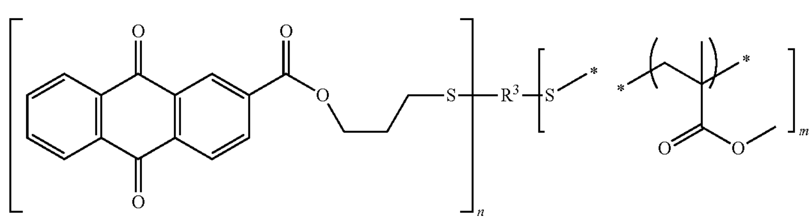

-continued

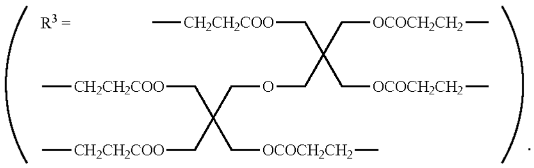

(Comparative colorant 5)

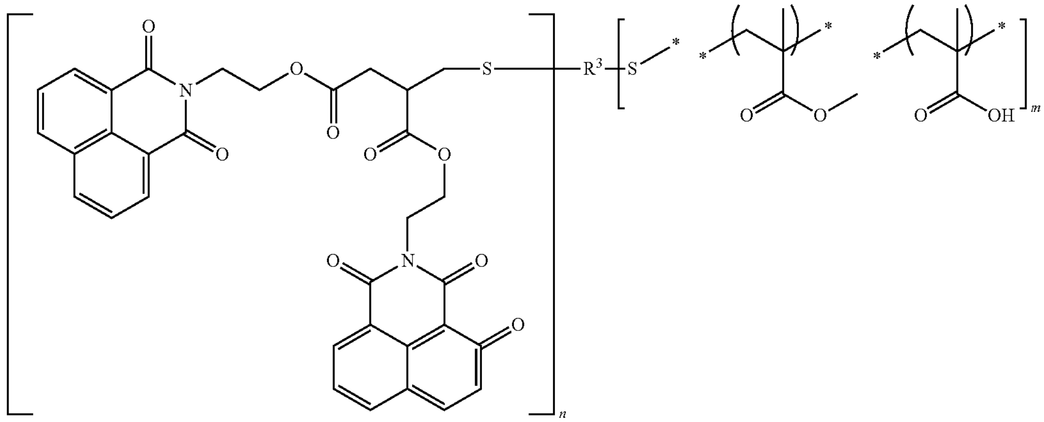

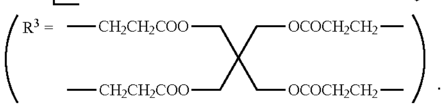

(Comparative colorant 6)

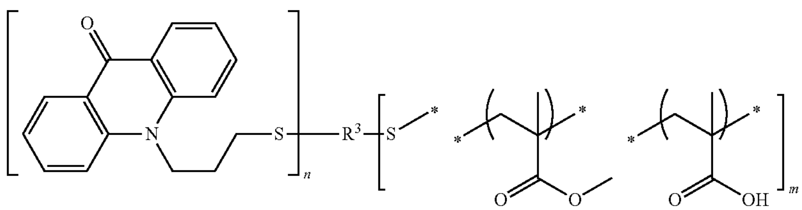

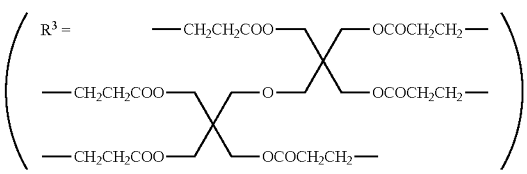

TABLE 3

| Synthesis Example | P moieties Repetition number | Acid value mgKOH/g | GPC Mw | Maximum absorption wavelength | Specific absorbance |
|---|---|---|---|---|---|
| Comparative colorant 4 | 100 | 25 | 32,000 | 400 | 1 |
| Comparative colorant 5 | 100 | 0 | 28,000 | 400 | 3 |
| Comparative colorant 6 | 100 | 50 | 32,000 | 400 | 1 |

Comparative Colorants 7 to 10

In the same manner as in Synthesis Example C-1 except that the chain transfer agent, the amount of the monomers, the amount of V-601, the amount of glycidyl methacrylate (GMA), and the amount of tetrabutylammonium bromide (TBAB) were changed as shown in the following Table 3, comparative colorants 7 to 10 were obtained.

TABLE 4

| Synthesis Example | Mercaptan compound Name | Introduction amount (parts) | m | n | Monomer Component 1 | Component 1 (parts) | Component 2 | Component 2 (parts) | V-601 (parts) | GMA (parts) | TBAB (parts) |
|---|---|---|---|---|---|---|---|---|---|---|---|
| Comparative colorant 7 | B-1 | 5.00 | 1 | 5 | M-4 | 1.59 | O-6 | 2.78 | 0.320 | 0.79 | 0.14 |
| Comparative colorant 8 | B-6 | 5.00 | 2 | 4 | M-4 | 1.61 | O-1 | 4.30 | 0.298 | 0.80 | 0.15 |
| Comparative colorant 9 | B-23 | 5.00 | 1.5 | 2.5 | M-4 | 1.29 | O-6 | 3.91 | 0.373 | 0.43 | 0.08 |
| Comparative colorant 10 | B-28 | 5.00 | 2 | 4 | M-4 | 0.91 | O-3 | 10.98 | 0.801 | 0.90 | 0.16 |

| Synthesis Example | Molar ratio (NMR) Colorant structure | Component 1 | Component 2 | GMA adduct | P moieties Repetition number | Acid value mgKOH/g | GPC Mw | Yield amount (parts) | Maximum absorption wavelength | Specific absorbance |
|---|---|---|---|---|---|---|---|---|---|---|
| Comparative colorant 7 | 5 | 14 | 30 | 6 | 50.0 | 72 | 17500 | 9.1 | 615 | 40 |
| Comparative colorant 8 | 4 | 14 | 26 | 6 | 23.0 | 63 | 19900 | 10.5 | 610 | 28 |
| Comparative colorant 9 | 2.5 | 8 | 26 | 2 | 24.0 | 63 | 11300 | 9.6 | 535 | 28 |
| Comparative colorant 10 | 4 | 4 | 100 | 6 | 55.0 | 13 | 26900 | 16.0 | 535 | 19 |

Example 1

1. Preparation of Resist Liquid

The components having the following composition were mixed and dissolved to prepare a resist solution for an undercoat layer.

Composition of Resist Solution for Undercoat Layer

| | |
|---|---|
| Solvent: propylene glycol monomethyl ether acetate | 19.20 parts |
| Solvent: ethyl lactate | 36.67 parts |
| Alkali-soluble resin: 40% PGMEA solution of a benzyl methacrylate/methacrylic acid/2-hydroxyethyl methacrylate copolymer (molar ratio = 60/22/18, weight-average molecular weight of 15,000, number-average molecular weight of 9,000) | 30.51 parts |
| Compound Containing Ethylenically Unsaturated Double Bond: Dipentaerythritol hexaacrylate | 12.20 parts |
| Polymerization inhibitor: p-methoxyphenol | 0.0061 parts |
| Fluorine-based surfactant: F-475, manufactured by DIC Corporation | 0.83 parts |
| Photopolymerization initiator: trihalomethyl triazine-based photopolymerization initiator (TAZ-107, manufactured by Midori Kagaku Co., Ltd.) | 0.586 parts |

2. Manufacture of Undercoat Layer-Attached Silicon Wafer Substrate

A 6-inch silicon wafer was heated in an oven at 200° C. for 30 minutes. Next, the resist solution was applied onto this silicon wafer such that the dry film thickness became 1.5 μm. Further, the resultant was further heated and dried in an oven at 220° C. for 1 hour to form an undercoat layer, thereby obtaining an undercoat layer-attached silicon wafer substrate.

3. Preparation of Coloring Composition

3-1. Preparation of Blue Pigment Dispersion Liquid (Preparation of Pigment Dispersion Liquid P1 (C. I. Pigment Blue 15:6 Dispersion Liquid))

A pigment dispersion liquid P1 (C. I. Pigment Blue 15:6 dispersion liquid) was prepared in the following manner.

That is, a mixed liquid including 19.4 parts by mass of C. I. Pigment Blue 15:6 (blue pigment; hereinafter also referred to as "PB 15:6") (average primary particle size of 55 nm), 2.95 parts by mass of BY-161 (manufactured by BYK) as a dispersing agent, 2.95 parts by mass in terms of solid contents (9.93 parts by mass of a solution) of an alkali-soluble resin J1 (a copolymer of benzyl methacrylate/methacrylic acid, a 30% PGMEA solution), and 165.3 parts by mass of PGMEA was mixed and dispersed for 3 hours by a beads mill (zirconia beads having a diameter of 0.3 mm). Thereafter, the pigment dispersion liquid was further subjected to a dispersion treatment under a pressure of 2,000 $kg/cm^3$ and at a flow rate of 500 g/min, by using a high-pressure dispersing machine equipped with a depressurizing mechanism, NANO-3000-10 (manufactured by Nihon B. E. E Co., Ltd.). This dispersion treatment was repeated 10 times to obtain a C. I. Pigment Blue 15:6 dispersion as a pigment dispersion liquid. For the obtained C. I. Pigment Blue 15:6 dispersion liquid, the average primary particle diameter of the pigment was measured using a dynamic light scattering method (MICROTRAC NANOTRAC UPA-EX150 (manufactured by Nikkiso Co., Ltd.), and as a result, found to be 24 nm.

Alkali-Soluble Resin J1

(J1)

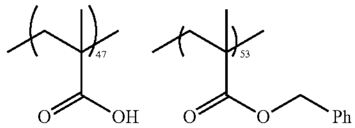

Mw: 11,000

(Preparation of Pigment Dispersion Liquid P2 (C. I. Pigment Blue 15:6 Dispersion Liquid))

By the same procedure as in the preparation of the pigment dispersion liquid P1 except that the following dispersing agent D1 was used as a pigment dispersing agent, a pigment dispersion liquid P2 was prepared.

Mw=20,000, x/y=15/85 (mass ratio), n=20, and acid value=100 mgKOH/g 3-2. Preparation of Coloring Composition The following respective components were mixed, dispersed, and dissolved to obtain coloring compositions.

- Organic solvent (cyclohexanone): 17.12 parts
- Alkali-soluble resin 1 (J1 below): 1.23 parts (a solid content of 0.37 parts and a solid content concentration of 30%)
- Alkali-soluble resin 2 (ACRYCURE RD-F8 (manufactured by Nippon Shokubai Co., Ltd.)): 0.23 parts
- Photopolymerization initiator I-2 (IRGACURE OXE-02): 0.975 parts
- Solution of a colorant in cyclohexanone (a solid content concentration of 12.3%): 24.57 parts

D1

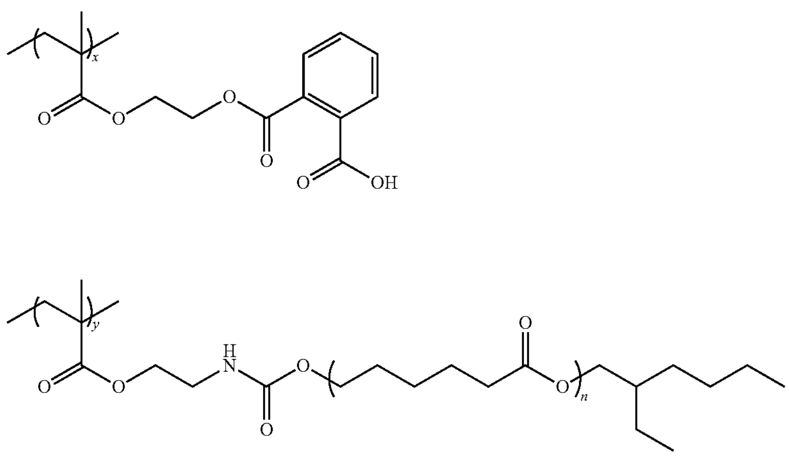

Mw=20,000, x/y=50/50 (mass ratio), n=20, and acid value=100 mgKOH/g (Preparation of Pigment Dispersion Liquid P3 (C. I. Pigment Blue 15:6 Dispersion Liquid))

By the same procedure as in the preparation of the pigment dispersion liquid P1, except that the following dispersing agent D2 was used instead of as a pigment dispersing agent, a pigment dispersion liquid P3 was prepared.

- Pigment dispersion liquid P1 (C. I. Pigment Blue 15:6 dispersion liquid, PGMEA solution, a solid content concentration of 12.8%): 51.40 parts
- Polymerizable compound Z-1 (dipentaerythritol hexaacrylate, NKester A-DPH-12E (manufactured by Shin-Nakamura Chemical Co., Ltd.)): 1.96 parts
- Polymerization inhibitor (p-methoxyphenol): 0.0007 parts

D2

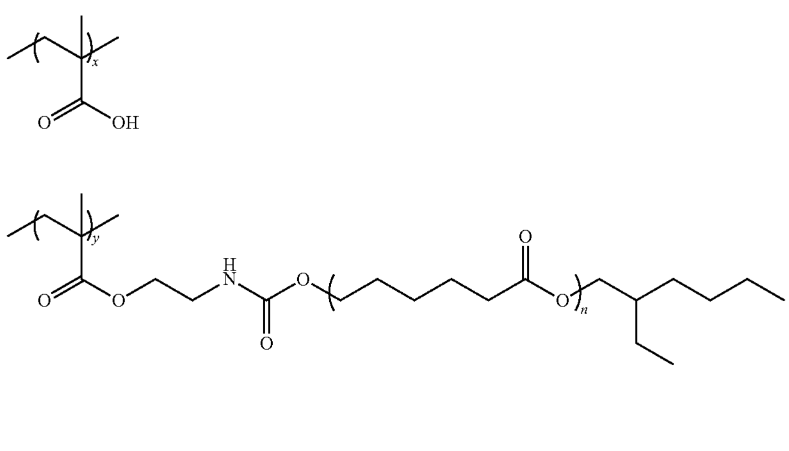

Fluorine-based surfactant (MEGAFACE F475 manufactured by DIC Corporation, a 1% PGMEA solution): 2.50 parts Alkali-soluble resin J1

(J1)

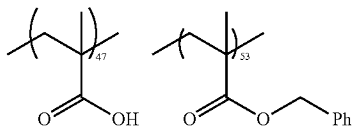

Mw: 11,000

4. Manufacture of Color Filter (Colored Pattern)

4-1: Manufacture of Color Filter Using Coloring Composition by Photolithography

The coloring composition 1 that had been prepared above was applied onto the undercoat layer of the undercoat layer-attached silicon wafer that had been manufactured above, thereby forming a colored layer (coating film). Then, a heating treatment (prebaking) was carried out for 120 seconds, using a hot plate at 100° C. such that the dry film thickness of the coating film became 1 μm.

Next, by using an i-ray stepper exposure device FPA-3000i5+ (manufactured by CANON Inc.), the wafer was exposed at a wavelength of 365 nm through an island pattern mask having a 1.0 μm×1.0 μm pattern, at an exposure dose ranging from 50 to 1,200 mJ/cm$^2$.

Subsequently, the silicon wafer substrate having the coating film irradiated with light formed thereon was loaded onto a horizontal spin table of a spin shower developing machine (Model DW-30, manufactured by Chemitronics Co., Ltd.), and subjected to puddle development at 23° C. for 60 seconds by using CD-2000 (manufactured by FUJIFILM Electronic Materials CO., LTD.), thereby forming a colored pattern on the undercoat layer of the undercoat layer-attached silicon wafer substrate.

The silicon wafer having the colored pattern formed thereon was fixed onto the horizontal spin table by a vacuum chuck method, and the silicon wafer substrate was rotated at a rotation frequency of 50 rpm by using a rotation device. In this state, from the position above the rotation center, pure water was supplied onto the wafer from a spray nozzle in the form of a shower so as to carry out a rinsing treatment, and then the wafer was spray-dried. Further, the wafer was post-baked on a hot plate at 200° C. for 300 seconds, thereby obtaining a colored pattern (color filter) having a film thickness of 1 μm on the silicon wafer.

In the manner described above, a pattern forming silicon wafer configured to have a colored pattern (color filter) provided on the undercoat layer of the undercoat layer-attached silicon wafer was obtained.

Thereafter, the size of the colored pattern was measured using a critical dimension SEM "S-9260A" (manufactured by Hitachi High-Technologies Corporation).

Evaluation of the development residues was carried out using a colored pattern with an exposure dose at which the pattern size became 1.0 μm.

<<Evaluation of Development Residues>>

Areas (unexposed areas) other than the region on which the colored pattern had been formed in the silicon wafer were observed using a scanning electron microscope at a magnification of 30,000, and evaluated according to the following evaluation standard.

A: No residue was found in areas (unexposed areas) other than the region on which the colored pattern has been formed.

B: Some residues were found in areas (unexposed areas) other than the region on which the colored pattern has been formed, but it was at a level such that there was no problem in practical use.

C: Residues were found in areas (unexposed areas) other than the region on which the colored pattern has been formed. By changing the development conditions from puddle development at 23° C. for 60 seconds to puddle development at 23° C. for 180 seconds, it was at a level such that there was no problem in practical use.

D: Residues were remarkably found in areas (unexposed areas) other than the region on which the colored pattern has been formed.

<<Evaluation of Color Transfer Properties>>

The absorbance of the colored pattern in each of the color filters was measured by MCPD-3000 (manufactured by Otsuka Electronics Co., Ltd.) (Absorbance A).

A CT-2000L solution (a transparent undercoating agent manufactured by FUJIFILM Electronics Materials Co., Ltd.) was applied onto the surface, on which the colored pattern of the color filter had been formed, such that the dried film thickness became 1 μm, and dried to form a transparent film, and the film was subjected to a heating treatment at 280° C. for 5 minutes.

After the completion of heating, the absorbance of the transparent film adjacent to the colored pattern was measured by MCPD-3000 (manufactured by Otsuka Electronics Co., Ltd.) (Absorbance B).

The ratio [%] of the absorbance A value of the colored pattern which had been measured before heating to the absorbance B value of the obtained transparent film was calculated [the following (Equation A)] The ratio was used as an index for evaluating the color transfer to adjacent pixels.

$$\text{Color transfer (\%)} = (\text{Absorbance } B / \text{Absorbance } A) \times 100 \quad \text{(Equation A)}$$

A: Less than 1%

B: 1% or more and less than 3%

C: 3% or more and less than 10%

D: 10% or more

<<Evaluation of Light Fastness>>

A coating film was formed by coating the colored photosensitive composition which has been prepared above on a glass substrate using a spin coater (manufactured by Mikasa Co., Ltd.). Further, the coating film was subjected to a heating treatment (prebaking) for 120 seconds using a hot plate at 100° C. such that the dry film thickness of the coating film was 0.6 μm. Subsequently, the coating film was cured by heating at 200° C. for 5 minutes, thereby forming a colored layer.

A light fastness test was carried out on the glass substrate on which the colored layer had been formed for 10 hours using a light fastness test apparatus (SX-75 manufactured by Suga Test instruments Co., Ltd.) under the conditions of a black panel temperature of 63° C., a quartz inner filter, a 275 nm cut outer filter, an illumination of 75 mw/m$^2$ (300 to 400 nm), and a humidity of 50%.

The color difference (ΔE*ab) before and after the light fastness test was measured using a spectrophotometer MCPD-3000 (manufactured by Otsuka Electronics Co., Ltd.). Based on the measured color difference (ΔE*ab), the light fastness was evaluated according to the following evaluation standard. As the numerical value is smaller, the light fastness is better. The evaluation results are shown in the following table. A and B are levels at which there is no problem in practical use.

<Evaluation Standard>

A: ΔE*ab is 3 or less

B: ΔE*ab is more than 3 and 5 or less

C: ΔE*ab is more than 5 and 10 or less

D: ΔE*ab is more than 10

<<Evaluation of Flatness>>

A coating film was formed by coating 1.0 mL of the colored photosensitive composition which has been prepared above on a 100 mm (4 inch) silicon wafer using a spin coater (manufactured by Mikasa Co., Ltd.). Further, the coating film was subjected to a heating treatment (prebaking) for 120 seconds using a hotplate at 100° C. such that the dry film thickness of the core of the coating film was 0.60 μm, thereby forming a colored layer.

The film thickness of the colored layer was measured using an optical film thickness meter (F20 manufactured by Filmetrics, Inc.). A smaller difference between the thinnest portion (central portion) and the thickest portion (peripheral portion) in the film thickness can be said to be good. The evaluation results are shown in the following table. A and B are levels at which there is no problem in practical use.

<Evaluation Standard>

A: The difference in film thickness is 0.02 μm or less.

B: The difference in film thickness is from 0.02 μm to 0.05 μm.

C: The difference in film thickness is more than 0.05 μm.

Examples 2 to 37 and Comparative Examples 1 to 10

In the same manner as in Example 1 except that the pigment dispersion liquid P1, the colorant C-1, the photopolymerization initiator I-2, the alkali-soluble resin 1, and the polymerizable compound A-DPH-12E (Z-1) were changed as in the following table in "3-2. Preparation of Coloring Composition" in Example 1, coloring compositions were prepared, and the development residues, the color migration properties, the light fastness, and the flatness were evaluated in the same manner as in Example 1.

TABLE 5

| | Colorant | | | | | | |
|---|---|---|---|---|---|---|---|
| | Number | P moieties Repetition number | Acid value mgKOH/g | GPC Mw | Pigment dispersion liquid | Photopolymerization initiator | Alkali-soluble resin 1 |
| Example 1 | C-1 | 12.0 | 46 | 11,600 | P1 | I2 | J1 |
| Example 2 | C-2 | 5.0 | 46 | 9,600 | P1 | I2 | J2 |
| Example 3 | C-3 | 2.7 | 47 | 7,600 | P1 | I1 | J1/J2 (mass ratio 1/1) |
| Example 4 | C-4 | 2.1 | 48 | 6,500 | P1 | I2 | J1 |
| Example 5 | C-5 | 8.5 | 40 | 11,100 | P2 | I2 | J1 |
| Example 6 | C-6 | 6.0 | 30 | 11,800 | P1 | I2 | J1 |
| Example 7 | C-7 | 6.0 | 90 | 9,900 | P1 | I7 | J3 |
| Example 8 | C-8 | 4.0 | 36 | 10,000 | P1 | I1/I2 (mass ratio 1/1) | J1 |
| Example 9 | C-9 | 2.5 | 21 | 8,500 | P1 | I2 | J1 |
| Example 10 | C-10 | 12.0 | 65 | 8,200 | P3 | I5 | J1 |
| Example 11 | C-11 | 16.0 | 53 | 10,100 | P1 | I2 | J1 |
| Example 12 | C-12 | 4.0 | 37 | 4,800 | P1 | I2 | J1 |
| Example 13 | C-13 | 4.0 | 42 | 10,700 | P1/P3 (mass ratio 1/1) | I2 | J2 |
| Example 14 | C-14 | 5.0 | 36 | 9,800 | P1 | I2 | J1 |
| Example 15 | C-15 | 5.0 | 41 | 8,600 | P1 | I5 | J1 |
| Example 16 | C-16 | 6.0 | 58 | 9,200 | P2 | I2 | J3 |
| Example 17 | C-17 | 4.0 | 32 | 5,500 | P1 | I2 | J2 |
| Example 18 | C-18 | 5.0 | 43 | 8,400 | P1 | I1 | J1 |
| Example 19 | C-19 | 9.0 | 50 | 10,800 | P1 | I2 | J1 |
| Example 20 | C-20 | 12.0 | 41 | 12,000 | P1 | I2 | J1 |
| Example 21 | C-21 | 4.0 | 44 | 10,100 | P1 | I2 | J1 |
| Example 22 | C-22 | 8.0 | 104 | 12,000 | P2/P3 (mass ratio 1/1) | I2 | J1 |
| Example 23 | C-23 | 2.7 | 28 | 6,300 | P1 | I7 | J3 |
| Example 24 | C-24 | 3.0 | 17 | 10,700 | P1 | I2 | J1 |
| Example 25 | C-25 | 5.0 | 39 | 11,400 | P3 | I2 | J1 |
| Example 26 | C-26 | 8.0 | 47 | 11,500 | P1 | I2 | J1 |
| Example 27 | C-27 | 2.5 | 34 | 10,500 | P1 | I2/I3 (mass ratio 1/1) | J1/J3 (mass ratio 1/1) |
| Example 28 | C-28 | 8.0 | 48 | 11,200 | P1 | I2 | J1 |
| Example 29 | C-29 | 3.0 | 41 | 8,600 | P1 | I2 | J2 |
| Example 30 | C-30 | 6.0 | 47 | 11,400 | P1 | I2 | J1 |
| Example 31 | C-31 | 6.0 | 51 | 10,400 | P1 | I2 | J1 |
| Example 32 | C-32 | 6.0 | 50 | 10,700 | P1 | I2 | J1 |
| Example 33 | C-27/C-4 (mass ratio 1/1) | 2.5<br>2.1 | 34<br>48 | 10,500<br>6,500 | P1 | I2 | J1 |
| Example 34 | C-27 | 2.5 | 34 | 10,500 | P1 | I3 | J1 |
| Example 35 | C-27 | 2.5 | 34 | 10,500 | P1 | I4 | J1 |
| Example 36 | C-27 | 2.5 | 34 | 10,500 | P1 | I6/I8 (mass ratio 1/1) | J1 |

TABLE 5-continued

| | | | | | | | |
|---|---|---|---|---|---|---|---|
| Example 37 | C-27 | 2.5 | 34 | 10,500 | P1 | I8 | J1 |
| Comparative Example 1 | Comparative colorant 1 | | | | P1 | I2 | J1 |
| Comparative Example 2 | Comparative colorant 2 | | | | P1 | I2 | J1 |
| Comparative Example 3 | Comparative colorant 3 | | 1.8 | 18,000 | P1 | I2 | J1 |
| Comparative Example 4 | Comparative colorant 4 | 100 | 25 | 32,000 | P1 | I2 | J1 |
| Comparative Example 5 | Comparative colorant 5 | 100 | 0 | 28,000 | P1 | I2 | J1 |
| Comparative Example 6 | Comparative colorant 6 | 100 | 50 | 32,000 | P1 | I2 | J1 |
| Comparative Example 7 | Comparative colorant 7 | 50 | 72 | 17,500 | P1 | I2 | J1 |
| Comparative Example 8 | Comparative colorant 8 | 23 | 63 | 19,900 | P1 | I2 | J1 |
| Comparative Example 9 | Comparative colorant 9 | 24 | 63 | 11,300 | P1 | I2 | J1 |
| Comparative Example 10 | Comparative colorant 10 | 55 | 13 | 26,900 | P1 | I2 | J1 |

| | | Evaluation of performance | | | |
|---|---|---|---|---|---|
| | Polymerizable compound | Developmentresidue | Color migration | Light fastness | Flatness |
| Example 1 | Z1 | B | A | A | B |
| Example 2 | Z1 | A | A | A | A |
| Example 3 | Z1 | A | A | A | A |
| Example 4 | Z3 | A | A | A | A |
| Example 5 | Z1 | B | A | A | A |
| Example 6 | Z1 | B | A | A | A |
| Example 7 | Z1 | A | A | A | A |
| Example 8 | Z5 | A | A | A | A |
| Example 9 | Z1 | A | A | A | A |
| Example 10 | Z1 | A | A | A | B |
| Example 11 | Z1 | A | A | A | B |
| Example 12 | Z1 | A | B | A | A |
| Example 13 | Z2 | A | A | A | A |
| Example 14 | Z1 | A | A | A | A |
| Example 15 | Z7 | A | A | A | A |
| Example 16 | Z1 | A | A | A | A |
| Example 17 | Z3 | A | A | A | A |
| Example 18 | Z1/Z6 (mass ratio 1/1) | A | A | A | A |
| Example 19 | Z4 | A | A | A | A |
| Example 20 | Z1 | B | A | A | B |
| Example 21 | Z1/Z2 (mass ratio 1/1) | A | A | A | A |
| Example 22 | Z1 | B | A | A | A |
| Example 23 | Z1 | A | A | A | A |
| Example 24 | Z1 | B | A | A | A |
| Example 25 | Z1 | B | A | A | A |
| Example 26 | Z1 | B | A | A | A |
| Example 27 | Z6 | A | A | A | A |
| Example 28 | Z1 | B | A | A | A |
| Example 29 | Z4 | A | A | A | A |
| Example 30 | Z1 | B | A | A | A |
| Example 31 | Z1 | A | A | A | A |
| Example 32 | Z1 | A | A | A | A |
| Example 33 | Z4/Z7 (mass ratio 1/1) | A | A | A | A |
| Example 34 | Z1 | A | B | A | A |
| Example 35 | Z1 | A | B | A | A |
| Example 36 | Z1 | A | B | A | A |
| Example 37 | Z1 | A | B | A | A |
| Comparative Example 1 | Z1 | B | D | A | A |
| Comparative Example 2 | Z1 | B | D | A | A |
| Comparative Example 3 | Z1 | D | A | A | C |
| Comparative Example 4 | Z1 | A | A | C | C |
| Comparative Example 5 | Z1 | A | A | C | C |
| Comparative Example 6 | Z1 | A | A | C | C |

TABLE 5-continued

| | | | | | |
|---|---|---|---|---|---|
| Comparative Example 7 | Z1 | C | A | A | C |
| Comparative Example 8 | Z1 | C | A | A | C |
| Comparative Example 9 | Z1 | B | A | A | C |
| Comparative Example 10 | Z1 | C | A | A | C |

As seen from the above results, the coloring compositions of Examples 1 to 37, including the colorants of the present invention, were excellent in color migration properties, light fastness, and flatness. In addition, there were very few development residues, and the developability was excellent.

In contrast, in Comparative Examples 1 to 10, at least one of the above properties was deteriorated.

Example 38

The components having the following composition were mixed, dispersed, and dissolved to obtain a coloring composition. A color filter was manufactured by the same manner as in Example 1 by using the obtained coloring composition, and the development residues, the color migration properties, the light fastness, and the flatness were evaluated.

Organic solvent (cyclohexanone): 14.69 parts

Alkali-soluble resin 1 (J1): 0.29 parts (a solid content of 0.09 parts, a solid content concentration of 30%)

Alkali-soluble resin 2 (ACRYCURE RD-F8 (manufactured by Nippon Shokubai Co., Ltd.)): 0.05 parts Photopolymerization initiator I-7 (IRGACURE OXE-02): 0.78 parts Solution of a colorant C-1 in cyclohexanone (a solid content concentration of 12.3%): 28.45 parts Pigment dispersion liquid P1 (C. I. Pigment Blue 15:6 dispersion liquid, PGMEA solution, a solid content concentration of 12.8%): 51.23 parts Polymerizable compound Z-3 ethoxylated (4) pentaerythritol tetraacrylate, SR494 (manufactured by Sartomer Company Inc. Company Inc.): 1.61 parts Epoxy compound E-1 (EHPE 3150, manufactured by Daicel Chemical Industries, Ltd.): 0.39 parts Polymerization inhibitor (p-methoxyphenol): 0.0007 parts Fluorine-based surfactant (manufactured by DIC Corporation F475, a 1% PGMEA solution): 2.50 parts

Example 39 to 50

In the same manner as in Example 38 except that the colorant C-1, the photopolymerization initiator I-7, the alkali-soluble resin 1, the polymerizable compound (Z-3), and the epoxy compound E-1 were changed as in the following table in the preparation of a coloring composition in Example 38, coloring compositions were prepared, and the development residues, the color migration properties, the light fastness, and the flatness were evaluated in the same manner as in Example 38.

TABLE 6

| | Colorant | | | | | | |
|---|---|---|---|---|---|---|---|
| | Number | P moieties Repetition number | Acid value mgKOH/g | GPC Mw | Photopolymerization initiator | Alkali-soluble resin 1 | Polymerizable compound |
| Example 38 | C-1 | 12.0 | 46 | 11,600 | I7 | J1 | Z3 |
| Example 39 | C-6 | 6.0 | 30 | 11,800 | I2 | J1 | Z4/Z6 (mass ratio 1/1) |
| Example 40 | C-9 | 2.5 | 21 | 8,500 | I7 | J1 | Z1 |
| Example 41 | C-10 | 12.0 | 65 | 8,200 | I7 | J1 | Z1 |
| Example 42 | C-15 | 5.0 | 41 | 8,600 | I5 | J1 | Z7 |
| Example 43 | C-17 | 4.0 | 32 | 5,500 | I7 | J2 | Z5 |
| Example 44 | C-20 | 12.0 | 41 | 12,000 | I7 | J1 | Z1 |
| Example 45 | C-21 | 4.0 | 44 | 10,100 | I7 | J1 | Z3/Z4 (mass ratio 7/3) |
| Example 46 | C-27 | 2.5 | 34 | 10,500 | I7 | J1 | Z6 |
| Example 47 | C-30 | 6.0 | 47 | 11,400 | I7 | J1 | Z1 |
| Example 48 | C-1/C-21 (mass ration 1/1) | 12.0<br>4.0 | 46<br>44 | 11,600<br>10,100 | I7/I1 (mass ratio 7/3) | J1 | Z3 |
| Example 49 | C-27 | 2.5 | 34 | 10,500 | I5/I4 (mass ratio 7/3) | J1/J3 (mass ratio 1/1) | Z6 |
| Example 50 | C-30 | 6.0 | 47 | 11,400 | I7 | J1 | Z1 |

TABLE 6-continued

| | Epoxy compound | Evaluation of performance | | | |
|---|---|---|---|---|---|
| | | Development residue | Color migration | Light fastness | Flatness |
| Example 38 | E1 | B | A | A | B |
| Example 39 | E3 | B | A | A | A |
| Example 40 | E2/E4 (mass ratio 1/1) | A | A | A | A |
| Example 41 | E1 | A | A | A | B |
| Example 42 | E2 | A | A | A | A |
| Example 43 | E1/E3 (mass ratio 1/1) | A | A | A | A |
| Example 44 | E1 | B | A | A | B |
| Example 45 | E4 | A | A | A | A |
| Example 46 | E2 | A | A | A | A |
| Example 47 | E1 | B | A | A | A |
| Example 48 | E4 | A | A | A | A |
| Example 49 | E2 | A | A | A | A |
| Example 50 | E1 | B | A | A | A |

As seen from the above results, the coloring compositions of Examples 39 to 50, including the colorants of the present invention, were excellent in color migration properties, light fastness, and flatness. In addition, there were very few development residues, and the developability was excellent.

Examples 51 to 71

In the same manner as in Example 38 except that the colorant C-1, the pigment dispersion liquid P-1, the photopolymerization initiator I-7, the alkali-soluble resin 1, the polymerizable compound (Z-3), and the epoxy compound E-1 were changed as in the following table in the preparation of a coloring composition in Example 38, coloring compositions were prepared, and the development residues, the color migration properties, the light fastness, and the flatness were evaluated in the same manner as in Example 38.

TABLE 7

| | Colorant | | | | Pigment | | | | | Evaluation of performance | | | |
|---|---|---|---|---|---|---|---|---|---|---|---|---|---|
| | Number | P moieties Repetition number | Acid value mgKOH/g | GPC Mw | dispersion liquid | Photopolymerization initiator | Alkali-soluble resin 1 | Polymerizable compound | Epoxy compound | Development residue | Color migration | Light fastness | Flatness |
| Example 51 | C-33 | 12.0 | 102 | 12,300 | P1 | I7 | J1 | Z3 | E1 | B | A | A | B |
| Example 52 | C-34 | 4.0 | 38 | 9,300 | P2 | I2 | J1 | Z4/Z6 (mass ratio 1/1) | E3 | A | A | A | A |
| Example 53 | C-35 | 5.0 | 56 | 9,600 | P3 | I7 | J1 | Z1 | E2 | A | A | A | A |
| Example 54 | C-36 | 4.0 | 39 | 11,500 | P1 | I7 | J1 | Z1 | E1 | B | A | A | A |
| Example 55 | C-37 | 8.0 | 44 | 12,300 | P1 | I5 | J1 | Z7 | E2 | B | A | A | A |
| Example 56 | C-38 | 2.5 | 68 | 5,200 | P4 | I7 | J2 | Z5 | E1/E3 (mass ratio 1/1) | A | A | B | A |
| Example 57 | C-39 | 8.0 | 69 | 7,700 | P5 | I7 | J1 | Z1 | E1 | A | A | B | A |
| Example 58 | C-40 | 4.0 | 63 | 5,700 | P1 | I5/I4 (mass ratio 7/3) | J1 | Z3/Z4 (mass ratio 1/1) | E4 | A | A | B | A |
| Example 59 | C-41 | 6.0 | 49 | 11,000 | P6 | I7 | J1 | Z6 | E2/E4 (mass ratio 7/3) | B | A | B | A |
| Example 60 | C-42 | 8.0 | 47 | 11,500 | P5 | I7 | J1 | Z1 | E1 | B | A | B | A |
| Example 61 | C-43 | 6.0 | 64 | 8,300 | P5 | I7/I1 (mass ratio 7/3) | J1 | Z3 | E4 | A | A | B | A |
| Example 62 | C-44 | 6.0 | 59 | 9,000 | P5 | I7 | J1/J3 (mass ratio 1/1) | Z6 | E2 | A | A | B | A |
| Example 63 | C-45 | 12.0 | 105 | 10,200 | P1 | I7 | J1 | Z1 | E1 | A | C | A | B |
| Example 64 | C-46 | 4.0 | 61 | 8,700 | P1 | I7 | J2 | Z5 | E1/E3 (mass ratio 1/1) | A | C | A | A |
| Example 65 | C-47 | 6.0 | 154 | 6,900 | P5 | I7 | J1 | Z1 | E1 | A | C | B | A |
| Example 66 | C-48 | 7.0 | 69 | 10,400 | P1 | I7 | J1 | Z3/Z4 (mass ratio 7/3) | E4 | A | A | A | A |
| Example 67 | C-49 | 5.6 | 54 | 10,000 | P1 | I7 | J1 | Z3 | E1 | A | A | A | A |
| Example 68 | C-50 | 7.0 | 62 | 8,700 | P5 | I7 | J1 | Z1 | E2 | A | A | B | A |
| Example 69 | C-51 | 5.6 | 0 | 10,100 | P1 | I7/I1 (mass ratio 7/3) | J1 | Z3 | E4 | C | A | A | A |
| Example 70 | C-49/C-38 (mass ratio 7/3) | 5.6<br>2.5 | 54<br>68 | 10,000<br>5,200 | P1 | I5/I4 (mass ratio 7/3) | J1/J3 (mass ratio 1/1) | Z6 | E2 | A | A | A | A |
| Example 71 | C-41/C-43 (mass ratio 7/3) | 6.0<br>6.0 | 49<br>64 | 11,000<br>8,300 | P5 | I7 | J1 | Z1 | E1 | A | A | B | A |

As seen from the above results, the coloring compositions of Examples 51 to 71, including the colorants of the present invention, were excellent in color migration properties, light fastness, and flatness.

Example 72

The following respective components were mixed and dissolved to obtain a coloring composition. A color filter was manufactured by the same manner as in Example 1 by using the obtained coloring composition, and the development residues, the color migration properties, the light fastness, and the flatness were evaluated.

- Organic solvent (cyclohexanone): 14.69 parts
- Alkali-soluble resin 1 (J1): 0.29 parts (a solid content of 0.09 parts, a solid content concentration of 30%)
- Alkali-soluble resin 2 (ACRYCURE RD-F8 (manufactured by Nippon Shokubai Co., Ltd.)): 0.05 parts
- Photopolymerization initiator I-7 (IRGACURE OXE-02): 0.78 parts
- Solution of a colorant C-1 in cyclohexanone (a solid content concentration of 12.3%): 28.45 parts
- Solution of a colorant C-43 in cyclohexanone (a solid content concentration of 12.8%): 51.23 parts
- Polymerizable compound Z-3 ethoxylated (4) pentaerythritol tetraacrylate, SR494 (manufactured by Sartomer Company Inc.): 1.61 parts
- Epoxy compound E-1 (EHPE 3150, manufactured by Daicel Chemical Industries, Ltd.): 0.39 parts
- Polymerization inhibitor (p-methoxyphenol): 0.0007 parts
- Fluorine-based surfactant (manufactured by DIC Corporation F475, a 1% PGMEA solution): 2.50 parts

Example 73 to 77

In the same manner as in Example 72 except that the colorant C-1, the colorant C-43, the photopolymerization initiator I-7, the alkali-soluble resin 1, the polymerizable compound, and the epoxy compound were changed as in the following table in the preparation of a coloring composition in Example 72, coloring compositions were prepared, and the development residues, the color migration properties, the light fastness, and the flatness were evaluated in the same manner as in Example 72.

As seen from the above results, the coloring compositions of Examples 72 to 77, including the colorants of the present invention, were excellent in color migration properties, light fastness, and flatness.

Preparation of Coloring Composition for Dry Etching

Example 78

The following respective components were mixed and dissolved to obtain a coloring composition.

- Organic solvent (cyclohexanone): 17.12 parts
- Epoxy compound E-5: JER1031S (manufactured by Mitsubishi Chemical Corporation, epoxy equivalents: 180 to 220 (g/eq.)): 4.395 parts
- Solution of a colorant C-1 in cyclohexanone (a solid content concentration of 12.3%): 24.57 parts
- Pigment dispersion liquid P1 (C. I. Pigment Blue 15:6 dispersion liquid, PGMEA solution, a solid content concentration of 12.8%): 51.40 parts
- Polymerization inhibitor (p-methoxyphenol): 0.0007 parts
- Fluorine-based surfactant (manufactured by DIC Corporation F475, a 1% PGMEA solution): 2.50 parts The coloring composition for dry etching obtained above was coated onto a glass substrate in 7.5 cm×7.5 cm using a spin coater to provide a coating film having a film thickness of 0.5 μm. Then, the resultant was heated using a hot plate at 200° C. for 5 minutes, and the coating film was cured to manufacture a colored layer. The film thickness of this colored layer was 0.5 μm.

Next, a positive type photoresist "FHi622BC" (manufactured by FUJIFILM Electronic Materials Co., Ltd.) was coated thereonto and subjected to a prebaking treatment at 90° C. for 1 minute to form a photoresist layer having a film thickness of 0.8 μm.

Subsequently, the photoresist layer was patternwise exposed at an exposure dose of 350 mJ/cm$^2$ using an i-ray stepper (manufactured by Canon Inc.), and then subjected to a heating treatment for 1 minute at the temperature of the photoresist layer or an atmospheric temperature reaching 90° C. Thereafter, the resultant was subjected to a developing treatment with a developing solution "FHD-5" (manu-

TABLE 8

| | Colorant | | | | | | | | Evaluation of performance | | | |
|---|---|---|---|---|---|---|---|---|---|---|---|---|
| | Number | P moieties Repetition number | Acid value mgKOH/g | GPC Mw | Photopolymerization initiator | Alkali-soluble resin 1 | Polymerizable compound | Epoxy compound | Development residue | Color migration | Light fastness | Flatness |
| Example 72 | C-1<br>C-43 | 12<br>6 | 46<br>64 | 11,600<br>8,300 | I7 | J1 | Z3 | E1 | B | A | B | B |
| Example 73 | C-27<br>C-41 | 2.5<br>6 | 34<br>49 | 10,500<br>11,000 | I7 | J1 | Z6 | E2/E4 (mass ratio 1/1) | B | A | B | A |
| Example 74 | C-39<br>C-48 | 8<br>7 | 69<br>69 | 7,700<br>10,000 | I7 | J2 | Z1 | E1 | A | A | B | A |
| Example 75 | C-38<br>C-40 | 2.5<br>4 | 68<br>63 | 5,200<br>5,700 | I4 | J1 | Z4/Z6 (mass ratio 1/1) | E4 | A | A | B | A |
| Example 76 | C-1<br>C-43 | 12<br>6 | 46<br>64 | 11,600<br>8,300 | I7 | J1 | Z3 | E1 | B | A | B | B |
| Example 77 | C-8<br>C-48 | 4<br>7 | 36<br>69 | 10,000<br>10,000 | I7 | J2 | Z1 | E1 | A | A | A | A |

factured by FUJIFILM Electronic Materials Co., Ltd.) for 1 minute, and then subjected to a postbaking treatment at 110° C. for 1 minute to form a resist pattern. This resist pattern is formed with one side of 1.0 μm, taking consideration an etching conversion difference (reduction in the pattern width by etching).

Next, the obtained glass substrate was attached to a 200 mm (8 inch) silicon wafer, and subjected to a first-stage etching treatment for 80 seconds at an RF power of 800 W, an antenna bias of 400 W, a wafer bias of 200 W, an internal pressure of a chamber of 4.0 Pa, a substrate temperature of 50° C., and gas types and flow rates of a mixed gas: $CF_4$: 80 mL/min., $O_2$: 40 mL/min., and Ar: 800 mL/min in a dry etching device (U-621, manufactured by Hitachi High-Technologies Corporation).

Subsequently, in the same etching chamber, the glass substrate was subjected to a second-stage etching treatment and an over-etching treatment for 28 seconds at an RF power of 600 W, an antenna bias of 100 W, a wafer bias of 250 W, an internal pressure of a chamber of 2.0 Pa, a substrate temperature of 50° C., and gas types and flow rates of a mixed gas: $N_2$: 500 mL/min., $O_2$: 50 mL/min., and Ar: 500 mL/min. ($N_2/O_2/Ar$=10/1/10), with an over-etching rate in the same etching chamber.

After carrying out the dry etching under the conditions, a stripping treatment was carried out using a photoresist stripping solution "MS230C" (manufactured by FUJIFILM Electronic Materials Co., Ltd.) at 50° C. for 120 seconds to remove the resist, thereby forming a blue colored pattern. Furthermore, washing with pure water and spin drying were carried out, and then a dehydration baking treatment was carried out at 100° C. for 2 minutes. Thus, a color filter was obtained.

By the same method as in Example 1, the development residues, the color migration properties, the light fastness, and the flatness were evaluated.

Examples 79 to 91 and Comparative Examples 11 to 19

In the same manner as in Example 78 except that the colorant C-1, the epoxy compound E-5, and the pigment dispersion liquid P1 were changed as in the following table in Preparation of Coloring Composition in Example 78, coloring compositions were prepared, and the development residues, the color migration properties, the light fastness, and the flatness were evaluated in the same manner as in Example 78.

TABLE 9

| | Colorant | P moieties | | | | Pigment | Performance evaluation | | | |
|---|---|---|---|---|---|---|---|---|---|---|
| | Number | Repetition number | Acid Value mgKOH/g | GPC Mw | Epoxy compound | dispersion liquid | Development residue | Color migration | Light fastness | Flatness |
| Example 78 | C-1 | 12.0 | 46 | 11,600 | E-5 | P1 | B | A | A | B |
| Example 79 | C-9 | 2.5 | 21 | 8,500 | E-3 | P3 | A | A | A | A |
| Example 80 | C-21 | 4.0 | 44 | 10,100 | E-1 | P1 | A | A | A | A |
| Example 81 | C-30 | 6.0 | 47 | 11,400 | E-2 | P3 | B | A | A | A |
| Example 82 | C-1/C-21 (mass ratio 1/1) | 12.0<br>4.0 | 46<br>44 | 11,600<br>10,100 | E-5 | P1 | A | A | A | A |
| Example 83 | C-38 | 2.5 | 68 | 5,200 | E-5 | P4 | A | A | B | A |
| Example 84 | C-39 | 8.0 | 69 | 7,700 | E-5 | P5 | A | A | B | A |
| Example 85 | C-40 | 4.0 | 63 | 5,700 | E-5 | P1 | A | A | B | A |
| Example 86 | C-41 | 6.0 | 49 | 11,000 | E-4 | P6 | B | A | B | A |
| Example 87 | C-42 | 8.0 | 47 | 11,500 | E-5 | P5 | B | A | B | A |
| Example 88 | C-43 | 6.0 | 64 | 8,300 | E-1 | P5 | A | A | B | A |
| Example 89 | C-44 | 6.0 | 59 | 9,000 | E-2 | P5 | A | A | B | A |
| Example 90 | C-45 | 12.0 | 105 | 10,200 | E-5 | P1 | A | C | A | B |
| Example 91 | C-48 | 7.0 | 69 | 10,400 | E-4 | P1 | A | A | A | A |
| Comparative Example 11 | Comparative colorant 1 | | | | E-5 | P1 | B | D | A | A |
| Comparative Example 12 | Comparative colorant 2 | | | | E-5 | P1 | B | D | A | A |
| Comparative Example 13 | Comparative colorant 4 | 100 | 25 | 32,000 | E-5 | P1 | A | A | C | C |
| Comparative Example 14 | Comparative colorant 5 | 100 | 0 | 28,000 | E-5 | P1 | A | A | C | C |
| Comparative Example 15 | Comparative colorant 6 | 100 | 50 | 32,000 | E-5 | P1 | A | A | C | C |
| Comparative Example 16 | Comparative colorant 7 | 50 | 72 | 17,500 | E-5 | P1 | C | A | A | C |
| Comparative Example 17 | Comparative colorant 8 | 23 | 63 | 19,900 | E-5 | P1 | C | A | A | C |
| Comparative Example 18 | Comparative colorant 9 | 24 | 63 | 11,300 | E-5 | P1 | B | A | A | C |
| Comparative Example 19 | Comparative colorant 10 | 55 | 13 | 26,900 | E-5 | P1 | C | A | A | C |

As seen from the above results, the coloring compositions of Examples 78 to 91, including the colorants of the present invention, were excellent in color migration properties, light fastness, and flatness.

In contrast, the coloring compositions of Comparative Examples were deteriorated in any of color migration properties, light fastness, and flatness.

Example 92

The following respective components were mixed and dissolved to obtain a coloring composition. A color filter was manufactured by the same manner as in Example 1 by using the obtained coloring composition, and the development residues, the color migration properties, the light fastness, and the flatness were evaluated.

- Organic solvent (cyclohexanone): 14.69 parts
- Alkali-soluble resin 1 (J1): 0.29 parts (a solid content of 0.09 parts, a solid content concentration of 30%)
- Alkali-soluble resin 2 (ACRYCURE RD-F8 (manufactured by Nippon Shokubai Co., Ltd.)): 0.05 parts
- Photopolymerization initiator I-7 (IRGACURE OXE-02): 0.78 parts
- Solution of a colorant C-52 in cyclohexanone (a solid content concentration of 12.3%): 79.68 parts
- Polymerizable compound Z-3 ethoxylated (4) pentaerythritol tetraacrylate, SR494 (manufactured by Sartomer Company Inc.): 1.61 parts
- Epoxy compound E-1 (EHPE 3150, manufactured by Daicel Chemical Industries, Ltd.): 0.39 parts
- Polymerization inhibitor (p-methoxyphenol): 0.0007 parts
- Fluorine-based surfactant (manufactured by DIC Corporation F475, a 1% PGMEA solution): 2.50 parts Examples 93 to 96

In the same manner as in Example 92 except that the colorant C-52, the photopolymerization initiator I-7, the alkali-soluble resin 1, the polymerizable compound (Z-3), and the epoxy compound E-1 were changed as in the following table in Preparation of Coloring Composition in Example 92, coloring compositions were prepared, and the development residues, the color migration properties, the light fastness, and the flatness were evaluated in the same manner as in Example 92.

As seen from the above results, the coloring compositions of Examples 92 to 96, including the colorants of the present invention, were excellent in color migration properties, light fastness, and flatness.

Abbreviations of the compounds described in Tables 5 to 10 are as follows.

Photopolymerization Initiator: The Following Structures (I-1)

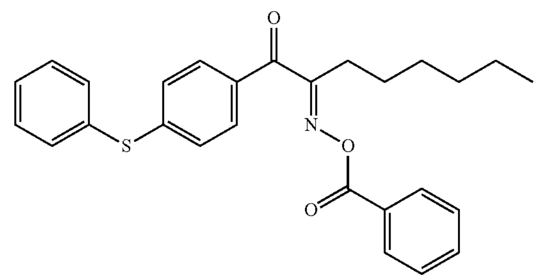

IRUGACURE OXE01 (manufactured by BASF)

(I-2)

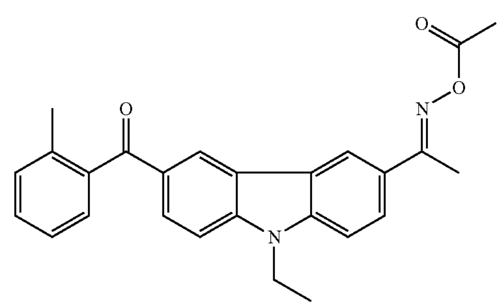

IRUGACURE OXE02 (manufactured by BASF)

TABLE 10

| | Colorant | | | | | | | | Evaluation of performance | | | |
|---|---|---|---|---|---|---|---|---|---|---|---|---|
| | Number | P moieties Repetition number | Acid value mgKOH/g | GPC Mw | Photopolymerization initiator | Alkali-soluble resin 1 | Polymerizable compound | Epoxy compound | Development residue | Color migration | Light fastness | Flatness |
| Example 92 | C-52 | 7.0 | 67 | 10,700 | I7 | J1 | Z3 | E1 | A | A | A | A |
| Example 93 | C-53 | 7.0 | 49 | 11,000 | I7 | J1 | Z6 | E2/E4 (mass ratio 1/1) | A | A | A | A |
| Example 94 | C-54 | 7.0 | 68 | 10,500 | I7 | J2 | Z1 | E1 | A | A | A | A |
| Example 95 | C-55 | 7.0 | 50 | 9,500 | I1 | J1 | Z4/Z6 (mass ratio 1/1) | E4 | A | A | B | A |
| Example 96 | C-56 | 11.0 | 113 | 10,500 | I7 | J1 | Z3 | E1 | A | A | B | B |

-continued (I-3)

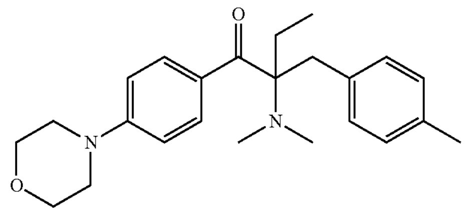

IRUGACURE OXE379 (manufactured by BASF)

(I-4)

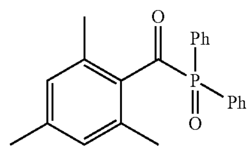

DAROCUR TP0 (manufactured by BASF)

(I-5)

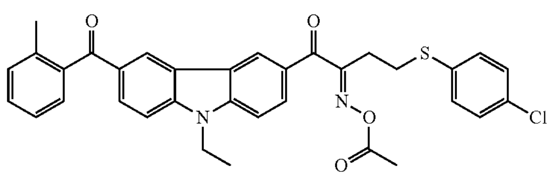

(I-6a)

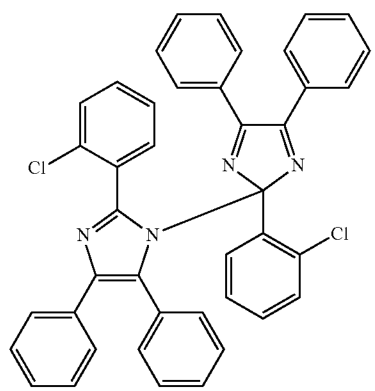

(I-6b)

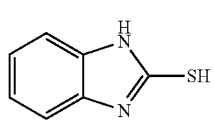

(I-6):(I-6a)/(I-6b) = 20/10 (mass ratio)

(I-7)

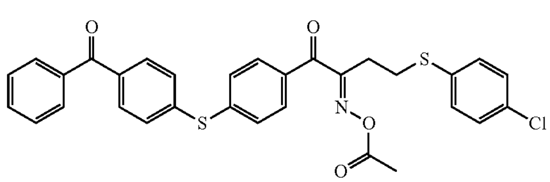

(I-8)

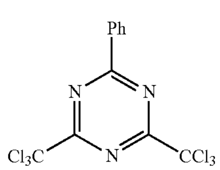

Alkali-Soluble Resin 1: The Following Structures (J1)

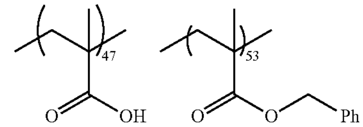

Mw: 11,000

(J2)

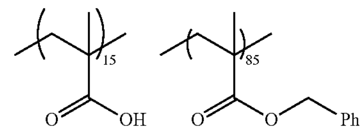

Mw: 15,000

(J3)

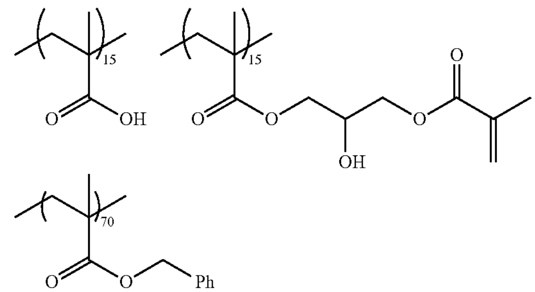

Mw: 15,000

Polymerizable Compounds

Z-1: Dipentaerythritol hexaacrylate, NKester A-DPH-12E (manufactured by Shin-Nakamura Chemical Co., Ltd.)

Z-2: Dipentaerythritol hexaacrylate, KAYARAD DPHA (manufactured by Nippon Kayaku Co., Ltd.)

Z-3: Ethoxylated (4) pentaerythritol tetraacrylate, SR494 (manufactured by Sartomer Company Inc.)

Z-4: Ethoxylated (3) trimethylolpropane triacrylate, SR454 (manufactured by Sartomer Company Inc.)

Z-5: Ethoxylated (6) trimethylolpropane triacrylate, SR499 (manufactured by Sartomer Company Inc.)

Z-6: KAYARAD DPCA-60 (manufactured by Nippon Kayaku Co., Ltd.) Z-7: Tris(2-hydroxyethyl)isocyanurate triacrylate, SR368 (manufactured by Sartomer Company Inc.)

Epoxy Compounds

E-1: EHPE 3150 (manufactured by Daicel Corporation)

E-2: EPICLON840 (manufactured by DIC Corporation)

E-3: EPICLON N660 (manufactured by DIC Corporation)

E-4: EPICLON HP7200 (manufactured by DIC Corporation)

E-5: JER1031S (manufactured by Mitsubishi Chemical Corporation)

Pigment Dispersion Liquid P4: In the same manner as in Preparation of Pigment Dispersion Liquid 1 except that C. I. Pigment Red 254 was used instead of PB 15:6 as a pigment in the preparation of the pigment dispersion liquid P1, a pigment dispersion liquid P4 was prepared. The average primary particle diameter of the pigment was measured using a dynamic light scattering method (MICROTRAC NANOTRAC UPA-EX150 (manufactured by Nikkiso Co., Ltd.), and as a result, found to be 26 nm.

Pigment Dispersion Liquid P5: In the same manner as in Preparation of Pigment Dispersion Liquid 1 except that C. I. Pigment Green 58 was used instead of PB 15:6 as a pigment in the preparation of the pigment dispersion liquid P1, a pigment dispersion liquid P5 was prepared. The average primary particle diameter of the pigment was measured using a dynamic light scattering method (MICROTRAC NANOTRAC UPA-EX150 (manufactured by Nikkiso Co., Ltd.), and as a result, found to be 30 nm.

Pigment Dispersion Liquid P6: In the same manner as in Preparation of Pigment Dispersion Liquid 1 except that C. I. Pigment Yellow 139 was used instead of PB 15:6 as a pigment in the preparation of the pigment dispersion liquid P1, a pigment dispersion liquid P6 was prepared. The average primary particle diameter of the pigment was measured using a dynamic light scattering method (MICROTRAC NANOTRAC UPA-EX150 (manufactured by Nikkiso Co., Ltd.), and as a result, found to be 27 nm.

What is claimed is:

1. A coloring composition comprising:

a colorant represented by General Formula (1); and a curable compound, wherein the colorant has a specific absorbance represented by formula ($A_\lambda$) of 5 or more at a maximum absorption wavelength of 400 nm to 800 nm:

$$(D\text{-}R^2)_n\text{—}R^1\text{-}(L^1\text{-}P)_m \quad (1)$$

wherein $R^1$ represents an (m+n)-valent linking group having 1 to 60 carbon atoms, 0 nitrogen atoms, 0 to 40 oxygen atoms, 1 to 120 hydrogen atoms, and 0 to 10 sulfur atoms, P represents a monovalent substituent having repeating units derived from a vinyl compound, D represents a colorant structure, $R^2$ and $L^1$ each independently represent a single bond or a divalent linking group, m represents an integer of 1 to 13, in the case where m is 1, P represents a monovalent substituent having 2 to 20 repeating units derived from a vinyl compound, in the case where m is 2 or more, a plurality of P's may be different from each other, and the average value of numbers of the repeating units derived from the vinyl compounds of the plurality of P's is 2 to 20, n represents an integer of 2 to 14, in the case where n is 2 or more, a plurality of D's may be different from each other, and m+n represents an integer of 3 to 15, and $$E=A/(c+l) \ldots (A_\lambda)$$

wherein

E represents the specific absorbance at a maximum absorption wavelength of 400 nm to 800 nm, A represents the absorbance at a maximum absorption wavelength of 400 nm to 800 nm, l represents the cell length in a unit of cm, and c represents the concentration in a unit of mg/ml of a colorant in the solution.

2. The coloring composition according to claim 1, wherein D in General Formula (1) is derived from a colorant selected from a triarylmethane colorant, a xanthene colorant, an anthraquinone colorant, a cyanine colorant, a squarylium colorant, a quinophthalone colorant, a phthalocyanine colorant, a subphthalocyanine colorant, an azo colorant, and a dipyrromethene colorant.

3. The coloring composition according to claim 1, wherein D in General Formula (1) is derived from a colorant selected from a triarylmethane colorant and a xanthene colorant.

4. The coloring composition according to claim 1, wherein P in General Formula (1) contains repeating units derived from a vinyl compound having an acid group in the amount of 30% by mole or more with respect to all the repeating units of P.

5. The coloring composition according to claim 1, wherein the colorant contains a group having an ethylenically unsaturated bond.

6. The coloring composition according to claim 1, wherein the colorant represented by General Formula (1) is a colorant represented by General Formula (2):

$$(D\text{-}R^4\text{—}(S)_p)_n\text{—}R^3\text{—}(S\text{-}L^2\text{-}P)_m \quad (2)$$

wherein $R^3$ represents an (m+n)-valent linking group having 1 to 60 carbon atoms, 0 nitrogen atoms, 0 to 40 oxygen atoms, 1 to 120 hydrogen atoms, and 0 to 10 sulfur atoms, P represents a monovalent substituent having repeating units derived from a vinyl compound, D represents a colorant structure, $R^4$ and $L^2$ each independently represent a single bond or a divalent linking group, S represents a sulfur atom, m represents an integer of 1 to 13, in the case where m is 1, P represents a monovalent substituent having 2 to 20 repeating units derived from a vinyl compound, in the case where m is 2 or more, a plurality of P's may be different from each other, and the average value of numbers of the repeating units derived from the vinyl compounds of the plurality of P's is 2 to 20, n represents an integer of 2 to 14, in the case where n is 2 or more, a plurality of D's may be different from each other, m+n represents an integer of 3 to 15, and p represents 0 or 1.

7. The coloring composition according to claim 1, wherein the colorant represented by General Formula (1) is obtained by subjecting a vinyl compound to a radical polymerization reaction in the presence of a compound represented by General Formula (3):

$$(D\text{-}R^4\text{—}(S)_p)_n\text{—}R^3\text{—}(SH)_m \quad (3)$$

wherein $R^3$ represents an (m+n)-valent linking group having 1 to 60 carbon atoms, 0 nitrogen atoms, 0 to 40 oxygen atoms, 1 to 120 hydrogen atoms, and 0 to 10 sulfur atoms, D represents a colorant structure, $R^4$ represents a single bond or a divalent linking group, S represents a sulfur atom, SH represents a thiol group, m represents an integer of 1 to 13, n represents an integer of 2 to 14, in the case where n is 2 or more, a plurality of D's may be different from each other, m+n represents an integer of 3 to 15, and p represents 0 or 1.

8. The coloring composition according to claim 1, wherein D of General Formula (1) has a cation moiety and a counter anion, or has a cation moiety and an anion moiety within one molecule.

9. The coloring composition according to claim 8, wherein the counter anion is at least one selected from a sulfonic acid anion, a sulfonylimide anion, a bis(alkylsulfonyl)imide anion, a tris(alkylsulfonyl)methide anion, a carboxylic acid anion, a tetraarylborate anion, $BF_4^-$, $PF_6^-$, and $SbF_6^-$.

10. The coloring composition according to claim 1, wherein the weight-average molecular weight of the colorant represented by General Formula (1) is 2,000 to 12,500.

11. The coloring composition according to claim 1, further comprising a pigment other than the colorant represented by General Formula (1).

12. The coloring composition according to claim 1, further comprising a photopolymerization initiator.

13. The coloring composition according to claim 1, for formation of a colored layer of a color filter.

14. A cured film obtained by curing the coloring composition according to claim 1.

15. A color filter formed by using the coloring composition according to claim 1.

16. A solid-state imaging device comprising the color filter according to claim 15.

17. An image display device comprising the color filter according to claim 15.

18. An organic electroluminescent element comprising the color filter according to claim 15.

19. A method for manufacturing a color filter, comprising:

applying the coloring composition according to claim 1 onto a support to form a coloring composition layer;

patternwise exposing the coloring composition layer; and removing an unexposed area by development to form a colored pattern.

20. A method for manufacturing a color filter, comprising:

applying the coloring composition according to claim 1 onto a support to form a coloring composition layer, followed by curing to form a colored layer;

forming a photoresist layer on the colored layer;

patterning the photoresist layer by carrying out exposure and development to obtain a resist pattern; and dry-etching the colored layer using the resist pattern as an etching mask to form a colored pattern.

21. The coloring composition according to claim 1, wherein P in General Formula (1) contains repeating units having an acid group.

22. The coloring composition according to claim 1, wherein P in General Formula (1) contains repeating units having a polymerizable group.

23. The coloring composition according to claim 1, wherein P in General Formula (1) represents a monovalent substituent having repeating units derived from a vinyl compound selected from the group consisting of (meth)acrylic acid esters, crotonic acid esters, vinyl esters, maleic acid diesters, fumaric acid diesters, itaconic acid diesters, (meth)acrylamides, styrenes, vinyl ethers, vinyl ketones, maleimides, (meth)acrylonitrile, and a vinyl compound having an acid group.

24. A colorant represented by General Formula (1), which has a specific absorbance represented by formula ($A_\lambda$) of 5 or more at a maximum absorption wavelength of 400 nm to 800 nm:

$$(D\text{-}R^2)_n\text{—}R^1\text{-}(L^1\text{-}P)_m \qquad (1)$$

wherein $R^1$ represents an (m+n)-valent linking group having 1 to 60 carbon atoms, 0 nitrogen atoms, 0 to 40 oxygen atoms, 1 to 120 hydrogen atoms, and 0 to 10 sulfur atoms, P represents a monovalent substituent having repeating units derived from a vinyl compound, D represents a colorant structure, $R^2$ and $L^1$ each independently represent a single bond or a divalent linking group, m represents an integer of 1 to 13, in the case where m is 1, P represents a monovalent substituent having 2 to 20 repeating units derived from a vinyl compound, in the case where m is 2 or more, a plurality of P's may be different from each other, and the average value of numbers of the repeating units derived from the vinyl compounds of the plurality of P's is 2 to 20, n represents an integer of 2 to 14, in the case where n is 2 or more, a plurality of D's may be different from each other, and m+n represents an integer of 3 to 15, and $$E=A/(c{\cdot}l) \ldots (A_\lambda)$$

wherein

E represents the specific absorbance at a maximum absorption wavelength of 400 nm to 800 nm, A represents the absorbance at a maximum absorption wavelength of 400 nm to 800 nm, l represents the cell length in a unit of cm, and c represents the concentration in a unit of mg/ml of a colorant in the solution.

25. The colorant according to claim 24, wherein D in General Formula (1) is derived from a colorant selected from a triarylmethane colorant, a xanthene colorant, an anthraquinone colorant, a cyanine colorant, a squarylium colorant, a quinophthalone colorant, a phthalocyanine colorant, a subphthalocyanine colorant, an azo colorant, and a dipyrromethene colorant.

26. The colorant according to claim 24, wherein D in General Formula (1) is derived from a colorant selected from a triarylmethane colorant and a xanthene colorant.

27. The colorant according to claim 24, wherein P in General Formula (1) contains repeating units derived from a vinyl compound having an acid group in the amount of 30% by mole or more with respect to all the repeating units of P.

28. The colorant according to claim 24, wherein the colorant contains a group having an ethylenically unsaturated bond.

29. A method for producing a colorant, comprising subjecting a vinyl compound to a radical polymerization reaction in the presence of a compound represented by General Formula (3) to produce the colorant according to claim 24:

$$(D\text{-}R^4\text{—}(S)_p)_n\text{—}R^3\text{—}(SH)_m \qquad (3)$$

wherein $R^3$ represents an (m+n)-valent linking group having 1 to 60 carbon atoms, 0 nitrogen atoms, 0 to 40 oxygen atoms, 1 to 120 hydrogen atoms, and 0 to 10 sulfur atoms, D represents a colorant structure, $R^4$ represents a single bond or a divalent linking group, S represents a sulfur atom, SH represents a thiol group, m represents an integer of 1 to 13, n represents an integer of 2 to 14, in the case where n is 2 or more, a plurality of D's may be different from each other, m+n represents an integer of 3 to 15, and p represents 0 or 1.

30. The colorant according to claim 24, wherein P in General Formula (1) contains repeating units having an acid group.

31. The colorant according to claim 24, wherein Pin General Formula (1) contains repeating units having a polymerizable group.

32. The colorant according to claim 24, wherein P in General Formula (1) represents a monovalent substituent having repeating units derived from a vinyl compound selected from the group consisting of (meth)acrylic acid esters, crotonic acid esters, vinyl esters, maleic acid diesters, fumaric acid diesters, itaconic acid diesters, (meth)acrylamides, styrenes, vinyl ethers, vinyl ketones, maleimides, (meth)acrylonitrile, and a vinyl compound having an acid group.

33. A coloring composition comprising:

a colorant represented by General Formula (1); and a curable compound, wherein the colorant has a specific absorbance represented by formula ($A_\lambda$) of 5 or more at a maximum absorption wavelength of 400 nm to 800 nm:

$$(D\text{-}R^2)_n\text{—}R^1\text{-}(L^1\text{-}P)_m \quad (1)$$

wherein $R^1$ represents an (m+n)-valent linking group selected from the group consisting of (1) to (4) and (6) to (31), P represents a monovalent substituent having repeating units derived from a vinyl compound, D represents a colorant structure, $R^2$ and $L^1$ each independently represent a single bond or a divalent linking group, m represents an integer of 1 to 13, in the case where m is 1, P represents a monovalent substituent having 2 to 20 repeating units derived from a vinyl compound, in the case where m is 2 or more, a plurality of P's may be different from each other, and the average value of numbers of the repeating units derived from the vinyl compounds of the plurality of P's is 2 to 20, n represents an integer of 2 to 14, in the case where n is 2 or more, a plurality of D's may be different from each other, and m+n represents an integer of 3 to 15, and $$E=A/(c+l) \ldots (A_\lambda)$$

wherein

E represents the specific absorbance at a maximum absorption wavelength of 400 nm to 800 nm, A represents the absorbance at a maximum absorption wavelength of 400 nm to 800 nm, l represents the cell length in a unit of cm, and c represents the concentration in a unit of mg/ml of a colorant in the solution, (1)

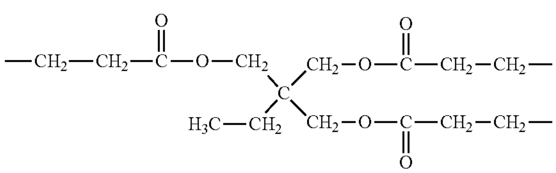

(2)

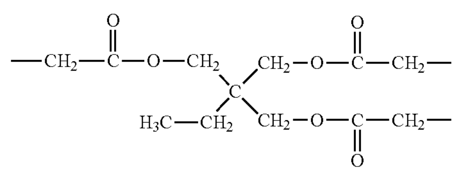

(3)

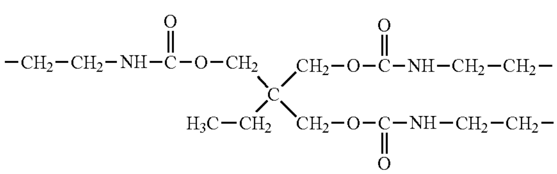

(4)

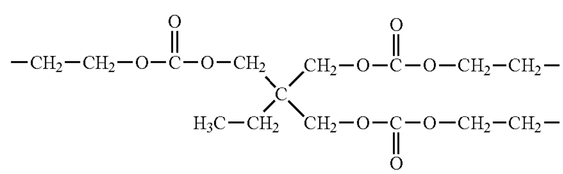

(5)

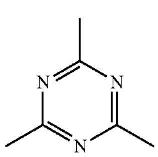

(6)

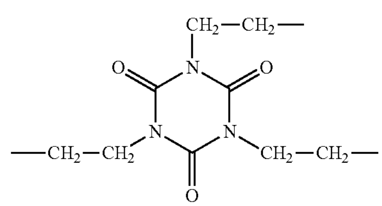

(7)

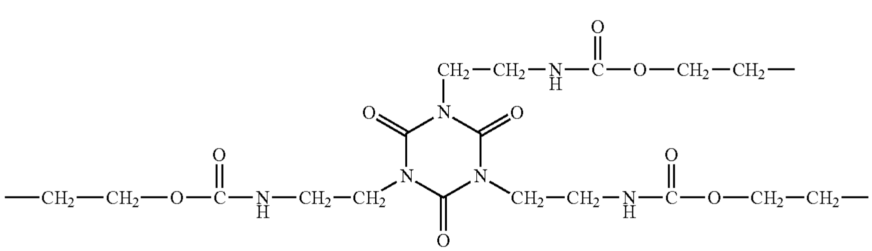

-continued
(8)
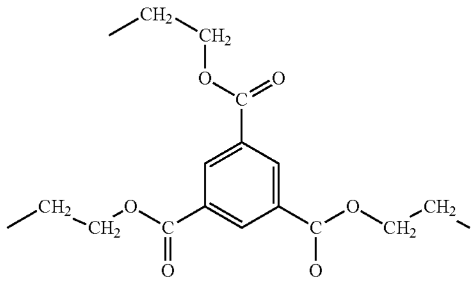
(9)
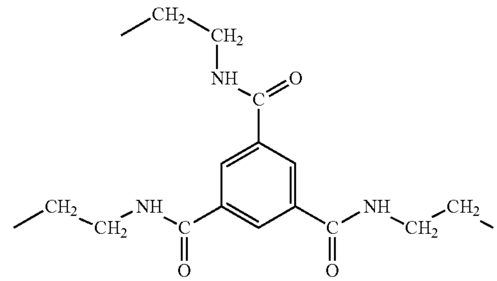
(10)
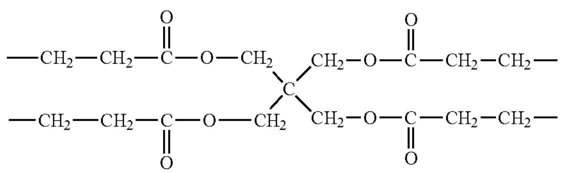
(11)
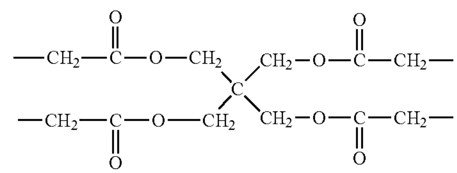
(12)
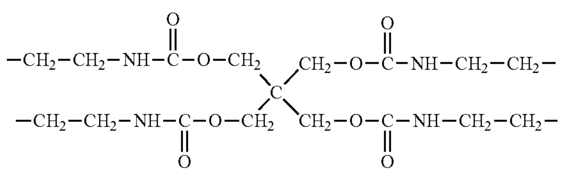
(13)
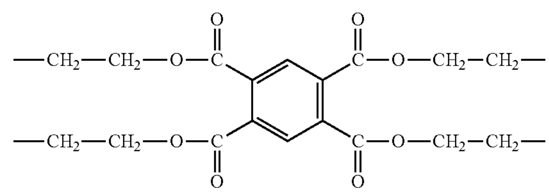
(14)
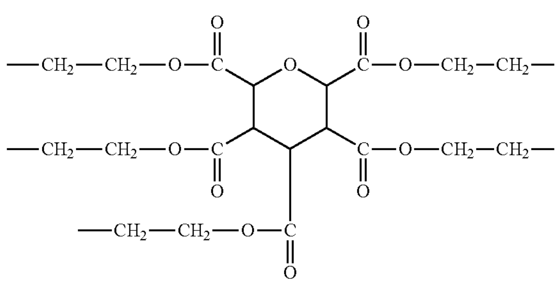
(15)
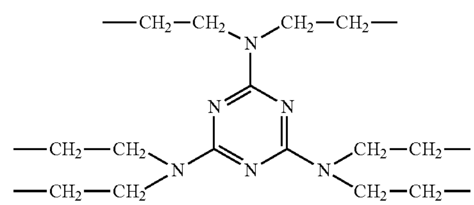
(16)
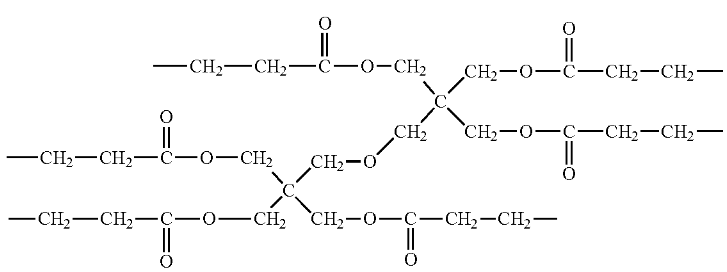
(17)
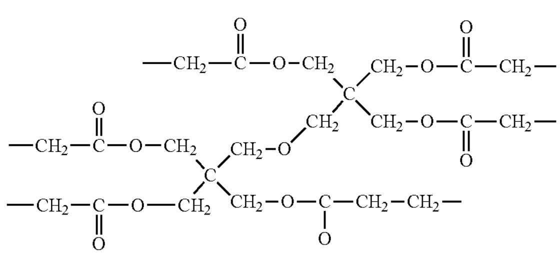
(18)
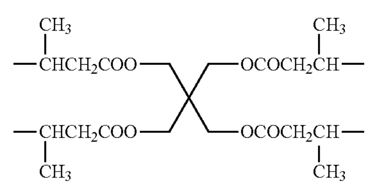

-continued
(19)
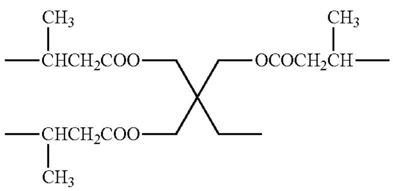
(20)
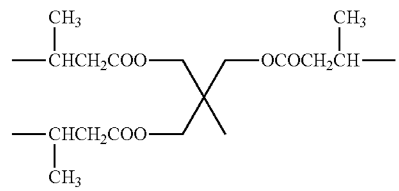
(21)
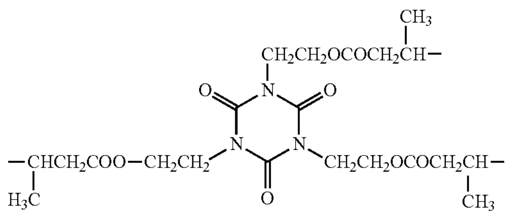
(22)
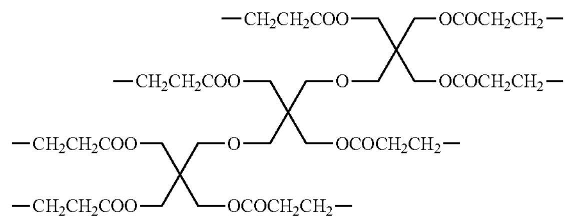
(23)
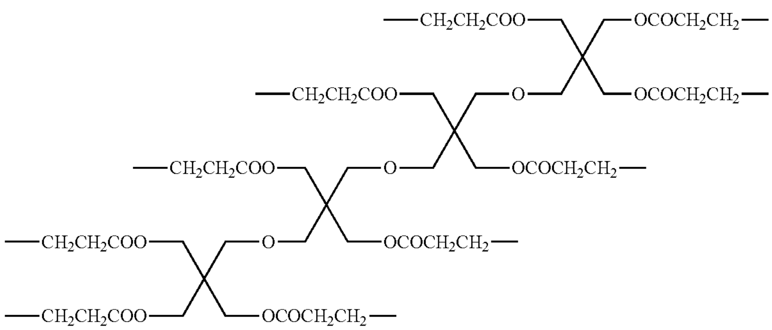
(24)
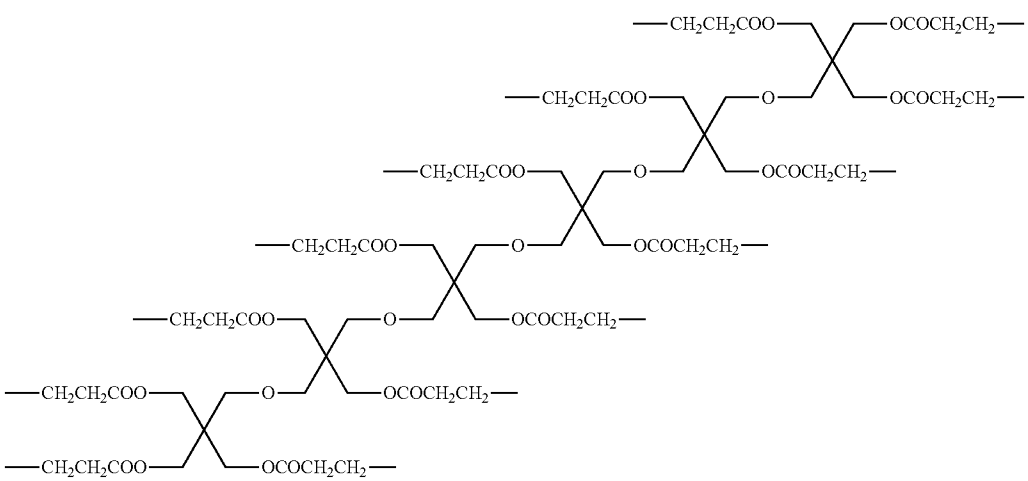

-continued
(25)
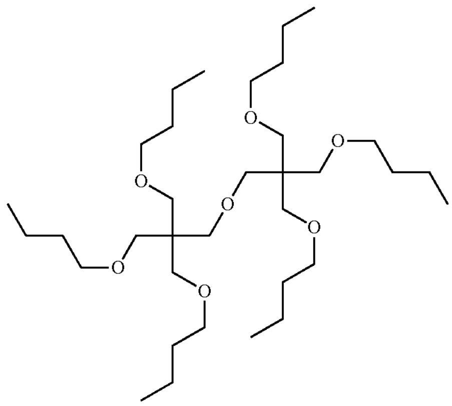
(26)
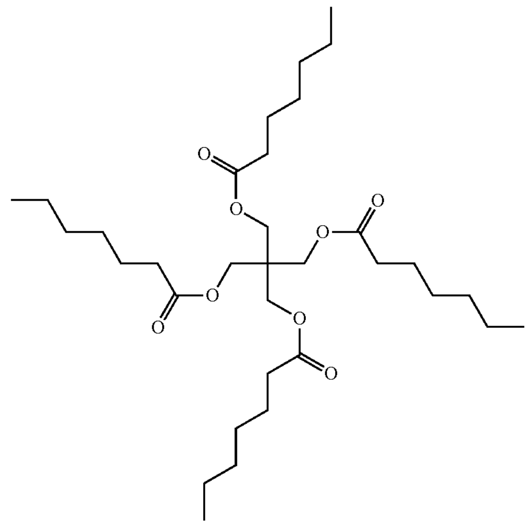
(27)
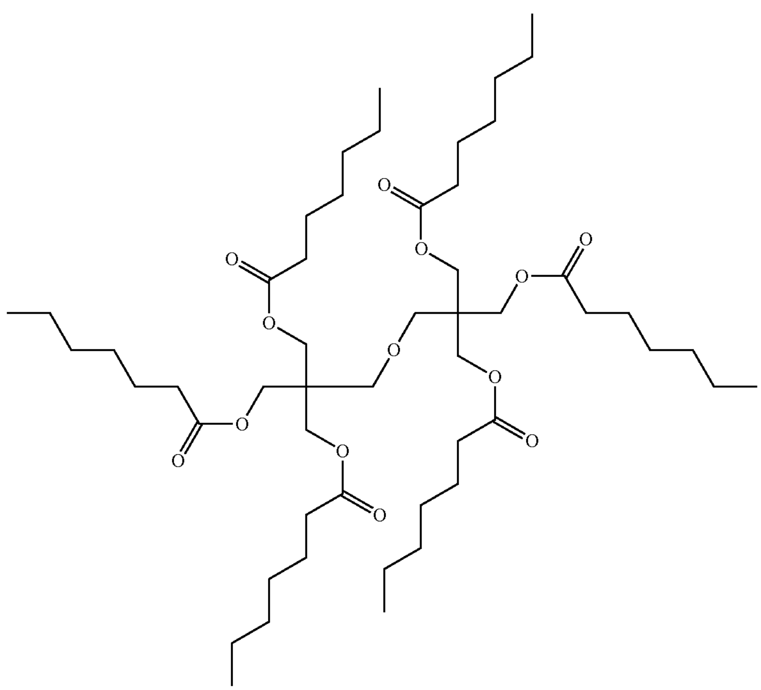

-continued
(28)
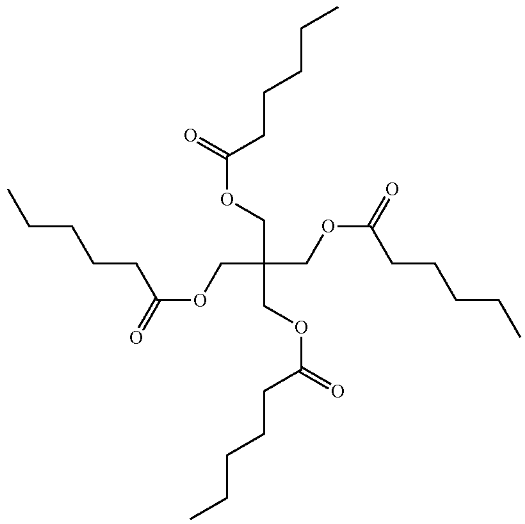
(29)
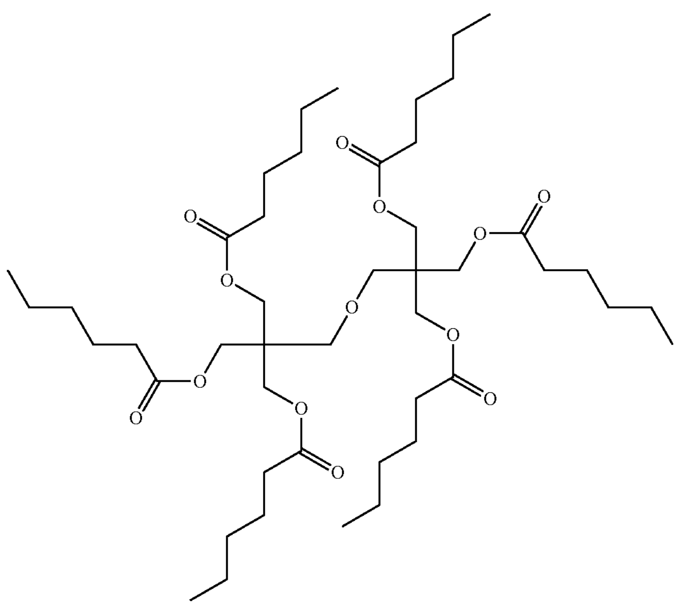
(30)
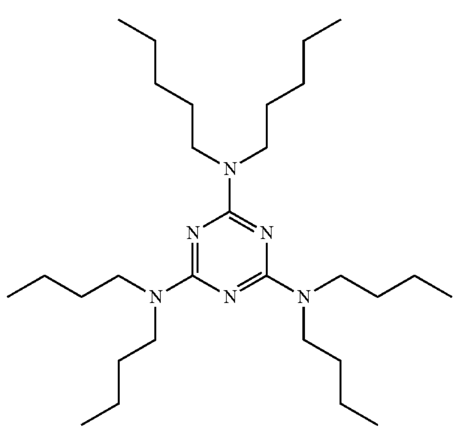

-continued (31)

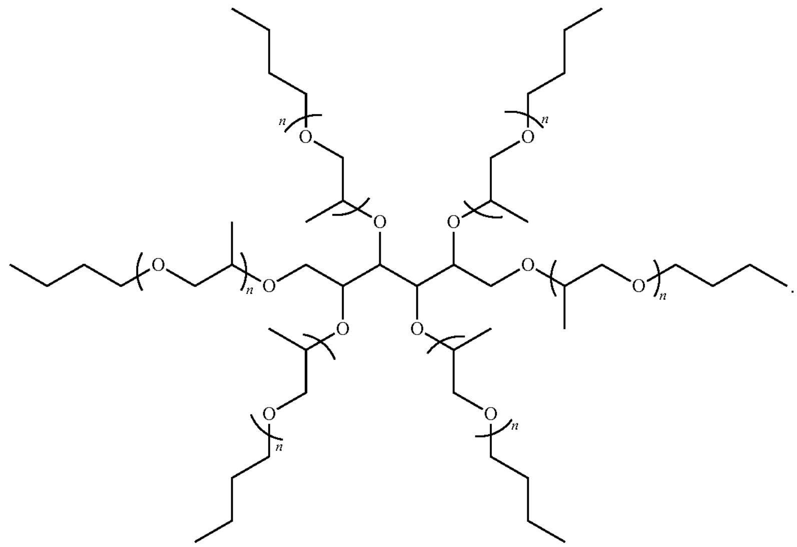

34. The coloring composition according to claim 33, wherein P in General Formula (1) contains repeating units having an acid group.

35. The coloring composition according to claim 33, wherein P in General Formula (1) contains repeating units having a polymerizable group.

36. The coloring composition according to claim 33, wherein P in General Formula (1) represents a monovalent substituent having repeating units derived from a vinyl compound selected from the group consisting of (meth) acrylic acid esters, crotonic acid esters, vinyl esters, maleic acid diesters, fumaric acid diesters, itaconic acid diesters, (meth)acrylamides, styrenes, vinyl ethers, vinyl ketones, maleimides, (meth)acrylonitrile, and a vinyl compound having an acid group.

37. A colorant represented by General Formula (1), which has a specific absorbance represented by formula ($A_\lambda$) of 5 or more at a maximum absorption wavelength of 400 nm to 800 nm:

$$(D\text{-}R^2)_n\text{—}R^1\text{-}(L^1\text{-}P)_m \quad (1)$$

wherein $R^1$ represents an (m+n)-valent linking group selected from the group consisting of (1) to (4) and (6) to (31), P represents a monovalent substituent having repeating units derived from a vinyl compound, D represents a colorant structure, $R^2$ and $L^1$ each independently represent a single bond or a divalent linking group, m represents an integer of 1 to 13, in the case where m is 1, P represents a monovalent substituent having 2 to 20 repeating units derived from a vinyl compound, in the case where m is 2 or more, a plurality of P's may be different from each other, and the average value of numbers of the repeating units derived from the vinyl compounds of the plurality of P's is 2 to 20, n represents an integer of 2 to 14, in the case where n is 2 or more, a plurality of D's may be different from each other, and m+n represents an integer of 3 to 15, and $$E=A/(c \cdot l) \ldots (A_\lambda)$$

wherein

E represents the specific absorbance at a maximum absorption wavelength of 400 nm to 800 nm, A represents the absorbance at a maximum absorption wavelength of 400 nm to 800 nm, l represents the cell length in a unit of cm, and c represents the concentration in a unit of mg/ml of a colorant in the solution, (1)

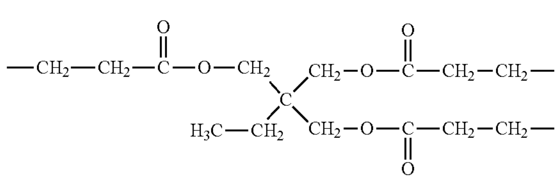

(2)

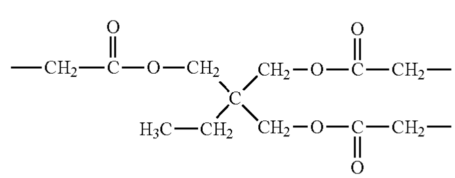

-continued
(3)
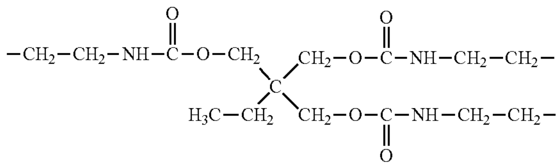
(4)
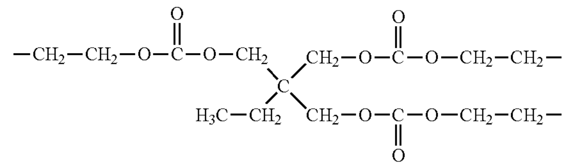
(5)
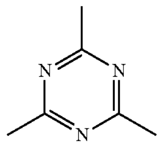
(6)
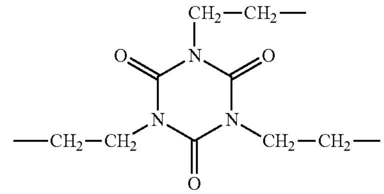
(7)
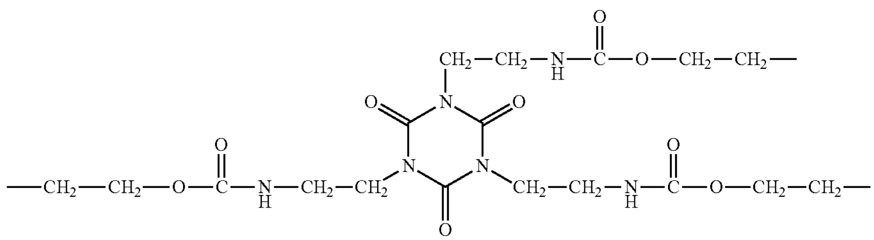
(8)
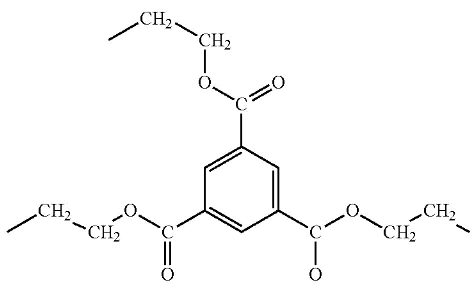
(9)
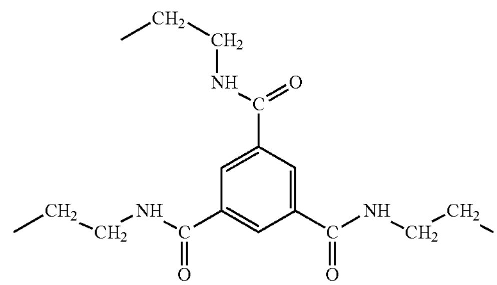
(10)
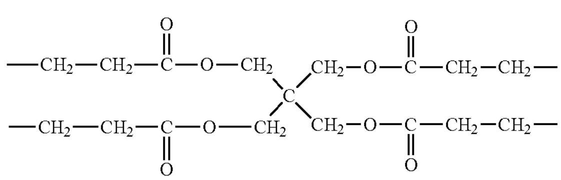
(11)
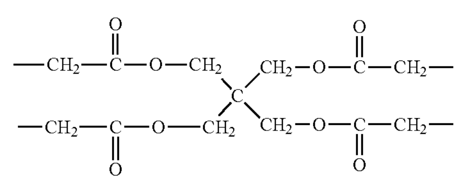
(12)
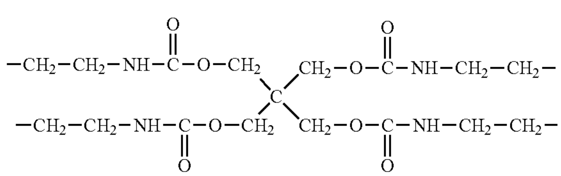
(13)
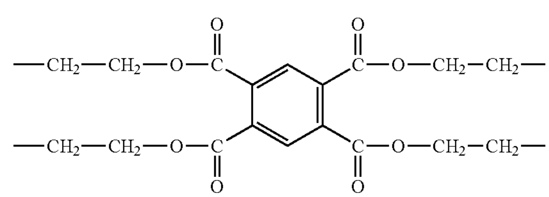
(14)
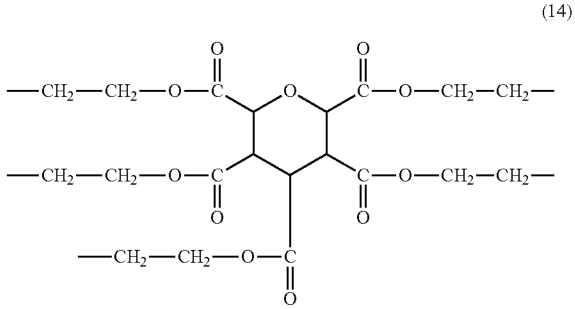
(15)
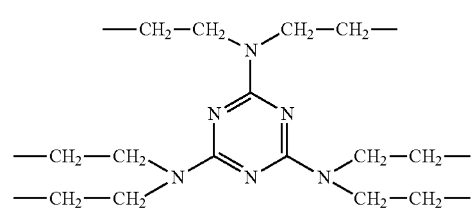

-continued
(16)
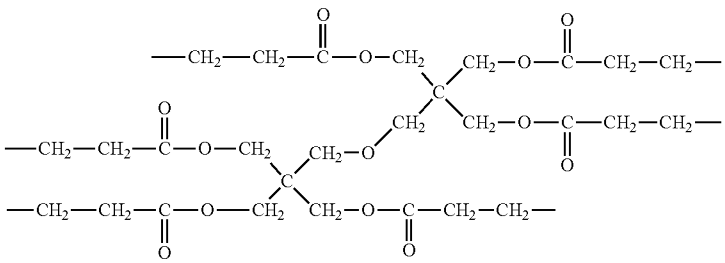
(17)
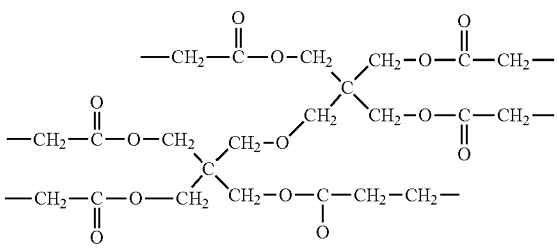
(18)
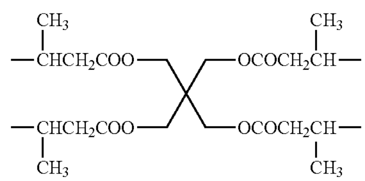
(19)
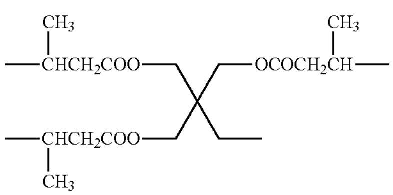
(20)
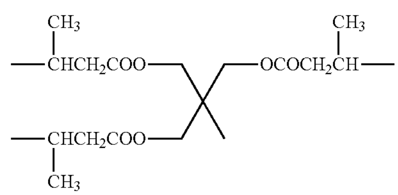
(21)
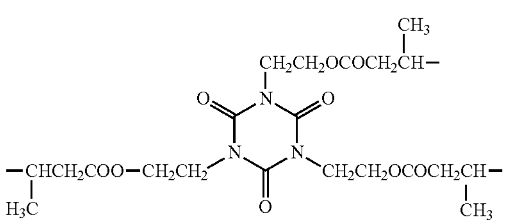
(22)
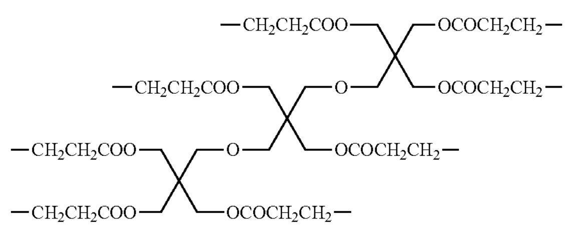
(23)
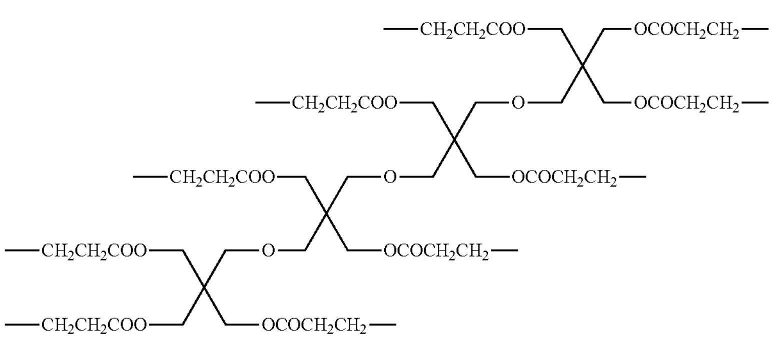

-continued
(24)
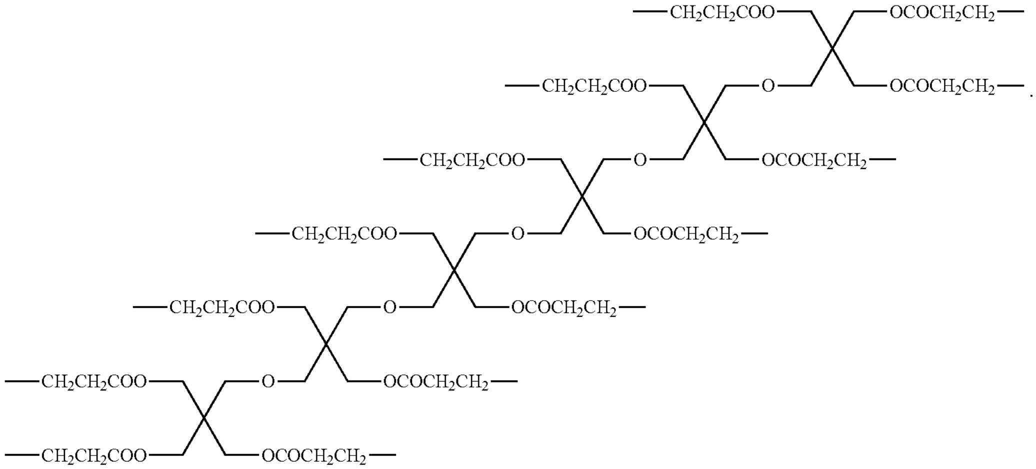
(25)
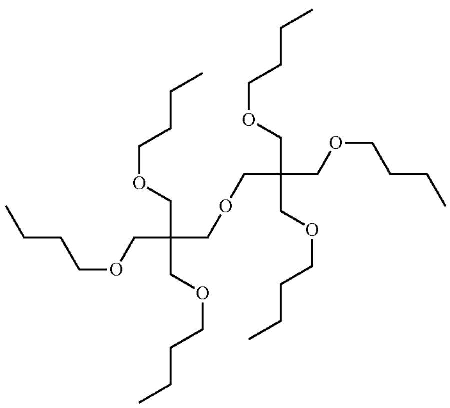
(26)
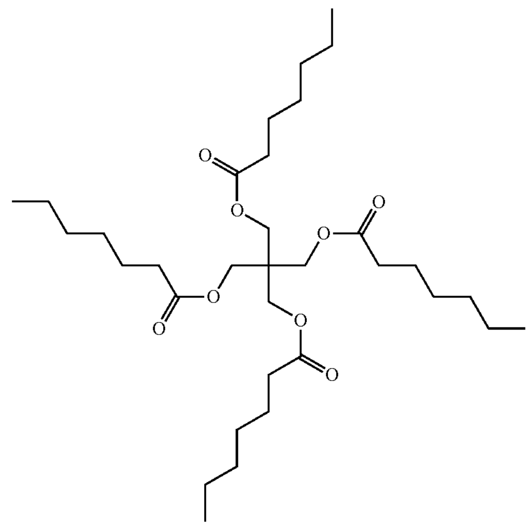
(27)
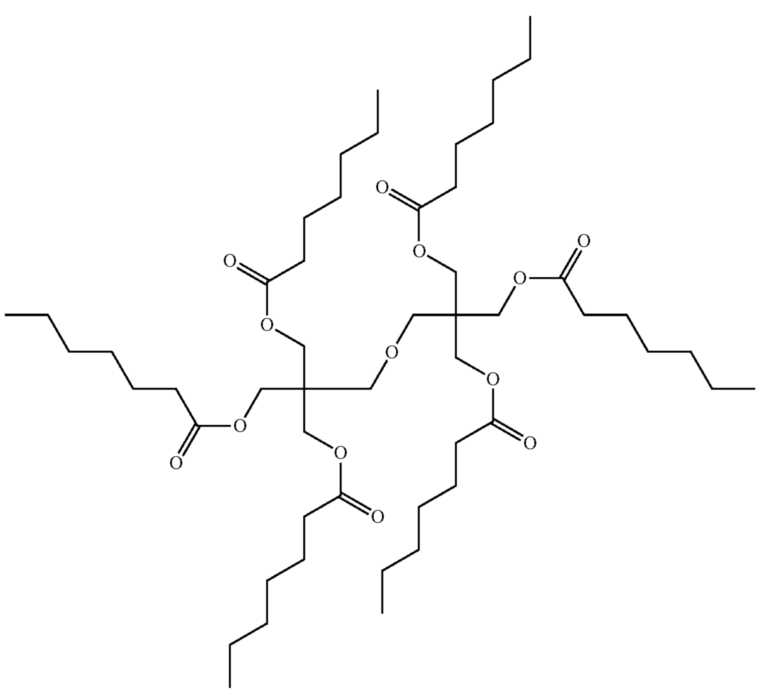

-continued
(28)
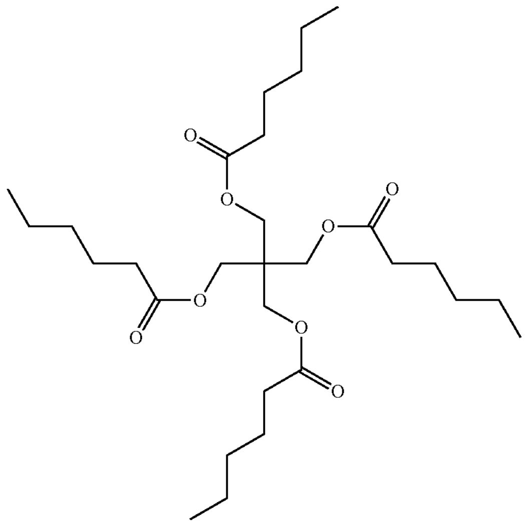
(29)
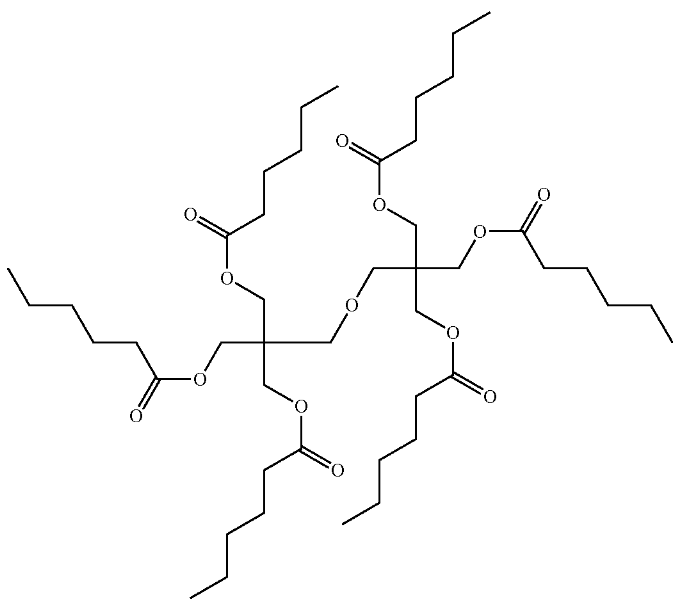
(30)
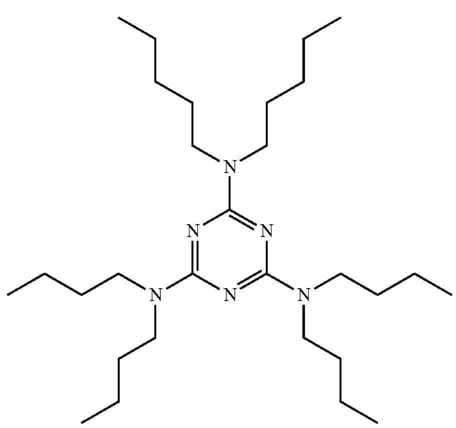

-continued (31)

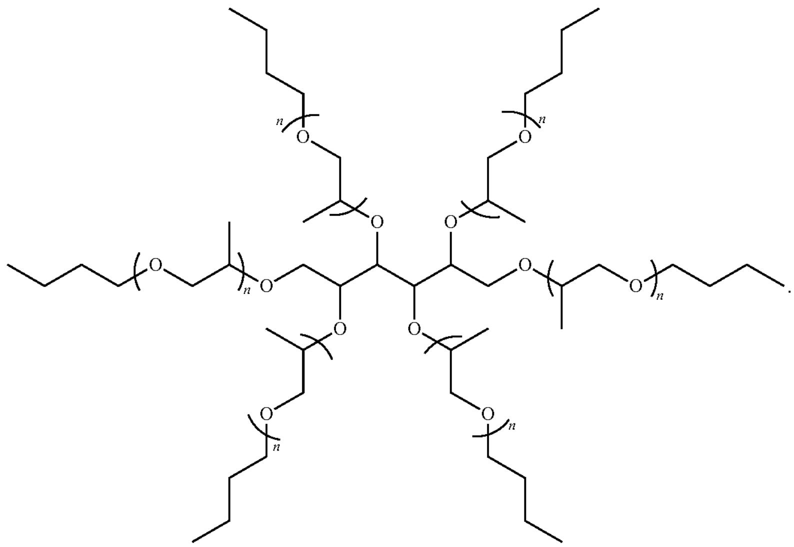

38. The colorant according to claim 37, wherein P in General Formula (1) contains repeating units having an acid group.

39. The colorant according to claim 37, wherein P in General Formula (1) contains repeating units having a polymerizable group.

40. The colorant according to claim 37, wherein P in General Formula (1) represents a monovalent substituent having repeating units derived from a vinyl compound selected from the group consisting of (meth)acrylic acid esters, crotonic acid esters, vinyl esters, maleic acid diesters, fumaric acid diesters, itaconic acid diesters, (meth)acrylamides, styrenes, vinyl ethers, vinyl ketones, maleimides, (meth)acrylonitrile, and a vinyl compound having an acid group.

41. A coloring composition comprising:

a colorant represented by General Formula (1); and a curable compound, wherein the colorant has a specific absorbance represented by formula ($A_\lambda$) of 5 or more at a maximum absorption wavelength of 400 nm to 800 nm:

$$(D\text{-}R^2)_n\text{—}R^1\text{-}(L^1\text{-}P)_m \qquad (1)$$

wherein $R^1$ represents an (m+n)-valent linking group selected from the group consisting of (10) to (11) and (16) to (18), P represents a monovalent substituent having 2 to 20 repeating units derived from a vinyl compound, D represents a xanthene colorant structure, $R^2$ each independently represent a group which bonds to $R^1$ at -s- terminal and includes 1 to 100 carbon atoms, 0 to 10 nitrogen atoms, 0 to 50 oxygen atoms, 1 to 200 hydrogen atoms, and 0 to 20 sulfur atoms, $L^1$ each independently represent a group which bonds to $R^1$ at -s- terminal and includes 1 to 100 carbon atoms, 0 to 10 nitrogen atoms, 0 to 50 oxygen atoms, 1 to 200 hydrogen atoms, and 0 to 20 sulfur atoms, m represents an integer of 1 to 3, in the case where m is 1, P represents a monovalent substituent having 2 to 20 repeating units derived from a vinyl compound, in the case where m is 2 or more, a plurality of P's may be different from each other, and the average value of numbers of the repeating units derived from the vinyl compounds of the plurality of P's is 2 to 20, n represents an integer of 2 to 4, in the case where n is 2 or more, a plurality of D's may be different from each other, and m+n represents an integer of 3 to 15, and $$E=A/(c \cdot l) \quad \ldots \quad (A_\lambda)$$

wherein

E represents the specific absorbance at a maximum absorption wavelength of 400 nm to 800 nm, A represents the absorbance at a maximum absorption wavelength of 400 nm to 800 nm, l represents the cell length in a unit of cm, and c represents the concentration in a unit of mg/ml of a colorant in the solution, (10)

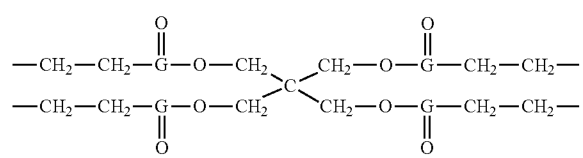

(11)

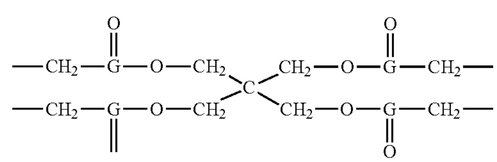

(16)

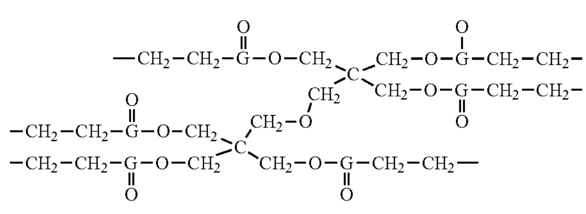

-continued (17)

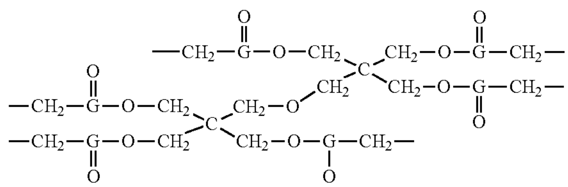

(18)

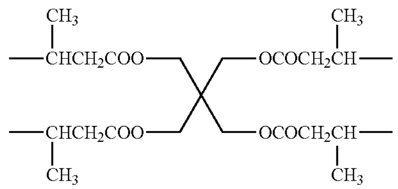

42. A colorant represented by General Formula (1), which has a specific absorbance represented by formula ($A_\lambda$) of 5 or more at a maximum absorption wavelength of 400 nm to 800 nm:

$$(D\text{-}R^2)_n\text{—}R^1\text{-}(L^1\text{-}P)_m \quad (1)$$

wherein $R^1$ represents an (m+n)-valent linking group selected from the group consisting of (10) to (11) and (16) to (18), P represents a monovalent substituent having 2 to 20 repeating units derived from a vinyl compound, D represents a xanthene colorant structure, $R^2$ each independently represents a group which bonds to $R^1$ at -s- terminal and includes 1 to 100 carbon atoms, 0 to 10 nitrogen atoms, 0 to 50 oxygen atoms, 1 to 200 hydrogen atoms, and 0 to 20 sulfur atoms, $L^1$ each independently represents a group which bonds to $R^1$ at -s- terminal and includes 1 to 100 carbon atoms, 0 to 10 nitrogen atoms, 0 to 50 oxygen atoms, 1 to 200 hydrogen atoms, and 0 to 20 sulfur atoms, m represents an integer of 1 to 3, in the case where m is 1, P represents a monovalent substituent having 2 to 20 repeating units derived from a vinyl compound, in the case where m is 2 or more, a plurality of P's may be different from each other, and the average value of numbers of the repeating units derived from the vinyl compounds of the plurality of P's is 2 to 20, n represents an integer of 2 to 4, in the case where n is 2 or more, a plurality of D's may be different from each other, and m+n represents an integer of 3 to 15, and $$E=A/(c{\cdot}l) \ldots (A_\lambda)$$

wherein

E represents the specific absorbance at a maximum absorption wavelength of 400 nm to 800 nm, A represents the absorbance at a maximum absorption wavelength of 400 nm to 800 nm, l represents the cell length in a unit of cm, and c represents the concentration in a unit of mg/ml of a colorant in the solution, (10)

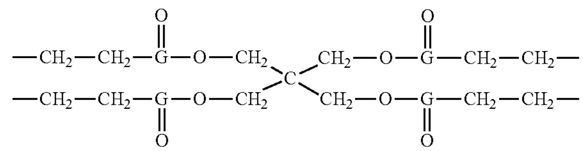

(11)

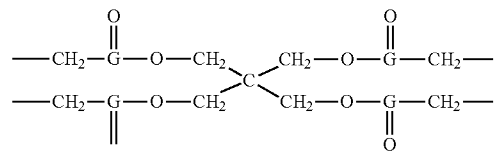

(16)

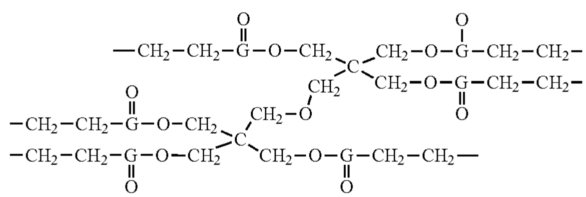

(17)

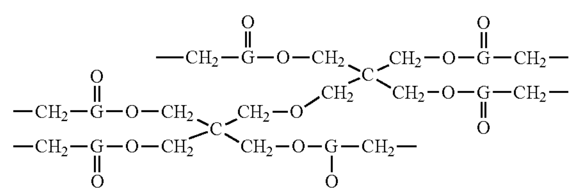

(18)

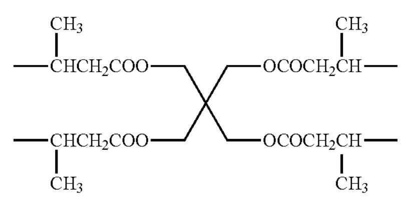

* * * * *